US011764339B2

(12) United States Patent
Biebersdorf et al.

(10) Patent No.: US 11,764,339 B2
(45) Date of Patent: Sep. 19, 2023

(54) μ-LED, μ-LED DEVICE, DISPLAY AND METHOD FOR THE SAME

(71) Applicant: OSRAM Opto Semiconductors GmbH, Regensburg (DE)

(72) Inventors: Andreas Biebersdorf, Regensburg (DE); Laura Kreiner, Regensburg (DE); Stefan Illek, Donaustauf (DE); Ines Pietzonka, Donaustauf (DE); Petrus Sundgren, Lappersdorf (DE); Christoph Klemp, Regensburg (DE); Felix Feix, Jena (DE); Christian Berger, Marburg (DE); Ana Kanevce, Stuttgart (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 17/645,637

(22) Filed: Dec. 22, 2021

(65) Prior Publication Data

US 2022/0123181 A1 Apr. 21, 2022

Related U.S. Application Data

(63) Continuation of application No. 17/038,283, filed on Sep. 30, 2020, now Pat. No. 11,271,143, which is a (Continued)

(30) Foreign Application Priority Data

Jan. 29, 2019 (DE) ..................... 10 2019 201 114.4
Jan. 29, 2019 (DK) ............................ PA201970059
(Continued)

(51) Int. Cl.
*H01L 33/52* (2010.01)
*H01L 33/50* (2010.01)
(Continued)

(52) U.S. Cl.
CPC .......... *H01L 33/52* (2013.01); *H01L 25/0753* (2013.01); *H01L 33/04* (2013.01);
(Continued)

(58) Field of Classification Search
CPC ....... H01L 33/52; H01L 33/04; H01L 33/502; H01L 33/60; B60K 2370/1523
See application file for complete search history.

(56) References Cited

U.S. PATENT DOCUMENTS 4,979,002 A 12/1990 Pankove
5,103,271 A 4/1992 Izumiya et al.
(Continued)

FOREIGN PATENT DOCUMENTS

DE 19744793 A1 4/1998
DE 19751649 A1 5/1999
(Continued)

OTHER PUBLICATIONS

Buljan et al., "Ultra-Compact Multichannel Freeform Optics for 4xWUXGA OLED Microdisplays," Proc. SPIE 10676, Digital Optics for Immersive Displays, 9 pages (2018).
(Continued)

*Primary Examiner* — Mark W Tornow
(74) *Attorney, Agent, or Firm* — ARENTFOX SCHIFF LLP

(57) ABSTRACT

The invention relates to various aspects of a μ-LED or a μ-LED array for augmented reality or lighting applications, in particular in the automotive field. The μ-LED is characterized by particularly small dimensions in the range of a few μm.

19 Claims, 102 Drawing Sheets

Related U.S. Application Data continuation of application No. PCT/EP2020/052191, filed on Jan. 29, 2020.

(30) Foreign Application Priority Data

| | | |
|---|---|---|
| Feb. 11, 2019 | (DE) | 10 2019 103 365.9 |
| May 7, 2019 | (DE) | 10 2019 111 766.6 |
| May 7, 2019 | (DE) | 10 2019 111 767.4 |
| May 14, 2019 | (DE) | 10 2019 112 605.3 |
| May 14, 2019 | (DE) | 10 2019 112 609.6 |
| May 22, 2019 | (DE) | 10 2019 113 636.9 |
| May 28, 2019 | (DE) | 10 2019 114 321.7 |
| Jul. 4, 2019 | (DE) | 10 2019 118 084.8 |
| Sep. 20, 2019 | (DE) | 10 2019 125 336.5 |
| Sep. 20, 2019 | (DE) | 10 2019 125 349.7 |
| Oct. 11, 2019 | (DE) | 10 2019 127 424.9 |
| Oct. 11, 2019 | (DE) | 10 2019 127 425.7 |
| Nov. 14, 2019 | (DE) | 10 2019 130 821.6 |
| Nov. 21, 2019 | (DE) | 10 2019 131 506.9 |

(51) Int. Cl.

*H01L 33/60* (2010.01)
*H01L 33/04* (2010.01)
*H01L 25/075* (2006.01)
*B60K 35/00* (2006.01)

(52) U.S. Cl.

CPC ............ *H01L 33/502* (2013.01); *H01L 33/60* (2013.01); *B60K 35/00* (2013.01); *B60K 2370/1523* (2019.05)

(56) References Cited

U.S. PATENT DOCUMENTS 5,526,063 A 6/1996 Joubert et al.
5,537,171 A 7/1996 Ogino et al.
7,067,339 B2 6/2006 Biwa et al.
7,808,005 B1 10/2010 Fattal et al.
8,049,233 B2 11/2011 Fukshima et al.
8,349,116 B1 1/2013 Bibl et al.
8,586,965 B2 11/2013 Toyoda et al.
9,202,988 B2 12/2015 Yoshida et al.
9,318,645 B2 4/2016 Tani et al.
9,368,683 B1 6/2016 Meiti et al.
10,069,036 B2 9/2018 Atanackovic
10,096,585 B2 10/2018 Tanaka et al.
10,162,182 B2 12/2018 Jepsen
10,177,195 B2 1/2019 Ahmed et al.
10,395,589 B1 8/2019 Vahid Far et al.
10,396,241 B1 * 8/2019 Perkins ................ H01L 33/025
10,418,517 B2 9/2019 Atanackovic
10,466,487 B2 11/2019 Blum et al.
10,490,695 B2 * 11/2019 Gomez-Iglesias .... H01L 33/007
10,522,787 B1 12/2019 Montgomery et al.
10,622,514 B1 4/2020 Atackovic
10,802,334 B2 10/2020 Kim et al.
10,903,193 B2 1/2021 Yamada
10,963,103 B1 3/2021 Shahmohammadi
11,156,759 B2 10/2021 Brick et al.
11,300,827 B2 4/2022 Hwang et al.
11,367,807 B2 6/2022 Wada et al.
2003/0141507 A1 7/2003 Krames et al.
2003/0189125 A1 10/2003 Trierenberg
2004/0146219 A1 7/2004 Sathyanarayana
2004/0189627 A1 9/2004 Shirasaki et al.
2005/0194598 A1 9/2005 Kim et al.
2005/0237488 A1 10/2005 Yamasaki et al.
2005/0264472 A1 12/2005 Rast
2006/0002247 A1 1/2006 Kim et al.
2007/0057249 A1 * 3/2007 Kim ..................... H01S 5/0424 257/14
2007/0096127 A1 5/2007 Pattison et al.
2008/0061304 A1 3/2008 Huang et al.
2009/0045416 A1 2/2009 Bierhuizen et al.
2009/0291237 A1 11/2009 Park et al.
2009/0315054 A1 12/2009 Kim et al.
2010/0019697 A1 1/2010 Korsunsky et al.
2010/0163894 A1 7/2010 Uemura et al.
2010/0252103 A1 10/2010 Yao et al.
2011/0151602 A1 6/2011 Speier
2011/0204327 A1 8/2011 Hiruma et al.
2011/0254043 A1 * 10/2011 Negishi .................. H01L 33/20 438/22
2012/0223289 A1 9/2012 Gwo et al.
2013/0063413 A1 3/2013 Miyake
2013/0063815 A1 3/2013 Kubota
2013/0082624 A1 4/2013 Brassfield et al.
2014/0008677 A1 1/2014 Zhu et al.
2014/0111559 A1 4/2014 Yang et al.
2014/0131753 A1 5/2014 Ishida et al.
2014/0319560 A1 10/2014 Tischler
2014/0340900 A1 11/2014 Bathurst et al.
2015/0103404 A1 4/2015 Rudy et al.
2015/0162560 A1 6/2015 Chen et al.
2015/0187991 A1 7/2015 McGroddy et al.
2015/0207399 A1 7/2015 Li et al.
2015/0280086 A1 10/2015 Jang et al.
2015/0293302 A1 10/2015 Czornomaz et al.
2016/0315218 A1 10/2016 Bour et al.
2016/0341942 A1 11/2016 Cheon et al.
2016/0351539 A1 12/2016 Bower et al.
2017/0082263 A1 3/2017 Byrnes et al.
2017/0170360 A1 * 6/2017 Bour .................... H01L 33/145
2017/0254518 A1 9/2017 Vasylyev
2017/0278733 A1 9/2017 Chang et al.
2017/0352309 A1 12/2017 Chang et al.
2017/0352313 A1 12/2017 Miyake
2017/0371087 A1 12/2017 You et al.
2018/0005562 A1 1/2018 Lin et al.
2018/0012540 A1 1/2018 Hosoyachi et al.
2018/0033768 A1 2/2018 Kumar et al.
2018/0075798 A1 3/2018 Nho et al.
2018/0097033 A1 4/2018 Ahmed et al.
2018/0114878 A1 4/2018 Danesh et al.
2018/0180249 A1 6/2018 Yamada et al.
2018/0182298 A1 6/2018 Jang et al.
2018/0211595 A1 7/2018 Takahashi et al.
2018/0219144 A1 8/2018 Perkins et al.
2018/0247586 A1 8/2018 Vahid Far et al.
2018/0275410 A1 9/2018 Yeoh et al.
2018/0301433 A1 10/2018 Robin et al.
2018/0323116 A1 11/2018 Wu et al.
2018/0331258 A1 11/2018 Halbritter et al.
2018/0342492 A1 11/2018 Lu
2018/0367769 A1 12/2018 Greenberg
2019/0013439 A1 1/2019 Sung et al.
2019/0044023 A1 2/2019 Cheng et al.
2019/0058081 A1 2/2019 Ahmed et al.
2019/0113727 A1 4/2019 Tamma
2019/0137757 A1 5/2019 Rousseau
2019/0165209 A1 5/2019 Bonar et al.
2019/0174079 A1 6/2019 Anthony et al.
2019/0198716 A1 6/2019 Gordon et al.
2019/0229097 A1 7/2019 Takeya et al.
2019/0258346 A1 8/2019 Cheng et al.
2019/0293939 A1 9/2019 Sluka
2019/0305035 A1 * 10/2019 Cho ........................ H01L 33/58
2019/0305185 A1 10/2019 Lauermann et al.
2019/0347979 A1 11/2019 Ahmed
2019/0378674 A1 12/2019 Chou et al.
2020/0119233 A1 4/2020 Dupont
2020/0219855 A1 7/2020 Chen et al.
2020/0227594 A1 7/2020 Kuo
2020/0343230 A1 10/2020 Sizov et al.
2020/0357103 A1 11/2020 Wippermann et al.
2020/0366067 A1 11/2020 David et al.
2021/0242370 A1 8/2021 Lee et al.
2021/0272938 A1 9/2021 Chang et al.
2021/0313497 A1 10/2021 Pourquier
2021/0325594 A1 10/2021 Meng et al.

(56) References Cited

U.S. PATENT DOCUMENTS

| | | | |
|---|---|---|---|
| 2021/0405276 | A1 | 12/2021 | Brick et al. |
| 2022/0102583 | A1 | 3/2022 | Baumheinrich et al. |
| 2022/0285591 | A1 | 9/2022 | Biebersdorf et al. |
| 2022/0285592 | A1 | 9/2022 | Biebersdorf et al. |
| 2022/0293829 | A1 | 9/2022 | Biebersdorf et al. |
| 2022/0293830 | A1 | 9/2022 | Biebersdorf et al. |
| 2022/0310888 | A1 | 9/2022 | Biebersdorf et al. |
| 2022/0352436 | A1 | 11/2022 | Biebersdorf et al. |
| 2022/0052235 | A1 | 12/2022 | Biebersdorf et al. |

FOREIGN PATENT DOCUMENTS

| | | | |
|---|---|---|---|
| DE | 19911717 | A1 | 9/2000 |
| DE | 10009782 | A1 | 9/2001 |
| DE | 102007043877 | A1 | 1/2009 |
| DE | 102007046339 | A1 | 4/2009 |
| DE | 102005063159 | B4 | 5/2009 |
| DE | 102013104273 | A1 | 10/2014 |
| DE | 102017106755 | A1 | 10/2018 |
| DE | 102017109083 | A1 | 10/2018 |
| DE | 102018108022 | A1 | 10/2018 |
| DE | 102017114369 | A1 | 1/2019 |
| DE | 102018113363 | A1 | 12/2019 |
| DE | 102018119312 | A1 | 2/2020 |
| DE | 102018119376 | A1 | 2/2020 |
| EP | 0488772 | A1 | 6/1992 |
| EP | 1544660 | A1 | 6/2005 |
| EP | 1553640 | A1 | 7/2005 |
| EP | 1887634 | A2 | 2/2008 |
| EP | 2323185 | A2 | 5/2011 |
| EP | 2396818 | A2 | 12/2011 |
| EP | 2430652 | | 3/2012 |
| EP | 2609624 | | 3/2012 |
| EP | 2477240 | A1 | 7/2012 |
| EP | 2506321 | A1 | 10/2012 |
| EP | 2642537 | A2 | 9/2013 |
| EP | 2685155 | A2 | 1/2014 |
| EP | 2750208 | A2 | 7/2014 |
| EP | 2838130 | A1 | 2/2015 |
| EP | 2924490 | A2 | 9/2015 |
| EP | 2980866 | A1 | 2/2016 |
| EP | 2986082 | A1 | 2/2016 |
| EP | 3010048 | A1 | 4/2016 |
| EP | 3031086 | A1 | 6/2016 |
| EP | 2676528 | B1 | 8/2017 |
| EP | 3226042 | A1 | 10/2017 |
| EP | 2704215 | B1 | 4/2018 |
| EP | 3367374 | A1 | 8/2018 |
| EP | 33673774 | A1 | 8/2018 |
| JP | H06244457 | A | 9/1994 |
| JP | 2007264610 | A | 10/2007 |
| JP | 2007324416 | A | 12/2007 |
| JP | 2009186794 | A | 8/2009 |
| JP | 2015099238 | A | 5/2015 |
| KR | 20130052944 | A | 5/2013 |
| WO | 2004084318 | A1 | 9/2004 |
| WO | 2006035212 | A1 | 4/2006 |
| WO | 2007001099 | A1 | 1/2007 |
| WO | 2009082121 | A2 | 7/2009 |
| WO | 2010019594 | A2 | 2/2010 |
| WO | 2010132552 | A1 | 11/2010 |
| WO | 2010149027 | A1 | 12/2010 |
| WO | 2011069747 | A1 | 6/2011 |
| WO | 2011117056 | A1 | 9/2011 |
| WO | 2011160051 | A2 | 12/2011 |
| WO | 2012014857 | A1 | 2/2012 |
| WO | 2013026440 | A2 | 2/2013 |
| WO | 2014047113 | A1 | 3/2014 |
| WO | 2014093063 | A1 | 6/2014 |
| WO | 2015138102 | A1 | 9/2015 |
| WO | 2016025325 | A1 | 2/2016 |
| WO | 2016054092 | A1 | 4/2016 |
| WO | 2016060677 | A1 | 4/2016 |
| WO | 2016151112 | A1 | 9/2016 |
| WO | 2017087312 | A1 | 5/2017 |
| WO | 2017111827 | A1 | 6/2017 |
| WO | 2017120320 | A1 | 7/2017 |
| WO | 2017120341 | A1 | 7/2017 |
| WO | 2017197576 | A1 | 11/2017 |
| WO | 2018117382 | A1 | 6/2018 |
| WO | 2018123280 | A1 | 7/2018 |

OTHER PUBLICATIONS

Fortuna, "Integrated Nanoscale Antenna-LED for On-Chip Optical Communication," UC Berkeley, 146 pages (2017).
Li et al., "Waveguiding in Vertical Cavity Quantum-Well Structure Defined by Ion Implantation," J. Lightwave Technol. 16, pp. 1498-1508 (1998).
Ogihara et al., "1200 Dots-Per-Inch Light Emitting Diode Array Fabricated by Solid-Phase Zinc Diffusion," IEICE Transactions on Electronics, 80;3, pp. 489-497 (1997).
Stevens et al., "Varifocal Technologies Providing Prescription and VAC Mitigation In HMDs Using Alvarez Lenses," Proc. SPIE 10676, Digital Optics for Immersive Displays, 18 pages (2018).
Tomioka et al., "Selective-Area Growth of III-V Nanowires and Their Applications," Journal of Materials Research, 26(17), pp. 2127-2141 (2011).
Waldern et al., "DigiLens Switchable Bragg Grating Waveguide Optics for Augmented Reality Applications," Proc. SPIE 10676, Digital Optics for Immersive Displays, 17 pages (2018).
Wheelwright et al., "Field of View: Not Just A Number," Proc. SPIE 10676, Digital Optics for Immersive Displays, 8 pages (2018).
Yu et al., "Hybrid LED Driver for Multi-Channel Output with High Consistency," 2015 IEEE 11th International Conference on ASIC (ASICON), Chengdu, 4 pages (2015).
Huang et al., "Metasurface Holography: From Fundamentals to Applications," Nanophotonics. 7(6), pp. 1169-1190 (2018).
International Search Report for International Patent Application No. PCT/EP2020/058997, dated Mar. 5, 2021 (10 pages).
International Search Report for International Patent Application No. PCT/EP2020/058547, dated Mar. 26, 2021 (9 pages).
Volz et al., "Influence of annealing on the optical and structural properties of dilute N-containing III/V semiconductor heterostructures," Journal of Crystal Growth, vol. 298, Jan. 2007, pp. 126-130.

* cited by examiner

| | App. Field | Usecase | Viewing Distance [cm] | Min. Size X* Y [cm] | Max. Size X* Y [cm] | PPI | PP [µm] | Res. Type |
|---|---|---|---|---|---|---|---|---|
| Direct Emitter Display | Auto | Low res HuD | tbd | tbd | tbd | tbd | tbd | tbd |
| | Auto | Multi Media Display Rear | 30 - 40 | 15*10 | 25*15 | ≥ 250 | ≤ 102 | mid res |
| | Auto | Rear View Mirror / Replacement | 25 - 70 | 16*6 | 30*15 | ≥ 250 | ≤ 102 | |
| | Auto | Display in the Window Pillars | 25 - 150 | 20*5 | 100*30 | ≥ 250 | ≤ 102 | |
| | Auto | Cluster | 40 - 70 | 20*10 | 90*30 | ≥ 200 | ≤ 127 | |
| | Auto | Center Stack | 40 - 70 | 12*9 | 40*25 | ≥ 200 | ≤ 127 | |
| | Auto | Small Distributed info Displays (e.g. AC Control) | 40 - 70 | 1*0,5 | 6*6 | ≥ 200 | ≤ 127 | |
| | Auto | Extended Cluster Across Dash Board | 40 - 70 | 150*10 | 180*30 | ≥ 200 | ≤ 127 | |
| | Auto | Exterior Advertisement good resolution | 50 - 150 | 30*30 | 50*150 | ≥ 100 | ≤ 254 | |
| | Auto | Roof / Sky | 20 - 40 | 70*40 | 200*180 | ≥ 50 | ≤ 508 | low res |
| | Auto | RCL | 200 - …. | 20*10 | 50*30 | ≥ 50 | ≤ 508 | |
| | Auto | Decoration Style Displays | 20 - 200 | 20*10 | 180*30 | ≥ 50 | ≤ 508 | |
| | MM | Command & Control | 300-1500 | 200*200 | 5000*300 | ≤ 30 | ≥ 847 | very low res |
| | MM | Conference/Board Rooms | 1000-10000 | 70*180 | 300*600 | ≤ 30 | ≥ 847 | |
| | Auto | Pedestrian Communication | 200-…… | tbd | tbd | ≥ 25 | ≤ 1016 | |
| | Auto | Exterior Advertisement | 50-2000 | 30*30 | 50*150 | ≥ 25 | ≤ 1016 | |
| | MM | Electronic Posters | 50-2000 | 100*200 | 200*400 | ≥ 25 | ≤ 1016 | |
| | MM | Cinema | 3000-50000 | 500*300 | 800*2000 | ≤ 10 | ≥ 2540 | |

| | | | | | | | | |
|---|---|---|---|---|---|---|---|---|
| Transparent Direct Emitter Display | Auto | Rear View Mirror | 25 - 70 | 15*10 | 30*15 | ≥ 250 | ≤ 102 | mid res |
| | Auto | Vanity Mirror | 25 - 70 | 7*4 | 90*90 | ≥ 250 | ≤ 102 | |
| | Auto | Side View Mirror | 40 ~ 70 | 12*8 | 20*15 | ≥ 200 | ≤ 127 | |
| | Auto | Side Window status indicators | 40 ~ 70 | 2*2 | 15*3 | ≥ 200 | ≤ 127 | |
| | Auto | Stacked Display (3D Cluster) | 40 ~ 70 | 20*10 | 180*30 | ≥ 200 | ≤ 127 | |
| | Auto | Panorama Roof Display | 20 - 40 | 70*40 | 200*180 | ≥ 50 | ≤ 508 | low res |
| | MM | Advertisement | 50-2000 | 100*200 | 200*400 | ≥ 25 | ≤ 1016 | very low res |
| | Auto | Rear/Side Window Display (Outside Communication, Rear Light, Turn Indicator) | 200 - 1000 | 20*20 | 180*150 | ≥ 10 | ≤ 2540 | |
| | Auto | CHMSL (Center High Mounted Stop Light) | 200 - [illegible] | 20*10 | 180*15 | ≥ 10 | ≤ 2540 | |
| | Auto | Peripheral Display (e.g. Wind Shield, Side Windows, etc...) | 40 ~ 70 | 5*5 | 180*15 | ≥ 10 | ≤ 2540 | |
| | Auto | Wind Shield Display for Autonomous Communication (Full Size) | 200 - 1000 | 3*50 | 180*150 | ≥ 10 | ≤ 2540 | |

FIG. 3C

μ-LED, μ-LED DEVICE, DISPLAY AND METHOD FOR THE SAME

This patent application is a continuation of U.S. Application Ser. No. 17/038,283 filed Sep. 30, 2020, which claims the priorities of the German applications DE 10 2019 201 114.4 of 29 Jan. 2019, DE 10 2019 111 766.6 of 7 May 2019, DE 10 2019 131 506.9 of 21 Nov. 2019, DE 10 2019 125 349.7 of 20 Sep. 2019, DE 10 2019 112 609.6 of 14 May 2019, DE 10 2019 114 321.7 of 28 May 2019, DE 10 2019 127 425.7 of 11 Oct. 2019, DE 10 2019 112 605.3 of 14 May 2019, DE 10 2019 113 636.9 of 22 May 2019, DE 10 2019 103 365.9 of 11 Feb. 2019, DE 10 2019 127 424.9 of 11 Oct. 2019, DE 10 2019 125 336.5 of 20 Sep. 2019, DE 10 2019 111 767.4 of 7 May 2019, DE 10 2019 118 084.8 of 4 Jul. 2019, DE 10 2019 130 821.6 of 14 Nov. 2019, as well as the priority of the Danish application DK PA201970059 of 29 Jan. 2019, as well as the priority of PCT/EP2020/052191 of 29 Jan. 2020. The disclosures of each of the above applications are incorporated herein by reference in their entireties. Additionally, this patent application is related to the following co-pending patent applications: U.S. application Ser. No. 17/039,283, filed Sep. 30, 2020; U.S. application Ser. No. 17/039,097, filed Sep. 30, 2020; U.S. application Ser. No. 17/039,482, filed Sep. 30, 2020; U.S. application Ser. No. 17/426,456, filed Jul. 28, 2021; U.S. application Ser. No. 17/426,520, filed Jul. 28, 2021; U.S. application Ser. No. 17/475,030, filed Sep. 14, 2021; U.S. application Ser. No. 17/474,975, filed Sep. 14, 2021; U.S. application Ser. No. 17/510,907, filed Oct. 26, 2021; U.S. application Ser. No. 17/513,398, filed Oct. 28, 2021; U.S. application Ser. No. 17/513,587, filed Oct. 28, 2021; U.S. application Ser. No. 17/513,475, filed Oct. 28, 2021; U.S. application Ser. No. 17/515,057, filed Oct. 29, 2021; U.S. application Ser. No. 17/515,102, filed Oct. 29, 2021; U.S. application Ser. No. 17/515,138, filed Oct. 29, 2021; U.S. application Ser. No. 17/515,142, filed Oct. 29, 2021; U.S. application Ser. No. 17/515,131, filed Oct. 29, 2021; U.S. application Ser. No. 17/515,337, filed Oct. 29, 2021; and U.S. application Ser. No. 17/515,338, filed Oct. 29, 2021.

BACKGROUND

The ongoing current developments within the Internet of Things and the field of communication have opened the door for various new applications and concepts. For development, service and manufacturing purposes, these concepts and applications offer increased effectiveness and efficiency.

One aspect of new concepts is based on augmented or virtual reality. A general definition of "augmented reality" is given by an "interactive experience of the real environment, whereby the objects from it, which are in the real world, are augmented by computer generated perceptible information".

The information is mostly transported by visualization, but is not limited to visual perception. Sometimes haptic or other sensory perceptions can be used to expand reality. In the case of visualization, the superimposed sensory-visual information can be constructive, i.e. additional to the natural environment, or it can be destructive, for example by obscuring parts of the natural environment. In some applications, it is also possible to interact with the superimposed sensory information in one way or another. In this way, augmented reality reinforces the ongoing perception of the user of the real environment.

In contrast, "virtual reality" completely replaces the real environment of the user with an environment that is completely simulated. In other words, while in an augmented reality environment the user is able to perceive the real world at least partially, in a virtual reality the environment is completely simulated and may differ significantly from reality.

Augmented Reality can be used to improve natural environmental situations, enriching the user's experience or supporting the user in performing certain tasks. For example, a user may use a display with augmented reality features to assist him in performing certain tasks. Because information about a real object is superimposed to provide clues to the user, the user is supported with additional information, allowing the user to act more quickly, safely and effectively during manufacturing, repair or other services. In the medical field, augmented reality can be used to guide and support the doctor in diagnosing and treating the patient. In development, an engineer may experience the results of his experiments directly and can therefore evaluate the results more easily. In the tourism or event industry, augmented reality can provide a user with additional information about sights, history, and the like. Augmented Reality can support the learning of activities or tasks.

SUMMARY

In the following summary different aspects for μ-displays in the automotive and augmented reality applications are explained. This includes devices, displays, controls, process engineering methods and other aspects suitable for augmented reality and automotive applications. This includes aspects which are directed to light generation by means of displays, indicators or similar. In addition, control circuits, power supplies and aspects of light extraction, light guidance and focusing as well as applications of such devices are listed and explained by means of various examples.

Because of the various limitations and challenges posed by the small size of the light-generating components, a combination of the various aspects is not only advantageous, but often necessary. For ease of reference, this disclosure is divided into several sections with similar topics. However, this should explicitly not be understood to mean that features from one topic cannot be combined with others. Rather, aspects from different topics should be combined to create a display for augmented reality or other applications or even in the automotive sector.

For considerations of the following solutions, some terms and expressions should be explained in order to define a common and equal understanding. The terms listed are generally used with this understanding in this document. In individual cases, however, there may be deviations from the interpretation, whereby such deviation will be specifically referred to.

"Active Matrix Display"

The term "active matrix display" was originally used for liquid crystal displays containing a matrix of thin film transistors that drive LCD pixels. Each individual pixel has a circuit with active components (usually transistors) and power supply connections. At present, however, this technology should not be limited to liquid crystals, but should also be used in particular for driving μ-LEDs or μ-displays.

"Active Matrix Carrier Substrate"

"Active matrix carrier substrate" or "active matrix backplane" means a drive for light emitting diodes of a display with thinfilm transistor circuits. The circuits may be integrated into the backplane or mounted on it. The "active matrix carrier substrate" has one or more interface contacts, which form an electrical connection to a μ-LED display structure. An "active-matrix carrier substrate" can thus be part of an active-matrix display or support it.

"Active Layer"

The active layer is referred to as the layer in an optoelectronic component or light emitting diode in which charge carriers recombine. In its simplest form, the active layer can be characterized by a region of two adjacent semiconductor layers of different conductivity type. More complex active layers comprise quantum wells (see there), multi-quantum wells or other structures that have additional properties. Similarly, the structure and material systems can be used to adjust the band gap (see there) in the active layer, which determines the wavelength and thus the color of the light.

"Alvarez Lens Array"

With the use of Alvarez lens pairs, a beam path can be adapted to video eyewear. An adjustment optic comprises an Alvarez lens arrangement, in particular a rotatable version with a Moire lens arrangement. Here, the beam deflection is determined by the first derivative of the respective phase plate relief, which is approximated, for example, by z=ax2+by2+cx+dy+e for the transmission direction z and the transverse directions x and y, and by the offset of the two phase plates arranged in pairs in the transverse directions x and y. For further design alternatives, swivelling prisms are provided in the adjustment optics.

"Augmented Reality (AR)"

This is an interactive experience of the real environment, where the subject of the picking up is located in the real world and is enhanced by computer-generated perceptible information. Extended reality is the computer-aided extension of the perception of reality by means of this computer-generated perceptible information. The information can address all human sensory modalities. Often, however, augmented reality is only understood to be the visual representation of information, i.e. the supplementation of images or videos with computer-generated additional information or virtual objects by means of fade-in/overlay.

Applications and explanations of the mode of operation of Augmented Reality can be found in the introduction and in the following in execution examples.

"Automotive."

Automotive generally refers to the motor vehicle or automobile industry. This term should therefore cover this branch, but also all other branches of industry which include μ-displays or generally light displays—with very high resolution and μ-LEDs.

"Bandgap"

Bandgap, also known as band gap or forbidden zone, is the energetic distance between the valence band and conduction band of a solid-state body. Its electrical and optical properties are largely determined by the size of the band gap. The size of the band gap is usually specified in electron volts (eV). The band gap is thus also used to differentiate between metals, semiconductors and insulators. The band gap can be adapted, i.e. changed, by various measures such as spatial doping, deforming of the crystal lattice structure or by changing the material systems. Material systems with so-called direct band gap, i.e. where the maximum of the valence band and a minimum of the conduction band in the pulse space are superimposed, allow a recombination of electron-hole pairs under emission of light.

"Bragg Grid"

Fibre Bragg gratings are special optical interference filters inscribed in optical fibres. Wavelengths that lie within the filter bandwidth around AB are reflected. In the fiber core of an optical waveguide, a periodic modulation of the refractive index is generated by means of various methods. This creates areas with high and low refractive indexes that reflect light of a certain wavelength (bandstop). The center wavelength of the filter bandwidth in single-mode fibers results from the Bragg condition.

"Directionality"

Directionality is the term used to describe the radiation pattern of a μ-LED or other light-emitting device. A high directionality corresponds to a high directional radiation, or a small radiation cone. In general, the aim should be to obtain a high directional radiation so that crosstalk of light into adjacent pixels is avoided as far as possible. Accordingly, the light-emitting component has a different brightness depending on the viewing angle and thus differs from a Lambert emitter.

The directionality can be changed by mechanical measures or other measures, for example on the side intended for the emission. In addition to lenses and the like, this includes photonic crystals or pillar structures (columnar structures) arranged on the emitting surface of a pixelated array or on an arrangement of, in particular, μ-LEDs. These generate a virtual band gap that reduces or prevents the propagation of a light vector along the emitting surface.

"Far Field"

The terms near field and far field describe spatial areas around a component emitting an electromagnetic wave, which differ in their characterization. Usually the space regions are divided into three areas: reactive near field, transition field and far field. In the far field, the electromagnetic wave propagates as a plane wave independent of the radiating element.

"Fly Screen Effect"

The Screen Door Effect (SDE) is a permanently visible image artefact in digital video projectors. The term fly screen effect describes the unwanted black space between the individual pixels or their projected information, which is caused by technical reasons, and takes the form of a fly screen. This distance is due to the construction, because between the individual LCD segments run the conductor paths for control, where light is swallowed and therefore cannot hit the screen. If small optoelectronic lighting devices and especially μ-LEDs are used or if the distance between individual light emitting diodes is too great, the resulting low packing density leads to possibly visible differences between pointy illuminated and dark areas when viewing a single pixel area. This so-called fly screen effect (screen door effect) is particularly noticeable at a short viewing distance and thus especially in applications such as VR glasses. Sub-pixel structures are usually perceived and perceived as disturbing when the illumination difference within a pixel continues periodically across the matrix arrangement. Accordingly, the fly screen effect in automotive and augmented reality applications should be avoided as far as possible.

"Flip Chip"

Flip-chip assembly is a process of assembly and connection technology for contacting unpackaged semiconductor chips by means of contact bumps, or short "bumps". In flip-chip mounting, the chip is mounted directly, without any further connecting wires, with the active contacting side down—towards the substrate/circuit carrier—via the bumps. This results in particularly small package dimensions and short conductor lengths. A flip-chip is thus in particular an electronic semiconductor component contacted on its rear side. The mounting may also require special transfer techniques, for example using an auxiliary carrier. The radiation direction of a flip chip is then usually the side opposite the contact surfaces.

"Flip-Flop"

A flip-flop, often called a bi-stable flip-flop or bi-stable flip-flop element, is an electronic circuit that has two stable states of the output signal. The current state depends not only on the input signals present at the moment, but also on the state that existed prior to the time under consideration. A dependence on time does not exist, but only on events. Due to the bi-stability, the flip-flop can store a data quantity of a single bit for an unlimited time. In contrast to other types of storage, however, power supply must be permanently guaranteed.

The flip-flop, as the basic component of sequential circuits, is an indispensable component of digital technology and thus a fundamental component of many electronic circuits, from quartz watches to microprocessors. In particular, as an elementary one-bit memory, it is the basic element of static memory components for computers. Some designs can use different types of flip-flops or other buffer circuits to store state information. Their respective input and output signals are digital, i.e. they alternate between logical "false" and logical "true". These values are also known as "low" 0 and "high" 1.

"Head-Up Display"

The head-up display is a display system or projection device that allows users to maintain their head position or viewing direction by projecting information into their field of vision. The Head-up Display is an augmented reality system. In some cases, a Head-Up Display has a sensor to determine the direction of vision or orientation in space.

"Horizontal Light Emitting Diode"

With horizontal LEDs, the electrical connections are on a common side of the LED. This is often the back of the LED facing away from the light emission surface. Horizontal LEDs therefore have contacts that are only formed on one surface side.

"Interference Filter"

Interference filters are optical components that use the effect of interference to filter light according to frequency, i.e. color for visible light.

"Collimation"

In optics, collimation refers to the parallel direction of divergent light beams. The corresponding lens is called collimator or convergent lens. A collimated light beam contains a large proportion of parallel rays and is therefore minimally spread when it spreads. A use in this sense refers to the spreading of light emitted by a source. A collimated beam emitted from a surface has a strong dependence on the angle of radiation. In other words, the radiance (power per unit of a fixed angle per unit of projected source area) of a collimated light source changes with increasing angle. Light can be collimated by a number of methods, for example by using a special lens placed in front of the light source. Consequently, collimated light can also be considered as light with a very high directional dependence.

"Converter Material"

Converter material is a material, which is suitable for converting light of a first wavelength into a second wavelength. The first wavelength is shorter than the second wavelength. This includes various stable inorganic as well as organic dyes and quantum dots. The converter material can be applied and structured in various processes.

"Lambert Lamps"

For many applications, a so-called Lambertian radiation pattern is required. This means that a light-emitting surface ideally has a uniform radiation density over its area, resulting in a vertically circular distribution of radiant intensity. Since the human eye only evaluates the luminance (luminance is the photometric equivalent of radiance), such a Lambertian material appears to be equally bright regardless of the direction of observation. Especially for curved and flexible display surfaces, this uniform, angle-independent brightness can be an important quality factor that is sometimes difficult to achieve with currently available displays due to their design and LED technology.

LEDs and μ-LEDs resemble a Lambert spotlight and emit light in a large spatial angle. Depending on the application, further measures are taken to improve the radiation characteristics or to achieve greater directionality (see there).

"Conductivity Type"

The term "conductivity type" refers to the majority of (n- or p-) charge carriers in a given semiconductor material. In other words, a semiconductor material that is n-doped is considered to be of n-type conductivity. Accordingly, if a semiconductor material is n-type, then it is n-doped. The term "active" region in a semiconductor refers to a border region in a semiconductor between an n-doped layer and a p-doped layer. In this region, a radiative recombination of p- and n-type charge carriers takes place. In some designs, the active region is still structured and includes, for example, quantum well or quantum dot structures.

"Light Field Display"

Virtual retinal display (VNA) or light field display is referred to a display technology that draws a raster image directly onto the retina of the eye. The user gets the impression of a screen floating in front of him. A light field display can be provided in the form of glasses, whereby a raster image is projected directly onto the retina of a user's eye. In the virtual retina display, a direct retinal projection creates an image within the user's eye. The light field display is an augmented reality system.

"Lithography" or "Photolithography"

Photolithography is one of the central methods of semiconductor and microsystem technology for the production of integrated circuits and other products. The image of a photomask is transferred onto a photosensitive photoresist by means of exposure. Afterwards, the exposed areas of the photoresist are dissolved (alternatively, the unexposed areas can be dissolved if the photoresist is cured under light). This creates a lithographic mask that allows further processing by chemical and physical processes, such as applying material to the open areas or etching depressions in the open areas. Later, the remaining photoresist can also be removed.

"μ-LED"

A μ-LED is an optoelectronic component whose edge lengths are less than 70 μm, especially down to less than 20 μm, especially in the range of 1 μm to 10 μm. Another range is between 10 to 30 μm. This results in an area of a few hundred $\mu m^2$ down to several tens of $\mu m^2$. For example, a μ-LED can comprise an area of about 60 $\mu m^2$ with an edge length of about 8 μm. In some cases, a μ-LED has an edge length of 5 μm or less, resulting in a size of less than 30 $\mu m^2$. Typical heights of such μ-LEDs are, for example, in the range of 1.5 μm to 10 μm.

In addition to classic lighting applications, displays are the main applications for μ-LEDs. The μ-LEDs form pixels or subpixels and emit light of a defined color. Due to their small pixel size and high density with a small pitch, μ-LEDs are suitable for small monolithic displays for AR applications, among other things.

Due to the above-mentioned very small size of a μ-LED, the production and processing is significantly more difficult compared to previous larger LEDs. The same applies to additional elements such as contacts, package, lenses etc. Some aspects that can be realized with larger optoelectronic components cannot be produced with μ-LEDs or only in a different way. In this respect, a μ-LED is therefore significantly different from a conventional LED, i.e. a light emitting device with an edge length of 200 μm or more.

"μ-LED array"

See at μ-Display

"μ-display"

A μ-display or μ-LED array is a matrix with a plurality of pixels arranged in defined rows and columns. With regard to its functionality, a μ-LED array often forms a matrix of μ-LEDs of the same type and color. Therefore, it rather provides a lighting surface. The purpose of a μ-display, on the other hand, is to transmit information, which often results in the demand for different colors or an addressable control for each individual pixel or subpixel. A μ-display can be made up of several μ-LED arrays, which are arranged together on a backplane or other carrier. Likewise, a μ-LED array can also form a μ-Display.

The size of each pixel is in the order of a few μm, similar to μ-LEDs. Consequently, the overall dimension of a μ display with 1920*1080 pixels with a μ-LED size of 5 μm per pixel and directly adjacent pixels is in the order of a few 10 $mm^2$. In other words, a μ-display or μ-LED array is a small-sized arrangement, which is realized by means of μ-LEDs.

μ-displays or μ-LED arrays can be formed from the same, i.e. from one work piece. The μ-LEDs of the μ-LED array can be monolithic. Such μ-displays or μ-LED arrays are called monolithic μ-LED arrays or μ-displays.

Alternatively, both assemblies can be formed by growing μ-LEDs individually on a substrate and then arranging them individually or in groups on a carrier at a desired distance from each other using a so-called Pick & Place process. Such μ-displays or μ-LED arrays are called non-monolithic. For non-monolithic μ-displays or μ-LED arrays, other distances between individual μ-LEDs are also possible. These distances can be chosen flexibly depending on the application and design. Thus, such μ-displays or μ-LED arrays can also be called pitch-expanded. In the case of pitch-expanded μ-displays or μ-LED arrays, this means that the μ-LEDs are arranged at a greater distance than on the growth substrate when transferred to a carrier. In a non-monolithic μ-display or μ-LED array, each individual pixel can comprise a blue light-emitting μ-LED and a green light-emitting μ-LED as well as a red light-emitting μ-LED.

To take advantage of different advantages of monolithic μ-LED arrays and non-monolithic μ-LED arrays in a single module, monolithic μ-LED arrays can be combined with non-monolithic μ-LED arrays in a μ-display. Thus, μ-displays can be used to realize different functions or applications. Such a display is called a hybrid display.

"μ-LED Nano Column"

A μ-LED nano column is generally a stack of semiconductor layers with an active layer, thus forming a μ-LED. The μ-LED nano column has an edge length smaller than the height of the column. For example, the edge length of a μ-LED nanopillar is approximately 10 nm to 300 nm, while the height of the device can be in the range of 200 nm to 1 μm or more.

"μ-Rod"

μ-rod or Rod designates in particular a geometric structure, in particular a rod or bar or generally a longitudinally extending, for example cylindrical, structure. μ-rods are produced with spatial dimensions in the μm to nanometer range. Thus, nanorods are also included here.

"Nanorods"

In nanotechnology, nanorods are a design of nanoscale objects. Each of their dimensions is in the range of about 10 nm to 500 nm. They may be synthesized from metal or semiconducting materials. Aspect ratios (length divided by width) are 3 to 5. Nanorods are produced by direct chemical synthesis. A combination of ligands acts as a shape control agent and attaches to different facets of the nanorod with different strengths. This allows different shapes of the nanorod with different growth rates to produce an elongated object. μLED nanopillars are such nanorods.

"Miniature LED"

Their dimensions range from 100 μm to 750 μm, especially in the range larger than 150 μm.

"Moiré Effect" and "Moiré Lens Arrangement"

The moiré effect refers to an apparent coarse raster that is created by overlaying regular, finer rasters. The resulting pattern, whose appearance is similar to patterns resulting from interference, is a special case of the aliasing effect by subsampling. In the field of signal analysis, aliasing effects are errors that occur when the signal to be sampled contains frequency components that are higher than half the sampling frequency. In image processing and computer graphics, aliasing effects occur when images are scanned and result in patterns that are not included in the original image. A moire lens array is a special case of an Alvarez lens array.

"Monolithic Construction Element"

A monolithic construction element is a construction element made of one piece. A typical such device is for example a monolithic pixel array, where the array is made of one piece and the μ-LEDs of the array are manufactured together on one carrier.

"Optical Mode"

A mode is the description of certain temporally stationary properties of a wave. The wave is described as the sum of different modes. The modes differ in the spatial distribution of the intensity. The shape of the modes is determined by the boundary conditions under which the wave propagates. The analysis according to vibration modes can be applied to both standing and continuous waves. For electromagnetic waves, such as light, laser and radio waves, the following types of modes are distinguished: TEM or transverse electromagnetic mode, TE or H modes, TM or E modes. TEM or transverse electromagnetic mode: Both the electric and the magnetic field components are always perpendicular to the direction of propagation. This mode is only propagation-capable if either two conductors (equipotential surfaces) insulated from each other are available, for example in a coaxial cable, or no electrical conductor is available, for example in gas lasers or optical fibers. TE or H modes: Only the electric field component is perpendicular to the direction of propagation, while the magnetic field component is in the direction of propagation. TM or E modes: Only the magnetic field component is perpendicular to the propagation direction, while the electric field component points in the propagation direction.

"Optoelectronic Device"

An optoelectronic component is a semiconductor body that generates light by recombination of charge carriers during operation and emits it. The light generated can range from the infrared to the ultraviolet range, with the wavelength depending on various parameters, including the material system used and doping. An optoelectronic component is also called a light emitting diode.

For the purpose of this disclosure, the term optoelectronic device or also light-emitting device is used synonymously. A μ-LED (see there) is thus a special optoelectronic device with regard to its geometry. In displays, optoelectronic components are usually monolithic or as individual components placed on a matrix.

"Passive matrix backplane" or "passive matrix carrier substrate" A passive matrix display is a matrix display, in which the individual pixels are driven passively (without additional electronic components in the individual pixels). A light emitting diode of a display can be controlled by means of IC circuits. In contrast, displays with active pixels driven by transistors are referred to as active matrix displays. A passive matrix carrier substrate is part of a passive matrix display and carries it.

"Photonic Crystal" or "Photonic Structure"

A photonic structure can be a photonic crystal, a quasi-periodic or deterministically aperiodic photonic structure. The photonic structure generates a band structure for photons by a periodic variation of the optical refractive index. This band structure can comprise a band gap in a certain frequency range. As a result, photons cannot propagate through the photonic structure in all spatial directions. In particular, propagation parallel to a surface is often blocked, but perpendicular to it is possible. In this way, the photonic structure or the photonic crystal determines a propagation in a certain direction. It blocks or reduces this in one direction and thus generates a beam or a bundle of rays of radiation directed as required into the room or radiation area provided for this purpose.

Photonic crystals are photonic structures occurring or created in transparent solids. Photonic crystals are not necessarily crystalline—their name derives from analogous diffraction and reflection effects of X-rays in crystals due to their lattice constants. The structure dimensions are equal to or greater than a quarter of the corresponding wavelength of the photons, i.e. they are in the range of fractions of a μm to several μm. They are produced by classical lithography or also by self-organizing processes.

Similar or the same property of a photonic crystal can alternatively be produced with non-periodic but nevertheless ordered structures. Such structures are especially quasiperiodic structures or deterministically aperiodic structures. These can be for example spiral photonic arrangements.

In particular, so-called two-dimensional photonic crystals are mentioned here as examples, which exhibit a periodic variation of the optical refractive index in two mutually perpendicular spatial directions, especially in two spatial directions parallel to the light-emitting surface and perpendicular to each other.

However, there are also one-dimensional photonic structures, especially one-dimensional photonic crystals. A one-dimensional photonic crystal exhibits a periodic variation of the refractive index along one direction. This direction can be parallel to the light exit plane. Due to the one-dimensional structure, a beam can be formed in a first spatial direction. Thereby a photonic effect can be achieved already with a few periods in the photonic structure. For example, the photonic structure can be designed in such a way that the electromagnetic radiation is at least approximately collimated with respect to the first spatial direction. Thus, a collimated beam can be generated at least with respect to the first direction in space.

"Pixel"

Pixel, pixel, image cell or picture element refers to the individual color values of a digital raster graphic as well as the area elements required to capture or display a color value in an image sensor or screen with raster control. A pixel is thus an addressable element in a display device and comprises at least one light-emitting device. A pixel has a certain size and adjacent pixels are separated by a defined distance or pixel space. In displays, especially μ-displays, often three (or in case of additional redundancy several) subpixels of different color are combined to one pixel.

"Planar Array"

A planar array is an essentially flat surface. It is often smooth and without protruding structures. Roughness of the surface is usually not desired and does not have the desired functionality. A planar array is for example a monolithic, planar array with several optoelectronic components.

"Pulse Width Modulation"

Pulse width modulation or PWM is a type of modulation for driving a component, in particular a μ-LED. Here the PWM signal controls a switch that is configured to switch a current through the respective μ-LED on and off so that the μ-LED either emits light or does not emit light. With the PWM, the output provides a square wave signal with a fixed frequency f. The relative quantity of the switch-on time compared to the switch-off time during each period T (=1/f) determines the brightness of the light emitted by the μ-LED. The longer the switch-on time, the brighter the light.

"Quantum Well"

A quantum well or quantum well refers to a potential in a band structure in one or more semiconductor materials that restricts the freedom of movement of a particle in a spatial dimension (usually in the z-direction). As a result, only one planar region (x, y plane) can be occupied by charge carriers. The width of the quantum well significantly determines the quantum mechanical states that the particles can assume and leads to the formation of energy levels (sub-bands), i.e. the particle can only assume discrete (potential) energy values.

"Recombination"

In general, a distinction is made between radiative and non-radiative recombination. In the latter case, a photon is generated which can leave a component. A non-radiative recombination leads to the generation of phonons, which heat a component. The ratio of radiative to non-radiative recombination is a relevant parameter and depends, among other things, on the size of the component. In general, the smaller the component, the smaller the ratio and non-radiative recombination increases in relation to radiative recombination.

"Refresh Time"

Refresh time is the time after which a cell of a display or similar must be rewritten so that it either does not lose the information or the refresh is predetermined by external circumstances.

"Die" or "Light-Emitting Body"

A light-emitting body or also a die is a semiconductor structure which is separated from a wafer after production on a wafer and which is suitable for generating light after an electrical contact during operation. In this context, a die is a semiconductor structure, which contains an active layer for light generation. The die is usually separated after contacting, but can also be processed further in the form of arrays.

"Slot Antenna"

A slot antenna is a special type of antenna in which instead of surrounding a metallic structure in space with air (as a non-conductor), an interruption of a metallic structure (e.g. a metal plate, a waveguide, etc.) is provided. This interruption causes an emission of an electromagnetic wave whose wavelength depends on the geometry of the interruption. The interruption often follows the principle of the dipole, but can theoretically have any other geometry. A slot antenna thus comprises a metallic structure with a cavity resonator having a length of the order of magnitude of wavelengths of visible light. The metallic structure can be located in or surrounded by an insulating material. Usually, the metallic structure is earthed to set a certain potential.

"Field of Vision"

Field of view (FOV) refers to the area in the field of view of an optical device, a sun sensor, the image area of a camera (film or picking up sensor) or a transparent display within which events or changes can be perceived and recorded. In particular, a field of view is an area that can be seen by a human being without movement of the eyes. With reference to augmented reality and an apparent object placed in front of the eye, the field of view comprises the area indicated as a number of degrees of the angle of vision during stable fixation of the eye.

"Subpixels"

A subpixel (approximately "subpixel") describes the inner structure of a pixel. In general, the term subpixel is associated with a higher resolution than can be expected from a single pixel. A pixel can also consist of several smaller subpixels, each of which radiates a single color. The overall color impression of a pixel is created by mixing the individual subpixels. A subpixel is thus the smallest addressable unit in a display device. A subpixel also comprises a certain size that is smaller than the size of the pixel to which the subpixel is assigned.

"Vertical Light Emitting Diode"

In contrast to the horizontal LED, a vertical LED comprises one electrical connection on the front and one on the back of the LED. One of the two sides also forms the light emission surface. Vertical LEDs thus comprise contacts that are formed towards two opposite main surface sides. Accordingly, it is necessary to deposit an electrically conductive but transparent material so that on the one hand, electrical contact is ensured and on the other hand, light can pass through.

"Virtual Reality"

Virtual reality, or VR for short, is the representation and simultaneous perception of reality and its physical properties in a real-time computer-generated, interactive virtual environment. A virtual reality can completely replace the real environment of an operator with a fully simulated environment.

In the following sections, various aspects on μ-LED semiconductors structures are explained. These include structures and material systems for light generation. These aspects also concern aspects of processing.

An essential aspect, both in the field of Augmented Reality and Automotive displays or other display arrangements with μ-LEDs is the aspect that adjacent μ-LEDs of an arrangement are also spaced as μ-display or μ-array in such a way that the human eye cannot resolve or recognize the individual μ-LEDs in this arrangement. In particular, individual rows or columns of a row-wise or column-wise arrangement of μ-LEDs cannot be resolved or recognized by the human eye. For this purpose, the distances between the μ-LEDs or pixel density and pixel pitch of the μ-LED array are also adjusted to the distance of the user from the μ-LED array so that the eye of a user cannot resolve or detect the individual μ-LEDs of the μ-LED array in the respective application.

μ-LED arrays have the advantages of comparatively low energy consumption and high brightness of up to 106 Cd/m2 compared to arrays with organic LEDs (OLEDs) and liquid crystal displays (LCDs). In addition, μ-LED arrays enable a very high pixel density of up to 5000 pixels per inch (PPI) and, when used in displays, a very high frame rate in the nanosecond range. In addition, μ-LED arrays have a very long lifetime compared to OLEDs and LCDs and a very good stability against environmental influences. Furthermore, the use of μ-LED arrays makes it possible to adjust the values for the contrast range and/or resolution to desired values of these parameters, for example depending on an application.

Furthermore, arrays of μ-LEDs allow the adaptation of a lighting surface formed by the μ-LEDs to a desired shape. Thus, the application is not limited to normal displays, but arrays of μ-LEDs can also be used in the automotive sector, for example to use curved surfaces as displays or lighting arrangements. The surface can be used to display information as well as a simple illuminated surface for illumination or lighting.

One aspect deals with the generation of different colors in monolithic displays. In a monolithic μ-LED array, each individual pixel can comprise, for example, a blue light-emitting μ-LED, and each μ-LED can also contain a conversion material for converting blue light partially or completely into secondary light, which together with the blue primary light produces a mixed light, for example white light. Monolithic μ-LED arrays enable luminous surfaces with high luminance and can therefore be advantageously used in automotive lighting, for example as light sources for vehicle headlights.

Non-monolithic μ-displays or μ-LED arrays, on the other hand, allow the use of gaps between adjacent pixels or μ-LEDs for the arrangement of other components, for example electronic components for operating the μ-LEDs or sensors or detectors. Non-monolithic μ-LED arrays can, for example, be advantageously used for displays and for displays with integrated sensors, especially touchscreens, as well as for operating elements.

Some aspects relate to the principle that electrically conductive structures can force emission of electrical radiation at a dedicated frequency. Accordingly, a concept is proposed here in which a slotted antenna structure is used to induce emission of light and increase the ratio of radiative recombination to non-radiative recombination in an active region of a semiconductor element. In general, the ratio of radiative recombination changes to the disadvantage of radiative recombination when μ-LEDs or active areas become smaller.

Such a structure would lead to further advantages besides an improvement of the above ratio, since the emitted wavelength depends mainly on geometrical parameters of the slotted antenna adapted by physical properties of the environment. Consequently, light of different colors can be generated by using different mechanical structures. Furthermore, slotted antenna structures allow a directional light emission, which could be beneficial for implementation in applications requiring strong collimation.

In one embodiment, a light-emitting device comprises an electrically conductive structure. The electrically conductive structure forms a slotted antenna structure and has an upper main surface and a lower main surface opposite the upper main surface and is separated by a layer thickness. A cavity is located within the electrically conductive structure. The cavity has a width and a specific length on which the wavelength of the light generated by the device depends. The width is smaller than the corresponding length of the cavity.

In some variants, the slotted antenna structure comprises a metal plate of a certain thickness comprising a slot or cavity in it. Similar to the above, the slot has a width and specific length. The light emitting device also comprises a stack of semiconductor layers along a first principal direction, which is located within a cavity and extends at least over the upper main surface. The semiconductor layer stack can be an LED nanopillar and has a first electrical contact, a second electrical contact and an active area. In some variants, the active area of the semiconductor layer stack may be arranged between the first and second contact. The active region of the semiconductor layer stack can be implemented by a single pn junction as well as by a quantum well, multi-quantum well or multi-quantum well or any combination thereof. The semiconductor layer stack may have a length greater than its corresponding width. For example, the semiconductor layer stack may be at least twice as long as its width. It can also be 5 times or up to 10 times longer than wide.

To define light and to support radiative recombination via non-radiative recombination of the semiconductor layer stack during operation, the length of the cavity is based essentially on n/2 of a wavelength of light to be emitted during operation, where n is a natural number. In this respect, it should be noted that various physical parameters change the emission behaviour and the medium wavelength of an emission, so that the actual length of the cavity may be easily adjustable. These parameters can be combined in a so-called shortening factor, which can be measured and/or calculated from the physical parameters. For the purpose of this application, the shortening factor is taken into account when it is pointed out that the length of the cavity is essentially based on n/2 of a wavelength of light emitted during operation.

In some variants, the electrically conductive structure has a distance between the upper and lower main surfaces (called thickness) that is greater than a thickness of the active area of the semiconductor layer stack. The active area can be placed inside the cavity and especially between the levels defined by the upper main surface and the lower main surface. Such design will place the active region into the cavity, which supports the condition of radiative recombination within the active region. With respect to the length of the cavity, the semiconductor layer stack can be placed essentially in the center of the cavity. Accordingly, the center of the semiconductor layer stack is essentially located at half the length of the cavity. In this implementation, the semiconductor layer stack and the slotted antenna form a dipole structure, in which the main emission wavelength is given by approximately twice the cavity length adjusted by the shortening factor.

In some other implementations, the semiconductor layer stack will be placed in the direction of the end portion of the cavity, for example at an edge of the cavity length. In yet another implementation, the light-emitting device may have two semiconductor layer stacks placed at the respective ends of the cavity, as described here.

The semiconductor layer stack can extend beyond the electrically conductive structure. This means that the first and second electrical contacts of the semiconductor layer stack are also located above the upper main surface or accordingly below the lower main surface. Accordingly, the semiconductor layer stack can be a so-called vertical layer stack. Depending on the application, the first contact can be a p-contact and the second contact an n-contact or vice versa. To contact the semiconductor layer stack outside the cavity can simplify the implementation and also reduce undesired effects.

To form a cavity to support the emission of visible light requires a cavity length in the range of several hundred nanometers. Since the semiconductor layer stack and the active region can be placed in the cavity, a diameter of the footprint of the semiconductor layer stack and the active region in particular is smaller than a wavelength emitted by the device during operation. The slit should generally be longer than it is wide. In some aspects, the length to width ratio may be between 30:1 and 5:1, in particular between 15:1 and 5:1. If the ratio is less than 5:1, but also for other ratios, a reflective but insulated layer may be provided along the sidewall of the semiconductor layer stack so that light with a component perpendicular to the length of the cavity is reflected. This suppresses light that wants to propagate perpendicular to the length of the cavity.

In some variants, the cavity extends through the electrically conductive structure, forming a slot. The slot has a rectangular shape but can also have round edges at its end section due to the manufacturing process. In some other variants, the cavity is more of a recess, with a through-hole placed where the semiconductor layer stack is located. In other words, the cavity is partially closed at the lower main surface except for the hole where the stack is located and extends through the electrically conductive structure.

In some aspects, the slot may also have a rectangular shape, with the semiconductor layer stack being located in the common corner of the two sub-slots.

Another aspect relates to insulating the electrically conductive structure and separating the structure from the stack. A transparent insulating layer is applied at least to the upper main surface of the electrically conductive structure. However, a contact of the semiconductor layer stack is not covered by the insulating material, but either extends over the insulating material or reaches a level of the surface of the insulating material opposite the electrically conductive structure. In this implementation, the light-emitting device also comprises a contact layer deposited on the transparent insulating layer and in contact with the first electrical contact. The contact layer may also be insulated by another layer applied to the contact layer. This layer (or the contact layer) may be structured to improve the emission characteristics of the device. Apart from coating or roughening, the surface to increase light extraction, periodic structures such as photonic crystals and the like can be placed on the top surface. Other optics such as microlenses and the like can be used.

In some other aspects, a transparent insulating layer also covers the lower main surface, the other contact of the semiconductor layer stack and the transparent insulating layer, by covering the lower main surface, form a substantially flat surface. However, the electrically conductive structure is not completely covered by an insulating layer, because the structure should be connected to a reference potential to act as a slotted antenna. Therefore, the electrically conductive structure also has at least one contact. In this context, the electrically conductive structure may comprise the same potential as a connection of the semiconductor layer stack. The layer stack would then be connected to the electrically conductive structure. However, it is also possible to imprint a different potential of the electrically conductive structure.

The light emitted by such a device can show a broad spectrum, i.e. the emission spectrum is centered on a central wavelength (as mentioned above) while it also contains other frequency components. Also, the spectrum of emitted light from elements with nominally identical cavities is broadened. To reduce the spectrum and provide light of a special center wave with a narrow spectrum, a color filter can be placed over the upper main surface corresponding to the emission surface. The filter could be a narrow ribbon pass. In some variants, a converter may be arranged over the top main surface to convert light from a first wavelength to a color of a second longer wavelength. Using a converter enables the light emitting device to be optimized for a given wavelength and then convert the light to another desired wavelength.

Another aspect concerns the implementation of a variety of such light emitting devices, especially for the production of a μ-LED display together with suitable driver and control circuits. Such an arrangement comprises at least two light emitting devices as described above. The at least two devices can now share a common electrically conductive structure. In the common electrically conductive structure, some cavities may be arranged, each of which belongs to a corresponding light emitting device. In addition or as an alternative, the μ-LED array may also have a common transparent insulating layer applied at least on the upper main surface of the electrically conductive structure. If the electrically conductive structure is a separate one for each light-emitting device, the insulating layer may also fill the spaces between the conductive structures of each device.

In some variants, a common filter or other structure applied over at least two light-emitting devices may be provided. This will provide some redundancy in case of damage from one light emitting device and also reduce the complexity of the implementation, because the color filter can now be applied over a larger area (compared to an application using only a stack and cavity).

In order to control the light emitting devices separately, at least one of the contact types, either the p-contact or the n-contact, is not connected to each other so that the light emitting devices can be addressed and controlled separately.

In a μ-LED array of the above-mentioned type, some light emitting devices may comprise a color filter to set the color of the corresponding light emitting device. These color filters can have different properties. For example, a color filter of the at least two light-emitting devices may have different band-pass or filter characteristics with respect to a color filter of the other of the two light-emitting devices. Therefore, different colors can be obtained. This can be useful, if the light-emitting devices have a very wide emission spectrum spanning two or more regions of interest. For example, the light-emitting devices may have an emission spectrum that overlaps green and blue components. Appropriate color filters can be used to filter the unwanted portion of the spectrum. A similar solution is presented when light-emitting devices each have a converter.

A converter of one of the at least two light-emitting devices may be different from a converter of the other of the at least two light-emitting devices. Thus, different colors can be achieved with cavities of the same length, pixels can be easily built up from 3 or 6 or 9 subpixels of the same cavity, with corresponding converters arranged above the cavities. Each pixel thus created can then share the same electrically conductive structure.

In addition to the μ-LED form described above, other designs are also conceivable. Most of them have a surface that is suitable for light generation. Such light emitting diodes are then combined and RGB modules are manufactured from them. This applies not only to designs of larger LEDs, but also to modules with small components. For modules with very small light emitting diodes in the range of μ-LEDs, however, the production of individual and transfer of such μ-LEDs can be connected with a very high effort.

Monolithic μ-LEDs, i.e. μ-LEDs grown together on a carrier in columns and rows, therefore offer the possibility to produce μ-display modules without a component transfer of μ-LEDs.

For some applications, however, such μ-LEDs must be designed to emit different colors. In this case, μ-LEDs emitting light in the blue, green and red spectrum form one μ-pixel each. Three, or in the redundant case of several such μ-pixels, form one pixel. To create an RGB μ-display or corresponding modules, μ-LEDs can be manufactured with different material systems that emit colored light during operation. A monolithic design is thus made more difficult.

Another approach is described by the following aspects and presented procedures. For example, in a method of manufacturing a μ-LED array of pixels, it is proposed to form pairs of coated material volumes in the form of a polyhedron or a prism on a growth support. The term material volumes refers to a semiconductor body produced on a surface of a carrier. The coated material volumes are designed with an active layer so that they are suitable for emitting light. In this respect, such coated material volumes can also be called μ-LEDs due to their size.

In a second step, a converter material matched to a defined color is inserted between material volumes of a pair. These colors can be red and green, for example. In some aspects the material volume, or the μ-LED produced in this way, can be designed to emit light of blue color, so that a converter between two material volumes is not necessary.

With a total of 4 such bars of material volumes and μ-LEDs, respectively, the individual generation of blue, green and red light is thus possible. The converter material lies at least in the middle between two material volumes, which can be electrically controlled simultaneously. In some aspects, the converter material also partially extends to the surface of the material volumes. With additional material volumes, redundancy can be created so that even if one volume fails, light of the desired wavelength can still be emitted. The material volume can have the shape of an elongated cuboid or a ingot shape own. However, other regular polyhedra, e.g. a parallelepiped, straight prism or similar shapes such as truncated pyramids, obelisks, wedges or regular polyhedra are also conceivable.

According to a second aspect, a μ-LED array, in particular for one pixel, is further proposed which has pairs in the form of a polyhedron or prism of comprehensive coated material volumes on a carrier substrate. A converter material is inserted between a pair of such material volumes, which converts light emitted from the material volumes into light of a further wavelength. This conversion is often complete.

To produce the material volumes, a core in the form of a bar is first formed on the carrier substrate and this is epitaxially overgrown with several layers. Suitable photostructures are used for this purpose. The material system for the core and the individual layers may be an III-V semiconductor system, for example on GaN basis. Since the material volumes are defined in the geometry by epitaxial growth, RGB pixels can be arranged on a very small area. The converter arrangement in the cavity allows redundancy and easy fabrication by means of jetting- or dispensing processes. In this way, μ-display can be generated as RGB-display based on a redundant 3D-bar arrangement.

An electrical connection is possible without any further wiring technique, especially by means of through-holes that go through the carrier. In this way SMT ("surface mounted technology") components can be formed. Alternatively, the material volumes can also be formed monolithically with conductor structures present in the carrier.

As already mentioned above, a first doped layer and a second doped layer are deposited over a core. Between the first and second layer is an active layer. The latter may comprise one or more quantum well structures. The first and/or second layer also comprises current widening layers, doping gradients or other measures to enable low possible resistance and high current densities to the active layer. Further measures, including current confinement to keep the current away from the edges of the material volumes are described in this disclosure and can be used to create the material volumes. These include quantum well intermixing and others. For each pair, electrical contact is made to a p-contact area and to an n-contact area via metallization. In some aspects, one or both areas may be common, i.e. the material volumes share one or two common contact areas.

According to a further embodiment, a growth layer can be formed on the growth support, which has areas free from masking to which the number of material volumes can be applied. According to another embodiment, the growth layer can include n-doping and especially GaN. The masking can comprise SiO2 or SiN. The growth layer can be made of the same material (e.g. GaN) as the core of the material volume, also doped depending on the application.

According to another embodiment, the material volumes can be generated with their longitudinal axes parallel to each other and in the same geometry. According to a further embodiment, a deposition of first reflective metallization, in particular those providing a solder, takes place on the sides of the material volumes covered with the active and the further layers that face away from the growth carrier, whereby p-contacts, in particular strip-shaped ones, can be formed. According to further aspects, a solder metallization layer is deposited on a main surface of a flat carrier, whereby the solder metallization layer can be connected, in particular bonded, to the first metallization of the material volumes forming p-contacts.

In some embodiments, the growth layer is removed in certain areas, in particular by etching (RIE (Reactive Ion Etching) or ICP (Inductively Coupled Plasma Etching). A passivation is deposited on the exposed areas of the growth layer, which can completely cover the surfaces of the exposed areas. Either areas are left out or the passivation is opened again. In some aspects, the latter opening is carried out along the longitudinal axes of the material volumes on their surfaces facing away from the substrate. Then strip-shaped second metallization forming n-contacts are applied to the exposed areas of the material volumes.

Depending on the design, at least some of the sidewalls that have been passivated are also coated with a metallization. This becomes reflective, so that light is reflected from there. In the case of two adjacent coated material volumes, these sidewall mirror metallization can be produced alternately facing away from and towards each other. In such designs, it is intended to fill the free space between two adjacent coated material volumes, in which the sidewall mirror metallization are produced facing away from each other, with a converter material.

At and along the passivation layer of the n-contacts, the sidewall mirror metallization and metallic intermediate connections deposited as third metallization, an electrical connection to, in particular strip-shaped n-contact areas deposited as fourth metallization is formed. These can be on the same side of the carrier. Alternatively, vias are provided, contact areas on a side facing away from the metal volumes. The vias are electrically isolated from the solder metallization layer and the carrier by a passivation layer. Of course, p and n areas can also be interchanged.

According to another design, the p-contact vias can be formed in the area of a respective converter material. Al or Ag or other suitable materials can be used as metallization.

If the length of the bars is reduced, so-called μ-rods are obtained. These are constructed as columns and also contain an active layer that extends over the surface along the longitudinal axis and thus basically radiates light in all directions during operation. Such μ-rods can be generated multiple times on a carrier by means of self-organization or orientation-dependent crystal growth. The rather small structures allow μ-LEDs to be produced especially for μ-displays, whereby only epitaxial process parameters have to be changed. μ-rods of this type have spatial dimensions in the range of less than [μm]-down to the nanometer range.

Since the light generated by μ-rods radiates in essentially all directions in space, the light portion that is radiated directly upwards is rather small due to the small footprint. Therefore, it may be intended to surround the μ-rods with one of the reflective structures revealed further down. The μ-rod is thus arranged in a kind of cavity, with the walls of this cavity being bevelled and reflective. In some aspects, the cover electrode disclosed below may also be provided.

Another possibility is described as follows. This is based on the principle of separating the μ-rods and then aligning and contacting them parallel to a substrate. In this way horizontally aligned μ-rods, which each form a subpixel.

According to a first aspect, an electronic component, and in particular a μ-LED, is proposed in which a μ-rod running essentially parallel to a carrier is connected to a carrier. For this purpose, the μ-rod has an elongated core with a first doping, the core being coated on the outside from a layer sequence from a first longitudinal end to a second longitudinal end free from the layer sequence. The layer sequence also comprises an active layer, which in some aspects may comprises quantum well structures or the like. In addition, special doping or other measures as disclosed in this application may be used to restrict a current to low defect areas of the active layer. The μ-rod is electrically and mechanically connected at the first longitudinal end to a first contact region of the substrate by means of the layer sequence and a first contact, and is electrically and mechanically connected at the second longitudinal end to a second contact region of the substrate by means of the core and a second contact. Finally, the layer sequence is electrically insulated from the second contact by means of a masking. Thus, the μ-rod is arranged elongated and substantially parallel to the carrier. Although this increases the space consumption, this design still allows a high light output to be achieved with a low power consumption.

In a process for producing such an electronic component, and a μ-LED electrically connected on a carrier, a μ-rod is produced in a first step, which can be contacted at its first end and at its second end, the ends contacting differently doped layers. This generation can be achieved in essential steps by epitaxial material deposition. The μ-rod thus has an elongated core with a first doping, the core having been grown outwardly, in particular epitaxially, by one or more layer sequences from a first longitudinal end to a second longitudinal end free from the layer sequence.

The μ-rod thus generated is then arranged along a carrier substantially parallel to it. At its first longitudinal end, the layer sequence having a first contact is electrically and mechanically connected to a first contact area of the carrier. At its second longitudinal end, the core is electrically and mechanically connected to a second contact area of the carrier by means of a second contact. Here the layer sequence is electrically insulated from the second contact by means of an insulating layer.

The high flexibility in manufacturing the μ-rods allows adjusting their light emission to a desired wavelength range or desired wavelength. In some aspects, the geometry of a μ-rod is designed for a light of a certain wavelength. The geometry can have different lengths or diameters of the μ-rods as well as different thicknesses of the individual layers. With different diameters μ-rods can be manufactured which emit light of different wavelengths during operation. Quantum wells or quantum wells can be provided in the active layer. The μ-rods can be designed as polyhedron, prism, pyramid or wedge along the longitudinal axis. It can have four or even six corners in cross section. The μ-rod can be covered in some aspects by an addition al converter material or in the further processed state by it, so that radiated light is converted.

If the μ-rod is parallel along its longitudinal axis on the carrier, in some aspects it may be convenient to apply a reflective layer between the carrier and the μ-rod. In this context, reference should be made to embodiments elsewhere where a carrier has a reflector structure surrounding a μ-LED so that light from the μ-LED arranged inside is deflected by the reflector structure. Such a reflector structure can also be arranged around groups of μ-rod arranged on the carrier.

In one aspect, three μ-rods forming a group are arranged in parallel on the carrier and electrically and mechanically connected to the contact areas of the carrier. The μ-rods can be designed to emit red, green or blue light. These thus form a pixel. Several such arrangements can be provided in rows and columns to form a μ-display. As mentioned above, the diameters of the μ-rods can be different for red, green and blue light. The μ-rods are so different in size. By permuting the μ-rods for multiple pixels, visual artefacts can be reduced due to periodicity.

Some aspects deal with the production and generation of the contacts. For example, the first contact, especially a p-contact, at the first longitudinal end of a respective μ-rod facing away from the insulation layer can be made in different ways. This includes epitaxial growth, especially by means of a seed layer photostructured by oxygen plasma etching. The contact can also be formed by sputtering. At the first contact, in some aspects at least one contact plane is formed as a contact surface to the first contact area of the carrier. The second contact is created in a similar way.

As already briefly indicated with the μ-rods, these can be generated by a certain self-organisation. Thereby the crystal orientation is used to produce a directed crystal growth. If three-dimensional, light-emitting heterostructures for optoelectronic semiconductor devices, e.g. μ-LEDs, are particularly small in size, controlled 3D shaping and the production of stress-free active layers with surface sections at an angle to each other is difficult. For μ-LEDs with nitrides such as GaN grown on sapphire with an active layer comprising InxGa1−xN quantum wells, it has already been proposed to fabricate them in the form of a triangular profile perpendicular to the <11-00> or <112−0> direction or to shape a Hexagonal Pyramid. For GaN-based semiconductor structures, a mask with hexagonal apertures aligned to the <11−00>- or <112−0> direction of GaN is used for lateral epitaxial overgrowth. For AlInGaP-based semiconductor structures on GaAs, it is proposed to apply the orientation of opposite corners of the hexagonal openings of the mask with an angular error smaller than 10° to the <110> direction of (001) n-GaAs. For ZnSe-based semiconductor structures, the angular error should be less than 15° to the <112> direction of (111) n-GaAs as epitaxial substrate. However, these applied approaches are not or only limitedly usable for very small structures, especially in the range of less than 70 μm edge length.

The methods disclosed in the following also allow the specification of small μ-LEDs or optoelectronic semiconductor devices, which have a high efficiency with regard to the ratio of luminous flux and absorbed electrical power. Correspondingly, such μ-LEDs in monolithic form or as individual pixels can form part of a μ-display.

The starting point of the concept proposed here is an optoelectronic semiconductor device comprising a three-dimensional light-emitting heterostructure with a first conductive semiconductor layer, an active layer and a second conductive semiconductor layer, the first and the second conductive semiconductor layer having different doping. According to the proposed principle, the light-emitting heterostructure comprises aluminum gallium arsenide (AlxGa1−xAs) and/or aluminum indium gallium phosphide (AlInGaP) and/or aluminum gallium indium phosphide arsenide and is formed three-dimensionally by growing it on a mold layer. The mould layer comprises a {110} oriented side surface. Optionally, a flat top surface {111} can be provided. For a high conversion rate and especially to reduce the non-radiative recombination at the edges of a light-emitting heterostructure with [μm] dimensions, the formation of a stress-free, three-dimensional layer structure with low lattice defects is necessary. It was recognized that the mold layer, which forms the base for the fabrication of the three-dimensional light-emitting heterostructure, should be selectively epitaxially deposited on a gallium arsenide (111)B epitaxial substrate.

In the present case, a gallium arsenide (111)B epitaxial substrate is understood to be a carrier substrate for selective epitaxy consisting of gallium arsenide with a (111) oriented surface used for epitaxial growth according to Miller indexing, the termination of the surface plane being formed by arsenic atoms. The gallium arsenide (111)B epitaxial substrate can be used doped or undoped. Compared to gallium arsenide (111)A with a gallium termination, an improved controllability of selective epitaxy is achieved, which is attributed to a higher volatility of the arsenic atoms. It is expected that due to the arsenic termination of gallium arsenide (111)B there will be a sufficient number of uniformly distributed As defects to improve nucleation, so that the initial phase of epitaxial layer formation can be advantageously controlled by externally adjustable epitaxial process parameters, such as temperature and feed of starting materials.

For the selectively epitaxially grown moulded layer on the gallium arsenide (111)B epitaxial substrate, the preferred material is gallium arsenide and/or aluminum gallium arsenide and/or aluminum gallium indium phosphide. The material of the mould layer can be undoped, n-doped or p-doped. Furthermore, it is provided for a further embodiment to create a Bragg mirror stack with a sequence of $SiO_x$— and $SiN_x$— layers within or on the mold layer, also epitaxially.

A lithographically structured dielectric layer, for example of SiOx, SiNx or SiOxNy, serves as a mask on the gallium arsenide (111)B epitaxial substrate. The openings in the mask are selected so that the base area of the shaped layer preferably has an edge length of 50 nm to 100 μm. In an embodiment, the shaping of the mask structure and its orientation relative to the crystal direction of the gallium arsenide (111)B epitaxial substrate supports the formation of at least one {110} oriented side surface of the molded layer. In some aspects, a molded layer is in the shape of a three-sided pyramid with (−1−10), (−10−1) and (0−1−1) oriented side faces. For another advantageous design, the form layer has a top surface with the orientation (−1−1−1)

in addition to the side surfaces with the orientation (−1−10), (−10−1) and (0−1−1), so that for another preferred design example a form layer is present which is designed as a truncated three-sided pyramid.

The proposed method results in a precisely epitaxially grown shaped body with a defined contour and low crystal-internal stresses and a reduced number of lattice defects, on which the light-emitting heterostructure is epitaxially grown on the basis of aluminum gallium arsenide (AlxGa1−xAs) and/or aluminum indium gallium phosphide (AlInGaP). Their three-dimensionality increases the area of the active layer and allows an improved light extraction for photons emitted parallel to the layer. In addition, the invention leads to an enclosure of the edge areas of the light-emitting heterostructure, in which at least the active layer can reach as far as the mask acting as an electrical insulator for selective epitaxy. The mask may comprise SiOx, SiNx or SiOxNy. This results in a closed light-emitting heterostructure without the need for additional passivation at the edges, which reduces non-radiative recombination and thus increases the efficiency of light generation. This border effect results from the side surface of the molded layer which is oriented {110} towards the mask and which extends at least to the mask edge. Consequently, the molded layer can be formed flat with a substrate parallel top layer with (111) orientation. Preference is given to a form layer with a transverse extension parallel to the epitaxial substrate of less than 20 μm and a vertical extension perpendicular to the epitaxial substrate of less than 5 μm. In order to set a desired contour, the form layer can be reworked after selective epitaxial growth by means of wet chemical processing. For a preferred design, the contouring of the form layer is exclusively done by selective epitaxial growth.

With the light-emitting heterostructure based on aluminum gallium arsenide (AlxGa1−xAs) and/or aluminum indium gallium phosphide (AlInGaP), wavelengths in the range of 560 nm to 1080 nm can be generated. To complete a μ-LED the optoelectronic semiconductor structure is supplemented by light guiding, contact and passivation layers. Embodiments are possible, for which the main radiation direction is in the growth direction of the layer stack of the semiconductor device or against the growth direction. Furthermore, light extraction is possible on the p- or n-side of the light-emitting heterostructure. Further measures for light guidance, collimation or even conversion into another color are disclosed in this application.

For a variant with a main radiation direction in the growth direction of the layer stack of the light-emitting heterostructure, a layer sequence with a transparent contact layer for the second conductive semiconductor layer, e.g. a layer of indium tin oxide (ITO), is located above this. For a possible embodiment, the ITO layer is deposited over the entire top side of the light-emitting heterostructure. Furthermore, a Bragg mirror stack (DBR) can be provided below the light-emitting heterostructure.

The electrical contacting of the first conductive semiconductor layer of the light-emitting heterostructure from below is most easily achieved by a conductive gallium arsenide (111)B epitaxial substrate applied with the appropriate doping and a shaped layer selectively epitaxially grown and also doped on top of it.

If a matrix arrangement of light emitting heterostructures is processed in parallel, it can be used as a matrix for a μ-LED display depending on the processing used. The structures are generated monolithically arranged in rows and columns.

Alternatively, the heterostructures can be separated in groups or individually by a laser separation process or similar without damaging the active layers protected at the edges by the masking layer. Light sources separated in this way can form μ-LEDs that comprise extended contact areas and can be mounted on complementary contact areas of an IC chip without separate wire bonding in the simplest case.

For another variant with main radiation direction in growth direction, the active layer is locally limited by quantum wells and located in the area of the {110} oriented side surfaces or a (111) oriented top surface. An opaque metallization can be provided over the non-emitting sections of the heterostructure, forming for example a ring contact. Additional passivation and carrier layers may also be provided. Also conceivable are light guide structures at the exit windows, in the simplest case a surface roughening to increase the out-coupling rate. A surface can also be created by joint processing, and then additionally processed to form collimators, photonic crystals or other elements that further improve the radiation characteristics.

To realize light emission with a main emission direction opposite to the growth direction, first, the gallium arsenide (111)B epitaxial substrate and at least part of the mold layer are removed and in a further step, a transparent contact layer is applied below the light-emitting heterostructure. Such a light source is suitable for IC chip assembly with bonding.

For a further alternative, a temporary support above the three-dimensional light-emitting heterostructure is used for the removal of the gallium arsenide (111)B epitaxial substrate and the molded layer. These bottom layers are replaced by a metallization and a carrier substrate. Then the temporary carrier can be replaced by a topside passivation and light-emitting structure. Such a design is suitable for designs that are contacted by double bonding on an IC chip.

In addition to the various aspects of a geometric shape or orientation of the crystal, it was also found that radiative recombination decreases compared to non-radiative recombination the smaller the area of the active layer is. The reason for this seems to be defects in the active layer, which are mainly formed in the edge area of the μ-LED, because processing (singulation or etching) causes changes in the crystal structure therein, which increase the defect density. In general, it can be said that the larger the edge area becomes in relation to the surface of the active layer, the greater the number of defects becomes and thus the non-radiative recombination increases. It has also been recognized that the defect density has an effect on the efficiency of a light emitting diode both at high and low current densities and, together with the current density, makes an important contribution to aging (and thus reduces the efficiency of the light emitting diode).

A prerequisite for automotive applications is that μ-displays and their individual pixels must have sufficient luminosity, i.e. be able to carry relatively high current densities. On the other hand, a high contrast range is important for augmented reality applications, i.e. the μ-LEDs of a display should be able to handle both high and low current densities equally well. Accordingly, the efficiency should be high or even increased at low currents.

In view of these requirements on the one hand and the effect of defects on the other hand, it is therefore desirable either to reduce the defect density in the active layer, especially in the edge region, or to keep the charge carriers away from the edge region.

One measure to improve the low current behaviour is the Quantum Well Intermixing, which is used in various aspects in the manufacture of active semiconductor components.

The band gap in this area is changed by the exchange of lattice atoms between the quantum well active layer and the surrounding barrier material. This exchange process can take place particularly efficiently if suitable impurity atoms, especially dopant atoms, are introduced into the semiconductor. This changes the band gap in the area covered by the exchange process, so that the charge carriers feel a force that can have a repulsive effect. For this purpose, dopants can be used, for example, which migrate into the active layer through a diffusion process and cause quantum well intermixing there. This method has also been successfully tested for optoelectronic devices based on III-V semiconductors, such as Ga, In, Al and P, As.

However, it was also observed that with smaller dimensions of light emitting diodes made of this material system and especially μ-LEDs, an increasing reduction in luminosity sets in over a relatively short period of time. Compared to components without quantum well intermixing, this degradation already occurs at significantly lower load current levels. In other words, quantum well intermixing leads to a reduction in the luminosity of a μ-LED even at low currents, although this is not observable with larger LEDs.

A method has now been found which not only significantly reduces this effect, but also almost completely prevents a reduction in luminous efficiency induced by interference points, at least over a longer period of time. This makes the process particularly suitable for the production of μ-LEDs.

For this purpose, a method is proposed for manufacturing a semiconductor device, in particular a μ-LED, in which a semiconductor structure is provided in a first step. This semiconductor structure can be produced, inter alia, by growth of differently doped layers and/or layers of different material composition and has, inter alia, a first n-doped layer, a second p-doped layer and an active layer with at least one quantum well arranged between them. The p-doped layer was provided with a first dopant for doping.

In a second step, a patterned mask is deposited on the semiconductor structure and especially on the p-doped layer. The mask is intended to protect areas of the active layer intended for the generation of electromagnetic radiation from the introduction of the second dopant. The mask material can comprise either a dielectric (silicon oxide, silicon nitride, . . . ), metal (Ti, . . . ) or semiconductor material.

The p-doped layer not covered by the patterned mask is then doped with a second dopant by a diffusion process with first process parameters. The process parameters and the mask material are selected in such a way that quantum well intermixing is produced in areas of the active layer which are not covered by any area of the patterned mask. The masking produces a relatively sharp lateral transition region in the intermixing of the at least one quantum well, so that the degree of intermixing in the quantum well decreases sharply at the boundary defined by the mask. This generates a relatively sharp change in the band gap of the quantum well.

According to the proposed principle, the diffusion process is followed by a final temperature step in which second process parameters are set that differ from the first process parameters. Without any further addition of the second dopant, the semiconductor is now subjected to an annealing step with these second process parameters.

This downstream curing step with different process parameters and without a second dopant is designed in such a way that the significant improvement in low current efficiency achieved with the first step is maintained over a longer period of operation.

The inventors recognized that the process of adding the second dopant at first process parameters is both causally important for the generation of quantum well intermixing and for the later degradation. Atoms of the second dopant diffuse into the semiconductor layer stack and into the active layer, or quantum well, where they can replace atoms of the original crystal lattice. These are either atoms of the first dopant, but also atoms of the actual lattice material. The atoms displaced to interstitial sites are mobile, and it is assumed that they play a major role in the degradation of the optoelectronic device. An additional annealing step with simultaneously changed process parameters during which the dopant is not added further reduces the subsequent reduction in efficiency. In a further aspect, suitable environmental conditions are provided for the annealing step by offering a supporting pressure with an element forming the crystal lattice (e.g. by providing a suitable precursor).

By suitable choice of this element, the lattice atoms displaced by the second dopant are offered a reaction possibility at the surface of the semiconductor and the free mobility of these atoms is thus prevented. If the displaced lattice atoms are, for example, atoms of group III, this process can be preferably initiated by a supporting pressure with an element of group V. The interstitial atoms produced by the diffusion process therefore diffuse to the surface during the healing step according to the invention and are bound there. By reducing the number of interstitial atoms participating in the degradation mechanism, the service life of the component increases considerably.

In one-step of the healing process, the precursor can be added right at the beginning or only after reaching the second process parameter. The concentration of the precursor can also change during the annealing step, so that sufficient precursor material is available to saturate the lattice atoms displaced by the dopant.

In a further aspect, this precursor may particularly include the elements phosphorus or arsenic, especially in compounds such as PH3, ASH3 TBAs or TBP.

Another aspect deals with the first and second process parameters. In one aspect, the parameters include at least one of the following parameters or a combination of them: temperature, temperature change over a defined period of time, pressure, pressure change over a defined period of time, composition and flow of a gas, in particular a precursor, and duration of the annealing step. For example, the second process parameters include a defined second temperature, which is higher than the temperature during the addition of the second dopant. In other words, a temperature during the annealing step is higher than a temperature during the generation of the quantum well intermixing. Also, the time durations of doping and annealing can be different.

In another aspect a second dopant is used, which is different from the first dopant. For example, Zn can be used as the second dopant. For example, an III-V semiconductor material is used as the material system for the semiconductor structure. This can have at least one of the following material systems: InP, Alp, GaP, GaAlP, InGaP, InAlP, GaAlP or InGaAlP. Other III-V semiconductors can also be considered as material systems, for example with As.

Another aspect is given by an optoelectronic component. This comprises a semiconductor structure with an III-V semiconductor material. The semiconductor structure comprises an n-doped layer, a p-doped layer and an active layer with at least one quantum well between them. The p-doped layer comprises a first dopant. Furthermore, the device has a light-generating region, in particular a central region in the active layer, which is laterally surrounded by a second region in the active layer. The band gap of the second region is larger than that of the central region because a second dopant is introduced into the second region which has caused quantum well intermixing in the at least one quantum well of the active layer located in the second region.

In another aspect, a structured mask is arranged on the p-doped layer so that it covers a first subarea of the p-doped layer. In a subregion of the p-doped layer not covered by the mask, a second dopant is introduced, which generates quantum well intermixing in the active layer located below this subregion. The size of the mask is substantially the same size as the first subregion. By selecting the supporting pressure during the healing step according to the invention, a material displaced by the second dopant is converted into a layer covering parts of the surface. The diffusion process during the annealing seems to remove the material from interstitial sites, so that it no longer leads to non-radiative recombination centers in the quantum well, and thus the efficiency of the optoelectronic device does not decrease even over a longer period of time. Accordingly, a layer of an III-valent material of the III-V semiconductor material and an element of a precursor material, in particular P or As, is formed on a surface of the intermixed subregion of the p-doped layer.

Another aspect of the improvement of quantum well intermixing is presented in the following procedure. For this purpose, a method is proposed for the manufacture of a semiconductor component, in particular an optoelectronic component or a μ-LED, in which a semiconductor structure is provided in a first step. This semiconductor structure can be generated, inter alia, by growth of differently doped layers and/or layers of different material composition and has, inter alia, a first n-doped layer, a second p-doped layer and an active layer with at least one quantum well arranged between them. The p-doped layer was provided with a first dopant for doping.

In a second step, a patterned mask is deposited on the semiconductor structure and especially on the p-doped layer. The mask is intended to protect an area of the active layer intended for generating electromagnetic radiation from the penetration of a second dopant. The mask material can either be a dielectric (silicon oxide, silicon nitride, . . . ), metal (Ti, . . . ) or semiconductor material.

The p-doped layer not covered by the patterned mask is then doped with the second dopant so that quantum well intermixing is generated in areas of the active layer not covered by any area of the patterned mask. Doping the p-doped layer with the second dopant can be performed by gas phase diffusion using a precursor with the second dopant. In other processes, the precursor is thermally decomposed in a gas phase reaction, the dopant is absorbed at the semiconductor surface and diffused into the semiconductor and a quantum well intermixing is generated. Since all these sub-processes have different temperature dependencies, the temperature range in which efficient quantum well intermixing can be realized is very limited (typically for InP- or GaAs-based semiconductors: 520+/−20° C.)

According to the proposed principle, the step of applying the dopant by means of precursor and diffusion is now specified. This creates a process sequence for efficient quantum well intermixing by gas phase diffusion, which allows an enlargement of the process window and thus an optimization of the process sequence for the realization of age-stable optoelectronic devices.

This specified process sequence has the following steps:

- depositing the second dopant on the surface of the p-doped layer by decomposition of the precursor at a first temperature selected such that substantially no diffusion of the second dopant into the p-doped layer takes place; and
- Diffusion of the deposited second dopant into the p-doped layer at a second temperature, which is higher than the first temperature.

The inventors recognized that the process control of doping with the second dopant has a significant influence on reducing the charge carrier concentration in those areas, in which a reduction in luminous efficiency induced by impurities occurs over a longer period of time. This is due, among other things, to the fact that the process control can increase the doping barrier in the active layer below the mask edge.

In process control according to the proposed principle, the step of diffusion of the dopant-containing precursor in the gas phase is explicitly separated in the steps:

- depositing decomposition products comprising the second dopant on the surface of the semiconductor structure; and
- diffusion of the second dopant into the semiconductor structure.

Due to the separation, the temperature for the diffusion step with the generation of the quantum well intermixing can be freely selected and, in particular, can be increased to values at which a surface coating by the second dopant is no longer possible due to excessive desorption (>520° C.). This can be advantageously used to improve the aging behaviour of optoelectronic components.

The second dopant is of the same dopant type as the first dopant and is formed from Zn, Mg, etc. The quantity of the deposited second dopant can be selected in such a way that it diffuses substantially completely into the p-doped layer during the diffusion process at a second temperature. Thus, only a quantity sufficient for diffusion and generation of quantum well intermixing is provided, but not beyond.

In a further aspect, the amount of the deposited second dopant is chosen, for example, in such a way that in areas of the active layer over which no area of the structured mask is located, a barrier for the lateral diffusion of charge carriers is formed, which is composed of a barrier produced by the second dopant as well as a barrier caused by quantum well intermixing.

In an further embodiment of this aspect, the amount of the second dopant is chosen such that in areas of the active layer over which no area of the patterned mask lies, a barrier for the lateral diffusion of charge carriers generated by the second dopant is greater than a barrier caused by quantum well intermixing. Furthermore, the amount of the second dopant can also be chosen such that the band gap in the active layer in the regions, which lie below the structured mask, is smaller than the band gap in the active layer in the regions above which no region of the structured mask lies.

In another aspect, the doping process is followed by a last temperature step at a third temperature, which is higher than the second temperature. Without further addition of the second dopant, the semiconductor is now subjected to an annealing step at this third temperature. This downstream annealing step at a higher temperature and without a second dopant is designed in such a way that the significant improvement in low current efficiency achieved with the doping process is maintained over a longer operating period.

The inventors recognized that the process of introducing the second dopant at a first temperature and the subsequent diffusion of the second dopant at a second temperature is both causal for the generation of quantum well intermixing and is also important for the subsequent degradation. Atoms of the second dopant diffuse into the semiconductor layer stack and into the active layer, or quantum well, where they can replace atoms of the original crystal lattice. These are either atoms of the first dopant, but also atoms of the actual lattice material. The atoms displaced to interstitial sites are mobile and it is assumed that they play a major role in the degradation of the optoelectronic device. By an additional annealing step at a higher third temperature and during which no further dopant is added, a subsequent decrease in efficiency is reduced.

In a further aspect, suitable environmental conditions are provided for the annealing step by offering a supporting pressure with an element forming the crystal lattice (e.g. by providing a suitable further precursor). By suitable choice of this element, the lattice atoms displaced by the second dopant are offered a reaction possibility at the surface of the semiconductor and the free mobility of these atoms is thus prevented. If, for example, the displaced lattice atoms are group III atoms, this process can be started by a supporting pressure with an element of group V. The interstitial atoms produced by the diffusion process therefore diffuse to the surface during the annealing step according to the invention and are bound there. By reducing the number of interstitial atoms participating in the degradation mechanism, the service life of the component increases considerably.

Accordingly, according to this aspect, the healing process includes the steps providing a further precursor comprising an element from the fifth main group, in particular P or As; and/or forming a layer of a III-V semiconductor material on the surface of the p-doped layer.

In one-step of the annealing process, the precursor can be added right at the beginning or only after reaching the second process parameter. The concentration of the precursor can also change during the annealing step, so that sufficient precursor material is available to saturate the lattice atoms displaced by the dopant.

In another aspect, this further precursor may contain in particular the elements phosphorus or arsenic, especially in compounds such as PH3, ASH3, TBAs or TBP.

Another point of view deals with the process parameters, which can be chosen differently during the steps of deposition, diffusion and annealing. In one aspect, the parameters include at least one of the following parameters or a combination thereof: temperature, temperature change over a defined period of time during one of the aforementioned steps, pressure, pressure change over a defined period of time during one of the aforementioned steps, composition and flow of a gas, in particular a precursor, and duration of the curing step.

For example, the process parameters include a defined first temperature during the supply of the second dopant, which is selected such that substantially no diffusion of the second dopant into the p-doped layer takes place during the deposition of the second dopant on the p-doped layer, a second temperature during the diffusion process of the second dopant, which is higher than the first temperature, for example, and a third temperature during the annealing step, which is again higher than the second temperature. In other words, one temperature during the annealing step is higher than the two temperatures during the creation of the quantum well intermixing. Also, the time periods for the addition of the second dopant, the diffusion process and the annealing can be different.

In another aspect a second dopant is used, which is different from the first dopant. For example, Zn or Mg can be used as the second dopant. For example, an III-V semiconductor material is used as the material system for the semiconductor structure. This can have at least one of the following material combinations: InP, Alp, GaP, GaAlP, InGaP, InAlP, GaAlP or InGaAlP. Other III-V semiconductors can also be considered as material systems, for example with As.

Another aspect is given by an optoelectronic component. This comprises a semiconductor structure with an III-V semiconductor material. The semiconductor structure comprises an n-doped layer, a p-doped layer and an active layer with at least one quantum well between them. The p-doped layer comprises a first dopant. Furthermore, the device comprises a light-generating region, in particular a central region in the active layer, which is laterally surrounded by a second region in the active layer. The band gap of the second region is larger than that of the central region due to a second dopant introduced into the second region which has caused quantum well intermixing in the at least one quantum well of the active layer located in the second region.

Due to this impurity induced local quantum well intermixing in the second region, but not in the first region, barriers are formed in the active layer, which limit a lateral movement of charge carriers in the quantum well in the active layer of the optoelectronic device to this first region of the active layer. This largely prevents, for example, that current for operating the optoelectronic device flows in the edge regions of the optoelectronic device, i.e. through the second region enclosing the first region. This reduces non-radiative recombination of charge carriers caused by non-radiative recombination centers or a high non-radiative surface recombination in the second region, which thus leads to an improved performance of the devices.

In another aspect, a structured mask is arranged on the p-doped layer so that it covers a first subregion of the p-doped layer.

In a subregion of the p-doped layer not covered by the mask, a second dopant is introduced, which produces quantum well intermixing in the active layer located below this subregion. The size of the mask is essentially the same size as the first subregion.

By choosing the supporting pressure during the annealing step according to the invention, a material displaced by the second dopant on interstitial sites is converted into a layer covering parts of the surface. The diffusion process during the annealing seems to remove the material from interstitial sites so that it no longer leads to non-radiative recombination centers in the quantum well and thus the efficiency of the optoelectronic device does not decrease even over a longer period of time. Accordingly, a layer of an III-valent material of the III-V semiconductor material and an element of a precursor material, in particular P or As, is formed on a surface of the intermixed subregion of the p-doped layer.

As already mentioned in the above concepts, the effectiveness of quantum well intermixing and the introduction of the impurities has an influence on the ageing behaviour of the μ-LED. Although this can be reduced with the measures revealed here, it was found that a measurable and sometimes relevant effect remains, especially at higher load current densities, especially with very small components such as μ-LEDs whose edge length is only a few μm. The reason is apparently a location or position dependent concentration gradient of the diffusing material. This is determined by the arrangement and structure of the photomask.

Correspondingly, in one aspect an optoelectronic device is proposed which comprises an n-doped first layer, a p-doped second layer with a first dopant and an active layer. The latter is located between the n-doped first layer and the p-doped second layer and has at least one quantum well. According to the invention, the active layer can be divided into at least two regions, which are in particular adjacent to one another. The second region is concentrically arranged around a first region, in particular an optically active region, and comprises quantum well intermixing.

The concentric arrangement of a quantum well intermixing around the optically active region corresponding to this aspect, means that the first region, in particular, the optically active region, is completely enclosed by the second region and the two region are arranged around a common centre of their respective surfaces. Within the manufacturing tolerances, however, a slight deviation of the centres from each other, as well as a deliberate shifting is also conceivable.

The inventors realized that the introduction of the impurities and quantum well intermixing probably depends on the offered open area over which the substance to be diffused is introduced. Since impurities in the corners of a square or rectangular active layer (or according to a rectangular structure given by a photomask) can diffuse from more than one side, the corner regions have a higher impurity concentration or quantum well intermixing than, for example, the regions in the middle of the side lengths. This effect is undesirable in some situations and is avoided by the chosen concentric arrangement, since the absence of a corner does not lead to such a greater diffusion in such a situation.

Quantum well intermixing can be achieved by doping the second region with a second dopant such as magnesium, zinc, or cadmium (Mg, Zn, Cd). However, this is not intended to be a restrictive selection for one dopant, but any other dopant of the same type that the skilled person can think of can be used for doping.

By locally applying a diffusion mask to the semiconductor structure and by means of, for example, a diffusion process, the second dopant enters the active layer in regions and quantum well intermixing occurs in the corresponding unmasked region in the existing quantum well. The region where quantum well intermixing occurs forms the second region. Correspondingly, according to this aspect, the optoelectronic device comprises a second dopant, which is essentially uniformly arranged in the second region.

In the first region, especially in the optically active region, quantum well intermixing is largely prevented in another aspect. More precisely, after this aspect, quantum well intermixing does not occur in the first region. Correspondingly, after the diffusion process there is almost no second dopant in the first region. This aspect can also be realized by the above-mentioned measures.

Due to this impurity induced local quantum well intermixing in the second region, but not in the first region, barriers are formed in the active layer, which limit a lateral movement of charge carriers in the quantum well in the active layer of the optoelectronic device to this first region of the active layer. This largely prevents, for example, that current for operating the optoelectronic device flows in the edge regions of the optoelectronic device, i.e. through the second region enclosing the first region. This reduces non-radiative recombination of charge carriers caused by non-radiative recombination centers or a high non-radiative surface recombination in the second region, which thus leads to an improved performance of the devices.

To achieve further improvement, in another aspect the two areas are at least approximately circular. The absence of corners has the consequence that impurities diffuse more evenly into the second area and no local maxima induced by corners are formed. The circular formation, or the approximately circular formation of the two regions, thus has the effect that the concentration of the introduced impurities along the circumference of the two regions is as homogeneous as possible. This in turn has the consequence that performance losses due to surface recombination in the second area are reduced.

Circular in this context means that a polygon with a number of corners greater than or equal to 6 corners is also possible, e.g. 8, 10 or more corners, since a positive effect of the power increase of the optoelectronic component has already been recognized for this shape. Likewise, the term circular can also include elliptical, as well as oval and other rounded convex shapes.

The diffusion process for the generation of the quantum well intermixing in the second region can mean in a further aspect that the second dopant is not only formed in the active layer in the second region, but also in the second p-doped layer and also at least partially in a region of the n-doped layer adjacent to the active layer. However, this is not necessarily to be understood to mean that the regions in the second p-doped layer and in the first n-doped layer in which the second dopant is formed are congruent with the second region in the active layer, but congruence is also possible.

In another aspect, an optoelectronic device and in particular a μ-LED is proposed, in which the second region comprises a substantially uniform band gap modified by quantum well intermixing. The second region is concentrically arranged around a first region. This means that in this region, the energy of the band gap comprises a largely constant value and only towards the edges of the region, the band gap increases or decreases or comprises an increase or decrease of the energy of the band gaps.

In contrast, the at least one quantum well in the first region, especially in the optically active region, has a smaller band gap than the second region. Accordingly, the barrier between the first and the second region is generated according to one of the above-mentioned aspects. The transition between the two band gaps can be a step with a sharp edge or an easy flowing transition.

Furthermore, the at least one quantum well in the first region, in particular the optically active region, comprises substantially no quantum well intermixing and thus there is substantially no second dopant in this region.

In addition to a geometrical consideration of the performance improvement in the range of a single μ-LED, it is also possible to provide measures that cause an improvement for a quantum well intermixing at wafer level. μ-LEDs are mostly produced as a variety of such structures on wafer level. The production can be monolithic or the μ-LEDs can be intended for later separation. In the former case, quantum well intermixing can also be used as a barrier against electrical crosstalk. In the latter case, quantum well intermixing can already be used during production to modify the region later forming the edge.

In one aspect a semiconductor structure is presented, which comprises an n-doped first layer, a p-doped second layer with a first dopant and an active layer. The latter is located between the n-doped first layer and the p-doped second layer and has at least one quantum well. According to the invention, the active layer can be divided into a plurality of first regions, in particular optically active regions, and at least one-second region. The plurality of first optically active regions and the at least one second region are particularly adjacent to each other. Furthermore, the plurality of first regions are arranged spaced apart from one another in a hexagonal pattern and are enclosed by the at least one second region which has a QWI.

For example, each of the numerous first, especially optically active, regions of the semiconductor structure can form a part of one optoelectronic component each. Accordingly, the semiconductor structure can be formed from a large number of individual optoelectronic components, which can then be separated by, for example, an etching process through the epitaxial layers or by laser cutting and subsequent substrate removal.

The plurality of first regions is for example circular. In comparison to a square μ-LED structure, the absence of corners results in a more homogeneous introduction of impurities and quantum well intermixing along the boundary of the later μ-LED. This in turn means that non-radiative recombination can be reduced in the boundary region of the second region and accordingly the power of each individual optoelectronic device can be increased.

Circular in this context means that a polygon with a number of corners greater than or equal to 6 corners is also possible, e.g. 8, 10 or more corners, since a positive effect of the power increase of an optoelectronic component can already be seen for this shape. Likewise, the term circular can also include elliptical, as well as oval and other rounded convex shapes.

By locally applying a mask to the semiconductor structure and by means of, for example, a diffusion process, a second dopant enters the active layer in certain regions and a QWI occurs in the corresponding area in the existing quantum well. The region where quantum well intermixing takes place forms the at least one second region. The semiconductor structure accordingly comprises a second dopant, in particular a dopant different from the first dopant arranged in the p-doped second layer, which is arranged substantially uniformly in the at least one second region.

In the large number of first regions, however, QWI is largely prevented by the application of the mask. More precisely, quantum well intermixing does not occur in the plurality of first regions. Correspondingly, after the diffusion process, there is no second dopant located in the plurality of first regions and therefore no second dopant is located in the active layer in the quantum well in the region of the first regions.

The division into first and second areas and the associated QWI enables the first regions to be used as optically active regions in the later operation of the end devices, especially the μ-LEDs. Accordingly, the first optically active regions are referred to in the following as the first optically active regions.

Due to this impurity induced local quantum well intermixing in at least one second region but not in the plurality of first optically active regions, electronic barriers are formed in the active layer by the changing band structure, which limit a lateral movement of charge carriers in quantum well in the active layer of the semiconductor structure to the plurality of first optically active regions of the active layer. This largely prevents, for example, the flow of current for operating an optoelectronic device in the edge regions of the optoelectronic device, i.e. through the second region enclosing the first region. Since non-radiating recombination centers often exist in the edge regions of a single μ-LED structure, the charge carriers are thus kept away from these edge regions, which leads to an improved performance of the devices.

In practice, however, the introduction of the impurities and thus quantum well intermixing depends on the size of the open area over which the substance to be diffused is introduced. Correspondingly, a hexagonal arrangement of the plurality of first optically active regions results in larger areas on the semiconductor structure in the interstices of three first optically active regions arranged in a triangle, i.e. local maxima with a higher impurity concentration, than in the areas directly between two adjacent first optically active regions. These maxima result from the fact that the diffusion process works more efficiently in the area of larger regions exposed to the second dopant than in smaller gaps between two first optically active regions covered by, for example, a mask. This effect is undesirable in some situations, since it is important to achieve a very homogeneous diffusion pattern in the semiconductor structure to improve the low current efficiency of the optoelectronic components.

Accordingly, in a further aspect a semiconductor structure is presented, which comprises an n-doped first layer, a p-doped second layer with a first dopant and an active layer. The latter is located between the n-doped first layer and the p-doped second layer and comprises at least one quantum well. According to the invention, the active layer can be divided into a plurality of first regions, in particular optically active regions, at least one second region and at least one third region. The plurality of first optically active regions and the at least one second region are particularly adjacent to each other. Furthermore, the plurality of first optically active areas are arranged spaced apart from one another in a hexagonal pattern and are enclosed by the at least one second area which includes QWI. In addition, the at least one third region is arranged in the spaces between the plurality of first optically active regions and the second region and in particular adjoins the at least one second region.

In contrast to the aspect described above, the active layer is divided into at least one third region in addition to the plurality of first optically active regions and the at least one second region.

The at least one third region is arranged in such a way that the regions in which local maxima with a higher impurity concentration would occur in accordance with the aspect described above are made inaccessible for quantum well intermixing, for example by applying a mask, and quantum well intermixing thus largely does not occur in these regions, as well as in the plurality of first optically active regions. Correspondingly, after the diffusion process there is largely no second dopant in the at least one third region and in the plurality of first optically active regions.

Further, the at least one second region encloses the plurality of first optically active regions such that each of the plurality of first optically active regions is concentrically surrounded by part of the at least one second region or individually by one of a plurality of second regions. Accordingly, the at least one second regions results, for example, from contiguous ring segments each of which is arranged around one of the plurality of first optically active areas, or from a plurality of ring-shaped individual areas each of which is arranged concentrically around one of the plurality of first optically active regions. Likewise, the term annular may also include circular, elliptical, as well as oval and other rounded convex shapes, which are arranged substantially concentrically around and fully enclose the plurality of first optically active regions.

The at least one third region is adjacent to the at least one second region. Correspondingly, the at least one third region may have a continuous mesh-like surface arranged around the plurality of annular second regions. In a further aspect, however, a large number of third regions can each at least approximately represent the shape of a deltoid curve. This can be formed, for example, by exactly three second regions arranged in a triangle, which are at least approximately circular or ring-shaped. In the same way, the plurality of third regions can be circular and be arranged in the middle of three first regions arranged in a triangle, which are at least approximately circular.

The decisive factor in the arrangement of the at least one third region is that, for example, by applying a mask such as a dielectric or, for example, a photoresist mask, local maxima with a higher impurity concentration in the second region are reduced during the diffusion process in order to achieve a diffusion pattern in the semiconductor structure that is as homogeneous as possible.

Quantum well intermixing can be achieved by doping the second region with a second dopant such as magnesium, zinc, or cadmium (Mg, Zn, Cd). However, this is not intended to be a limiting choice for the dopant, but any other dopant of the same type imaginable to the expert can be used for doping.

In a further aspect, the diffusion process for producing quantum well intermixing in at least one second region can result in the second dopant being formed not only in the active layer in the second region, but also in the second p-doped layer and also at least partially in a region of the n-doped layer adjacent to the active layer. However, this is not necessarily to be understood to mean that the regions in the second p-doped layer and in the first n-doped layer in which the second dopant is formed are congruent with the at least one second region in the active layer, but congruence is also possible.

In another aspect, a semiconductor structure is proposed in which the at least one second region has a substantially uniform band gap created by quantum well intermixing. This means that in this region, the energy of the band gap has a largely constant value, and only towards the edges of the region, the band gap becomes larger or smaller.

In contrast, the at least one quantum well in the plurality of first optically active regions and in the at least one third region has a smaller band gap than in the at least one second region. Accordingly, the barrier generated according to one of the above-mentioned aspects results between the plurality of first optically active regions and the second region and between the at least one third region and the second region. The transition between the band gaps can be either a step with a sharp edge or an easily flowing transition.

In another aspect, the plurality of first optically active regions and the at least one third region has a substantially identical band gap. This results, among other things, from the fact that the at least one quantum well in the plurality of first optically active regions and in the at least one third region comprises substantially no quantum well intermixing and thus essentially no second dopant occurs in these regions.

The semiconductor structure, which can be formed from a plurality of individual optoelectronic components, is separated into the plurality of optoelectronic components according to a further aspect by, for example, an etching process through the epitaxial layers or by laser cutting and subsequent substrate removal. The section of each of the plurality of optoelectronic components is thereby for example circular and comprises at least one of the plurality of first optically active regions, as well as a section of the at least one second region. The first optically active region and the second region are in particular arranged concentrically in the circular cut-out. Correspondingly, it follows that the at least one third region of the semiconductor structure is not part of the plurality of individual optoelectronic components and thus represents in particular a scrap of the separation process.

In the case of small light emitting diodes, particularly of the color red, further miniaturization of the chip size, especially below 50 μm, is difficult due to non-radiative recombination at the outer edges of the chips. Up to now, this difficulty has not been given much attention with red light emitting diodes based on the AlGaInP material system, as the chip size has not fallen below about 100 $\mu m^2$. Further up, quantum well intermixing is used to reduce the proportion of non-radiative recombination. In the following aspects, a concept is presented in which charge carriers are transferred from one edge of a chip by means of a magnetic constriction be kept away.

According to a first aspect an optoelectronic device, in particular a vertical μ-LED for a monolithic μ-display is proposed. This has a layer stack with an active layer running in one plane. A main direction of movement of charge carriers, i.e. electrons and holes, is perpendicular to this plane and through the active layer. In the latter, the desired radiative recombination takes place. However, the defect density is higher in the circumferential edge of the active layer, so that these defects can lead to non-radiative recombination. A magnetization element is provided accordingly. This is configured to provide magnetic field lines that run through at least parts of the layer stack in such a way that the moving charge carriers are kept away from edge regions of X-Y cross-sectional areas of the layer stack.

According to a second aspect, a method for the reduction of non-radiative recombination, especially in the region of an active layer, especially a μ-LED, is proposed. The vertical μ-LED comprises a layer stack, in which layers extending along an X-Y plane are stacked together along a Z-axis perpendicular to the X-Y plane, whereby a main direction of movement of charge carriers along the Z-axis, and in particular this axis runs centrally through X-Y cross-sectional areas of the layer stack. The method comprises the step of generating magnetic field lines by means of which the charge carriers are kept away from edge regions of X-Y cross-sectional surfaces of the layer stack.

By means of the proposed arrangement, magnetic effects are used to influence effectively the lateral distribution of a current flow within a μ-LED. This is intended to keep charge carriers (i.e. electrons or optionally holes as well) away from an edge region of the active layer. Thus, a kind of electron lens is realized. In this way, a scalability to smaller chip sizes can be achieved. Non-radiative recombination at the chip edges are thus reduced.

According to a further embodiment, the magnetizing element can provide the magnetic field lines in the region of an active layer and/or against the main direction of motion of the charge carriers in a region in front of the active layer running towards a pole of a magnetic dipole or along the Z-axis. It is useful to arrange the magnetization element in such a way that it provides magnetic field lines only in the edge regions of the X-Y cross-sectional areas of the layer stack.

In an embodiment, the magnetizing element comprises a number of, in particular strip-shaped, current lines running along a lateral surface of the stack of layers, with a current flow of one current line in each case being provided anti-parallel to the current flow through the optoelectronic component. Alternatively, the magnetizing element can be provided by means of a number of permanent magnet dipoles, which circulate around the layer stack along an X-Y plane, in particular arranged in the region of the active layer and/or against the main direction of movement of the charge carriers in a region in front of the active layer. Instead of permanent magnet dipoles, electromagnets can also be used, the current flow of which can be provided in particular by means of the current flow through the optoelectronic component.

In accordance with a further embodiment, the magnetizing element can be in the form of a magnetic material, in particular manganese, which circulates around the layer stack along an X-Y plane in the region of an active layer and/or against the main direction of movement of the charge carriers in a region in front of the active layer, deposited on a lateral surface of the layer stack and magnetized by means of an external magnetic field.

According to a further embodiment, the layer stack can have an electrically insulating and passivating coating, particularly on the outer surface of the layer stack. In this context, the layer stack is a columnar μ-LED. Simplified, it comprises a p-doped layer, an n-doped layer and an active layer arranged in between. The latter can be configured as a quantum well or multiquantum well. Corresponding designs of a μ-LED with further measures are part of this disclosure. It is understood that the layer stack described here or the μ-LED used here can be replaced or supplemented by the embodiments disclosed in this disclosure. For example, the magnetic current constriction can simultaneously exhibit reflective properties so that light cannot escape on the side surface. In one aspect, it is possible to make two opposite side faces reflective and use them to transport current and to place a dielectric mirror on the other two side faces. In another aspect, an outcoupling layer on the surface can have a photonic structure.

Besides the production of a semiconductor and measures to improve light generation, another aspect deals with the direction of light emission. Particularly for μ-displays and also for many area displays a defined radiation characteristic should be achieved. Light generated in a μ-LED should on the one hand not interact with neighbouring μ-LEDs, on the other hand, the light should also be decoupled in order to optimise the light efficiency at a given current intensity. In the following aspects, different measures are presented to improve the radiation characteristics of an optoelectronic device or μ-LED by adding a layer around the active layer or the μ-LED surrounding reflective layers or mirror.

With some μ-LEDs, light is emitted laterally. This effect is often undesirable, because crosstalk to neighbouring pixels can lead to interference or other effects that worsen the visual impression. In addition, the light yield is lower. A Lambertian radiation characteristic of the display is also required for many applications. This means in particular that the display should be equally bright when viewed from all sides. A strong edge emission of the chip results in a non-Lambertian radiation characteristic.

The smallest μ-LED chips can be realized with a vertical design, i.e. with one contact each on the top and bottom side of the chip. In order to connect electrically a vertical μ-LED to a substrate, a so-called "top contact" must be deposited and structured on a second contact of the μ-LED (opposite or above the substrate). A planarization and/or passivation layer is also applied around the chip.

According to a first aspect, a method for manufacturing an array with at least one light-emitting body is proposed. The light-emitting body can be, among others, a μ-LED, one of the μ-rod already presented here, a μ-LED column or another component whose light also emerges laterally with a component parallel to the active layer. In the process, a first contact region and a second contact region are structured on one side of a substrate. The light-emitting body is also applied to the structure or produced there by structuring from several semiconductor layers.

Then a first metal mirror layer and a second metal mirror layer are applied, wherein the first metal mirror layer electrically connects a contact layer applied to a second contact of the light-emitting body with the second contact region and the second metal mirror layer is formed on a reflector structure arranged on the substrate. The reflector structure can be obtained from a planarization layer with subsequent structuring. In some aspects, the reflector structure frames the light-emitting body at a distance. In other aspects, part of the planarization layer can be structured so that it surrounds the light-emitting body.

An optoelectronic component comprises a light-emitting body electrically contacted, in particular by means of a first metal mirror layer, and a micro-reflector structure, in particular surrounding it, coated with a second metal mirror layer.

According to a second aspect, an array with at least one light emitting body is proposed, where on one side of a substrate a first contact of a vertical light emitting body is connected to a first contact area. On the same side of the substrate, a second contact of the vertical light-emitting body facing away from the substrate is connected to a second contact region by means of a, in particular semi-transparent, contact layer and a first metal mirror layer. In addition, a reflector structure is formed which has a second metal mirror layer on its side flanks and which surrounds the light-emitting body at a distance. The reflector structure includes reflective sidewalls in some aspects. These can run at an angle to deflect the light. In other aspects, the sidewall can also be non-linear, for example, square or parabolic.

The processing of a second contact or a top contact can be used to produce optical outcoupling structures on the substrate in a single step. A top contact here is formed in particular by a second contact of the light-emitting body, a contact layer, a first metal mirror layer and a second contact region. Here, the contact layer attached to the second contact of the light-emitting body is electrically connected to the second contact region by means of the first metal mirror layer.

An optical outcoupling structure is formed here by means of a reflector structure, in particular a micro-reflector structure, which is coated by means of a second metal mirror layer.

To establish a top contact, the light-emitting bodies are first embedded in a planarization layer. This can be opened photolithographically at the second contact area for the second contact or for the top contact (upper contact) on the substrate. This structuring process is used to form structures for reflectors, especially μ-reflectors, on the substrate from the planarization layer in the same step. After deposition of a transparent contact layer, a structured application of a metal mirror layer can be performed as a metal bridge between the second contact and the second contact area.

This is necessary because the contact layer is not suitable for bridging large differences in height. This metallization process can be used to mirror simultaneously reflector structures.

This makes the production of displays more cost-effective and faster, as conventional separate lithography processes for forming reflectors are no longer required. By providing reflectors from a planarization layer with a top contact metal mirror layer, efficiency and contrast can be increased and the radiation characteristics of the display improved without additional processing effort.

Some other aspects are mainly concerned with the arrangement and contacting of vertical μ-LEDs with a transparent and electrical cover layer. One of the aims is to improve the display properties when the number of pixels per unit area is high. Due to the spatial position of the electrical contact of a vertical μ-LED on the upper side facing away from the carrier substrate, the use of a transparent or at least partially transparent conductive material is considered, as already explained in this application. Known materials for this purpose are, for example, materials such as ITO (indium tin oxide), a transparent or partially transparent semiconducting mixed oxide for visible light, but this material has a relatively high surface resistance.

Therefore, a pixel element in the form of one or more μ-LEDs is proposed to generate a pixel of a display, which has a flat carrier substrate. A carrier substrate can be understood here as a backplane or carrier surface that provides a mechanically stabilizing holding function and additionally a supply of electrical connections for μ-LEDs. Possible materials for the carrier substrate can be insulating compounds, but also semiconductors such as silicon or III-V semiconductor materials. According to an example, the carrier substrate is designed to be flexible or bendable.

At least one μ-LED is arranged on the carrier substrate and designed to emit light transverse to a carrier substrate plane in a direction away from the carrier substrate. The at least one μ-LED can be attached to the carrier substrate, for example by gluing, fusing or as a result of an epitaxial layer process. The μ-LED is configured as a so-called vertical chip, with at least one contact in a spatial region of the μ-LED remote from the carrier substrate. The at least one μ-LED thus has an electrical contact on its upper side facing away from the carrier substrate. An upper side is to be understood here as a lateral surface or an area of an outer surface of the μ-LED where at least a part of the upper side is directed parallel to the carrier substrate plane.

Embodiment of the vertical μ-LEDs are mentioned here. These include, but are not limited to, the above-mentioned pairs of bars with converter material arranged in between, the upright or horizontally aligned μ-rods or even the antenna structure. Quantum well intermixing may be provided to prevent carriers from an edge or border of the active layer.

The electrical contact can, for example, be a metallic or generally electrically conductive surface. The idea here is that this surface should come into contact with a layer above it relative to the carrier substrate plane. The pixel element has an at least partially electrically conductive flat contact layer on the upper side of the emitter chip. This is electrically connected to the electrical contact of the emitter chip.

In other words, for example, an additional layer can be processed over the at least one μ-LED that comes into direct contact with the electrical contact of the at least one μ-LED. For example, this two-dimensional contacting layer can extend in one piece over a plurality of μ-LEDs and pixel elements. According to an example, this contacting layer forms a common cathode or a common anode. According to an example, the thickness of this contacting layer is between 80 and 150 nm.

The flat contacting layer is at least partially transparent for the light emitted by the at least one μ-LED. This means that light emitted by the at least one μ-LED can at least partially pass through the contacting layer. The known ITO materials can be used for this purpose, for example. A conductor track is provided on the contacting layer, which is electrically connected to the contacting layer over its entire surface. The electrical conductivity of the conductor track is greater than the electrical conductivity of the contacting layer. The conductor track can be designed, for example, planar or as a flat surface or strip.

The material of the conductor track is selected so that it has better electrical conduction properties than, for example, the ITO material. In other words, the conductor path is intended to bridge less conductive spatial regions of the contacting layer and thus cause an overall reduced electrical resistance across the contacting layer, also known as improved transverse conductivity. For this purpose, the conductor track should be connected to the contacting layer at at least two points remote from each other in order to reduce a total resistance of the arrangement of conductor track and contacting layer between these two points due to the increased conductivity of the conductor track.

For example, a conductor track can be understood as a bus bar, distribution bar or similar electrically conductive structure. According to an example, the conductor track is designed as a spatially delimited structure as part of the contacting layer itself. This can mean, for example, that within the contacting layer there are areas with different structures or with a modified combination of materials or substances, which have an improved electrical conductivity. A material of the conductor track can, for example, contain silver, aluminum, gold, chrome or nickel-vanadium.

According to an example, the contacting layer can be located in a gap between two adjacent μ-LEDs. In other words, the structure and arrangement of the μ-LEDs between the respective μ-LEDs results in gaps, which can be advantageously provided for accommodating the contacting layer. According to an example, the electrical contact of the at least one μ-LED is arranged on a lateral surface of the at least one μ-LED. In other words, the contacting layer contacts the contact of the at least one μ-LED for example in the area of the gap between two μ-LEDs.

In one aspect, the conductor path between two μ-LEDs arranged adjacent to each other on the carrier substrate is located outside a primary radiation range of the μ-LEDs. The consideration here is that the μ-LED, due to its structure, emits a large proportion of the light at right angles to the carrier substrate plane and away from this carrier substrate plane. It may be desirable that a high proportion of the light is emitted as vertically as possible, i.e. with a conical or ideally Lambertian radiation characteristic.

As a result, there is a need to suppress unwanted light outside this advantageous primary beam area to avoid cross-talk, crosstalk and unwanted reflections. For this reason, the mostly light-transparent tracks should not shade or restrict this primary beam area and are therefore advantageously positioned outside this primary beam area or beam corridor. This can be achieved in particular by creating a suitable spatial region for this purpose through the spaces between the μ-LEDs.

In one aspect, the track is designed to absorb and/or reflect light components of the light emitted by the at least one μ-LED outside of the primary emission range in order to shape the beam of the at least one μ-LED. In other words, this means that in addition to the function of improved electrical conductivity, an absorption function or reflection function of the conductive path with respect to the light emitted by the μ-LED can also be used.

The conductor path is thus deliberately placed in an area around the primary beam area of the at least one μ-LED, so that a beam-shaping effect is achieved. For example, the conductor path can be designed as a ring-shaped flat conductor structure running around an area of the at least one μ-LED. If three μ-LEDs are used as sub-pixels, each forming one pixel, the conductor structure can run around each pixel. According to another example, beam shaping can be achieved by providing a breakthrough in the conductor path through which the emitted light can pass.

In order to achieve improved absorption of unwanted light components outside a primary emission range of a μ-LED, the conductor path comprises according to an aspect a light-absorbing layer on its side facing the carrier substrate. This can be, according to an example, a separately applied layer of an absorbing material, but can also be implemented by surface structures on the conductor track.

In one aspect, the conductor path extends over a large area with a large number of μ-LEDs. In addition, recesses are provided on the conductor track in the area of the respective primary radiation areas of the μ-LEDs to pass through the light emitted by the respective μ-LEDs. These recesses can be, for example, breakthroughs, holes, gaps or similar structures through which the light emitted by the μ-LED can pass. In other words, the track can be provided as a continuous layer or as a continuous element. This can, among other things, advantageously permit more complex forms of apertures or recesses for beam shaping.

In one aspect, the conductor track is deposited to one side of the contacting layer facing away from the carrier substrate. In other words, the conductor path is located on a top side of the contacting layer, for example as an element that is sequentially applied subsequently during the manufacturing process. In another aspect, the conductor track is deposited to a side of the contacting layer facing the carrier substrate. In other words, the track is under an ITO bonding layer when viewed from the carrier substrate.

According to another aspect, the conductor track is applied to the carrier substrate. The adjacent arrangement of several μ-LEDs to each other results in corresponding gaps. These gaps can reach down to a height or level of the carrier substrate itself. It is conceivable here that a planarization layer is not continuous, but is recessed in the area of this gap. A manufacturing advantage can be that the conductor path is produced directly on the carrier substrate and the contacting layer is applied vertically above it.

According to an aspect, the at least one μ-LED is located in a cavity of the carrier substrate and the conductor track is located outside the cavity. The carrier substrate can thus be understood as a structured surface, for example, which is not continuously flat or planar, but comprises depressions. The μ-LEDs are placed in these recesses or pits, whereby sidewalls of these recesses can be used as a reflection surface for beam shaping. In order to avoid shading and absorption, one or more conductive tracks are placed outside the depression.

According to an aspect, a connecting element is provided on the pixel element for the electrical connection of the contacting layer with a terminal element of the carrier substrate. The consideration here can be seen in the fact that a contacting layer arranged above the carrier substrate forms, for example, a common anode or a common cathode and must therefore be electrically connected. This can be achieved by a connection element being attached electrically conductively with one end to the contacting layer and with another end to a conductor structure of the carrier substrate. This connection element can, for example, be arranged on an outer edge area of one or more pixel elements.

Another aspect deals with the production of one or more pixel elements for a display. In a first step, a flat carrier substrate is provided and a large number of light-emitting components are manufactured on it. The components can be produced with common methods by depositing, doping and structuring different semiconductor layers. Typical material systems are based on GaN, including for example GaN, GaNP, GaNInP, GaNAlP and others. The large number of light-emitting devices have a main radiation direction that points away from the carrier substrate. In addition, an electrical contact is provided on the surface of each of the plurality of light-emitting devices facing away from the carrier substrate. Furthermore, an at least partially electrically conductive flat contacting layer is deposited, which is electrically connected to the electrical contacts of the plurality of light-emitting components. The contacting layer can extend in one aspect over the carrier substrate and cover the components. The contacting layer is at least partially transparent to the light emitted by the semiconductor components during operation. At least one conductor track is provided on the contacting layer, which is electrically connected to the contacting layer and is connected flat to the contacting layer. Here the electrical conductivity of the conductor track is greater than an electrical conductivity of the contacting layer.

The aspects presented above for a reflective layer or mirror can also be applied to other designs of μ-LED realizations, for example to the vertical μ-LEDs with circumferential structure. Various designs based on vertical or horizontal μ-LED architectures are suitable for the production of μ-LED displays. Short switching times combined with sufficient current carrying capacity are of particular importance. At the same time, the light emitted should be as collimated as possible.

When horizontal μ-LEDs are used, both the anode and cathode contacts are usually realized by means of separate metallic lead wires, both contacts are located on the underside of the chip. For both the cathode and the anode, the metallic leads are led to each pixel. When vertical μ-LED chips are used, the anode contact on the underside of the chip is realized by separate metallic leads, while the cathode contact on the top of each chip is realized by a common cathode. In both cases, the supply lines should be as short as possible to keep parasitic capacitances low.

As already explained, the μ-LEDs are manufactured either monolithically or individually and then further processed on a substrate. The backplane (in case of a backplane assembly; in case of a monolithic assembly, the backplane can also serve as a substrate or the growth substrate is replaced by the backplane) contains the control electronics. A distinction is made between passive matrix backplanes with IC circuits and active matrix backplanes with TFT circuits. In passive matrix backplanes with IC circuits for driving the LED, the cathode and anode leads are usually routed directly to the pixels or in subpixels. The pixels or subpixels are controlled by the micro-integrated circuits.

In the realization of active matrix backplanes, the individual pixels are controlled by integrated TFT circuits (TFT=Thin Film Transistor).

An arrangement is now proposed in which the supply lines can be kept short in order to achieve high switching times. In addition, a common cathode or anode connection is realized. This arrangement is particularly suitable for generating pixels for a μ-display module, which in turn can be individually addressed and controlled. The setup can be supplemented with additional measures, such as the above-mentioned circumferential mirror structures. This also reduces optical crosstalk into adjacent pixels in some aspects.

According to a first aspect, a device with a substrate and a μ-LED die fixed to one side of the substrate is proposed. The chip comprises an electrical contact on a side facing away from the substrate, which is electrically connected to an electrical control contact by means of a mirror coating, whereby the mirror coating at least partially covers the substrate surface facing the die.

The mirroring therefore has two functions. On the one hand, it serves to deflect light in the direction of radiation, on the other hand, it transports the current. By means of the common cover contact or the common cover electrode, fast-switching times for μ-displays can be realized. This enables the provision of pulse width modulation dimming concepts, especially for μ-proving panel efficiency in combination with an improvement of optical parameters, such as the angle dependence of an emission and the contrast.

In a method of manufacturing such an arrangement, a substrate with a number of contacts is first provided on the surface and a μ-LED die is attached to one of these contacts. The attachment can use conventional transfer and attachment techniques, some of which are also presented in this disclosure. The μ-LED die is configured as a vertical die and also includes a contact on one of the substrate surfaces. A reflective layer is formed on the substrate surface, which is electrically connected to an electrical control contact on the surface of the substrate and covers the surface at least partially. In a last step, a transparent cover electrode is formed on the further contact, which electrically contacts the mirror coating.

In addition, the use of a mirror coating to expand the current, improve the current carrying capacity and switching times can also be implemented in combination with cavity structures. Such cavities can then also be used to improve decoupling efficiency, the angle dependence of emissions and contrast. For this purpose, some aspects of the substrate include an elevation surrounding the μ-LED die. Alternatively, instead of an elevation, a cavity can be provided in the substrate surface in which the μ-LED die is located. In addition to one μ-LED die, three μ-LED die can be surrounded or arranged so that they form a single pixel as subpixels.

In both cases, optionally bevelled side surfaces of the cavity or the elevation are provided with the mirror coating. This structure is similar to the one mentioned above. The angle of these side surfaces with the substrate surface can have different values depending on the desired characteristics. In particular, it can also change so that the side flanks show a parabolic or other non-linear course. In some aspects, the circumferential mirror structure disclosed in this application can be used. The height of the elevation or the depth of the cavity is chosen so that the μ-LED die is flush with the top of the elevation or cavity. This allows the cover electrode to terminate. This is particularly useful, if the mirror coating is arranged on the top side so that the cover electrode rests on the mirror coating.

In some aspects, a gap between μ-LED die or the region within an elevation or a cavity is filled with a transparent insulation layer, which thus surrounds the dies. The transparent insulation layer closes especially at the level of the remote contact of the die, so that the cover electrode rests on the insulating material.

In some aspects, the mirror surface arranged on the substrate surface and possibly surrounding structure surrounds not only one but a large number of dies. These can be designed as redundant chips, so that if one chip fails, the other one can take over the function. A more uniform radiation is generated by a circumferentially arranged mirror surface. Several dies can also be arranged within the circumferential mirror surface to generate light of different wavelengths. A circumferential mirror surface can separate different pixels from each other so that optical crosstalk between pixels is reduced.

The mirror coating is connected in series with the cover electrode and the control contact of the substrate and comprises a highly reflective material, in particular of Al, Ag, AgPdCu, Nd, Nb, La, Au, Cu, Pd, Pt, Mg, Mo, Cr, Ni, Os, Sn, Zn as well as alloys or combinations thereof. These others also effectively increase the current. The cover electrode may comprise a transparent electrically conductive oxide layer, in particular a material made of ITO, IGZO. Further examples of cover electrode material can be transparent conductive oxides, such as metal oxides, zinc oxide, tin oxide, cadmium oxide, indium-doped tin oxide (ITO), aluminum-doped tin oxide (AZO), $Zn_2SnO_4$, $CdSnO_3$, $ZnSnO_3$, $In_4Sn_3O_{12}$ or mixtures of different transparent conductive oxides.

The transparent insulating layer may include SiO or other insulating transparent materials mentioned here.

According to a further embodiment, the direct electrical contact of the cover electrode with the mirror coating can be created by means of a contacting overlap of a cover electrode surface and a mirror coating surface, especially on the surface of the elevation or at one end of a recess or cavity. In this way, a reliable low-impedance contact can also be provided. Particularly in the case of several such cavities or elevations arranged in series, the cover electrode can rest on several mirror coatings. This allows the current to be applied to the cover electrode over a large area and at several positions.

In some aspects, the mirror layer runs along the surface of the substrate and especially partly around the μ-LED die(s). This increases the reflection over a large area, including the substrate surface.

In order to ensure contact, a direct electrical contact of the cover electrode with the mirror coating is provided by a through-hole plating or a via of the mirror coating material through a planarization and/or insulation layer. Additional process steps for realizing a metallic contact between the conductive oxide of the cover electrode and the contact areas on the backplane/substrate are not necessary. A simple bridge can be created from, for example, the ITO cover contact to the CrAl contact area for ACF bonding. This can lead to further cost savings. This via can be realized as openings. In other designs, however, a trench or other structure can be provided in the transparent insulation layer, the inner walls of which are filled with a conductive reflective layer for contacting. This creates a good electrical contact on the one hand and a reflective structure on the other hand and in addition to good light reflection, optical crosstalk is reduced in some areas.

In some cases, the isolation layer at the edge of a pixel is bevelled and the reflective layer is exposed. The cover electrode extends along this sloped surface and thus contacts the reflective layer. In this way, a compact design can be provided. The flanks or inner walls of the opening have an angle depending on the desired radiation characteristics. These can correspond to those revealed here. In this way, further material breakage at transition edges can be avoided.

Another aspect deals with the production of a pixel or μ-LED module, which comprises a plurality of these μ-LED dies arranged in rows and columns. Each pixel can be embedded in a cavity or surrounded by a raised area. The cover electrode can thus be used as a common connection for a plurality of such μ-LED dies. Decoupling structures can also be provided on the cover electrode. The photonic structures disclosed herein are particularly suitable for further collimation of light. Converters can also be attached to the cover electrode. In this way, a μ-LED die type can be used which, for example, generates blue light in order to convert it by means of the converter layer. In this case, further reflective structures can be built on the cover electrode to avoid optical crosstalk into another pixel. In addition, photonic structures that collimate the converted light are also conceivable here again.

Nano light emitting diode arrays applied in a matrix arrangement and vertically layered nanopillars or nano rods are already described in this disclosure in connection with the stimulated emission in the slotted antenna structure. A characteristic of nanopillars is their high aspect ratio, i.e. their height compared to their footprint, which is typically in the range of 1 $\mu m^2$ and smaller.

Compared to light emitting diodes with planar-extended semiconductor layer stacks, the quasi one-dimensionality of a nanopillar and the resulting reduced requirement for lattice matching offers the advantage of a more flexible material composition for the formation of the active layer. This results in an improved spectral adjustability of the light emission, which can additionally be influenced by the targeted incorporation of strains and the determination of the expansion of the active layer. This result in the possibility of the stimulated emission described above. However, columns for the emission of different colored light can also be created with different material systems and/or tensions or doping.

Depending on the manufacturing variant, nanopillars are produced starting from a planar semiconductor layer system with layers that comprise a different conductivity type (n- or p-doping). An active layer in the semiconductor layer system typically comprises a quantum well structure. By means of photolithographic techniques, a structuring is then carried out which extends at least into the depth of the active layer and which serves to work out nanopillars with a laterally bounded disc-shaped active zone from the planar semiconductor layer system.

A second manufacturing variant for a nano-luminescent diode device is achieved by epitaxial growth of nano-layer structures in the form of upright nanocolumns of III-V semiconductors, in particular (AlxInyGa1−x−y)N, starting from a structured n-gallium nitride layer on a carrier substrate, such as $Al_2O_3$, SiC or ZnO. The nanopillars have a core-shell structure with an elongated core, an active layer covering the core and a shell layer with a charge carrier polarity different from the material of the core.

The area between adjacent nanopillars is filled with an insulating material that serves as a base for a transparent contacting layer. Alternatively, the upper contact layer can form bridge structures spanning air-filled sections between the nanopillars.

The starting point of the following considerations for improving a nano-light emitting diode array is an array comprising a carrier substrate and a nanopillar at least indirectly connected to the carrier substrate and pointing in a longitudinal direction from the latter. Preferably, a matrix arrangement with several nanopillars is present on the carrier substrate. Each nanopillar comprises a semiconductor sequence with at least one active layer, which generates electromagnetic radiation and is arranged in such a way that at least part of the radiation emission is transverse to the longitudinal direction. According to the proposed concept, a reflector device is arranged on the carrier substrate laterally to the nanopillar, which deflects the radiation emission transversely to the longitudinal direction at least partially into a main radiation direction running parallel to the longitudinal direction. This reduces the radiation angle of the nano light emitting diode arrangement and, due to the precollimation achieved, facilitates beam coupling into optical components following in the beam path.

For advantageous embodiment, the reflector device comprises a first reflective optical element and a second reflective optical element arranged on different sides of an associated nanopillar. It is also advantageous to provide a reflector device between each two adjacent nanopillars.

The nanopillar emitting electromagnetic radiation can be part of a pixel for a lighting or display device. For a possible design, each pixel comprises a single nanopillar and a reflector device associated with and surrounding it. For a further embodiment, a pixel comprises several nanopillars according to some aspects, whereby the reflector device associated with the pixel may surround the nanopillars of the pixel. For a design alternative, there are multiple reflector devices within a pixel, wherein a separate reflector device is provided for each of the nanopillars of the pixel.

A pixel can be designed for spectral adaptability of light emission, for example as an RGB pixel. For designs with several nanopillars per pixel, they can be designed for different colors. It is conceivable either to adapt the active layer of the respective nanopillar or to adjust the color by locally embedding the nanopillars in different light conversion materials. Furthermore, the n- and/or the p-contacts are structured so that a pixel and/or parts of a pixel, in particular individual nanopillars or groups of nanopillars, can be individually energized.

For an embodiment, the nano light emitting diode array has a molded layer that is monolithically formed with a layer of the semiconductor sequence of the nano column. These layers can be one-piece and result from a common manufacturing process or from successive manufacturing steps with the same substrate.

To improve the degree of reflection, the reflector device has a metallic reflective layer and/or a Bragg mirror in some aspects. In other aspects, the embodiment features a Fresnel lens arrangement incorporated into the reflector device to improve the collimation effect further. Furthermore, a wavelength conversion element is arranged for further shaping in the beam path between the nanopillar and the reflector device, wherein a first wavelength conversion element associated with a first nanopillar is arranged for emitting electromagnetic radiation, which is spectrally different from the emission of a second wavelength conversion element associated with a second nanopillar. For an embodiment alternative of the nano-luminous diode arrangement, at least some of the nanopillars have a lateral direction in which no reflector device is arranged. Instead, an optical separating element may be provided in this direction between adjacent nanopillars.

The method of manufacturing a nano light emitting diode device according to these principles comprises a photolithographic patterning of at least one shaped layer of the reflector device and/or a layer of the semiconductor sequence of the nano column. Furthermore, a structuring of the reflector device with an anisotropic etching process is provided as well as the application of an etch stop layer to form the nanopillar with a high aspect ratio. For a further preferred manufacturing process, the form layer of the reflector device and/or a layer of the semiconductor sequence of the nanopillar is epitaxially grown. A further manufacturing alternative is offered by a nano stamping process.

As already mentioned several times, the light emerging from the sidewalls is deflected by a reflector layer to reduce light loss. In another approach a reflective interface is proposed, which is placed directly on the lateral surface of the optoelectronic device. Accordingly, this approach can be realized in monolithic structures as well as in single optoelectronic devices. This approach can also be applied to a μ-LED nanopillar or a semiconductor layer stack, as proposed for example in the antenna structure.

In one aspect, an optoelectronic device comprises at least one optoelectronic light source based on semiconductor materials, in particular in the form of a μ-LED, which has an active zone for generating light, a light exit surface for the generated light being formed on an upper side of the light source, the light source having, in addition to the upper side, at least one further boundary surface which delimits the light source on the side and/or downwards, and a dielectric reflector which is configured to reflect the generated light being arranged at the boundary surface.

In contrast to or in addition to the other measures of a reflecting mirror, here a dielectric reflector is applied directly to the interface. Without the dielectric reflector, light generated in the light source could escape sideways and/or downwards and, in particular, enter a material of a carrier of the device surrounding the light source. In contrast, the dielectric reflector at least partially reflects light incident on the interface back into the interior of the light source. The use of the dielectric reflector can thus at least partially prevent light escaping sideways and/or downwards from the light source. Ideally, the reflected light escapes through the light exit surface, for example after further reflections. The light yield can thus be increased by the dielectric reflector. At the same time, the component is very small.

The interface may have a lateral surface circumferentially surrounding the light source and a lower surface of the light source, the lower surface being opposite the upper surface. The dielectric reflector can be arranged exclusively on the side surface or exclusively on the bottom surface. Alternatively, the dielectric reflector can be arranged on the side surface as well as on the bottom. Therefore, with the exception of the top surface, the dielectric reflector can be arranged on the entire boundary surface bounding the light source. The dielectric reflector can therefore surround the entire light source—with the exception of the top side—, which allows a relatively large increase in light yield.

The dielectric reflector can comprise a sequence, in particular periodic or non-periodic, of a number of material layers lying one above the other, at least two directly successive material layers having different refractive indices. In particular, the dielectric reflector can consist of a periodic sequence of two alternating dielectric material layers, which have different refractive indices. The thickness of the material layers can be adapted to a wavelength of the light emitted by the light source to achieve the highest possible reflection.

A non-periodic sequence of material layers can, at least in some embodiments, create a comparable mirror effect with thinner layers—compared to a periodic layer sequence. In particular, the dielectric reflector can be adapted as a Bragg mirror. Bragg mirrors are known per se. They are also known as distributed Bragg reflectors, abbreviated DBR.

A Bragg mirror can be formed by a periodic arrangement of two alternating thin layers of material with different refractive indices. Usually the layers consist of dielectrics based on semiconductor materials. At an interface between two layers of material, part of the incident light is reflected according to the so-called Fresnel formulas. A constructive interference between the reflected beams is formed when the wavelength is close to four times the optical wavelength in the respective material layer.

The wavelength range in which the reflection of Bragg mirrors is very high, especially with vertically incident light, and can at least theoretically reach 100% with a very high number of alternating layers, is called stop band. Light whose wavelength lies within the stop band of a Bragg mirror is reflected at least to a high degree and ideally cannot propagate through the Bragg mirror.

The reflector designed as a Bragg mirror is therefore preferably designed so that the wavelength of the light emitted by the light source lies within the stop band, especially in its center. The material layers of the Bragg reflector are then matched in thickness to the wavelength of the emitted light. The optical thickness of the layers is preferably a quarter of the wavelength of the emitted light. The optical thickness corresponds to the product of layer thickness and optical refractive index.

Some aspects of this concept also apply to an optoelectronic arrangement such as a display array or monolithic array or a headlamp such as a matrix headlamp, the optoelectronic arrangement comprising a plurality of the proposed optoelectronic devices, the light sources of the optoelectronic devices being arrayed. Each light source can form one pixel of the display order or monolithic array. It may be provided that each light source emits light in one of a number of predetermined colors, for example red, green and blue. Each light source can form a sub-pixel of a pixel, where a pixel is formed by several light sources, each of which emits light in one of the colors.

The light sources of optoelectronic devices may be embedded in a carrier, in particular in such a way that only the light exit surfaces of the light sources constitute free external surfaces, while a respective interface of the light sources is surrounded by carrier material. The dielectric reflector of an optoelectronic device may be located between the interface of the light source and the carrier material. For example, the substrate may comprise one or more layers of semiconductor materials. The layers may include electrical conductors, for example in the form of one or more layers of conductive tracks. Electronic circuits may also be present to supply or control the light sources. For example, the conductors can be used to supply the light sources with electrical power.

Further aspects of the concept presented also relate to a method of manufacturing an optoelectronic device, in particular a display device or headlamp, in which an optoelectronic light source based on semiconductor materials is provided, wherein the light source has an active zone for generating light and, on an upper side, a light exit surface for the generated light, and wherein a dielectric reflector is arranged at at least one interface of the light source, which is configured to reflect the generated light, and wherein the interface limits the light source to the side and/or downwards.

The interface may form the remaining outer surface of the light source with the exception of the upper surface. The reflector may cover all or part of the interface.

Likewise, a method of manufacturing an optoelectronic device, such as a display arrangement or a headlight arrangement, shall be presented. In some aspects, in the method, the light sources of a plurality of optoelectronic devices of the invention are arrayed and embedded in a carrier in such a way that only the light exit surfaces of the light sources are free external surfaces, while material of the carrier surrounds the interfaces of the light sources. A dielectric reflector can be arranged between the material of the carrier and a respective interface of a light source. This step can be done before a light source is embedded in the substrate.

The proposed concept also concerns a method of manufacturing an optoelectronic arrangement, for example a monolithic array or a headlamp, in particular with a large number of the proposed optoelectronic devices or μ-LEDs. In the method, a plurality of optoelectronic light sources based on semiconductor materials are formed in an array on a carrier in such a way that each light source has an active zone for generating light and a free, outer upper side as a light exit surface for the light, and wherein for each light source a dielectric reflector is arranged at at least one boundary surface which delimits the light source laterally and/or downwardly with respect to a material of the carrier, which dielectric reflector is configured to reflect the generated light.

The arrangement of the dielectric reflector may include the application of material for the dielectric reflector by means of atomic layer deposition. The materials for forming the dielectric reflector can be deposited in extremely thin layers. Layer thicknesses corresponding to atomic monolayers can be realized. This makes it possible to deposit layers with precisely defined thicknesses even on non-planar (e.g. curved) surfaces. Atomic layer deposition is a simple way to produce a reflector, in particular a Bragg mirror.

As material for the dielectric layers of the reflector with high refractive index can be used for example $Nb_2O_5$, $TiO_2$, $ZrO_2$, $HfO_2$, $Al_2O_3$, $Ta_2O_5$ or ZnO. For the dielectric layers with low refractive index, $SiO_2$, SiN, SiON or $MgF_2$ can be used.

The placement of the dielectric reflector may include placing the material for at least one layer of the dielectric reflector by a first method and placing the material for the other layers by a second method. In particular, a layer directly adjacent to the interface of a light source can be arranged by means of the first method. The first method can be, for example, a vapour phase deposition method, such as in particular CVD (for chemical vapour deposition) or PE-CVD (for plasma-enhanced chemical vapour deposition). This allows unevenness at the interface, for example a rough surface resulting from an etching process, to be covered by a more conformal deposition. The other layers of the dielectric mirror can then be created on a smooth surface.

The second process may be atomic layer deposition. In this way layers for the dielectric reflector with defined thicknesses can be formed.

Another aspect also concerns a process for the manufacture of an optoelectronic arrangement or in which method optoelectronic light sources based on semiconductor materials are arranged in an array on a carrier in such a way that each light source has an active zone for generating light and, on the upper side, a free, externally located upper side as a light exit surface for the light, the light sources being arranged in such a way that there is at least a slight gap between adjacent light sources on the upper side with an intermediate space behind it, wherein for each light source at least one light exit surface is located on the carrier, the light source is arranged in relation to a boundary surface bounding material of the support to the side and/or downwards, a dielectric reflector is arranged which is configured to reflect the light generated in the light source, and wherein the dielectric reflectors of the light sources are formed by introducing, for example by means of atomic layer deposition, material for the dielectric reflectors from the top side into the respective gap between adjacent light sources and the dielectric reflectors are formed in the respective gap located behind a gap.

At least the light exit surfaces of the light sources can be covered, especially with a photomask, while the dielectric reflectors are formed in the gaps. The photomask can be removed after finishing the reflectors. The headlamp mentioned as an example can be a matrix headlamp. Accordingly, the headlamp arrangement can be a matrix headlamp arrangement.

A further aspect is concerned with improving the radiation characteristics of a μ-LED, which is a dielectric filter with additional reflecting sides. An optoelectronic device, in particular a μ-LED according to a first aspect of the present disclosure, comprises at least a semiconductor element, a dielectric filter and a reflective material. Furthermore, the optoelectronic device may contain components, for example the components described in this disclosure.

The at least one semiconductor element contains an active region designed to generate light. It can be configured in particular as a vertical or horizontal μ-LED. Measures like quantum well intermixing and similar are possible to increase the efficiency of the device. Furthermore the at least one semiconductor element comprises a first main surface, a second main surface opposite to the first main surface and at least one side surface extending between the two main surfaces. For example, the at least one semiconductor element may have three or four or more side surfaces. However, it is also possible that the at least one semiconductor element has round main surfaces and therefore has only one side surface.

The dielectric filter is located above the first main surface of the at least one semiconductor element and is configured to transmit only light entering the dielectric filter in predetermined directions.

For example, the dielectric filter can be designed in such a way that it only transmits light in a given angular cone. The angle cone is aligned with its axis perpendicular to the first main surface of the at least one semiconductor element. The angle between the surface or surface lines of the cone and the axis of the cone, i.e. half the opening angle of the cone, can have a predetermined value. For example, the half aperture angle of the cone may be maximum 5° or maximum 15° or maximum 30° or maximum 60°. Light components entering the dielectric filter from the semiconductor element at an angle within the predetermined angle cone are transmitted, the remaining light components are substantially not transmitted and, for example, reflected back into the semiconductor element. This enables a high directionality of the light emitted by the optoelectronic device.

The dielectric filter may be designed such that the angle cone has a very small aperture angle, which means that substantially only light exiting the semiconductor element perpendicular to the first main surface is transmitted by the dielectric filter.

The dielectric filter can be formed by a stack of dielectric layers, which are applied to the semiconductor element by coating and in particular have a high transmission. For example, the dielectric layers in the stack may alternately have a low and a high refractive index. As material for the dielectric layers with high refractive index, for example $Nb_2O_5$, $TiO_2$, $ZrO_2$, $HfO_2$, $Al_2O_3$, $Ta_2O_5$ or ZnO can be used. For the dielectric layers with low refractive index $SiO_2$, SiN, SiON or $MgF_2$ can be used. The stack of dielectric layers with alternating high and low refractive index can be configured as a Bragg filter. Furthermore, the dielectric filter can be a photonic crystal.

The reflective material is deposited on the side surface(s) of the at least one semiconductor element and the dielectric filter. It may be provided that the reflective material covers at least one or more or all of the side faces of the at least one semiconductor element. In the same way, the reflective material may cover at least one or more or all of the lateral faces of the dielectric filter. In one configuration, the reflective material completely encloses laterally both the at least one semiconductor element and the dielectric filter.

The reflective material may be reflective to the light emitted by the at least one semiconductor element or at least one wavelength range of that light. Consequently, light which emerges through the side faces of the at least one semiconductor element or the dielectric filter is reflected back again, thereby increasing the efficiency of the opto-electronic device.

Several components can also be provided. These in turn comprise one or more semiconductor elements, each of which has the properties described above. A dielectric filter is arranged on each semiconductor element. In addition, the semiconductor elements are surrounded by the reflective material. Additionally or alternatively, several components with their semiconductor elements can also be surrounded by such a mirror. For example, such an embodiment allows redundancy to be provided so that if one semiconductor element fails, a redundant semiconductor element can take over the function. The semiconductor elements can, for example, be arranged in an array, i.e. a regular arrangement.

The optoelectronic component may be contained in a display, i.e. an indicating device. Each of the semiconductor elements can represent one pixel of the display. In addition, each of the semiconductor elements can represent a sub-pixel of a pixel, each pixel being formed by several sub-pixels emitting, for example, light with the colors red, green and blue.

The reflective material surrounding the individual semi-conductor elements and the respective dielectric filters on each side achieves a high contrast between adjacent pixels. A high pixel density is also possible. According to an embodiment, the semiconductor elements are designed as μ-LEDs. A μ-LED has small lateral expansions in the light emitting plane, especially in the μm range. In contrast to μ-LEDs in a monolithic array, separate μ-LEDs each form a self-contained unit that can be set and operated individually and also at a greater distance from each other. The light emitted by the semiconductor elements can, for example, be light in the visible range, ultraviolet (UV) light and/or infrared (IR) light.

In addition to displays, the optoelectronic component can also be used in AR (augmented reality) applications or in other applications for pixelated arrays or pixelated light sources, for example, according to the first aspect of the disclosure.

According to an embodiment, at least one or more or all side surfaces of the at least one semiconductor element run diagonally at the height of the active zone. This means that at least a part of the respective side face encloses an angle with the first main surface of the at least one semiconductor element which is unequal to 90° and in particular smaller than 90°. The at least one semiconductor element may be bevelled over its entire height or only partially, the active region should in any case be located in the bevelled area. The lateral faces, which are totally or partially tapered, can form an interface with an insulating layer having a low refractive index. Light emitted in the horizontal direction is reflected by the tapered side surfaces towards the component surface.

The at least one semiconductor element may have a first electrical connection and a second electrical connection. For example, one terminal may represent a cathode and the other terminal an anode. Furthermore, the reflective material may be electrically conductive and electrically coupled to the first terminal of the at least one semiconductor element. In particular, the first terminal may be connected to an n-doped region of the at least one semiconductor element. The reflective material thus provides both an optical separation between adjacent pixels and also causes an electrical contact to the at least one semiconductor element.

If several optoelectronic components with a large number of semiconductor elements are provided, the reflective as well as electrically conductive material surrounding the respective semiconductor elements can be interconnected, which makes it possible to drive jointly the first terminals of the semiconductor elements from outside. In this case, the second terminals of the semiconductor elements can be individually controlled, for example, via the underside of the semiconductor elements. Since only one contact with a good resolution has to be defined, this design is advantageous for the production and also facilitates the production of very small pixels where the area would not be sufficient to attach two separate contacts to the underside of the chip. The reflective material can, for example, be or contain a metal and can be electrodeposited.

A reflective layer may be disposed below the second main surface of the at least one semiconductor element. As a result, light emerging through the second main surface is reflected back into the semiconductor element and emerges from the optoelectronic device completely through the top surface. Furthermore, the reflective layer may be electrically conductive and may be coupled to the second terminal of the at least one semiconductor element. For example, the second terminal can be connected to a p-doped region of the at least one semiconductor element. The reflective layer thus serves, in addition to its reflective properties, to create an electrical contact with the at least one semiconductor element. It may be provided that the second terminal of each semiconductor element can be individually controlled.

The same material can, but does not have to be used for the reflective layer as for the reflective material. For example, a metal can be used for the reflective layer.

Alternatively to the embodiment described above, the reflective layer may be electrically insulating and one or more electrically conductive layers may be arranged above and/or below the reflective layer, in particular coupled to the second terminal of the at least one semiconductor element. In this case, the reflecting layer may, for example, be a dielectric mirror and may be arranged in particular over a metal layer. The electrical contact is then made via a feedthrough through the dielectric layer or via a lateral surface of the dielectric layer. Furthermore, an electrically conductive and transparent layer can be arranged above the reflecting layer, i.e. between the at least one semiconductor element and the reflecting layer. The material for the electrically conductive and transparent layer can be indium tin oxide (ITO), for example.

According to an embodiment, a silver mirror is arranged below the electrically conductive and transparent layer, for example of indium tin oxide, and the dielectric mirror. Alternatively, only an electrically conductive and transparent layer, for example of indium tin oxide, and a silver mirror can be arranged below the at least one semiconductor element.

An electrically insulating first material can be arranged between the reflective material and the reflective layer. The electrically insulating first material may also be in direct contact with one or more of the lateral faces of the at least one semiconductor element, in particular with the bevelled part of the lateral faces. Furthermore, the electrically insulating first material may have a lower refractive index than the at least one semiconductor element, in particular than the at least one semiconductor element in the region of the interface with the electrically insulating first material. The electrically insulating first material thus provides electrical insulation between the first and second terminals of the at least one semiconductor element. Furthermore, light can be reflected back at the interface between the at least one semiconductor element and the electrically insulating first material due to the refractive index contrast.

The electrically insulating first material may, for example, consist of $SiO_2$ and be deposited in a deposition process, in particular a gas phase deposition process, for example with TEOS (tetraethylorthosilicate), or another process, for example based on silane, in order to be able to fill high aspect ratios.

Between the at least one semiconductor element and the dielectric filter, i.e. on the first main surface of the at least one semiconductor element, there may be a layer with a roughened surface which is designed to deflect light in other spatial directions or to scatter light. The layer may have a Lambertian radiation characteristic. Furthermore, the layer can be configured in such a way that light components are deflected at angles beyond the limit angle for total reflection, so that in principle all components can be decoupled and do not remain "trapped" in the component.

The layer described above can, for example, consist of a randomly or deterministically structured semiconductor surface. The surface may have a roughened structure with sloping edges, whereby the roughened structure in the case of μ-LEDs has a height of a few 100 nm at most. The roughened structure can be created by etching, for example.

It is still possible not to use the layer described above and instead roughen the first main surface of the at least one semiconductor element. For this purpose, for example, a random or deterministic topology can be etched into the first main surface in order to achieve a Lambertian radiation characteristic in particular. The roughened first main surface of the at least one semiconductor element may have the same properties as the roughened surface of the layer described above.

On the roughened surface of the at least one semiconductor element or the layer arranged above it, a further layer, for example of $SiO_2$, may be deposited which has a different refractive index than the layer below it and also has a flat upper surface. This additional layer enables the application of the dielectric filter due to its flat upper surface and at the same time maintains the functionality of the underlying roughened surface due to the refractive index difference.

The small lateral extension of a pixel of 50 μm or less allows a low height of at least one semiconductor element in the μm-range. In particular, the at least one semiconductor element may have a lateral expansion or edge length of at most 50 μm and/or a height of at most 1 μm to 2 μm.

As described above, a device may contain several optoelectronic components, which may be of the shapes described in this application. Each of the semiconductor elements of a device, together with the associated dielectric filter and the reflective layer disposed beneath the respective semiconductor element, may be completely surrounded laterally by the reflective material. According to an embodiment, the semiconductor elements are arranged in an array with adjacent semiconductor elements separated by the reflecting material. Consequently, the reflective material forms a grating and adjacent semiconductor elements are separated only by the grating.

If the reflective material is also electrically conductive, the first terminals of all semiconductor elements can be connected to a common external terminal via the reflective material. The second terminals of the semiconductor elements can be individually controlled.

According to an alternative design, the several semiconductor elements, each surrounded laterally by the reflective material, are arranged next to each other, with an electrically insulating second material between adjacent semiconductor elements. For example, the electrically insulating second material can be a potting material.

The reflective material can also be electrically conductive in this embodiment. In order to connect the first terminals of the semiconductor elements to a common external terminal, conductive tracks may extend above and/or below and/or within the electrically insulating second material connecting the first terminals of the semiconductor elements to the common external terminal. The second terminals of the semiconductor elements can be driven individually.

A process according to a second aspect of the present application is used to manufacture an optoelectronic device. The method comprises providing at least one semiconductor element having an active region adapted to generate light, and placing a dielectric filter above a first main surface of the at least one semiconductor element. The dielectric filter is adapted to transmit only light in predetermined directions. A reflective material is further deposited on at least one side surface of the at least one semiconductor element and on at least one side surface of the dielectric filter.

The method of manufacturing an optoelectronic device according to the second aspect of the application may have the above-described configurations of the optoelectronic device according to the first aspect of the application.

BRIEF DESCRIPTION OF THE DRAWINGS

In the following section, some of the above-mentioned and summarized aspects are explained in more detail using various explanations and examples.

FIGS. 3B and 3C include a table of preferred applications for μ-LED arrays;

FIG. 86 shows a second embodiment of a proposed array in cross-section with a reflector structure in between;

FIG. 113 shows a first embodiment of a μ-LED arrangement with nanocolumns according to some proposed aspects in a lateral sectional view;

FIG. 114 shows the first embodiment of the arrangement of the previous figure in plan view;

FIGS. 115A to 115H show various aspects of making the first embodiment of the arrangement according to some suggested aspects;

FIGS. 116A to 116D illustrate various aspects of a process for producing a second embodiment of the arrangement according to some suggested aspects;

FIGS. 117A to 117D show different steps for a process according to some further aspects to produce a third embodiment of the arrangement;

FIG. 118 is a fourth embodiment of the nano light emitting diode array with some of the proposed aspects;

FIGS. 119A and 119B illustrate supplementary versions of the embodiment of FIG. 116D, where additional supplementary measures are arranged.

FIG. 120 shows a cross-sectional view of an optoelectronic device, such as a display array, with a plurality of optoelectronic devices of the invention according to some aspects;

FIG. 121 is a cross-sectional view of another optoelectronic device with a large number of optoelectronic devices configured as μ-LEDs according to the proposed concept;

FIG. 122 shows a cross-sectional view for another proposal of a monolithic array with a variety of optoelectronic devices;

FIG. 123 shows a cross-sectional view of another monolithic array with a plurality of optoelectronic devices configured as μ-LEDs; and FIG. 124 illustrates, based on the example of the previous structure, a monolithic array with a light-shaping structure;

FIG. 125 is a cross-sectional view of a dielectric reflector;

Figure 126:
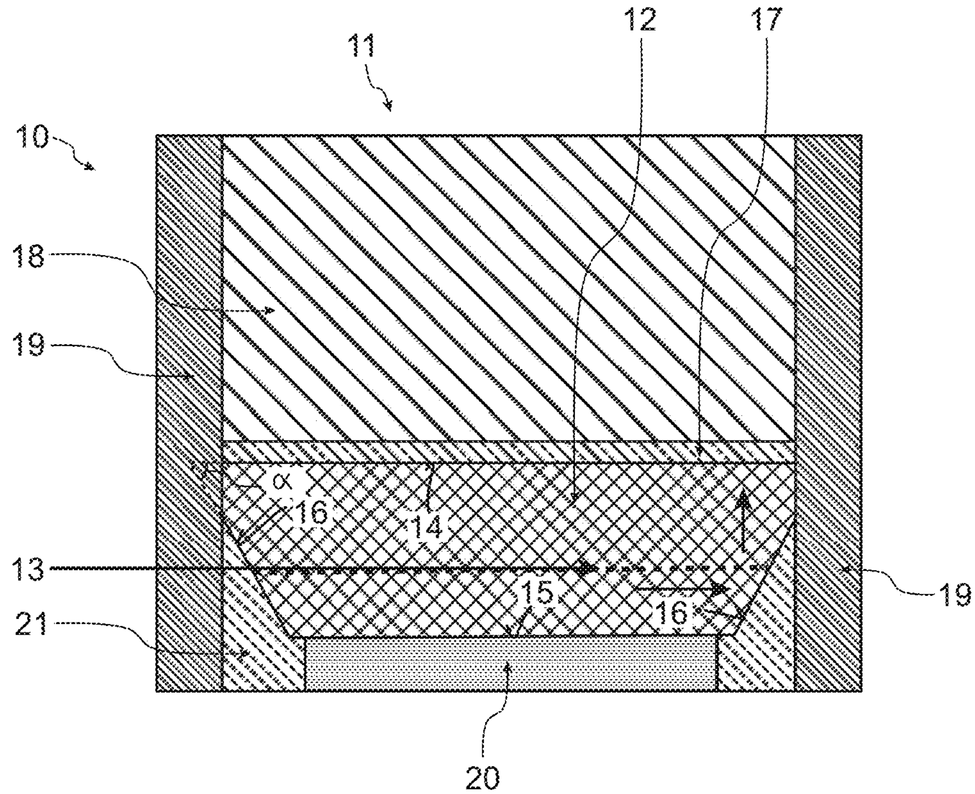
Figure 127A:
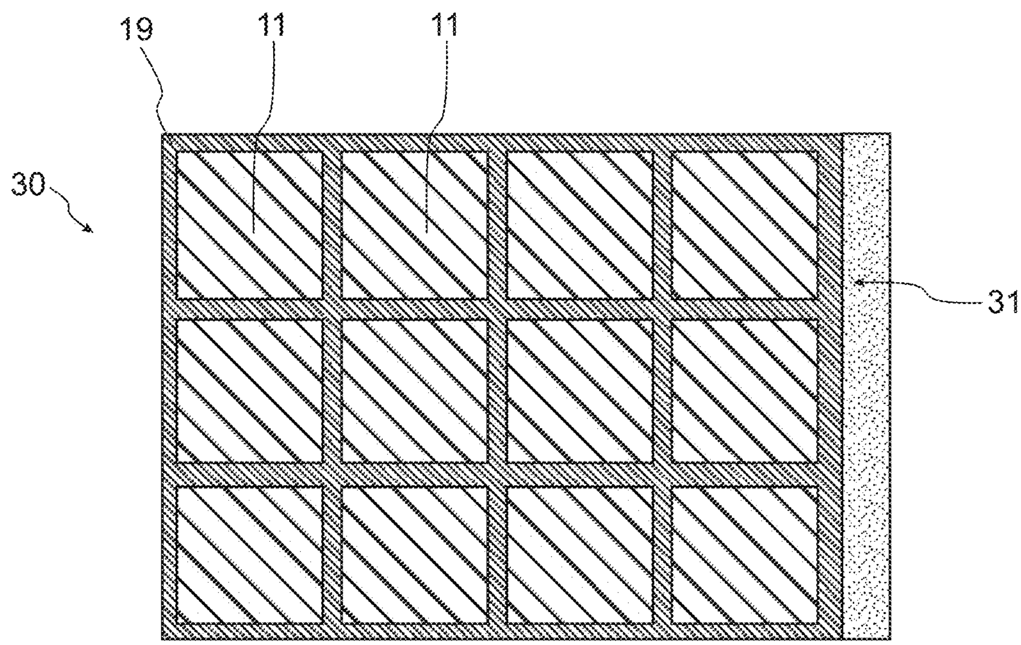
Figure 127B:
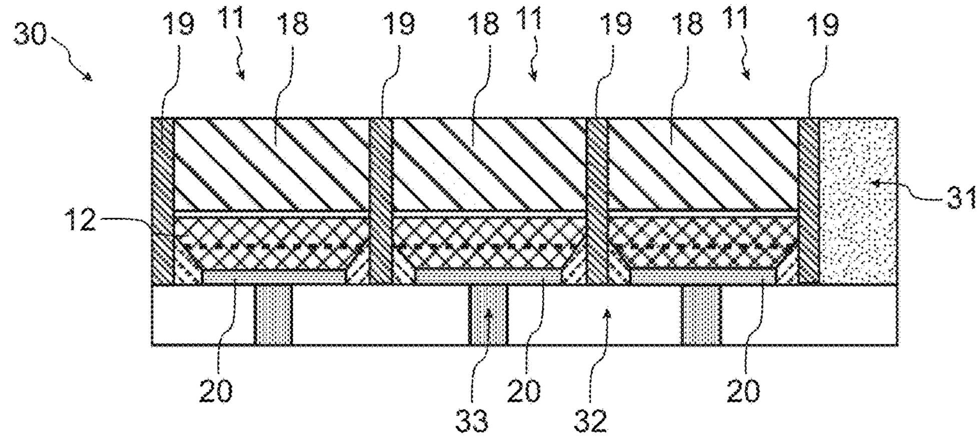
Figure 128A:
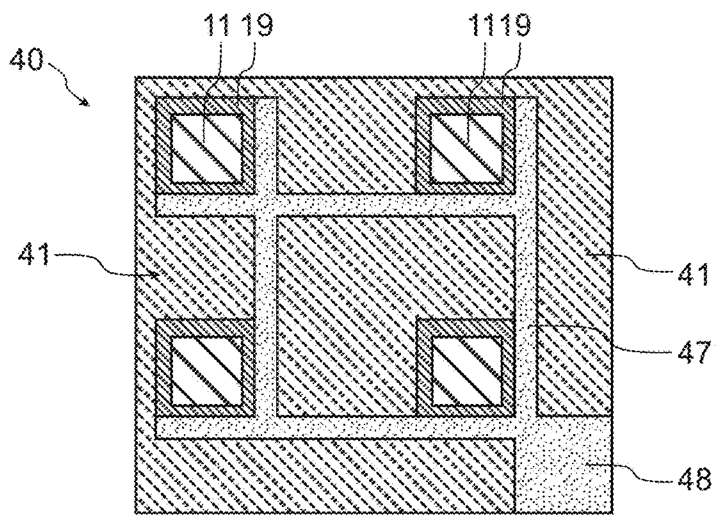
Figure 128B:
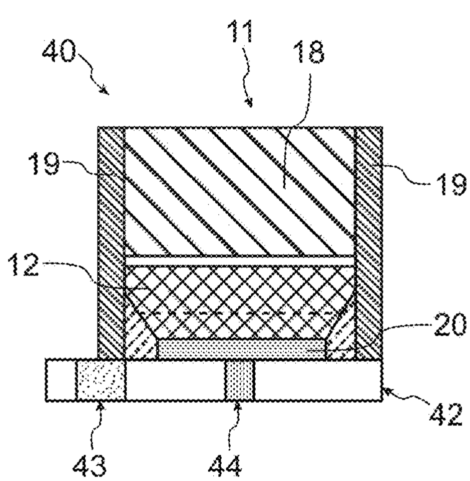
Figure 128C:
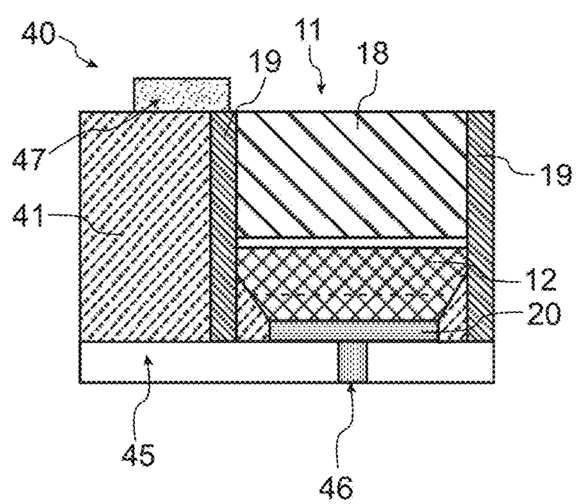
Figure 129A:
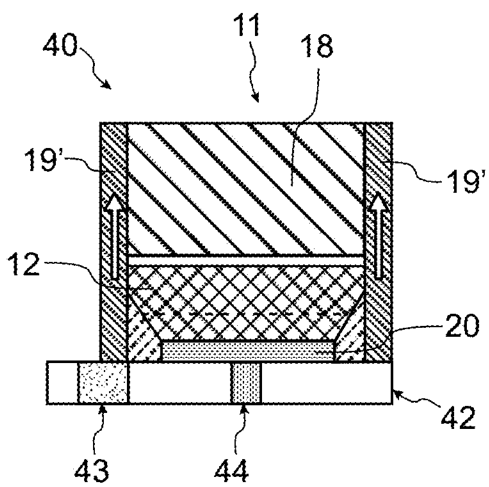
Figure 129B:
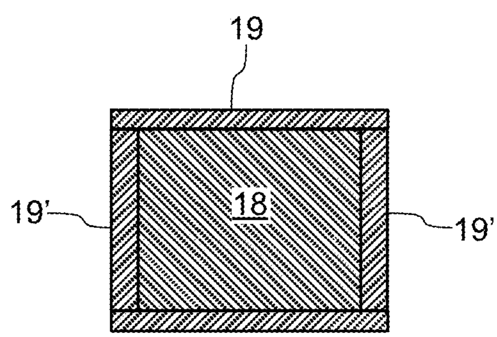
Figure 130A:
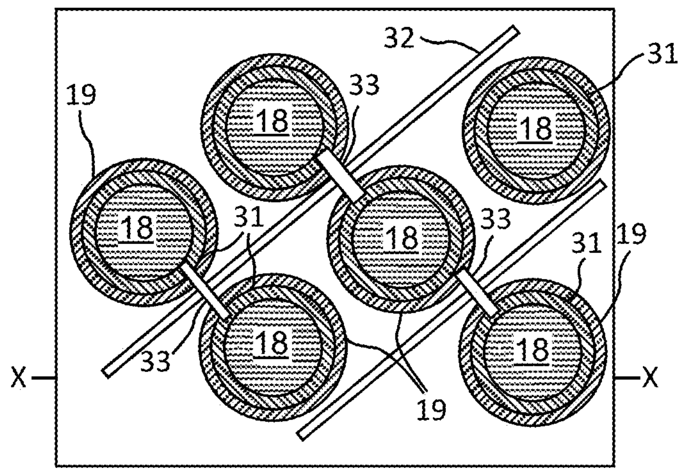
Figure 130B:
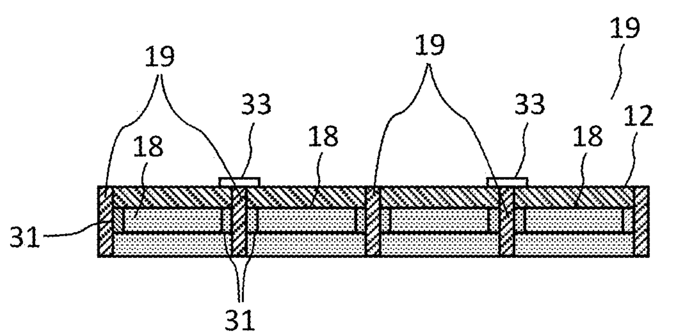

FIG. 126 shows an example of an optoelectronic device with an LED semiconductor element and a dielectric filter according to some aspects of the proposed principle;

FIGS. 127A and 127B are representations of an embodiment of an optoelectronic device having an array of a plurality of semiconductor elements; and FIGS. 128A to 128C are illustrations of another embodiment of an optoelectronic device with several μ-LEDs according to some aspects;

FIGS. 129A and 129B each show a respective embodiment with aspects of magnetic current confinement in a cross-section and in plan view;

FIGS. 130A and 130B illustrate a further embodiment, in which quantum well intermixing was additionally performed to constrict the current.

DETAILED DESCRIPTION

Augmented reality is usually generated by a dedicated display whose image is superimposed on reality. Such device can be positioned directly in the user's line of sight, i.e. directly in front of it. Alternatively, optical beam guidance elements can be used to guide the light from a display to the user's eye. In both cases, the display may be implemented and be part of the glasses or other visually enhancing devices worn by the user. Google's™ Glasses is an example of such a visually augmenting device that allows the user to overlay certain information about real world objects. For the Google™ glasses, the information was displayed on a small screen placed in front of one of the lenses. In this respect, the appearance of such an additional device is a key characteristic of eyeglasses, combining technical functionality with a design aspect when wearing glasses. In the meantime, users require glasses without such bulky or easily damaged devices to provide advanced reality functionality. One idea, therefore, is that the glasses themselves become a display or at least a screen on or into which the information is projected.

In such cases, the field of vision for the user is limited to the dimension of the glasses. Accordingly, the area onto which extended reality functionality can be projected is approximately the size of a pair of spectacles. Here, the same, but also different information can be projected on, into or onto the two lenses of a pair of spectacles.

In addition, the image that the user experiences when wearing glasses with augmented reality functionality should have a resolution that creates a seamless impression to the user, so that the user does not perceive the augmented reality as a pixelated object or as a low-resolution element. Straight bevelled edges, arrows or similar elements show a staircase shape that is disturbing for the user at low resolutions.

In order to achieve the desired impression, two display parameters are considered important, which have an influence on the visual impression for a given or known human sight. One is the pixel size itself, i.e. the geometric shape and dimension of a single pixel or the area of 3 subpixels representing the pixel. The second parameter is the pixel pitch, i.e. the distance between two adjacent pixels or, if necessary, subpixels. Sometimes the pixel pitch is also called pixel gap. A larger pixel pitch can be detected by a user and is perceived as a gap between the pixels and in some cases causes the so-called fly screen effect. The gap should therefore not exceed a certain limit.

The maximum angular resolution of the human eye is typically between 0.02 and 0.03 angular degrees, which roughly corresponds to 1.2 to 1.8 arc minutes per line pair. This results in a pixel gap of 0.6-0.9 arc minutes. Some current mobile phone displays have about 400 pixels/inch, resulting in a viewing angle of approximately 2.9° at a distance of 25 cm from a user's eye or approximately 70 pixels/° viewing angle and cm. The distance between two pixels in such displays is therefore in the range of the maximum angular resolution. Furthermore, the pixel size itself is about 56 μm.

Figure 1A:
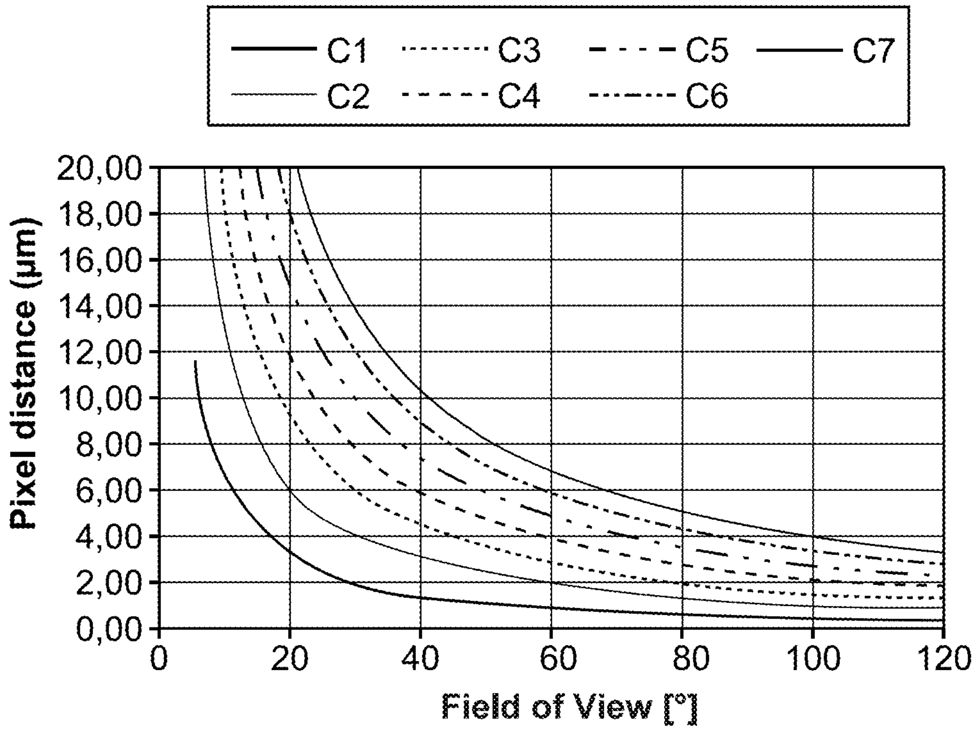
FIG. 1A shows a diagram illustrating some requirements for so-called μ-displays or micro-displays of different sizes with respect to the field of view and pixel pitch of the μ-display.

FIG. 1A illustrates the pixel pitch, i.e. the distance between two adjacent pixels as a function of the field of view in angular degrees. In this respect, the field of view is the extension of the observable world seen at a given moment. This is because human vision is defined as the number of degrees of the angle of view during stable fixation of the eye.

In particular, humans have a forward horizontal arc of their field of vision for both eyes of slightly more than 210°, while the vertical arc of their field of vision for humans is around 135°. However, the range of visual abilities is not uniform across the field of vision and can vary from person to person.

The binocular vision of humans covers approximately 114° horizontally (peripheral vision), and about 90° vertically. The remaining degrees on both sides have no binocular area but can be considered part of the field of vision.

Furthermore, color vision and the ability to perceive shapes and movement can further limit the horizontal and vertical field of vision. The rods and cones responsible for color vision are not evenly distributed.

Figure 1B:
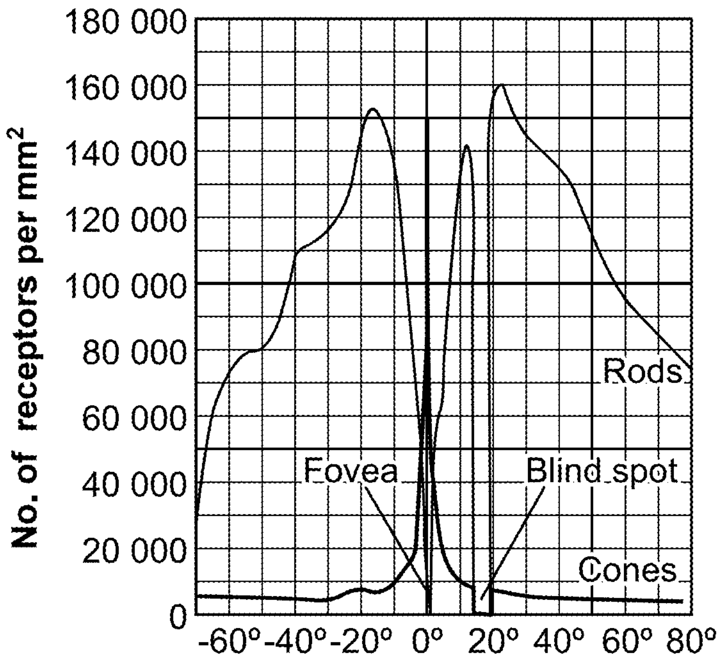
FIG. 1B shows a diagram of the spatial distribution of rods and cones in the human eye.
Figure 1C:
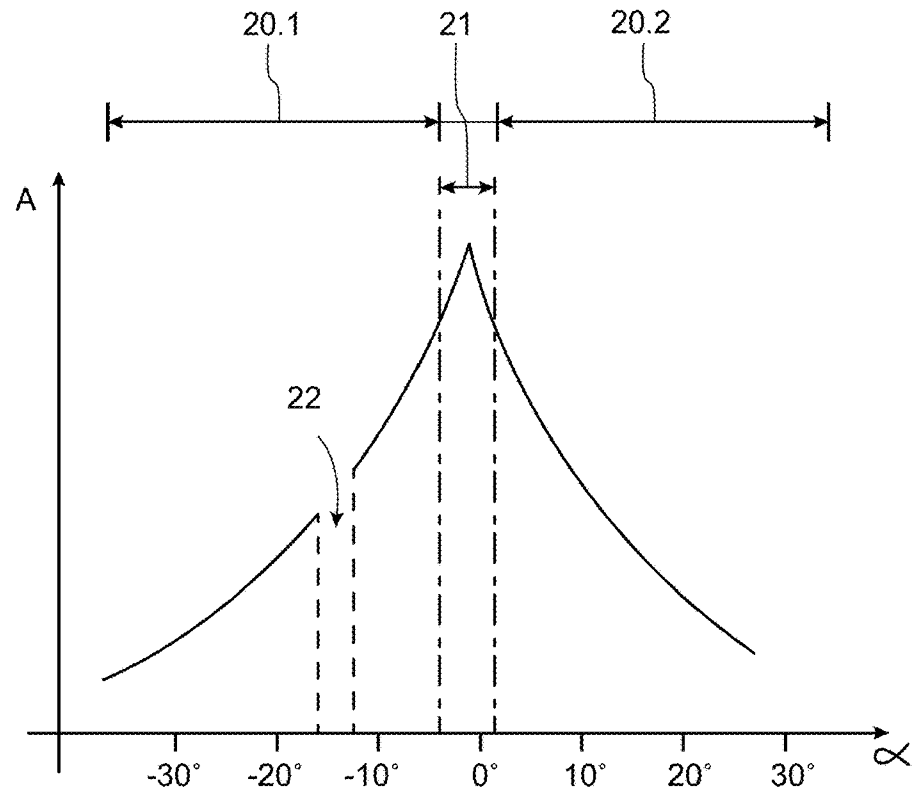
FIG. 1C shows a diagram of the perceptual capacity of the human eye with assigned projection areas.
Figure 1D:
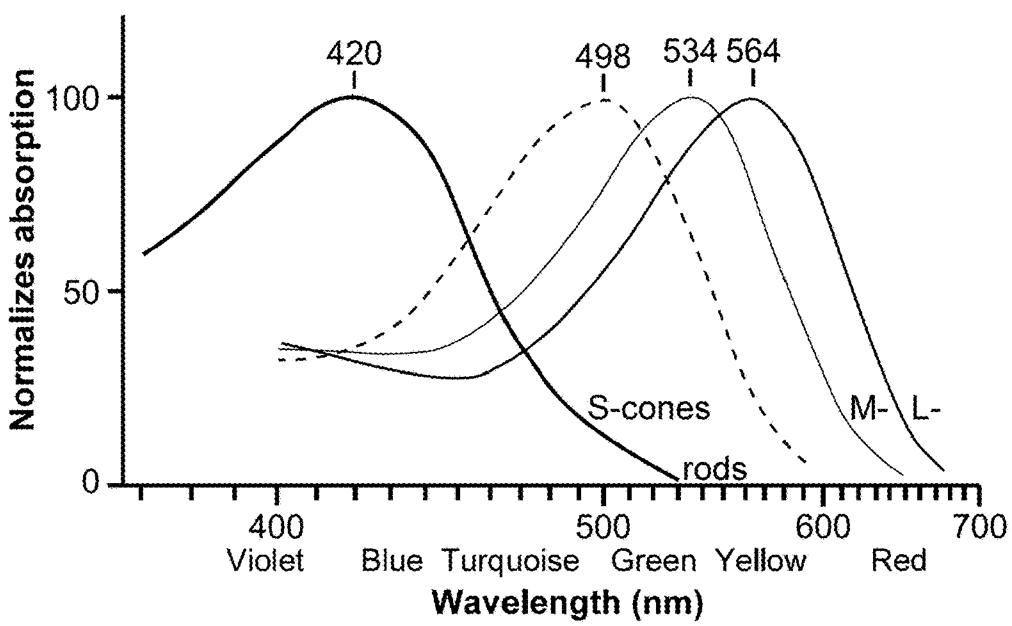
FIG. 1D is a figure showing the sensitivity of the rods and cones over the wavelength.

This point of view is shown in more detail in FIGS. 1B to 1D. In the area of central vision, i.e. directly in front of the eye, as required for Augmented Reality applications and partly also in the automotive sector, the sensitivity of the eye is very high both in terms of spatial resolution and in terms of color perception.

FIG. 1B shows the spatial density of rods and cones per $mm^2$ as a function of the fovea angle. FIG. 1C describes the color sensitivity of cones and rods as a function of wavelength. In the central area of the fovea, the increased density of cones (L, S and M) means that better color vision predominates. At a distance of about 25° around the fovea, the sensitivity begins to decrease and the density of the visual cells decreases. Towards the edge, the sensitivity of color vision decreases, but at the same time contrast vision by means of the rods remains over a larger angular range. Overall, the eye develops a radially symmetrical visual pattern rather than a Cartesian visual pattern. A high resolution for all primary colors is therefore required, especially in the center. At the edge it may be sufficient to work with an emitter adapted to the spectral sensitivity of the rods (max. sensitivity at 498 nm, see FIG. 1D and the sensitivity of the eye).

FIG. 1C shows the different perceptual capacity of the human eye by means of a graph of the angular resolution A relative to the angular deviation α from the optical axis of the eye. It can be seen that the highest angular resolution A is in an interval of the angular deviation α of +/−2.5°, in which the fovea centralis 7 with a diameter of 1.5 mm is located on the retina 19. In addition, the position of the blind spot 22 on the retina 19 is sketched, which is located in the area of the optic nerve papilla 23, which has a position with an angular deviation α of about 15°.

The eye compensates this non-constant density and also the so-called blind spot by small movements of the eye. Such changes in the direction of vision or focus can be counteracted by suitable optics and tracking of the eye.

Furthermore, even with glasses, the field of vision is further restricted and, for example, can be approximately in the range of 80° for each lens.

The pixel pitch in FIG. 1A on the Y-axis is given in μm and defines the distance between two adjacent pixels. The various curves C1 to C7 define the diagonal dimension of a corresponding display from 5 mm to approximately 35 mm. For example, curve C1 corresponds to a display with the diagonal size of 5 mm, i.e. a side length of approximately 2.25 mm. For a field of view of approximately 80°, the pixel pitch of a display with a diagonal size of 5 mm is in the range of 1 μm. For larger displays like curve C7 and 35 mm diagonal size, the same field of view can be implemented with a pixel pitch of approximately 5 μm.

Nevertheless, the curves in FIG. 1A illustrate that for larger fields of view, which are preferred for extended reality applications, very high pixel densities with small pixel pitch are required if the well-known fly screen effect is to be avoided. One can now calculate the size of the pixel for a given number of pixels, a given field of view and a given diagonal size of a μ-display.

Equation 1 shows the relationship between dimension D of a pixel, pixel pitch pp, number N of pixels and the edge length d of the display. The distance r between two adjacent pixels calculated from their respective centers is given by $$r=d/2+pp+d/2.$$

$$D=d/N-pp$$

$$N=d/(D+pp) \qquad (1)$$

Assuming that the display (e.g. glasses) is at a distance of 2.54 cm (1 inch) from the eye, the distance r between two adjacent pixels for an angular resolution of 1 arcminute as roughly estimated above is given by $$r=)\tan(1/60°)*30\text{ mm}$$

$$r=8.7\ \mu m$$

The size of a pixel is therefore smaller than 10 μm, especially if some space is required between two different pixels. With a distance, r between two pixels and a display with the size of 15 mm×10 mm, 1720×1150 pixels can be arranged on the surface.

Figure 2A:
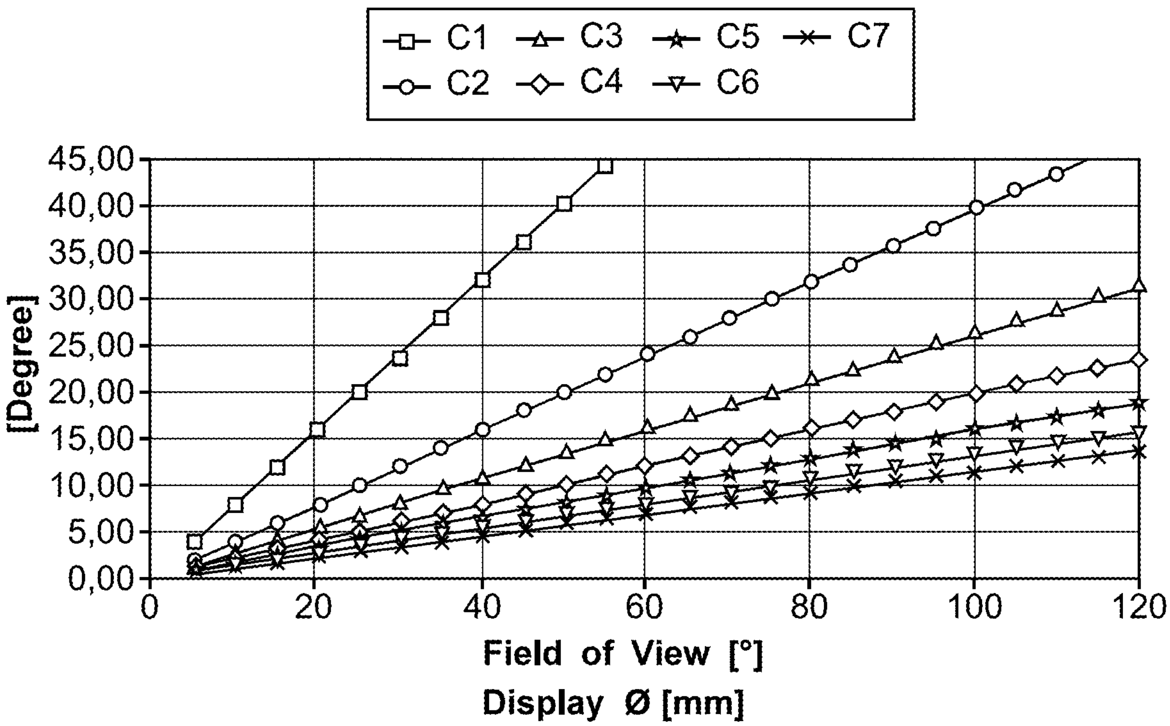
FIG. 2A is a diagram illustrating some requirements for micro-displays of different sizes in terms of the field of view and the angle of collimation of a pixel of the μ-display.
Figure 2B:
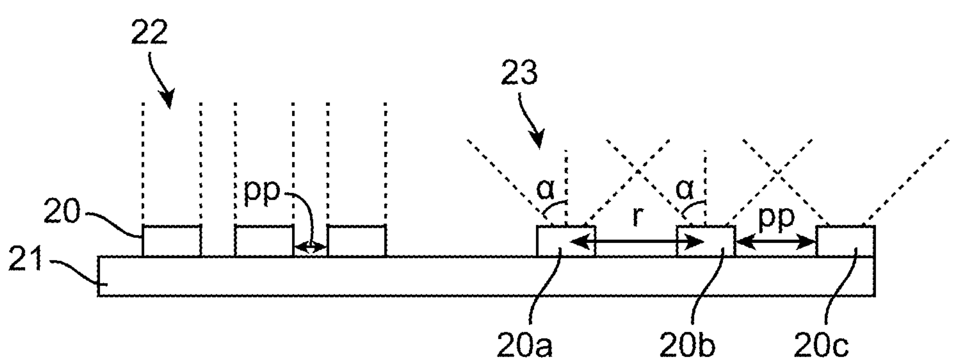
FIG. 2B illustrates an exemplary execution of a pixel arrangement to illustrate the parameters used in FIGS. 1A and 2A.

FIG. 2B shows an arrangement, which has a carrier 21 on which a large number of pixels, 20 and 20*a* to 20*c* are arranged. Pixels 20 arranged side by side have the pixel pitch pp, while pixels 20*a* to 20*c* are placed on carrier 21 with a larger pixel pitch pp. The distance between two pixels is given by the sum of the pixel pitch and half the size for each adjacent pixel. Each of the pixels 20 is configured so that its illumination characteristic or its emission vector 22 is substantially perpendicular to the emission surface of the corresponding LED.

The angle between the perpendicular axes to the emission surface of the LED and the beam vector is defined as the collimation angle. In the example of emission vector 22, the collimation angle of LEDs 20 is approximately zero. LED 20 emits light that is collinear and does not widen significantly.

In contrast, the collimation angle of the emission vector 23 of the LED pixels 20*a* to 20*c* is quite large and in the range of approximately 45°. As a result, part of the light emitted by LED 20*a* overlaps with the emission of an adjacent LED 20*b*.

The emission of the LEDs 20*a* to 20*c* is partially overlapping, so that its superposition of the corresponding light emission occurs. In case the LEDs emit light of different colors, the result will be a color mixture or a combined color. A similar effect occurs between areas of high contrast, i.e. when LED 20*a* is dark while LED 20*b* emits a certain light. Because of the overlap, the contrast is reduced and information about each individual position corresponding to a pixel position is reduced.

In displays where the distance to the user's eye is only small, as in the applications mentioned above, a larger collimation angle is rather annoying due to the effects mentioned above and other disadvantages. A user is able to see a wide collimation angle and may perceive displayed objects in slightly different colors blurred or with reduced contrast.

FIG. 2A illustrates in this respect the requirement for the collimation angle in degrees against the field of view in degrees, independent of specific display sizes. For smaller display sizes such as the one in curve C1 (approx. 5 mm diagonal), the collimation angle increases significantly depending on the field of view.

As the size of the display increases, the collimation angle requirements change drastically, so that even for large display geometries such as those illustrated in curve C7, the collimation angle reaches about 10° for a field of view of 100°. In other words, the collimation angle requirements for larger displays and larger fields of view are increasing. In such displays, light emitted by a pixel must be highly collimated to avoid or reduce the effects mentioned above. Consequently, strong collimation is required when displays with a large field of view are to be made available to a user, even if the display geometry is relatively large.

As a result of the above diagrams and equations, one can deduce that the requirements regarding pixel pitch and collimation angle become increasingly challenging as the display geometry and field of view grow. As already indicated by equation 1, the dimension of the display increases strongly with a larger number of pixels. Conversely, a large number of pixels is required for large fields of view if sufficient resolution is to be achieved and fly screens or other disturbing effects are to be avoided.

Figure 3A:
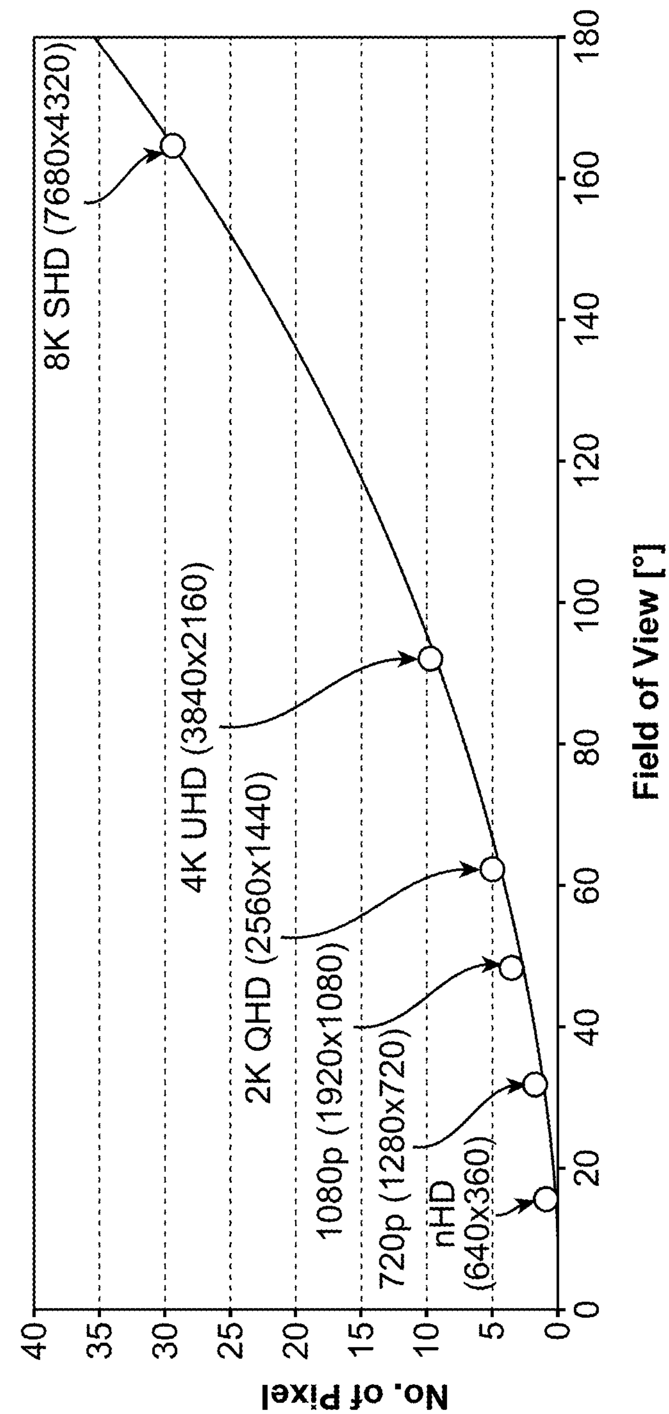
FIG. 3A shows a diagram illustrating the number of pixels required depending on the field of view for a specific resolution.

FIG. 3A shows a diagram of the number of pixels required to achieve an angular resolution of 1.3 arc minutes. For a field of view of approximately 80°, the number of pixels exceeds 5 million. It is easy to estimate that the size of the pixels for a QHD resolution is well below 10 μm, even if the display is 15 mm×10 mm. In summary, advanced reality displays with resolutions in the HD range, i.e. 1080p, require a total of 2.0736 million pixels. This allows a field of view of approximately 50° to be covered. Such a quantity of pixels arranged on a display size of 10×10 mm with a distance between the pixels of fpm results in a pixel size of about 4 μm.

In contrast, the table in FIGS. 3B and 3C shows several application areas in which μ-LED arrays can be used. The table shows applications (use case) of μ-LED arrays in vehicles (Auto) or for multimedia (MM), such as automotive displays and exemplary values regarding the minimum and maximum display size (min. and max. size X Y [cm]), the pixel density (PPI) and the pixel pitch (PP [μm]) as well as the resolution (Res.-Type) and the distance of the viewer (Viewing Distance [cm]) to the lighting device or display. In this context, the abbreviations "very low res", "low res", "mid res" and "high res" have the following meaning:

| | |
|---|---|
| very low res | pixel pitch approx. 0.8-3 mm |
| low res | Pixel pitch approx. 0.5-0.8 mm |
| mid res | Pixel pitch approx. 0.1-0.5 mm |
| high res | Pixel pitch less than 0.1 mm |

The upper part of the table, entitled "Direct Emitter Displays", shows inventive applications of μ-LED arrays in displays and lighting devices in vehicles and for the multimedia sector. The lower part of the table, titled "Transparent Direct Emitter Displays", names various applications of μ-LED arrays in transparent displays and transparent lighting devices. Some of the applications of μ-displays listed in the table are explained in more detail below in the form of embodiments.

The above considerations make it clear that challenges are considerable in terms of resolution, collimation and field of view suitable for extended reality applications. Accordingly, very high demands are placed on the technical implementation of such displays.

Conventional techniques are configured for the production of displays that have LEDs with edge lengths in the range of 100 μm or even more. However, they cannot be automatically scaled to the sizes of 70 μm and below required here. Pixel sizes of a few μm as well as distances of a few μm or even less come closer to the order of magnitude of the wavelength of the generated light and make novel technologies in processing necessary.

In addition, new challenges in light collimation and light direction are emerging. Optical lenses, for example, which can be easily structured for larger LEDs and can also be calculated using classical optics, cannot be reduced to such a small size without the Maxwell equations. Apart from this, the production of such small lenses is hardly possible without large errors or deviations. In some variants, quantum effects can influence the behaviour of pixels of the above-mentioned size and have to be considered. Tolerances in manufacturing or transfer techniques from pixels to sub mounts or matrix structures are becoming increasingly demanding. Likewise, the pixels must be contacted and individually controllable. Conventional circuits have a space requirement, which in some cases exceeds the pixel area, resulting in an arrangement and space problem.

Accordingly, new concepts for the control and accessibility of pixels of this size can be quite different from conventional technologies. Finally, a focus is on the power consumption of such displays and controllers. Especially for mobile applications, a low power consumption is desirable.

In summary, for many concepts that work for larger pixel sizes, extensive changes must be made before a reduction can be successful. While concepts that can be easily up scaled to LEDs at 2000 μm for the production of LEDs in the 200 μm range, downscaling to 20 μm is much more difficult. Many documents and literature that disclose such concepts have not taken into account the various effects and increased demands on the very small dimensions and are therefore not directly suitable or limited to pixel sizes well above 70 μm.

In the following, various aspects of the structure and design of μ-LED semiconductors, aspects of processing, light extraction and light guidance, display and control are presented. These are suitable and designed to realize displays with pixel sizes in the range of 70 μm and below. Some concepts are specifically designed for the production, light extraction and control of μ-LEDs with an edge length of less than 20 μm and especially less than 10 μm. It goes without saying, and is even desired, that the concepts presented here can and should be combined with each other for the different aspects. This concerns for example a concept for the production of a μ-LED with a concept for light extraction. In concrete terms, a μ-LED implemented by means of methods to avoid defects at edges or methods for current conduction or current constriction can be provided with light extraction structures based on photonic crystal structures. Likewise, a special drive can also be realized for displays whose pixel size is variable. Light guidance with piezoelectric mirrors can be realized for μ-LEDs displays based on the slot antenna aspect or on conventional monolithic pixel matrices.

In some of the following embodiments and described aspects, additional examples of a combination of the different embodiment s or individual aspects thereof are suggested. These are intended to illustrate that the various aspects, embodiments or parts thereof can be combined with each other by the skilled person. Some applications require specially adapted concepts; in other applications, the requirements for the technology are somewhat lower. Automotive applications and displays, for example, may have a longer pixel edge length due to the generally somewhat greater distance to a user. Especially there, besides applications of extended reality, classical pixel applications or virtual reality applications exist. This is in the context of this disclosure for the realization of μ-LED displays, whose pixel edge length is in the range of 70 μm and below, also explicitly desired.

Figure 4A:
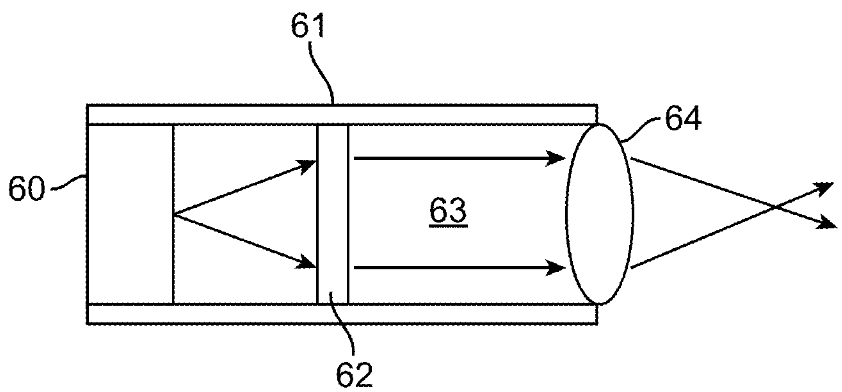
FIG. 4A shows a principle representation of a μ-LED display with essential elements for light generation and light guidance.

A general illustration of the main components of a pixel in a μ-display is shown schematically in FIG. 4A. It shows an element 60 as a light generating and light emitting device. Various aspects of this are described in more detail below in the section on light generation and processing. Element 60 also includes basic circuits, interconnects, and such to control the illumination, intensity, and, when applicable, color of the pixel. Aspects of this are described in more detail in the section on light control. Apart from light generation, the emitted light must be collimated. For this purpose, many pixels in microdisplays have such collimation functionality in element 60. The parallel light in element 63 is then fed for light guidance into some optics 64, for further shaping and the like. Light collimation and optics suitable for implementing pixels for microdisplays are described in the section on light extraction and light guidance.

The pixel device of FIG. 4A illustrates the different components and aspects as separate elements. An expert will recognize that many components can be integrated into a single device. In practice, the height of a μ-display is also limited, resulting in a desired flat arrangement.

This section describes in general terms aspects on μ-LED semiconductor structures and method for their manufacture. The active layer of the structures emit light of one wavelength or a wavelength range during operation. Some aspects relate to current conduction or other measures to reduce a defect density in order to achieve higher quantum efficiency.

As explained above, the structuring of micropixels for collinear light emission is a major requirement for extended realities functionality with μ-displays. While collinearity can be achieved by beam-shaping using lenses and other optical devices to shape the light emitted from a pixel, collinear emission can also be achieved by controlling the way the light is generated in the active zone or by directing the light before it leaves the pixel material. The latter can be achieved by shaping the pixel in a certain way to increase collinearity.

Apart from the above mentioned problem of generating collinear light or preventing light from being emitted with a large emission angle, the small distance between the pixels of 2 to 1 μm or even smaller places high demands on the photomask, dopant implementation and other process steps. Small variations in the mask lead to variations in pixel size and/or geometry, which changes the properties. Besides the small pixel size, the ratio of the circumference of each pixel to the area will change significantly. Assuming a square pixel, shortening the length of a side edge by half will also change the ratio by half. Side edges and variations along the edges of pixels, along with defects within the active layer, are the main causes of non-radiative recombination (NRR), the ratio between radiative recombination and non-radiative recombination also changes to the disadvantage of the former.

Figure 4B:
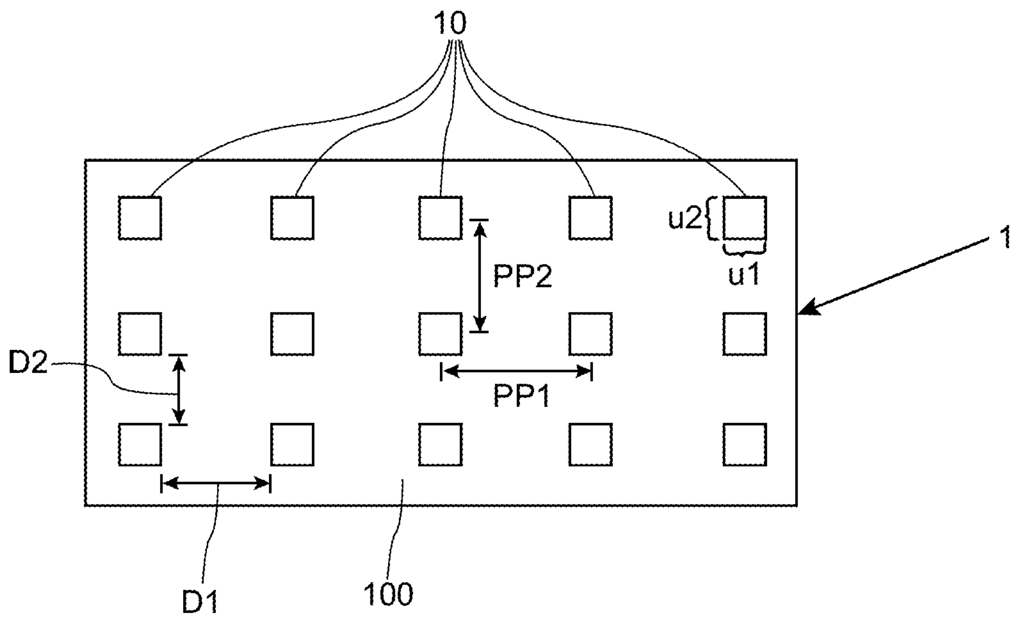
FIG. 4B shows a schematic representation of a μ-LED array with similar μ-LEDs.

FIG. 4B schematically shows a μ-display with similar μ-LEDs 10 is shown. The μ-LEDs 10 of the μ-display 1 are arranged in rows and columns on a carrier 100 with distances D1, D2 to adjacent μ-LEDs 10. Each μ-LED 10 forms a pixel. The pixel pitch PP1 or PP2 is measured from the center of a pixel to the center of an adjacent pixel. It thus corresponds to the sum of the distance D1 or D2 and the corresponding edge length K1 or K2 of a μ-LED 10. If the values for PP1 and PP2 are different, the larger value is defined as pixel pitch PP.

Figure 4C:
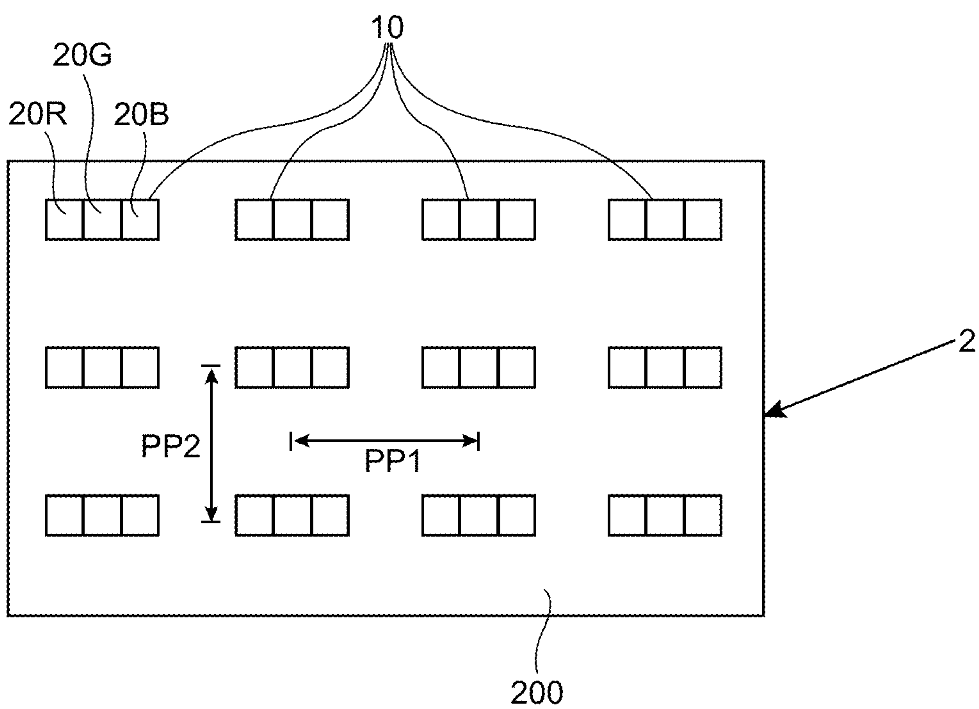
FIG. 4C is a schematic representation of a μ-LED array with μ-LEDs of different light colors.
Figure 5A:
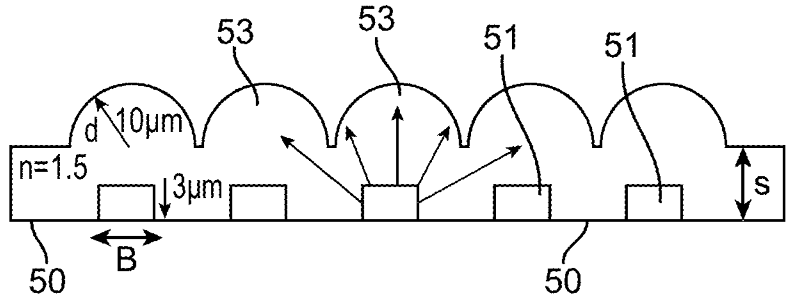
FIG. 5A and FIG. 5B show two examples of a structure or beamline and collimation.
Figure 5B:
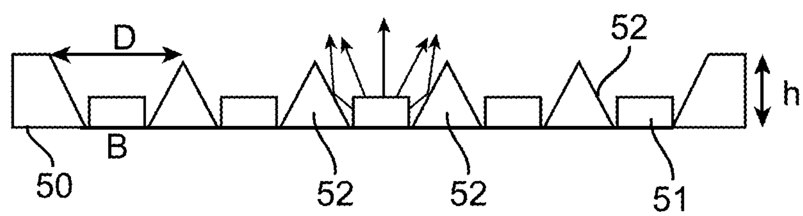

FIG. 4C schematically shows a μ-display 2 with three different types R, G, B of μ-LEDs 20R, 20G, 20B. The μ-LEDs 20R emit red light during operation, the μ-LEDs 20G emit green light during operation and the μ-LEDs 20B emit blue light during operation. A red light emitting μ-LED 20R, a green light emitting μ-LED 20G and a blue light emitting μ-LED 20B are each grouped on the carrier 200 to form a triple 20. The triple 20 of μ-LEDs 20R, 20G, 20B are arranged in rows and columns on the carrier 200. The individual μ-LEDs each form a subpixel of each Triple 20 and thus represent one pixel. The pixel pitch PP1 or PP2 is measured from the center of one pixel to the center of an adjacent pixel. If the values for PP1 and PP2 are different, the larger value is defined as pixel pitch PP. In addition to this representation, in which the three μ-LEDs are arranged in a row as subpixels, there is also another representation, for example in the form of a triangle or offset as shown in FIG. 25C.

One aspect for light generation proposes an adaptation of the emission characteristics of an LED based on the principle of induced emission by means of a slotted antenna structure. In concrete terms slotted antenna structure are used. Such slotted antennas are normally used to generate highly directional radiation from electromagnetic waves.

In contrast to a normal antenna, in which a metallic structure in space is surrounded by air (as a non-conductor) and thus radiates the electromagnetic wave, this is the opposite with the slotted antenna. The slotted antenna has an interruption, the slot, through which the electromagnetic radiation is emitted. The geometry of the slits determines the wavelength and radiation pattern. In the simplest case, the length of the interruption or slot is a multiple of the wavelength, with the radiated wave being strongly directed in the plane of the antenna. The radiated power can become very high.

Light is a type of electromagnetic radiation in the range of approximately 300 nm to 700 nm. While this requires structures of the same order of magnitude, the highly directional emission can simplify the use of other optics.

The following embodiments provide some suggestions for such slotted antennas, implemented and realized in different semiconductor material systems. The idea is based on the discovery that the wavelength emitted by electromagnetic radiation is mainly independent of the material used but depends mainly on the dimension of the slot of the waveguide. Therefore, a single material system can be used to produce light of different colors. This is because LEDs do not produce monochromatic light, but usually a broader spectrum. Thus, the emission can be easily adjusted over a range by the geometry of the slot antenna.

Slotted antennas also force an increase in spontaneous radiative recombination, which makes light generation faster than in conventional LEDs without such an antenna structure. At the same time, radiative recombination is preferred to non-radiative recombination, which improves the ratio even for very small structures. This characteristic also allows using GaN based material systems to generate red light. Because of their lower dependence on the material system, light emission induced by slotted antennas can also be less dependent on parameter changes such as temperature, carrier density and the like.

However, the light emission is dependent on the current, which allows some kind of current modulation to control the intensity of the emitted light. Driver circuits can be simplified without losing speed when switching the light on or off. For example, PWM modulation can have less steep rising and falling edges. The small structure also makes it possible to use more than a single emitter per pixel, which provides redundancy against failure or process variations that lead to a broadening of the light spectrum. Using more than one emitter of the same color not only provides redundancy but also a higher resolution in light intensity and therefore more brightness gradations.

Figure 6:
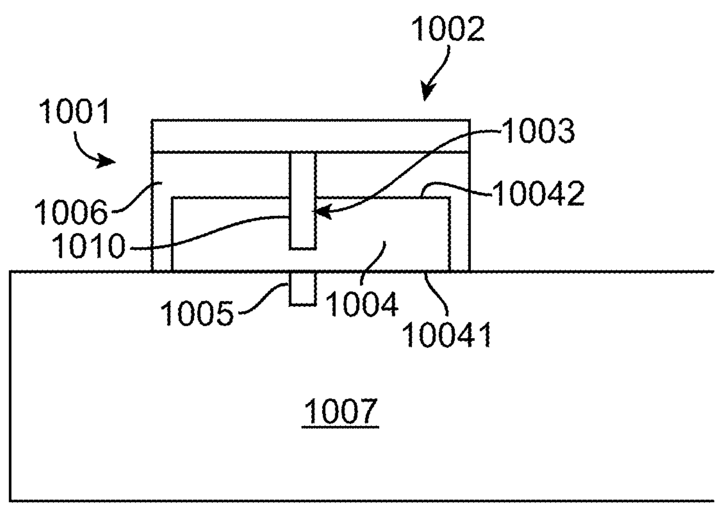
FIG. 6 illustrates an example of a slotted antenna according to the proposed principle.

FIG. 6 shows the main elements of a version of a light-emitting device using the principle of antenna-induced emission.

A light emitting device 1001 is placed on a carrier 1007. The carrier may contain driver circuitry, current and voltage sources and the like to provide power to the light emitting device. The light-emitting device comprises a semiconductor stack 1003 or a LED nanopillar extending substantially perpendicular to the main surface of the carrier 1007. The LED nanopillar comprises a plurality of semiconductor layers including an active layer. In some variants, the active layer of the LED nanopillar 1003 comprises a quantum well or a multi-quantum well structure. Quantum wells are also conceivable. The end sections of the stack 1003 are formed with highly doped p- or n-contacts. The carrier 1007 has an electrical second contact 1005, which is connected to the corresponding contact of the LED nanopillar to supply energy to the light emitting device.

The light emitting device is located in a cavity 1010 of an electrically conductive structure 1004. Structure 1004 has an upper major surface 10042 and a lower major surface 10041, the latter being located adjacent to the substrate. To prevent an electrical short circuit between the electrically conductive structure 1004 and the carrier, an insulating layer is provided between carrier 1007 and the structure. The cavity in the electrical structure 1010 comprises a width w and a length l (not shown). Width w is approximately the size of the LED nanopillar. The LED nanopillar 1003 is also insulated so that the conductive structure does not cause a short circuit with the column. The electrically conductive structure 1004 is made of or contains metal. In some variants, copper, aluminum, gold, silver or other suitable metals are used. Together with the cavity, the electrically conductive structure forms a slotted antenna structure in which the radiation source (the light-emitting device) is placed. The length l of the cavity is adapted to the desired length of the emitted radiation.

The electrically conductive structure and the LED nanopillar are covered with an insulating but optically transparent material 1006. Material 1006 optionally extends to the sidewalls of the electrically conductive structure 1004. Contact layer 1002 is applied to the insulating material and in contact with the corresponding contact of the LED nanopillar. At this point, the contact layer 1002 can also be omitted and the electrically conductive structure itself can form a contact. In particular, in this embodiment, the electrically conductive layer would be conductively connected to the electrical contact facing away from the carrier, so that they are at the same electrical potential. The insulating layer can then, as described below, include converters or structures to convert the light in its color or to shape the radiation further.

During operation, charge carriers are injected into the active layer of the light-emitting device, for example into the quantum well structure. The antenna structure now forces an increase in spontaneous emission. The recombination leading to light emission increases strongly compared to non-radiative recombination. Because of the specific length of the cavity, an electrical dipole is formed and directed emission of light at a wavelength based on the length of the cavity is preferred. Different cavity lengths will therefore lead to the emission of light at the corresponding wavelength.

Figure 7A:
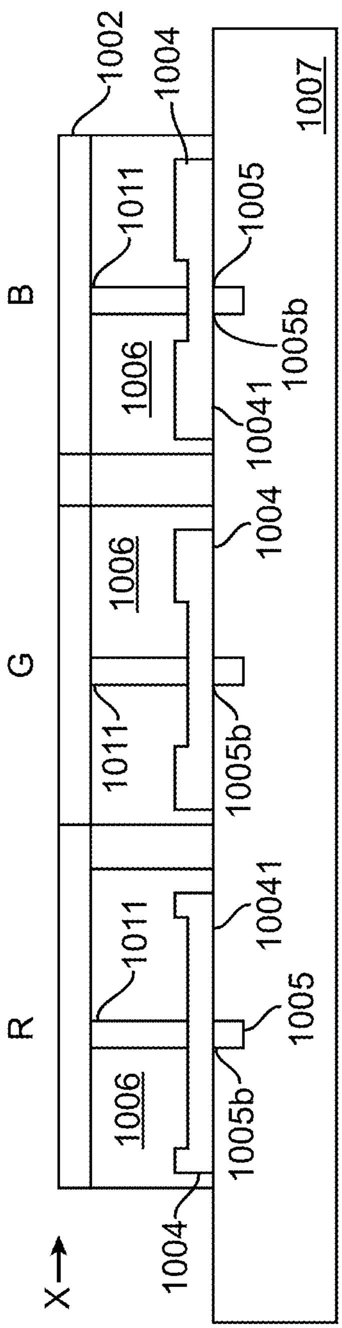
FIGS. 7A to 7C illustrate an example of light-emitting devices based on the proposed principle that are capable of producing light of different colors.
Figure 7B:
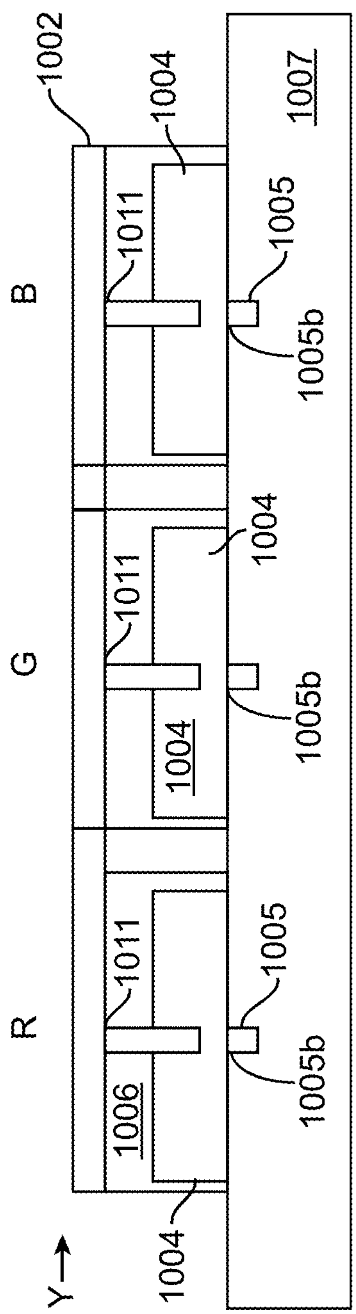
Figure 7C:
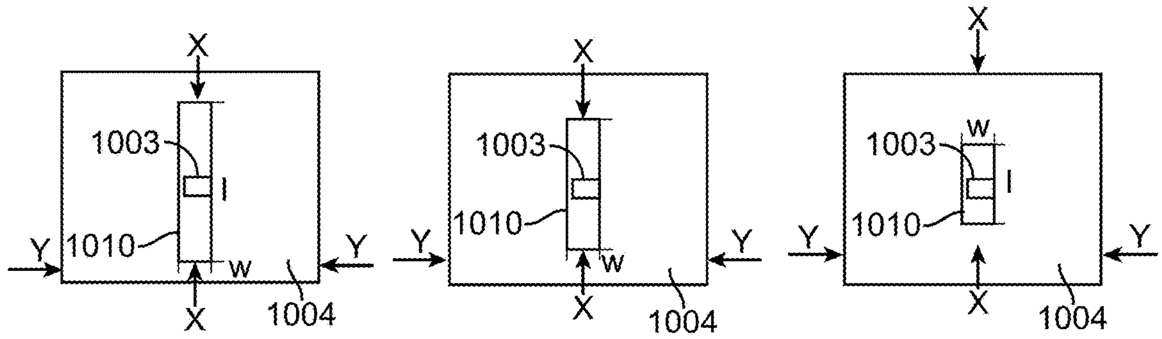

FIG. 7A to FIG. 7C illustrate an example of light-emitting devices based on the proposed principle, which are capable of producing light of different colors. FIG. 7C shows the top view of the three light-emitting devices. FIG. 7A illustrates the same devices in sectional view along the X-X-axis as shown in FIG. 7C. FIG. 7B also illustrates the three fixtures along the Y-Y-axis.

As shown in FIG. 7A, the light-emitting devices R, G, B are arranged on a carrier 1007 and electrically contacted with its n-contact surface 1005*b* to corresponding second contacts 1005 on the carrier 1007. Each light emitting device comprises a LED nanopillar 1003 formed as a semiconductor stack. The semiconductor stack has an n-contact 1005*b* and a corresponding p-contact, which is contacted by a common p-doped layer 1002. It should be mentioned that p- and n-contacts could be exchanged without deviation from the proposed principle. Each light emitting device also comprises an active region (not shown here) where recombination takes place. Layer 1006 is electrically insulating. Thus, the LED nanopillars or semiconductor layer stack extends beyond the level of the electrically conductive layer.

As shown in FIG. 7C, the LED nanocolumns 1003 are arranged in a cavity 1010 of an electrically conductive structure 1004. More specifically, the LED nanopillars, or semiconductor layer stacks 1003 are placed as an insulated wire in the center of the cavity 1010.

The electrically conductive structure has a rectangular shape but can also have a different shape suitable for induced emission. However, the semiconductor layer stack must be arranged in the cavity. In the disclosed embodiment, the electrically conductive structure of the light emitting devices R, G and B comprise the same dimension and this is in the range of 1 $\mu m^2$ to 2 $\mu m^2$. Each cavity 1010 comprise a width w and a length l and has a rectangular shape. The width of the cavity approximately corresponds to the width of the LED nanopillar or is slightly larger so that the LED nanopillar does not cause a short circuit. Between the column and the carrier is either air or other gas or an insulating solid. A spontaneous emission is induced by the length l of the cavity, the wavelength of which depends on the length l. Very simplified; the structure resembles a dipole slot antenna, where the length of the cavity corresponds to half the wavelength to be transmitted. For a wavelength of 400 nm, a cavity of approximately 200 nm is used. The actual cavity can be shorter by a shortening factor that takes into account a physical parameter.

Referring to FIG. 7A, an electrically conductive structure in sectional view along the X-X-axis forms a "U" cross-sectional contour, in which the cavity forms the inner part limited by the outer flanks. The individual electrically conductive structures 1004 of the different elements are connected to each other (not shown here). The semiconductor layer stack extends through the cavity and thus the electrically conductive structure. The electrically conductive structure is surrounded by an optically transparent insulating material 1006 and thus completely covered. The material 1006 also fills the cavity and extends up to the first contact 1011. A common contact layer 1002 is applied to the insulating material 1006. The common contact layer 1002 electrically contacts each of the LED nanopillars. FIG. 7B illustrates the light emitting devices along the Y-Y sectional view of FIG. 7C.

Figure 9:
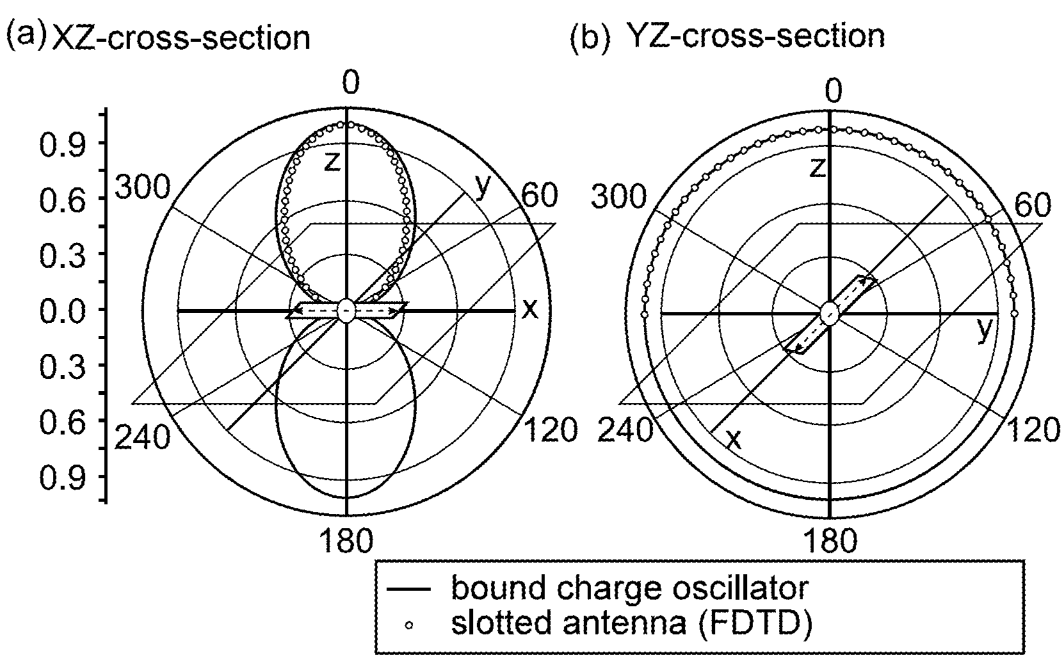
FIG. 9 illustrates the radiation pattern for a simple example of a slotted antenna according to FIG. 8A.

Now referring to FIG. 9 to illustrate the effect that the electrically conductive structure or metal plate has on the emission characteristics of a light emitting device. The figure shows a comparison of a simulated far-field radiation pattern of a slotted antenna with the dipole radiation pattern of a bonded charge oscillator. Both result in almost the same radiation pattern, indicating that the light-emitting device may behave similarly to a bound charge oscillator.

Figure 8A:
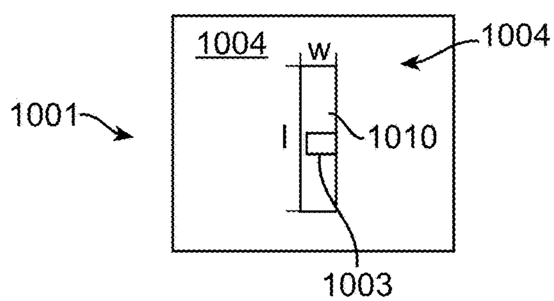
FIGS. 8A to 8F show various examples of a slotted antenna realized in a semiconductor material for light emission.
Figure 8B:
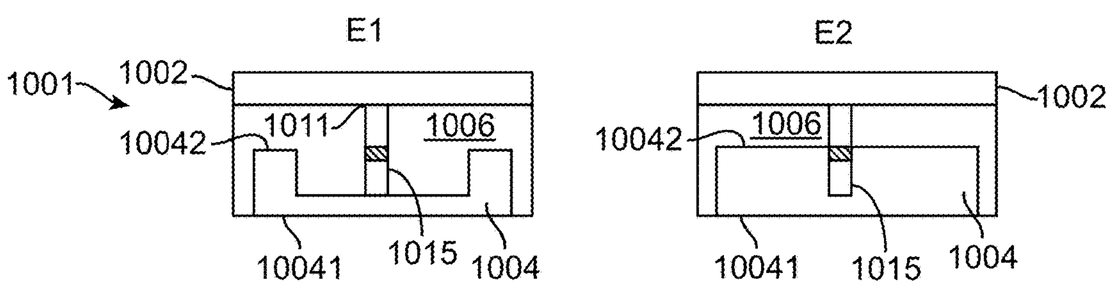
Figure 8C:
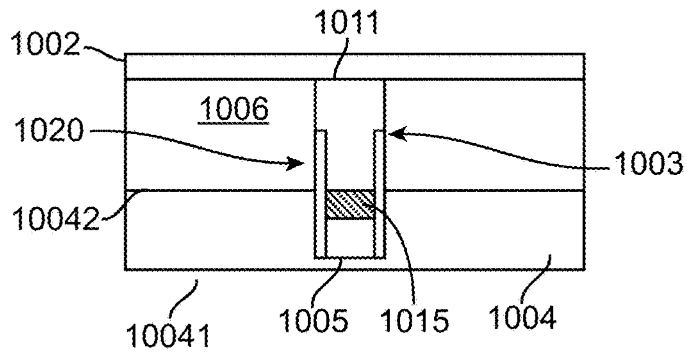
Figure 8D:
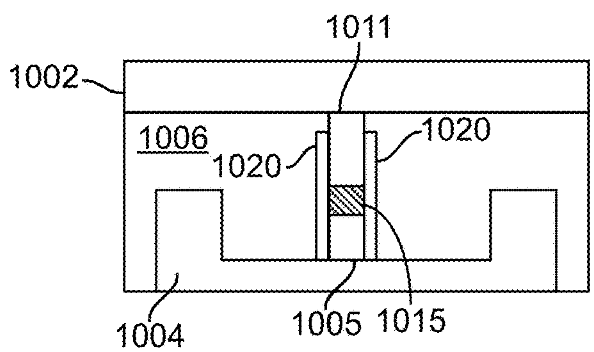
Figure 8E:
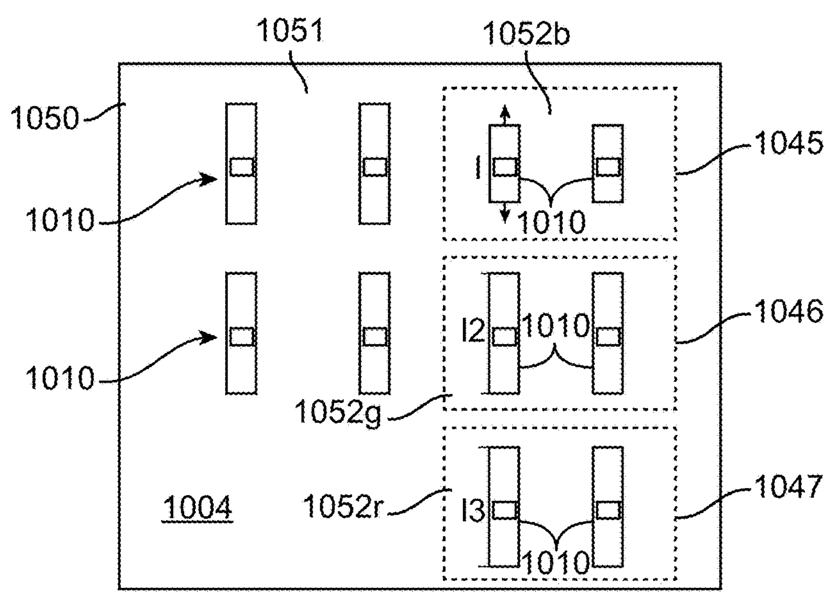
Figure 8F:
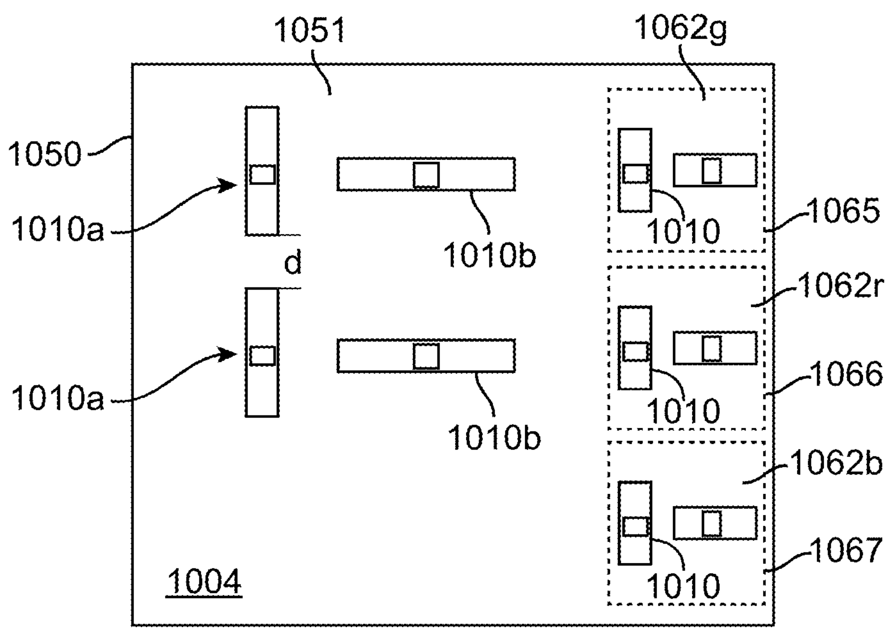

Now referring to FIG. 8A and FIGS. 8E and 8F. FIG. 8C shows a light-emitting device similar to those previously explained in detail.

Now referring to FIG. 8E and FIG. 8F, which show the top view of a μ-LED array comprising two or more light-emitting devices with substantially the same cavities. The small dimension for each light emitting device allows the implementation of densely packed μ-display arrays. Since, for example, a light emitting device according to the proposed principle comprise an area of approximately 1 $\mu m^2$, several such devices can be arranged side by side without exceeding an edge length of 4 μm. This creates a redundancy by which damaged devices can be replaced. On the other hand, it allows a better resolution, which allows finer intensity gradations. The small size is particularly suitable for monolithic integration with a large number of such light-emitting devices.

FIG. 8E illustrates an example of monolithic integration of a pixel comprising four light-emitting devices arranged as a group 1051. The μ-LED array shares several common structures, in this case the electrically conductive structure 1050 formed as a metal plate, the insulating layer on the metal plate, and a common contact layer. The metal plate comprises four cavities 1010 arranged in a 2×2 μ-LED matrix 1051. Adjacent cavities 1010 are arranged parallel to each other. The cavities are covered by a transparent insulating material (not shown in this top view) together with the LED semiconductor layer stacks or nanopillars placed in them. A common electrical contact layer (not shown) is applied to the insulating material. The contact layer contacts the LED nanopillar from one side. On the bottom side (not shown) underneath the metal plate, similar contacts are formed for the LED nanopillars.

During operation, the cavities can be controlled separately in pairs or all at once. In some variants, all cavities are switched at the same time. This allows a high resolution in terms of intensity to be achieved. Due to process variations, temperature effects and other physical properties, the spectrum of each cavity is broadened, resulting in a slightly increased spectrum. By selecting a slightly different length of the cavity, a so-called white light spectrum can be achieved for the light emitted by the four cavities. By placing a color filter on the arrangement with the four cavities, the desired color can be selected.

The larger area occupied by the four cavities compared to a single light-emitting device also simplifies the placement of an optical element or color filter on the array. In an alternative solution, six such illuminators can be arranged using shared structures to create three sub-pixels by placing a corresponding color filter over a pair of light emitting devices. Alternatively, the semiconductor layer stack can be configured with different material systems and cavity lengths so that different colors can be produced. Such an embodiment is illustrated in FIG. 8E, in the right part of the metal plate structure. Six light-emitting devices are arranged in pairs, with pairs of 1052*b*, 1052*g*, 1052*r* of identical devices arranged in parallel.

The first pair is adapted to emit light that has the shortest wavelength, e.g. blue light, so their cavity has the shorter length l1. A blue filter 1045, illustrated by the dotted line, is placed on the two cavities 1010, which shapes the light or, if necessary, filters out the unwanted parts of the blue spectrum. The filter can also be omitted due to its directionality. The second pair of light emitting devices 1052*g* also includes a pair of cavities arranged parallel to each other with a corresponding LED nanocolumn structure arranged in the center of the cavity. The length l2 is greater than the length l1 and corresponds for example to a green color. An optional forming or filter element 1046 is also provided. Finally, the third pair of light-emitting devices has cavities with the greatest length 13. An optional forming or filtered element 1047 is also provided here, which blocks unwanted parts of the emitted spectrum and shapes the radiation pattern.

The distance between the cavities of each pair is set so that their crosstalk is either minimized or adjusted to a distance that may be beneficial for other parameters such as emission characteristics, process control, and the like. The distance between two different pairs of the same color is adjusted to minimize crosstalk. If necessary, the metal plate implementing the slotted antenna can be separated to reduce the influence of the metal structure. In some variants, the μ-LED array then comprises only one common contact layer structure.

FIG. 8F shows a different arrangement of light-emitting devices using a common structure. The slotted antenna structure comprises not only a directional emission, but can also influence the polarization of the emitted light. For a dipole antenna structure such as a slotted antenna, the electric field vector E is in the same direction as the dipole.

In FIG. 8F, the group of four light-emitting devices is arranged in such a way that two light-emitting devices are arranged in parallel, but the pairs are offset from each other by 90°. In other words, the cavities 1010*a* are parallel to each other but rotated 90° to the cavities 1010*b*. This means that two light-emitting devices are arranged in such a way that their cavities are perpendicular to each other in the shared metal plate. During operation of the devices, the dipole emission of the two devices will also be rotated, resulting in a common rotating electric field vector. Cavities 1010*a* are arranged in a row separated by a distance d of the common metal plate. Thus, the radiation pattern of the versions of the arrangement of FIGS. 8E and 8F is different due to the orientation of the cavities (parallel and 90° offset).

Each cavity 1010*b* of the light emitting devices is arranged perpendicular to the corresponding cavity 1010*a* of the devices so that its extension of the cavity 1010*b* of the device passes through the center and the LED nanopillar of the corresponding other device. The length of each cavity 1010*a* and 1010*b* of light-emitting devices is the same in the illustrated example. However, similar to the above, the length may be slightly different, thus spreading the spectrum. This can be useful when an adjustable polarizing filter is placed over the devices, as such filters can be used to change color selectively.

The right side of the illustrated example of FIG. 8F shows a structure to obtain different colors red, green and blue using converters. For this purpose, each subpixel 1062*r*, 1062 and 1062*b* comprise two light-emitting devices with their corresponding cavities 1010, arranged perpendicular to each other as described above. In some variants, they may also be arranged parallel or in any other configuration. The length of the cavities 1010 of each subpixel is selected with a value that causes the light-emitting device to emit a wavelength suitable for color conversion. A shared converter is arranged above the light emitting devices in subpixels 1062*g* to convert the light (e.g. blue light) emitted from the cavities to a green color.

Also a 1066 converter is used to convert the light from the light emitting devices from subpixel 1062*r* to red. Finally, in this example a color filter 1067 is used to filter unwanted parts of the spectrum for subpixel 1062*b*. In the example presented, the cavity lengths are set to a value that causes the light-emitting devices to emit blue light. If the cavity for subpixel 1062*b* already emits with the desired color, filter 1067 can be omitted.

In some variants, it may be appropriate to select a different length for the cavities depending on the available converter or process requirements. For example, a converter can be used to convert blue light to red or green light to red for red light generation. In the latter case, the cavity length requirements can be reduced, making it easier to process the device.

FIG. 8A illustrates another aspect. The figure shows the top view of a light-emitting device 1001 according to the proposed principle. The cavity 1010 in the electrically conductive structure, for example a metallic plate has a length l and a width w. The width w is set to be slightly larger than a width of the LED nanopillar 1003.

Furthermore, the LED nanopillar 1003 is slightly shifted and not completely centered. This means that the LED Nanopillar 1003 is positioned with one side adjacent to one sidewall of the cavity 1010, which creates a small gap between the other sidewall of the cavity and the opposite side of the LED nanopillar. In order to avoid unwanted leakage current between the LED nanopillar and the sidewall, the LED nanopillar is covered with an insulating layer at least on the longer sidewalls of the cavity opposite sides. In the current example, the LED nanopillar is covered with insulating material on each side. In an alternative version of FIG. 8A, the semiconductor layer stack or nanopillar 1003 is centered in the cavity. An area of the cavity between the semiconductor layer stack 1003 and the electrically conductive layer is filled with a transparent electrically insulating material.

FIG. 8B shows yet another aspect. The LED nanopillar comprises an active region, i.e. one or more quantum well layers in which radiative recombination takes place. In FIG. 8B, the first contact 1011 forms a p-contact, which is connected to the conductive layer 1002. The semiconductor layer stack or LED nanopillar is mainly surrounded by an insulating material 1006. The metal layer forming the slotted antenna forms a U-shaped structure with an upper major surface 10042 and a lower major surface 10041, but this shape is not necessary. In particular, the metal structure can also be completely planar and have only the cavities. The LED nanopillar is placed in the recess or cavity. The active area is formed at the level of the upper main surface, so the end of the active layer facing contact 1011 corresponds approximately to the level of the upper main surface of the cavity. In other words, the active area of the LED nanopillar is placed in cavity 1003 so that one end of the active area is located at approximately the upper major surface 10042 of the cavity.

FIG. 8B, which illustrates the rough view along the Y-Y-axis, shows the arrangement of the active area in the cavity. One end, for example the end of the active area closer to the first contact 1011 is placed at a level of the upper main surface 10042 of the cavity. The active area itself is thus placed closer to the upper opening of the capacity. Such an arrangement and especially the position of the active area within the cavity has an influence on the emission characteristics. In addition to this example, the active layer can also extend further into the metallic cavity.

FIG. 8C and FIG. 8D show some other aspects of light emitting devices to reduce crosstalk further or to improve emission and optical properties. The light emitting device in FIG. 8C along the Y-Y-axis comprises a coating layer 1002, which can be structured and transparent to allow emission in that direction.

Cover layer 1002 is electrically contacted with first contact 1011, the width of which is greater than that of the remaining LED nanopillar 1003, which is placed in a cavity 1004 with a lower main surface 10041 that can be placed on a chip driver circuit or other device. The LED Nanopillar 1003 also comprises a lower second contact 1005 and an active area 1015. Active region 1015 is formed by a large number of quantum wells or quantum dots, but in some other variants it may also have a single quantum well or a multi-quantum well.

The active region 1015 is arranged in the cavity in such a way that its cover layer, which is opposite the first contact 1011, is placed at a level corresponding to the upper main surface 10042 of the metallic slotted antenna structure forming the cavity. The LED nanopillar is covered with a transparent insulating layer 1020 or passivation layer 1020 within the area of the cavity at its sidewalls. The layer prevents unwanted electrical contact between the LED nanopillar and the surrounding cavity structure. The passivation layer 1020 runs from the second contact 1005 towards the area of the first contact 1011.

FIG. 8D shows the execution along the X-X view. The active area 1015 is located in the cavity recess, the passivation layer 1020 formed on the sidewalls of the LED nanopillar runs from the bottom of the cavity to the upper part of the LED nanopillar adjacent to the first contact. It should be noted that although the active area is arranged with one side at the level corresponding to the upper major surface, other arrangements can be formed. For example, the active area can be formed slightly below the upper major surface. Alternatively, the active region may be formed so that it crosses the level of the upper major surface.

Figure 10:
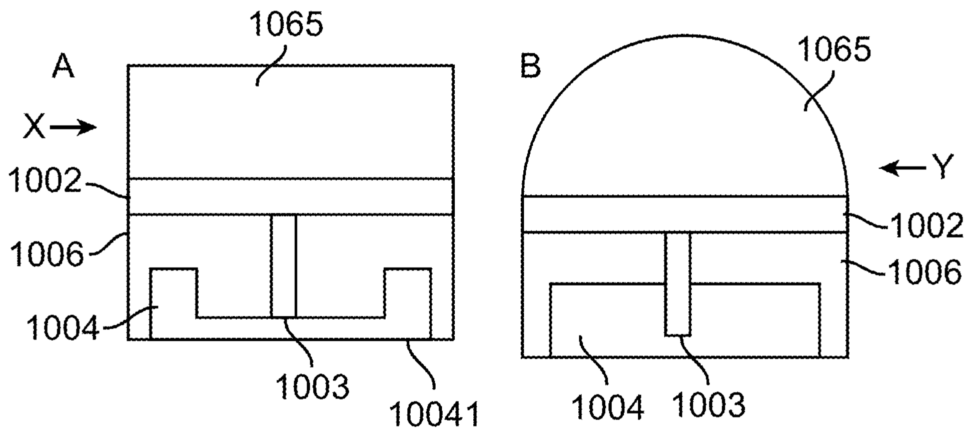
FIG. 10 shows two exemplary versions of a slotted antenna with additional optics arranged on the emission surface.

FIG. 10 shows some examples of the geometry for a coating, mesa structure, converter, color filter or any other structure placed on the light emitting device. Due to the emission characteristics of the device, a structure need not have a symmetrical structure, but its geometry may vary as shown in the figures. In the illustrated example, structure 1065 (for example a color filter) comprises the shape of a half cylinder in subfigure A. In figure B, structure 1065 may have the shape of a hemisphere. This is due to the narrow emission characteristic of the device.

Figure 11:
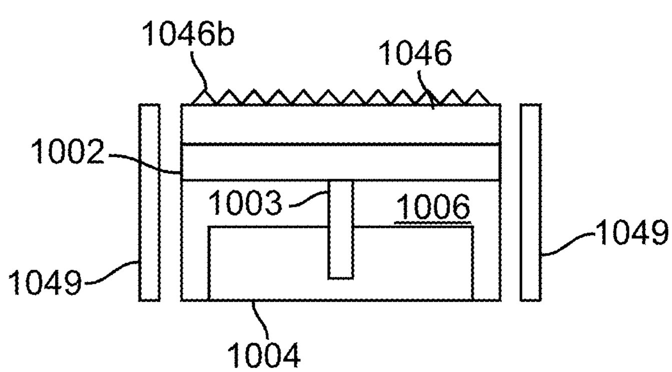
FIG. 11 shows another example of a slotted antenna to produce light of a defined color.

FIG. 11 shows another example that uses color filters and separators to reduce crosstalk. The light emitting device has a color filter 1046 on contact layer 1002. The color filter 1046 comprises a top layer structure 1046*b* to improve coupling of emitted light into another material. The structure can be periodic, i.e. a photonic crystal or a similar structure. Also non-periodic structures such as simple roughening can be used to increase the coupling of light. The light emitting device also comprises transparent separators 1049 on almost every side of the pixel and the light emitting device. The separators 1049 comprises a height roughly corresponding to the height of the light emitting device.

The device shown is manufactured in a monolithic display version with cavities of the same length. This display is used as a light-emitting element for the example of a light guide according to FIG. 248 described below.

Figure 12:
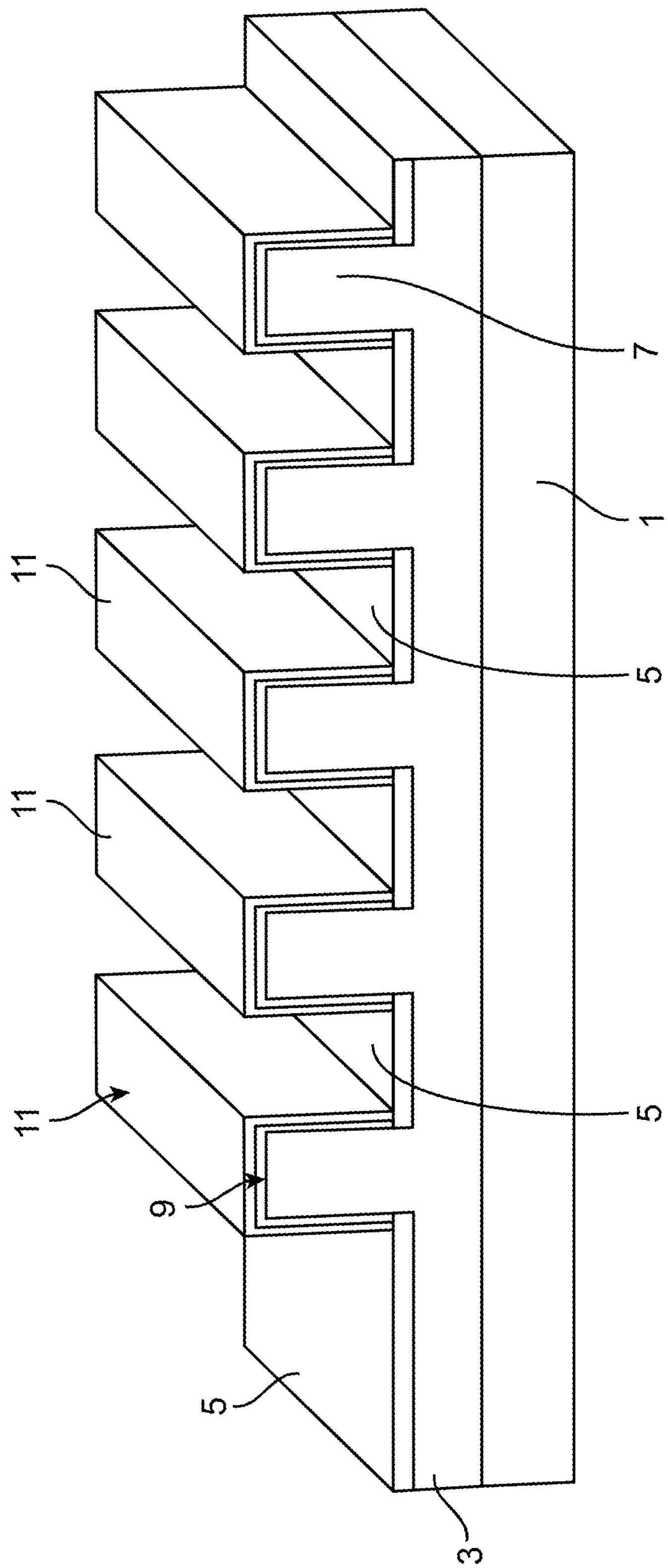
FIGS. 12 to 19 show a step in the production of a pixel from pairs of μ-LEDs in bar form with a converter layer between the pairs in representation of a cross section.

FIG. 12 shows a growth carrier 1, especially a sapphire substrate. This substrate is particularly suitable for the GaN material system. In a first step, matching layers or other measures are taken to obtain a surface that is as planar as possible. Then a growth layer 3 is deposited, on which an insulating masking layer, e.g. of SiO is deposited. This is then structured so that elongated rectangular areas are exposed. The areas are parallel to each other and essentially the same size. A number of, for example six, material volumes 7 in the form of polyhedra, in particular cuboids, are epitaxially grown onto these free areas. This core can be doped so that it can conduct current well. An active layer 9 is then applied to the surface and sidewalls. This in turn is followed by an additional layer 11. The latter is of a different doping type than the core and can, for example, also include a current-expanding layer in order to distribute charge carriers evenly over the entire area, i.e. surface and sidewalls. In this way μ-LEDs are produced in cuboid or Ingot shape.

In FIG. 12 the growth, layer 3 shows n-doping and especially GaN. Masking 5 comprises silicon dioxide or silicon nitrogen. The material volumes 7 show a material identical to the growth layer 3. The active layer 9 contains In— or Al—GaN-MQW (multi quantum wells). The additional layer 11 is p-doped and also based on GaN. Other material systems are also possible. The structures thus formed are substantially parallel to each other with longitudinal axes and have the same size or geometry. Variations result from process fluctuations.

Figure 13:
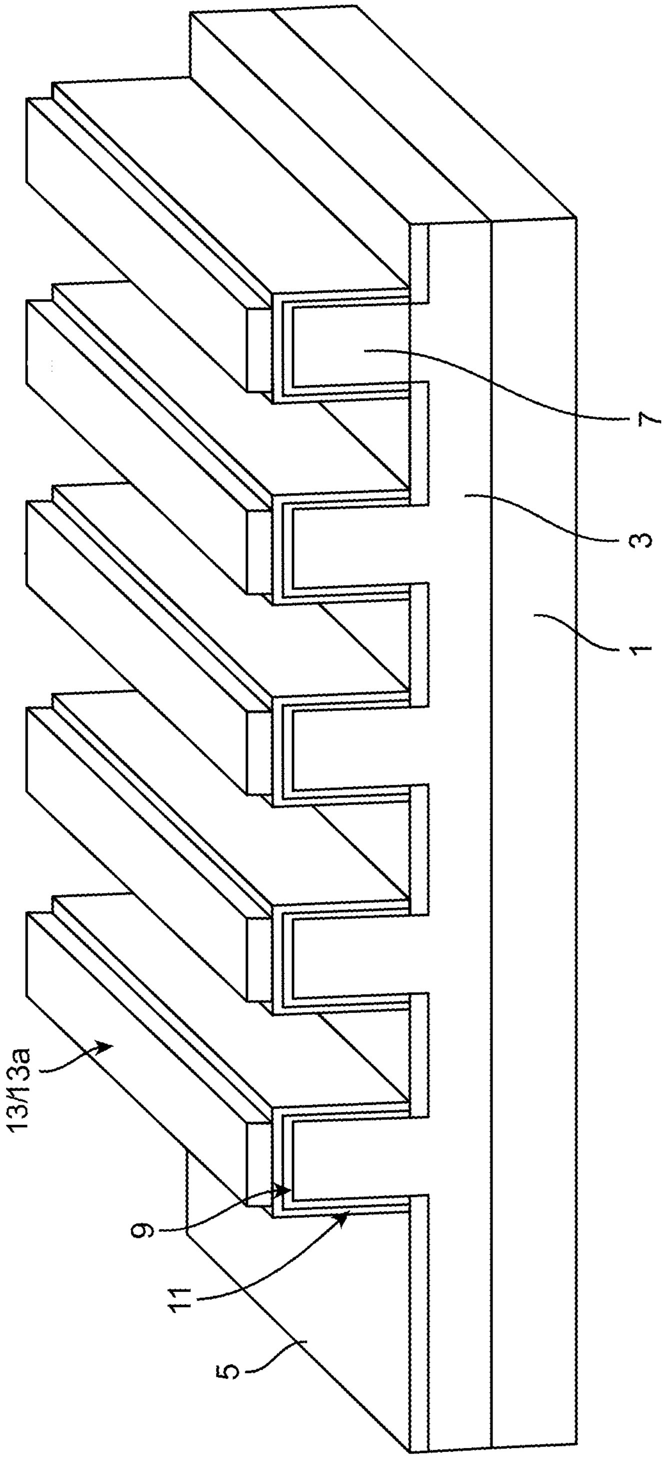

FIG. 13 shows a further step in the production of a proposed electronic component in the same cross-sectional view. In FIG. 13, a mirror metallization 13 or a mirror first metallization 13*a* providing a solder is created on the surface of the material volume 7 covered with the active layer 9 and the other layers 11 on the surface opposite to the growth layer 3. These thus form the p-contacts. The mirror metallization 13 is thus located on the upper side of the cuboids and contacts the p-doped layer underneath over the entire length. This creates a large-area contact that promotes an even current distribution into the p-doped layer.

Figure 14:
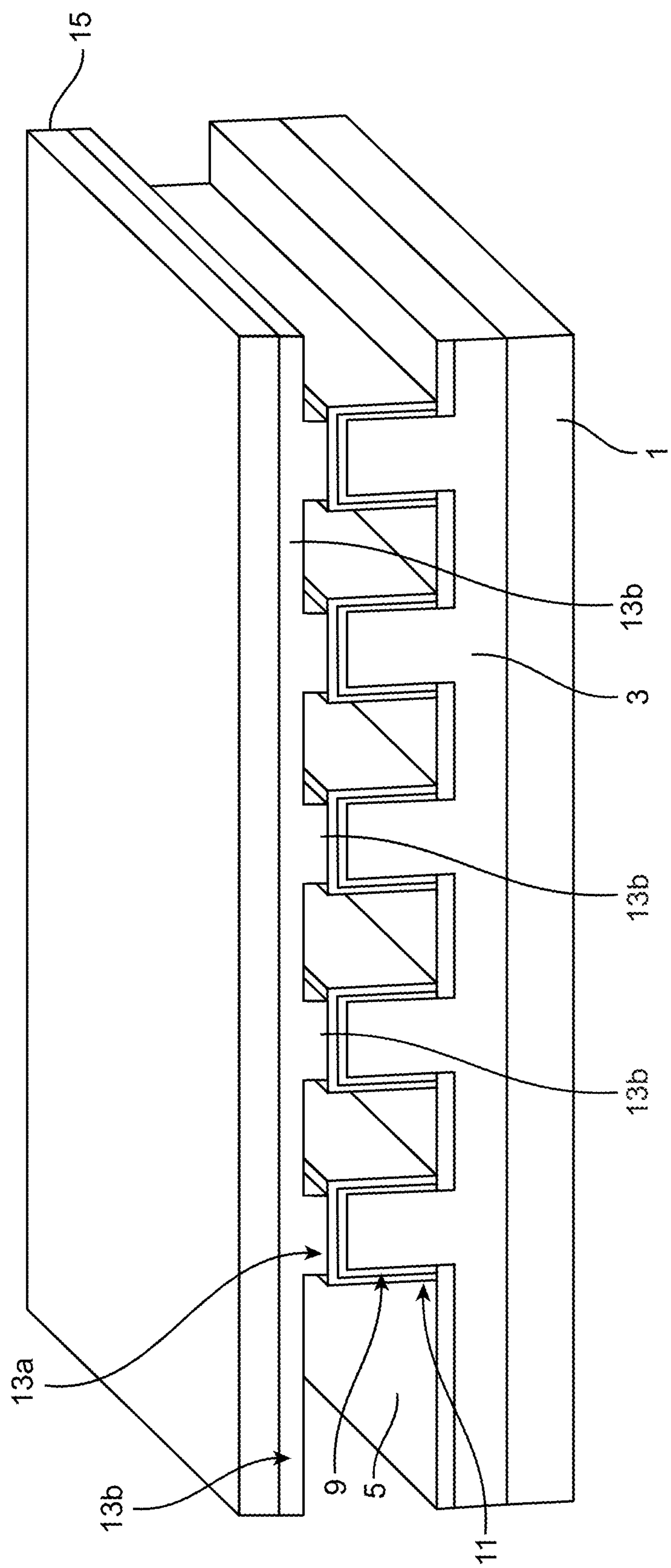

FIG. 14 shows a further step in the production of a proposed electronic component in a cross-sectional view. In this, a solder metallization layer 13*b* is first bonded to a main surface of a flat carrier 15 and then this is provided. The solder metallization layer 13*b* contains a number of contact strips whose length corresponds to the length of the cuboids or bars and the contacts 13*a*. In addition, the distance between the contact strips is chosen to correspond to the distance between the bars on substrate 1. The carrier with the metallization is placed and aligned over the cuboids and then bonded or otherwise fixed to them. This ensures a contact and the metallization 13*b* forms a common connection for all cuboids. The first metallization 13*a* can have the same material as the solder metallization layer 13*b*.

Figure 15:
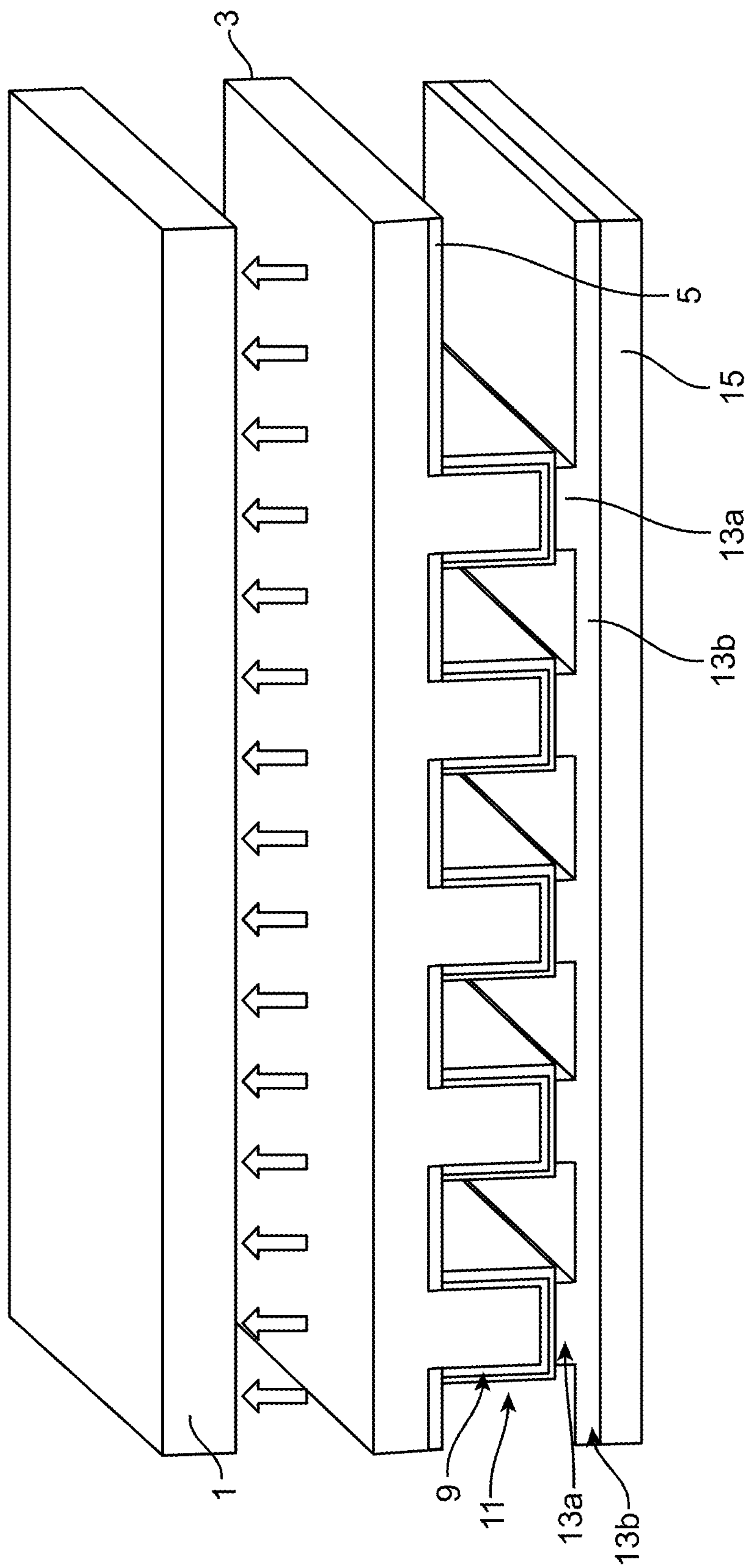

Then, as shown in FIG. 15, the carrier is flipped and the growth carrier or sapphire substrate 1 is removed from the growth layer 3. This process includes a laser lift-off process (LLO (Laser Lift-Off)).

Figure 16:
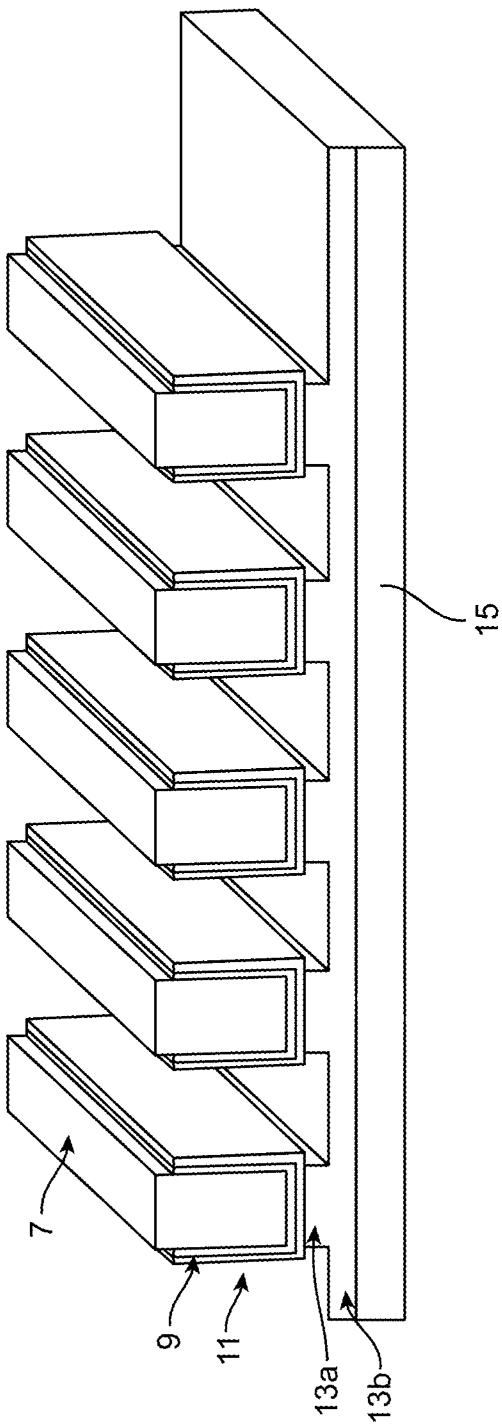

FIG. 16 shows a further step in which the growth layer 3 and parts of the mask were removed. This removal is carried out in two steps, in which the growth layer is first removed to a large extent. Then the element is processed in such a way that an area 7 protruding is left over, in this area it is left out of the further etching process, especially an etching process for the masking layer 5. As shown, a structure results in which the active layer 9 and the further layer 11 are slightly recessed with respect to the surface of the area 7. The etching process can be done by reactive ion etching or plasma etching.

Figure 17:
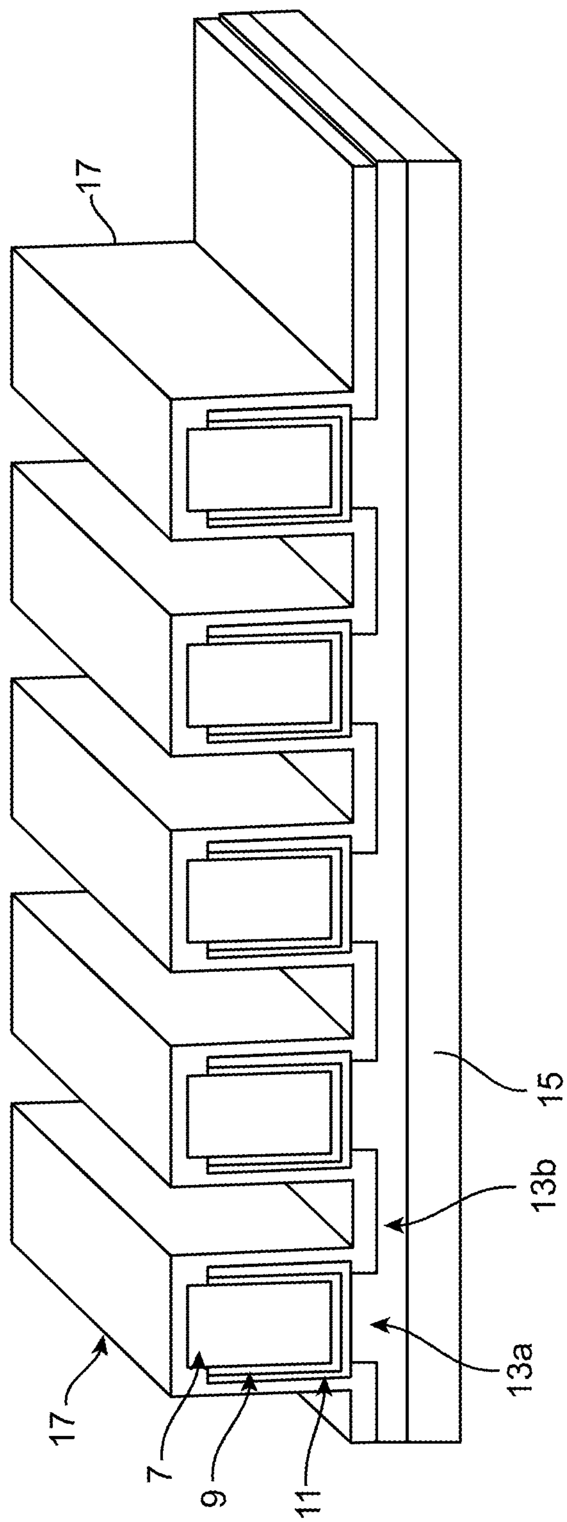

The areas now exposed at the surfaces are completely surrounded by a passivation layer in a subsequent step in FIG. 17. This contains SiO and grows over the entire surface along the long side of the cuboids. Likewise, the surface of metallization 13*b* is covered by a passivation layer, which also extends into the undercut between trench and metallization 13*a*, 13*b*. Although the front side is exposed in the illustration shown, it goes without saying that passivation is also carried out here to protect the underlying layers from oxidation or damage.

Figure 18:
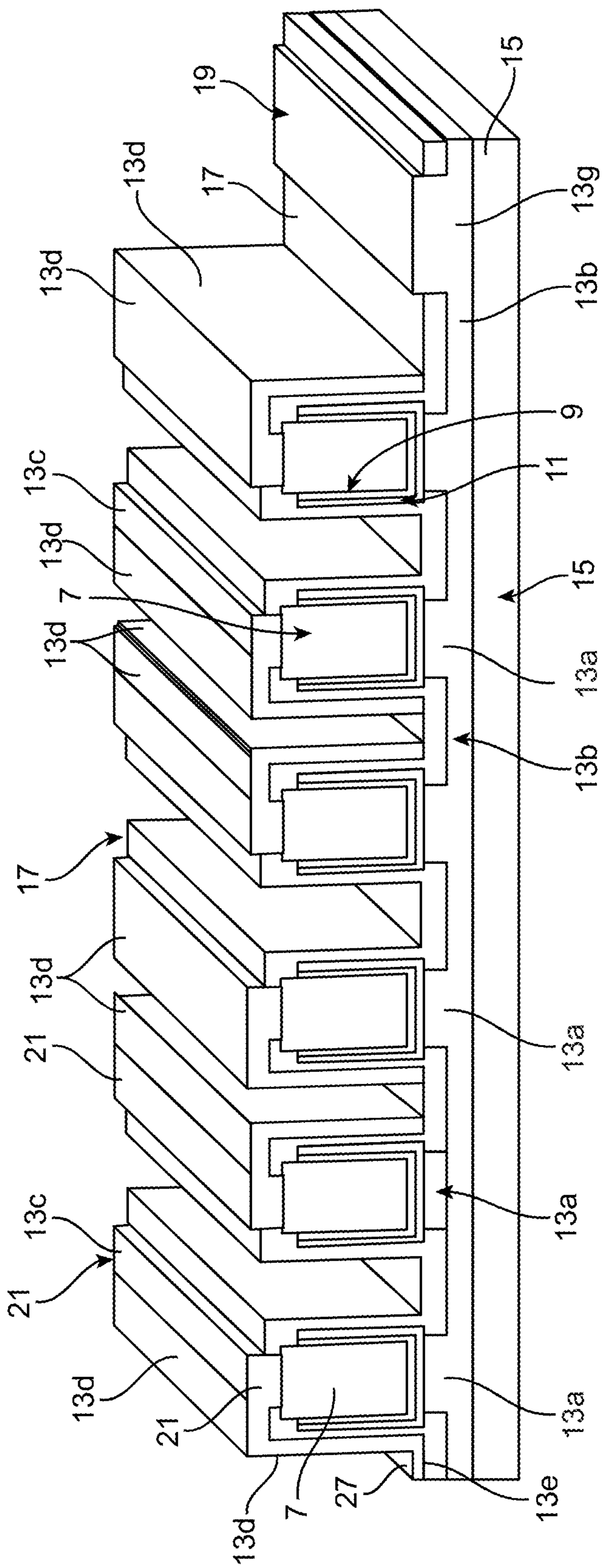

According to FIG. 18, a photo mask is now applied (not shown) and the passivation along the surface of the cuboid is opened again in a strip by an etching process and the underlying core is exposed. The width of the strip is slightly smaller than the width of the surface of the core. This means that a passivation remains even along the longitudinal edge of the core. Then, in a further step, a further metallization 13*c* is applied to the strip. This forms the n-contact 21 for the μ-LED elements. In addition to the n-contact formed by a strip, the strip is also contacted by a metallization 13*d* on one side. The metallization 13*d* extends in this embodiment over the whole long side of the μ-LED element and also runs along the sidewall down to the passivation 17. Metallization 13*d* is reflective. The course of the metallization 13*d* is chosen in such a way that two metallizations 13*d* are applied to the sidewalls of the μ-LED elements opposite each other. In three adjacent μ-LED elements at least two metallization of the elements are opposite each other.

Figure 20:
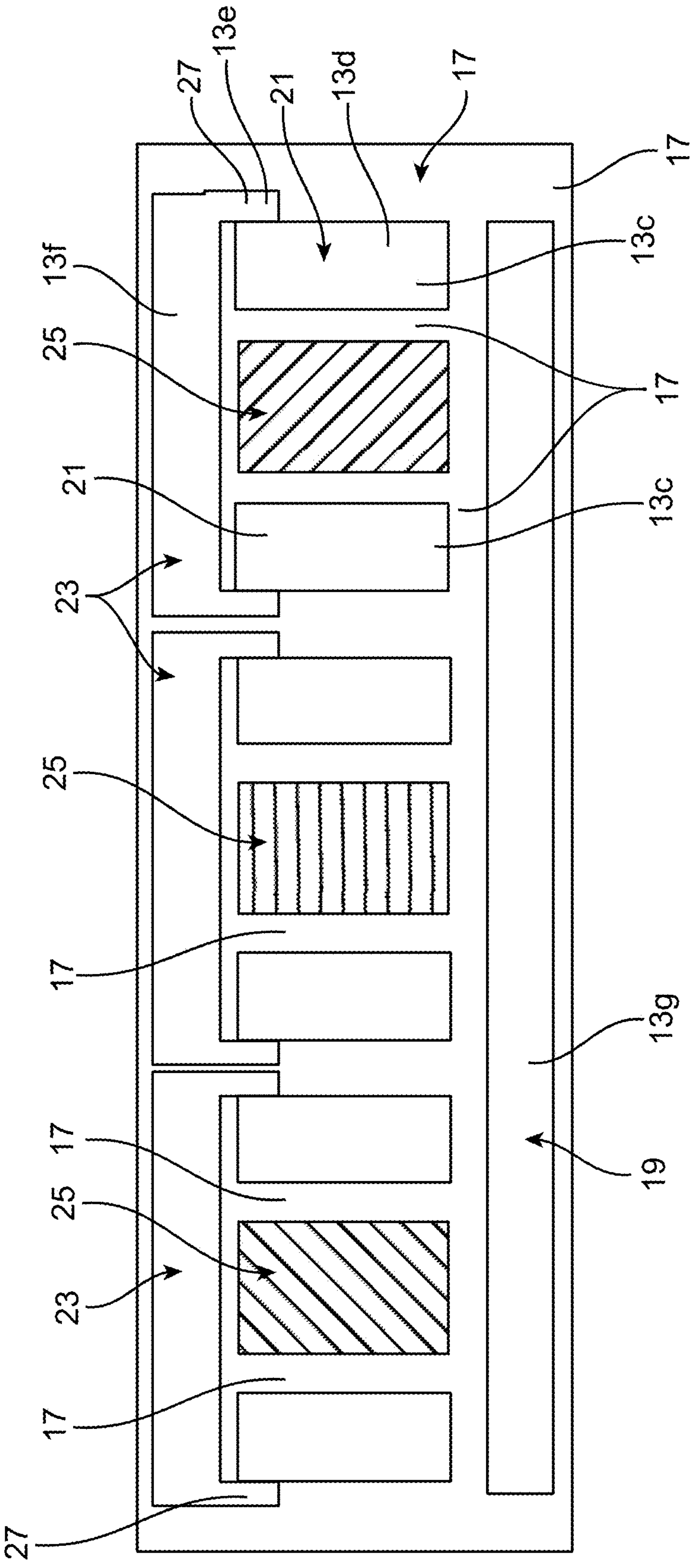
FIG. 20 illustrates a step of a first contacting of a proposed pixel with pairs of μ-LEDs in a top view.
Figure 21:
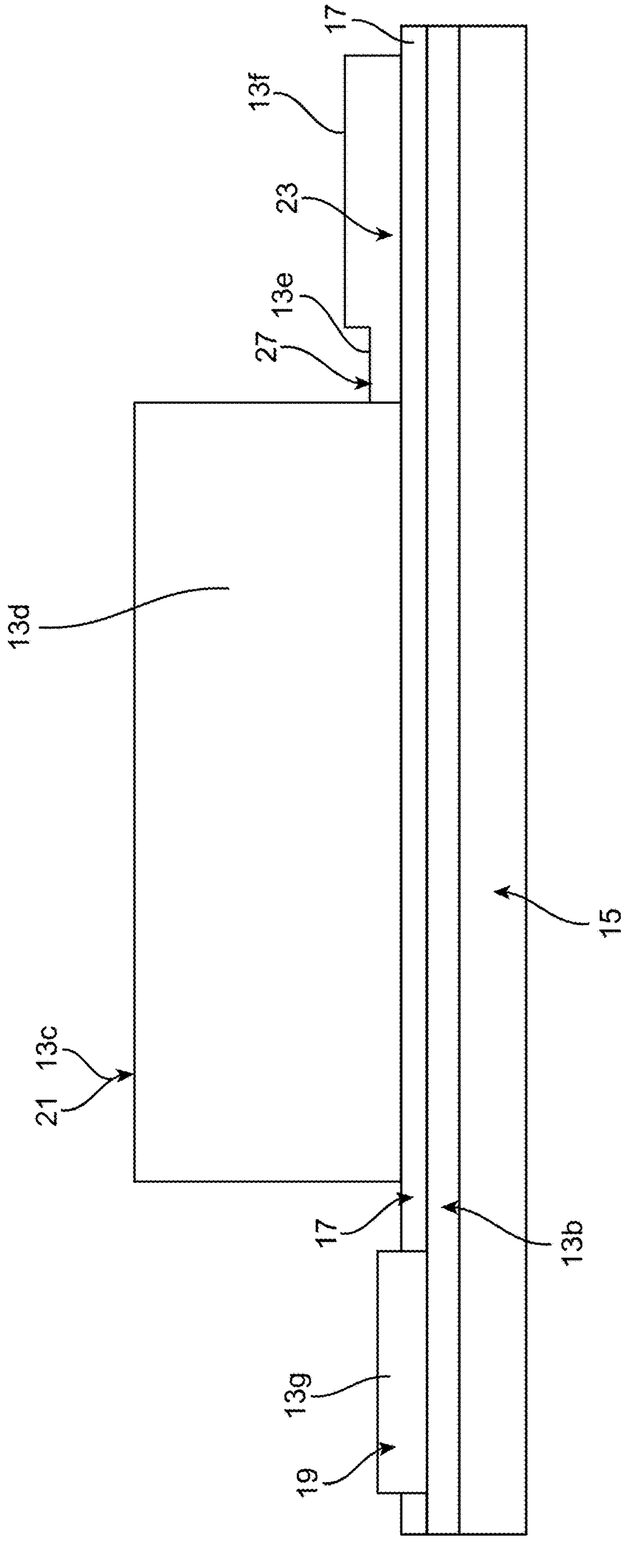
FIG. 21 shows the step of first contacting a proposed pixel in a longitudinal section according to some aspects of the proposed concept.

On one side, shown in FIG. 18 on the far left, another third metallization 13*e* is also deposited. This forms a metallic n-interconnection 27 to n-contact areas 23 attached to this surface of the passivation layer 17, which can be formed by means of fourth metallization 13*f*. The n-contact areas 23 can be created as contact strips and are shown in FIGS. 20 and 21.

In contrast, on the far right side of the pixel element shown in FIG. 18, the passivation has been removed in one area to expose the metallization 13*b*. This is then filled with the electrically conductive material 13*g* and forms a planar p-contact area 19, which is electrically connected to the p-contacts 13*a* by means of the solder metallization layer 13*b*. The p-contact area 19 has a large surface area and is thus suitable for bonding.

Figure 19:
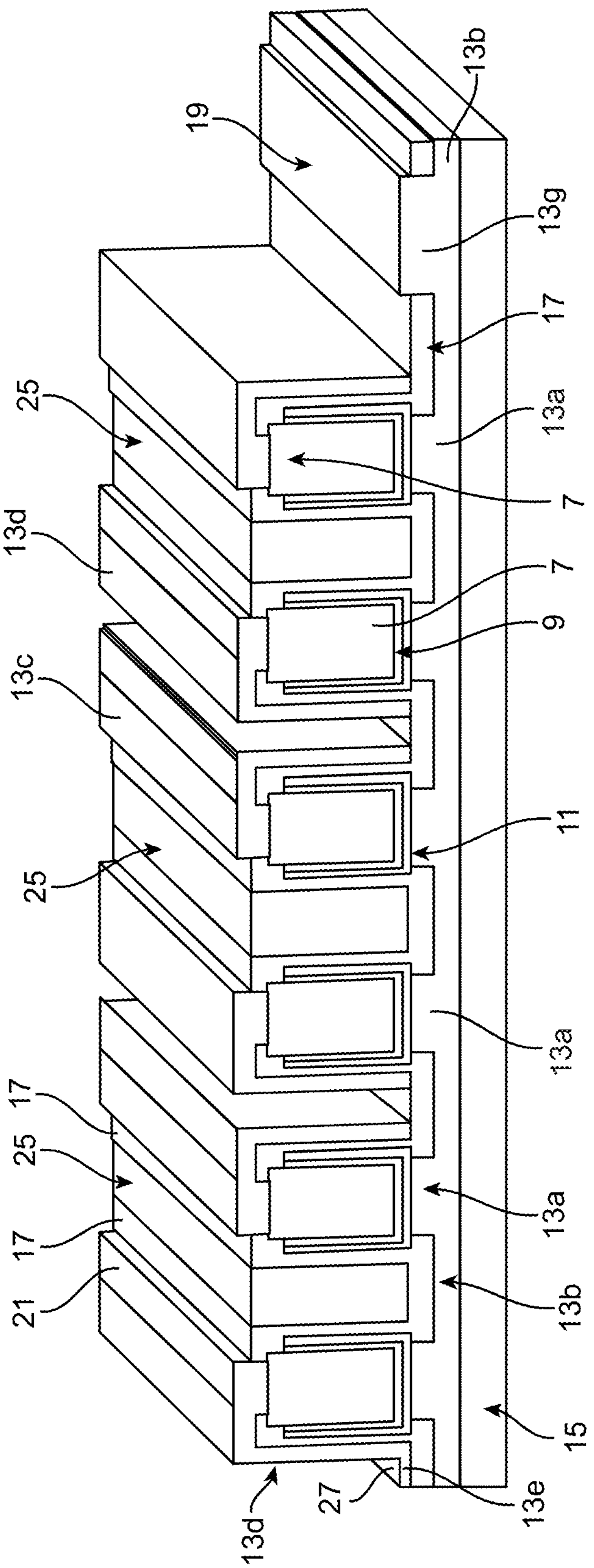

In the last step, as shown in FIG. 19, a part of the spaces between the two materials is filled with a converter material. In detail, however, only the space between the two materials is filled in where no reflective metallization is present. The area with opposite metallization 13*d* is left out. In other words, only the space(s) in between is/are filled with converter material where sidewall mirror metallization 13*d* facing away from each other were produced. The reason for this is that light generated in the active layer by the reflective metal layer is directed back towards the converter material. The converter material is filled up to approximately the height of the n-contacts 21. Thus, even slightly obliquely emitted photons can be converted in the converter.

The converter material 25 can, for example, be produced differently for each color in epitaxially generated micro light-emitting diodes of identical construction, which emit in the ultraviolet range, for example, so that the light is converted into red, green and blue light. With a number of six electrical μ-LEDs, a converter material 25 matched to one color can be used for every two adjacent μ-LEDs. Since two μ-LEDs are thus assigned to each color, there is redundancy for each color. In this way, a redundant RGB pixel is created.

FIG. 20 shows such a pixel arranged in a row with three subpixels each consisting of two μ-LEDs with converter material in between in top view. FIG. 21 shows a longitudinal section of the same pixel element. In this version, there is a common p-contact 19, which extends over the entire length of the pixel. The n-contacts 23 each contact a pair of μ-LEDs, with converter material arranged between them for converting light into different wavelengths. FIG. 20 shows in particular that n-contacts 21 are electrically connected to n-contact areas 23 by means of sidewall mirror metallization 13*d* and third metallization 13*e* deposited on the side of the passivation layer 17 facing away from the carrier 15, forming n-interconnections 27. N contacts 21 are formed as second metallization 13*c*. N-contact areas 23 are formed as fourth metallization 13*f*.

The n-contact areas 23 and p-contact areas 19 are configured in the form of connection strips or bus bars and can be arranged both on the front side for bonding contact wires and on the back of the carrier for connection as a "flip chip". FIG. 21 also shows that p-contact areas 19 created by means of fifth metallization 13*g* are electrically connected by means of solder metallization layer 13*b*. This is electrically connected to p-contacts 20 created from first metallization 13*a*, which are not shown here.

Figure 22:
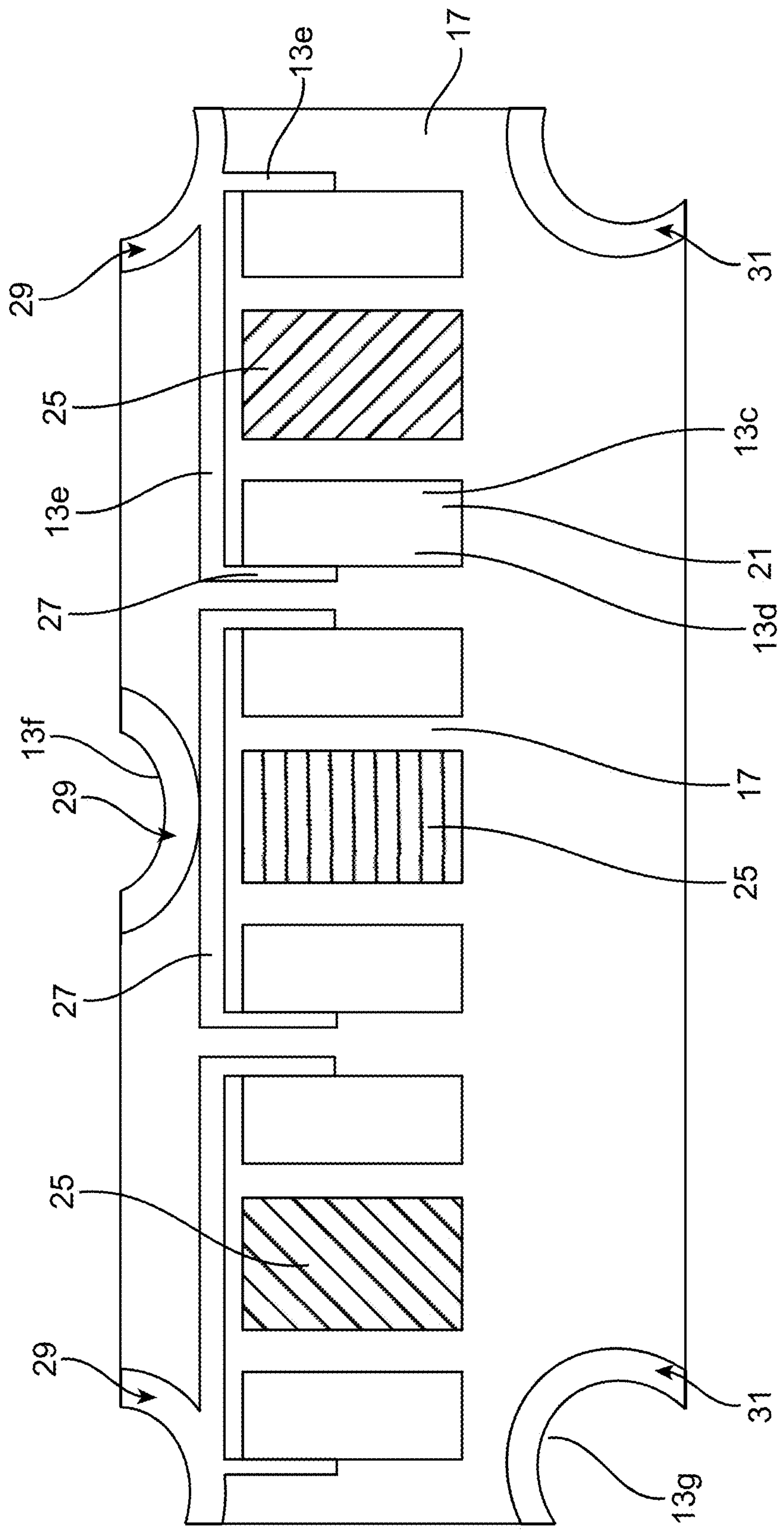
FIG. 22 represents a step of a second contacting of a proposed pixel in a cross-sectional view according to some aspects of the proposed concept.

A further contact possibility of such a pixel is shown in FIG. 22. Here the pixel is configured as a surface-mountable module. In contrast to the previous version, the n-contacts 21 are electrically connected to n-contact vias or vias via intermediate line 27. The n-contacts 13*d* are connected to the intermediate lines through the metallization running along the sidewalls. For each n-contact, there is a through hole. The via 29 and the intermediate layers are electrically isolated from the metallization 13*b* (not shown here) and the carrier 15.

Figure 23:
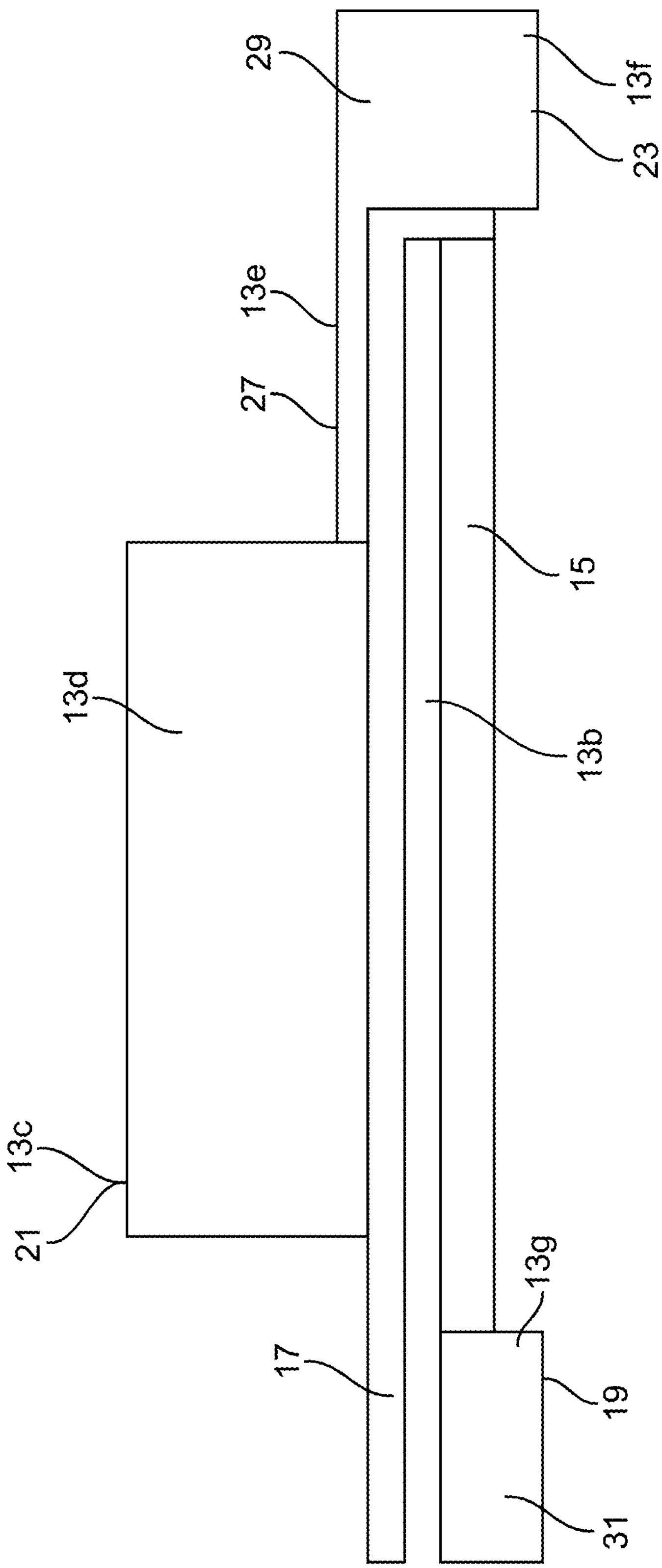
FIG. 23 shows the step of the second contacting of a proposed electronic component in a longitudinal section.

FIG. 23 shows the longitudinal section of the pixel element. Line 27 contacts the n-contact 13*d* and then leads to a via 29, which is connected to the n-contact 23 on the bottom of the carrier 15. Passivation layer 17 separates the p-contact 31 also on the bottom side and the metallization connected to it from the n-contact. The two contacts on the underside allow the pixel to be applied directly to a matrix.

Figure 24:
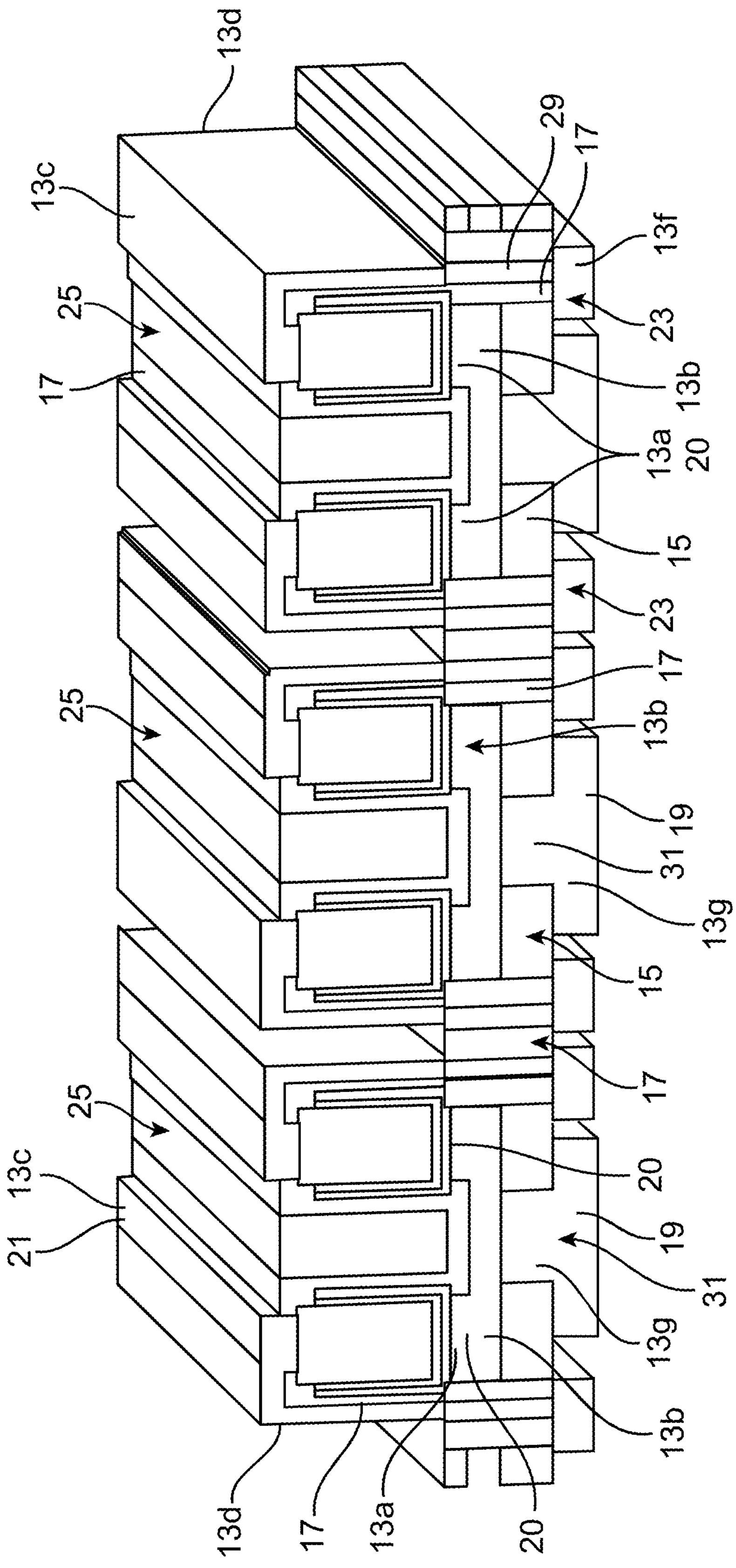
FIG. 24 shows the step to create a pixel after the previous figure in a cross-sectional view.

FIG. 24 shows a pixel redundant for red-green-blue light where the n-contact vias 29 have been formed where the sidewall mirror metallization 13*d* end. These run from the second metallization 13*c*, along the surfaces of the passivation layer 17 perpendicular to the substrate 15 to the surface of the passivation layer 17 facing away from and parallel to the substrate 15, from where via 29 are provided to contact the n-contact with areas 23 on the other side of the substrate. A via 31 is also provided, which is located at a point on the substrate opposite the center of the converter material and contacts the p-layers. In this way, a redundant RGB pixel is created, since even if one μ-LED fails, the second one can still be controlled.

Three converter materials are provided in this embodiment. However, blue light does not need to be converted. Therefore, a diffusion or another material can be used instead of a blue light conversion material. In addition, individual pixel elements are shown here. It goes without saying, however, that a large number of pixels can be produced in this way. Thus, a large number of pixel elements can be produced monolithically in rows and columns. These form a μ-display or a module, which in turn can be placed and contacted on a carrier or a board with appropriate control electronics.

Figure 25A:
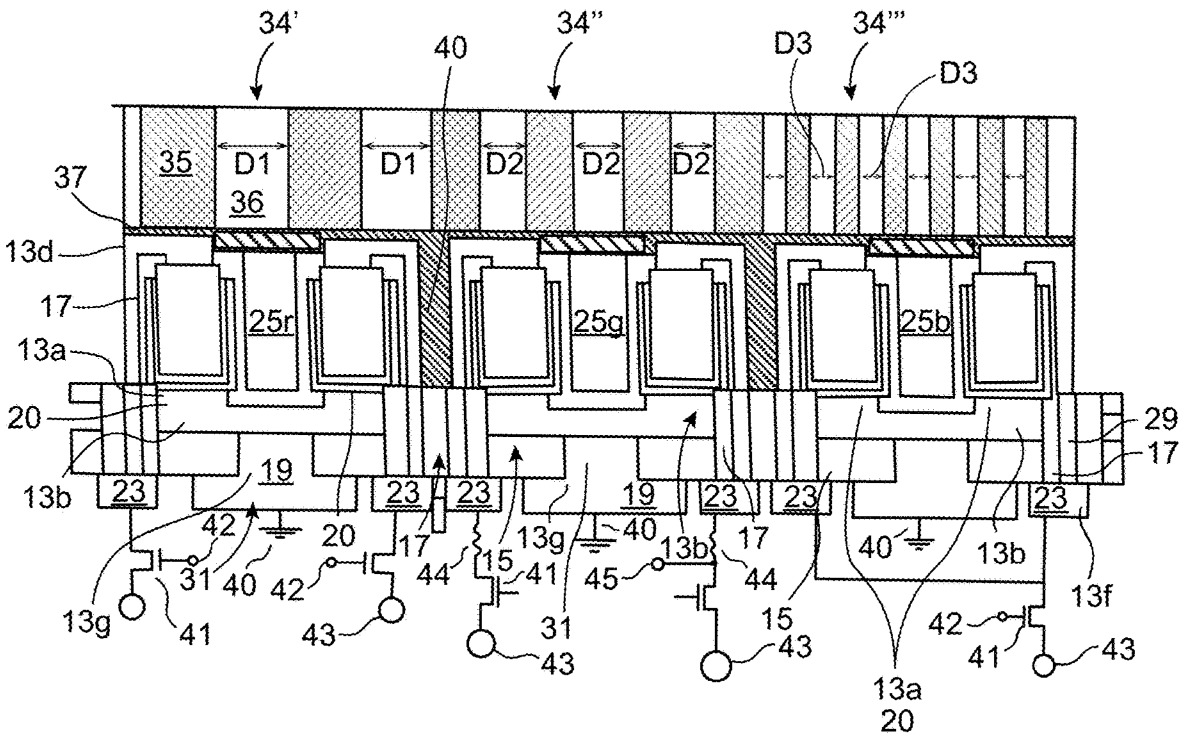
FIG. 25A is an embodiment of a pixel with an arranged light-shaping structure and different control options according to some aspects of this disclosure.

FIG. 25A is an addition to the embodiment of FIG. 24 with some more of the measures described in this revelation. The redundant pixel is covered with a dielectric and transparent top layer 37, which was subsequently planarized. The top layer also extends into the recesses between the pixels so that they are filled with a material. A light-shaping structure in the form of a photonic crystal 34 matched to the respective color is incorporated in the top layer 37. The crystal is made by one of the techniques described in this revelation. It can be formed by other structures shown in this disclosure in addition to the structure specifically shown here. The photonic structure comprises sections 35 and 36 of materials with different refractive indices, with material 35 corresponding to the top layer. The first structure 341 has sections of thickness D1, which is matched to the wavelength of the light emitted by the converter 25*r*. In the case of red light, thickness D1, and therefore the distance between sections of the same refractive index is the greatest.

Above the second subpixel with the 25*g* converter material, a photonic structure is arranged whose sections have the smaller distance D2 to each other. Above the subpixel with the converter material 25*b*, the distance D3 between materials with the same refractive index is smallest, the periodicity as the reciprocal of the distance is correspondingly largest. In this form of representation, the photonic structure is designed so that its periodicity is adapted to the frequency of the emitted light. This results in the different distances. In another embodiment, it may be intended to select common divisors or multiples of this periodicity, or to specify superlattices, in order to provide, if necessary, a photonic structure with equal distances between materials having the same refractive index. Alternatively, such a superlattice may be intended to provide frequency-selective selection, i.e. to deflect, scatter or reduce unconverted light as shown in some of the embodiments herein. In this way, the photonic structure can also act as a filter for unconverted light emerging from converters 25*r* and 25*b*.

Figure 25B:
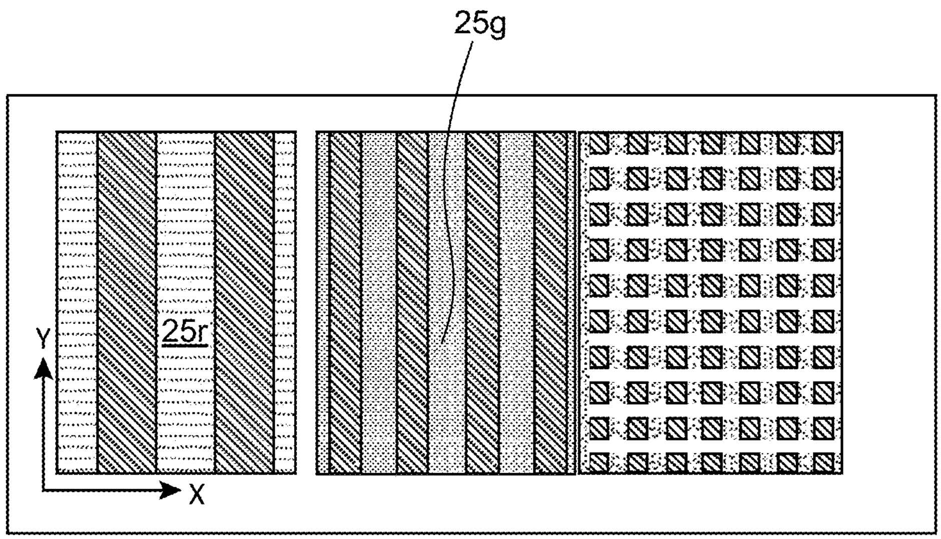
FIG. 25B shows a top view of the photonic structure.
Figure 25C:
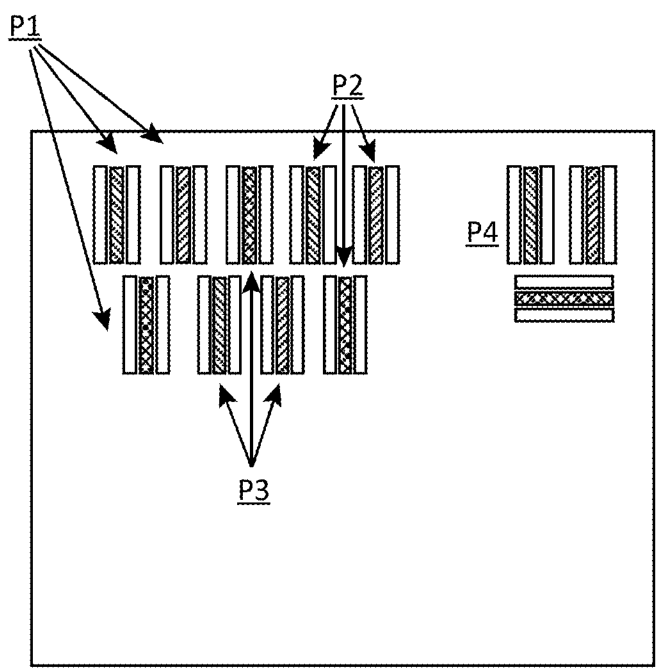
FIG. 25C shows another top view of different ways to position subpixels of different pixels, according to some aspects of FIG. 25A.

FIG. 25B shows a top view of this structure. In the left subregion the subpixel 25*r*, in the middle subregion the subpixel 25*g* and in the right subregion the subpixel 25*b* are each represented with a photonic structure. The photonic structure of the first and second portion is formed as a so-called one-dimensional photonic structure. Due to the bar, shape of the photonic structure, where the material of different refractive index is substantially parallel to the μ-LEDs and the converter material, a virtual band gap along the periodicity results. Light propagating along direction x is reduced by the photonic structure. In the right section for the subpixel 25*b* a two-dimensional photonic structure is shown whose periodicity is the same in both spatial directions x and y. This results in a suppression of light propagation of emitted light in both spatial directions and light is emitted in a narrow cone.

At this point, it should be mentioned that instead of the photonic structure shown, a microlens or other light-shaping structure can also be arranged above the individual subpixels. The same applies to other μ-LED arrangements. A microlens is produced photolithographically and seems to be possible even with smaller structures by inherent selective etching.

Referring again to FIG. 25A, the figure also shows examples of how to control the different subpixels. Of course, the skilled person knows that in an implementation it makes sense to use only one of the possible controls. The illustration is therefore schematic in nature. For all subpixels 25*r*, the connecting contacts 19 are connected to a common ground potential 40 each. Contacts 23 for the first subpixel with the μ-LED pair and converter 25*r* each lead to a voltage source 43 via a current driver transistor 41. Thus, both μ-LEDs can be supplied with current independently of each other in the embodiment for subpixel 25*r*. Thus, each μ-LED can be operated with lower current intensities for the same total intensity. For the middle pixel, a fuse 44 is connected between the current driver transistor and the μ-LED. This design is similar to one of the embodiments in FIGS. 323 to 327 in that one of the fuses is connected to an element that triggers the fuse, which is represented in the figure by reference sign 45. In the right subpixel 25*b*, both pins 23 are connected to a common current driver 41. The current driver transistor 41 may, inter alia, be configured as the driver transistors disclosed in this application. This includes, for example, the backgate transistor disclosed in this application (see FIG. 296*ff*).

Furthermore, the individual subpixels do not have to be arranged in parallel. Thus, there is the option of arranging one pair of μ-LEDs offset to the other two or even offset by 90°. FIG. 25C shows an example of such a pixel structure in top view. The left view shows two rows of sub-pixels of pixels P1, P2 and P3. These are arranged alternately, i.e. pixel 1 has the green and blue subpixels in the first row, while the red subpixel is centered in the second lower row. Pixel P2 is again arranged exactly the other way round, i.e. pixel 1 has the blue and green subpixel in the second row, while the red subpixel is centered in the first row. This results in a structure similar to the above, but the control is slightly different because the three subpixels arranged in a row belong to at least two different pixels. In the right part of FIG. 25C, the red subpixel with its cuboids is arranged perpendicular to the other two subpixel pairs. This results in a very small space consumption.

Figure 26:
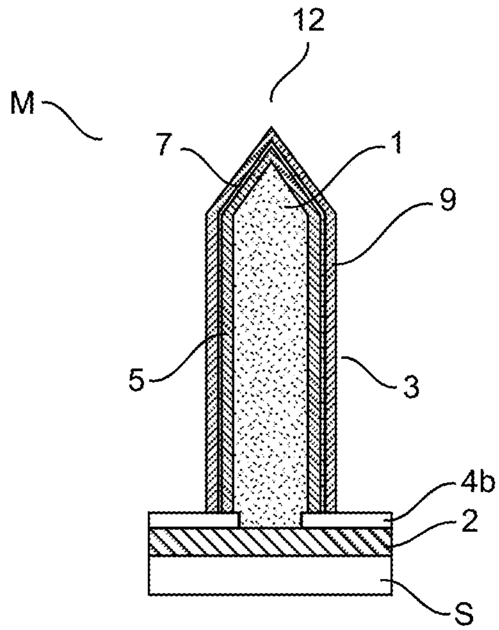
FIG. 26 is an embodiment example of a μ-rod as starting material for the production of an optoelectronic device, in particular a μ-LED.

FIG. 26 shows an embodiment of a μ-rod M as it is manufactured separately. It serves as a basis for the production of the proposed electronic component with a variety of horizontally aligned μ-rods.

The μ-rod comprises a core 1, which is partially enveloped by a layer sequence 3. The layer sequence 3 is formed from inside to outside by a first layer 5, an active layer 7 and a second layer 9. The core 1 comprises n-doped GaN. The first layer 5 can also contain n-doped GaN, but with a different doping concentration. The active layer 7 comprises one or more quantum wells or quantum wells with InGaN. In the active layer 7, the charge carriers recombine and emit light. The second layer 9 is deposited on the active layer 7 and has p-doped GaN.

The μ-rod is generated on a sapphire substrate S on which an optional growth layer 2 of n-doped GaN is grown. A structured mask 4*b* of $SiO_2$ is deposited on this layer.

The μ-rod M is a regular hexagon in cross-section. At its tip, the diameter decreases and ends in the shape of a pyramid tip. Active layer 7 thus extends around the core and runs substantially from mask layer 4*b* to the tip. Likewise, the p-doped GaS layer completely encompasses the core and the active layer 7.

An emission wavelength is set by the shape and geometry, in particular the diameter of the μ-rods together with the material system used for the active layer and/or doping. The size of the μ-rods, especially the height, is in the range of a few μm, for example less than 20 μm or in the range of 5 μm. The diameter is also in the range of a few μm, for example 2 μm. In some aspects, a ratio of height to diameter is in the range of 1 to 1 to 4 to 1. After production, the μ-rod is removed from growth substrate 2 and further processed.

Figure 27A:
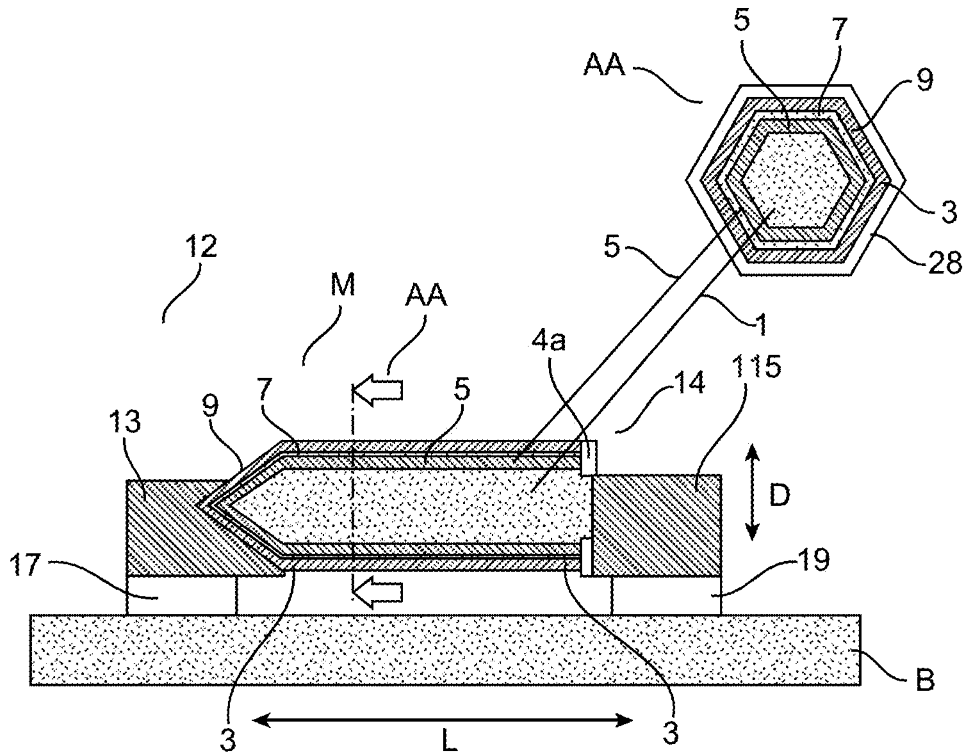
FIG. 27A shows an example of a μ-LED with a μ-rod structure aligned horizontally to the carrier.

FIG. 27A shows an embodiment of a μ-rods M fixed on a carrier and electrically connected, thus forming a pixel or subpixel. The cross-section of the μ-rod is shown again in FIG. 27A along the sectional area AA in the upper right corner. The μ-rod has a cross-section in the shape of a hexagon with equal angles and edges. The layer sequence 3 from inside to outside is shown, with an additional current expansion layer 28 surrounding it on the outside. The current expansion layer is appropriately transparent and extends from the tip of the μ-rod to the insulating layer 4*b*.

The μ-rod M is now arranged lengthwise and substantially parallel to carrier B. At its first longitudinal end 12 the current expansion layer 28, or the p-doped layer 9, is connected to a first contact 13. The first contact extends along the lower half side of the pyramid or tip, and runs from tip 12 to the longitudinally extending area. Part of the contact is also attached to the top of the tip, so that the contact forms a kind of cap and partially encapsulates the tip of the μ-rod. The contact 13 is in turn applied to a contact area 17, which is connected to the carrier B and any electrical structures present in it. The contact area 17 extends beyond the surface of carrier B, which means that the μ-rod is slightly spaced from the surface of the carrier.

At its other rear end 14 core 1 is connected to contact 115. Due to the remains of the insulating masking layer 4*a*, contact 115 does not create a short circuit and is electrically insulated from layer 19 or even 28. The height of contact 115 reaches approximately to the upper part of the insulating layer 4*a*. This contact is also electrically and mechanically connected to a contact area 19. Contact areas 17 and 19 are substantially the same height, so that the μ-rod is aligned parallel to the surface of the carrier. The space between carrier B and the μ-rod is empty in this example, i.e. not filled with a reflective material. However, as explained further below, it is advisable to place a reflector structure below and around the μ-rod thus arranged.

Figure 27B:
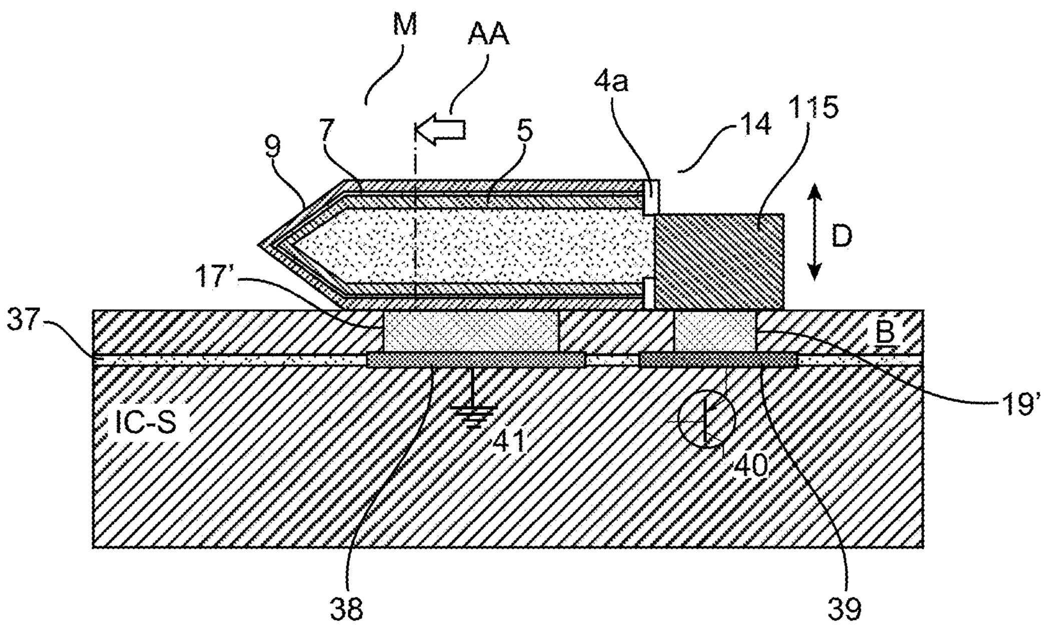
FIG. 27B shows another embodiment example where the contacting is done on a bottom side of the μ-rod.

FIG. 27B represents an alternative embodiment and supplement to FIG. 27A. In this embodiment, the μ-rod is directly in contact with the surface of carrier B. A contact area 17' is provided for contacting, which is relatively large in area, making positioning easier. In another version, this contact area 17' can also slightly protrude over the surface of carrier B, so that the μ-rod is positioned slightly above it. Contact 115 is connected to contact element 19'. In addition, the figure shows another substrate IC-S, in which several driver circuits, lines and other components are accommodated. Contacts 38 and 39, which also have a large surface area, are connected to the lines and circuits. For example, the contact area 38 leads to a ground potential 41, the contact area 39 leads to a driver circuit 40, shown here schematically. An adhesive 37 connects both carriers with each other. Due to the large surface area of the contacts, positioning the carriers on each other is simplified.

In another version according to FIG. 27B, the μ-rod can also be placed directly on the base carrier B. In this embodiment, the p-doped layer 9 or the current expansion layer along one long side is directly connected to a first contact area 17' on the surface of carrier B. A second contact area 19' is provided in carrier B, isolated from this and electrically and mechanically connected to contact 115. In addition to a simpler production, the steps in FIGS. 30 and 31 can be omitted; a larger contact area 17' is possible here.

This simplifies alignment and placement. Contact area 17' includes a reflective conductive layer. A reflective structure around the μ-LED can also be provided here. This forms a box around the μ-LED, whereby the surface or the space in between can be filled with converter material.

Figure 28:
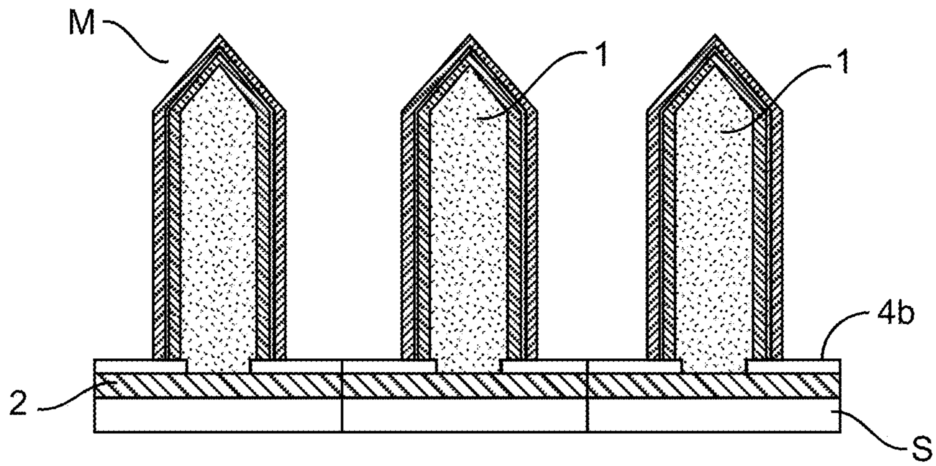
FIGS. 28 to 37 illustrate an embodiment example of a proposed process for manufacturing a group of three μ-LEDs aligned and contacted horizontally to the carrier according to the proposed principle.

FIGS. 28 to 38 show an example of a proposed process for manufacturing a group of optoelectronic components from three μ-rods. FIG. 28 shows three μ-rods M arranged side by side and extending vertically from a growth substrate S, which are produced by means of an optional growth layer 2 having a first doping. A patterned mask 4*b* is deposited on the surface of the growth substrate 2. In the exposed areas, an elongated core 1 is formed perpendicularly from the growth layer 2, a core 1 having a material identical to the growth layer 2. The growth process produces the tapered tip shown in FIGS. 26 to 28. Then the layer sequence 3 is deposited on the core in several steps. First, layer 5 with the same doping type is deposited on the core. An active layer 7 is grown on this. This comprises several quantum wells. A p-doped layer 9 follows on the active layer 7. In addition, a current-expanding layer is deposited on the p-doped layer to distribute the injected charge carriers over the entire area of the p-doped layer 9. Of course, p- and n-doping can also be interchanged. In these examples, layer sequence 3 is produced epitaxially as far as possible.

FIG. 28 shows a further process step for the manufacture of a proposed optoelectronic component. First contacts 13 are formed for the group of three μ-rods. For this purpose, a photoresist 11 is applied to the surface of the μ-rod and the current expansion layer. The longitudinal end 12 with the tip is then exposed by means of O plasma etching and a conductive transparent contact is deposited flat on the tip. ITO is suitable for this contact 13. As shown in FIG. 28, the contact does not extend over the entire tip, but only over the upper area.

Figure 29:
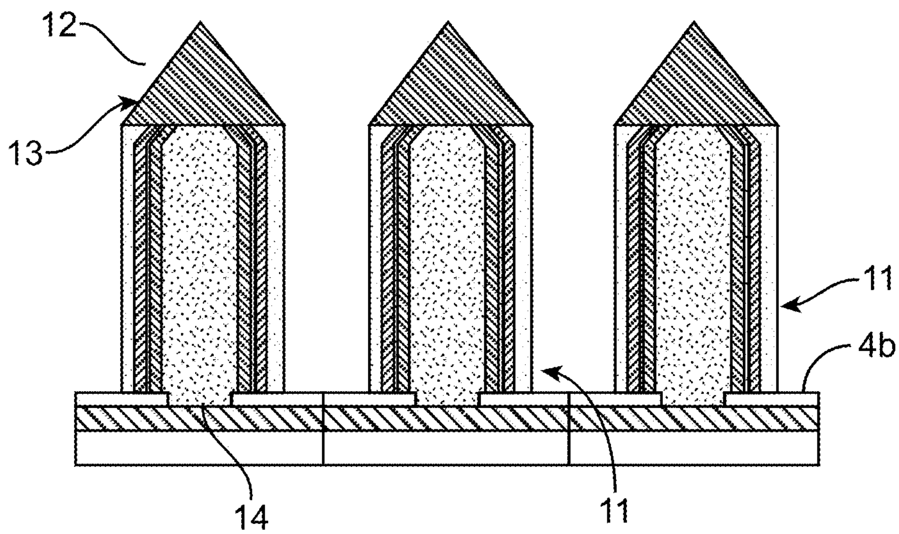

FIG. 29 shows an alternative embodiment. This can be produced by using the first contact 13 as shown in FIG. 28 as a seed layer and then electroplating or sputtering contact material onto it. This means that contact 13 comprises at least one contact layer to which a first contact area 17 of a carrier B can be easily connected mechanically and electrically. The contact planes for contacting with the first and second contact areas 17 and 19 run parallel along the longitudinal axis of a μ-rod M. The formation of the first contact 13 as a cube or cuboid is useful, because the resulting component does not show a strong change of its diameter, but substantially forms a twill with a hexagonal base or another polyhedron.

Figure 30:
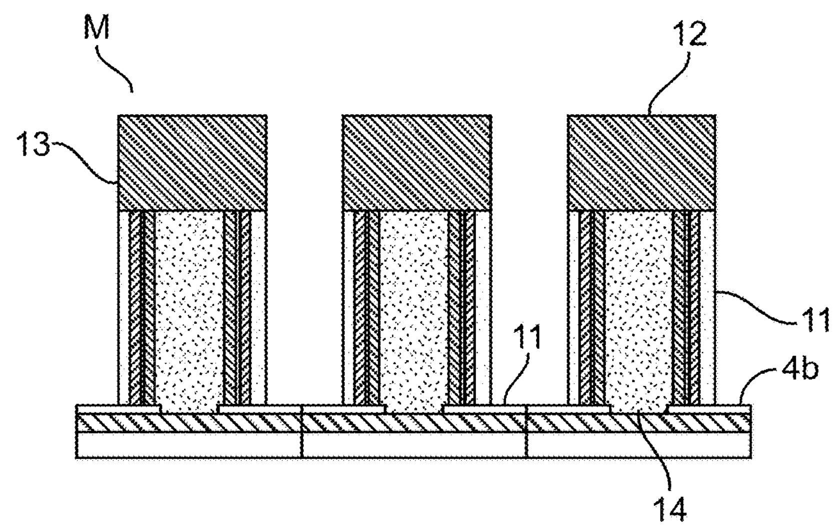
Figure 31:
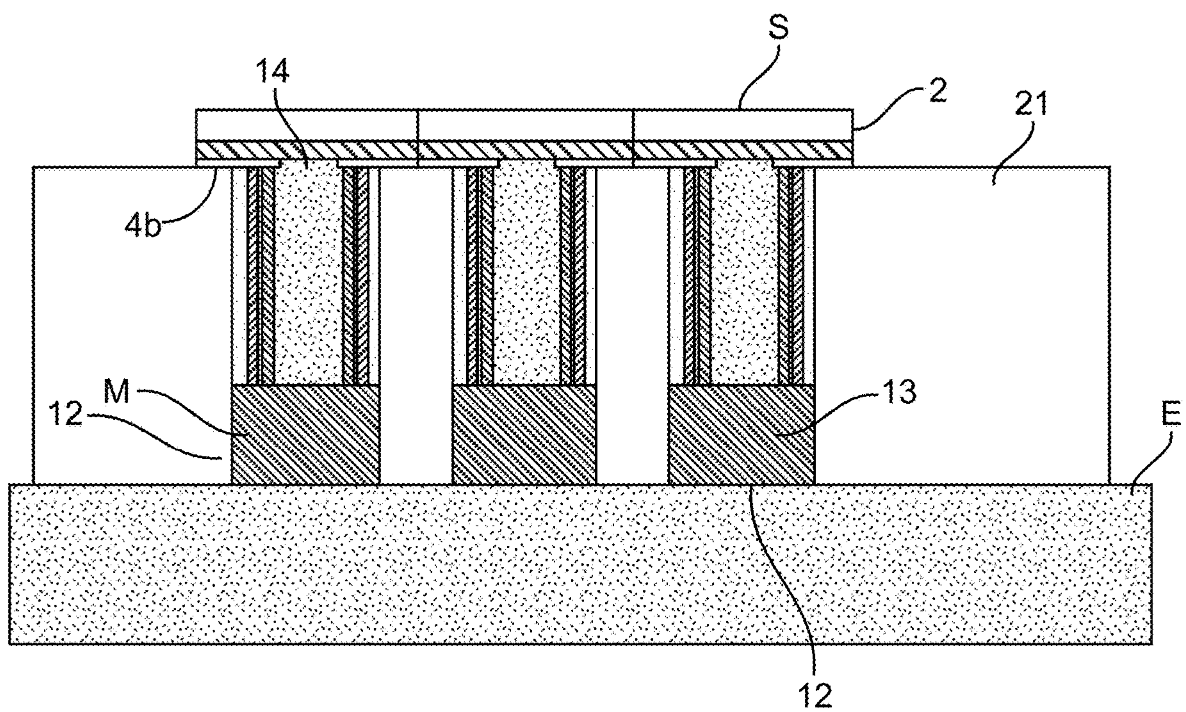
Figure 32:
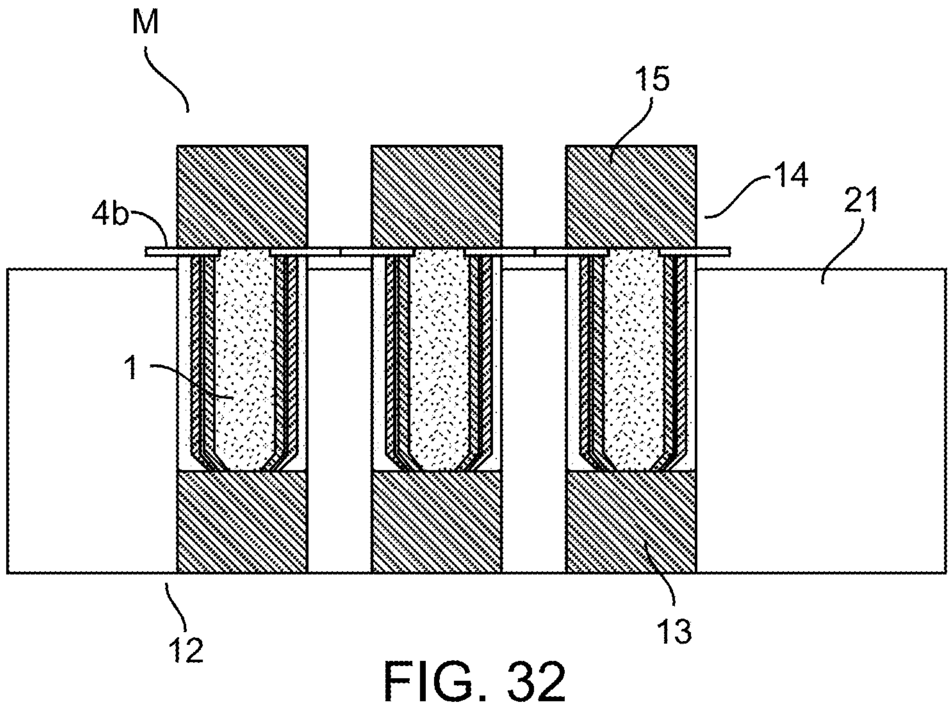

FIGS. 30 to 32 show further process steps of a proposed process for the manufacture of a proposed optoelectronic component. In these, the μ-rods as a group of, in particular, three μ-rods M are transferred from a growth substrate S to a foil 23, in particular by means of a flip-chip technique. FIG. 30 forms the starting point for the process. Although only three μ-rods are shown, a large number of such μ-rods can be provided in columns and rows.

In a first step, according to FIG. 31, the μ-rods are surrounded by a bonding layer 21, in particular a thermoplastic bonding layer 21. This extends from the contact 12 to the masking layer 4*b*. If necessary, and not shown here, the bonding layer 21 is removed except for the first contacts, so that a planar surface is obtained. The first longitudinal ends 12 and the contacts 13 are temporarily resting on a replacement carrier E. In this step, the group of μ-rods M is transferred to the replacement carrier together with the growth layer 2 and the sapphire substrate.

In FIG. 32 the replacement substrate E is removed, so that the μ-rods M are now held together by the bonding layer 21. Only a part of the masking layer remains as an insulating layer on the μ-rods. A contact 15 is applied to the surface of the now exposed core. This contacts the core electrically and extends over part of the insulation layer. The second contact 15 may have been created by electroplating or sputtering.

Figure 33:
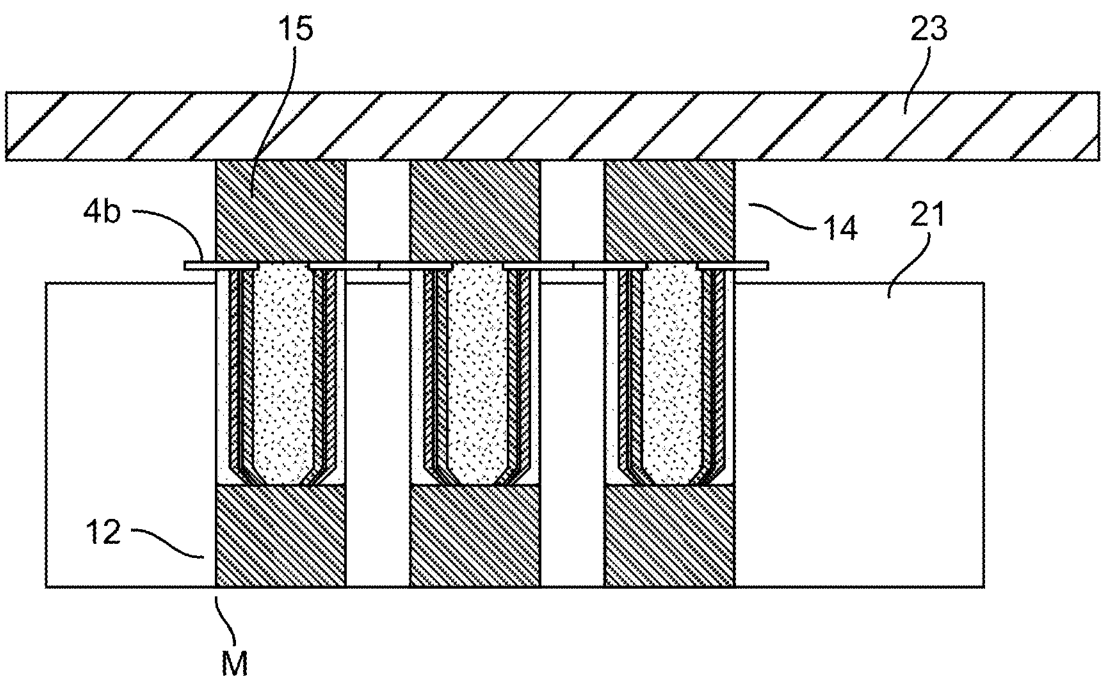
Figure 34:
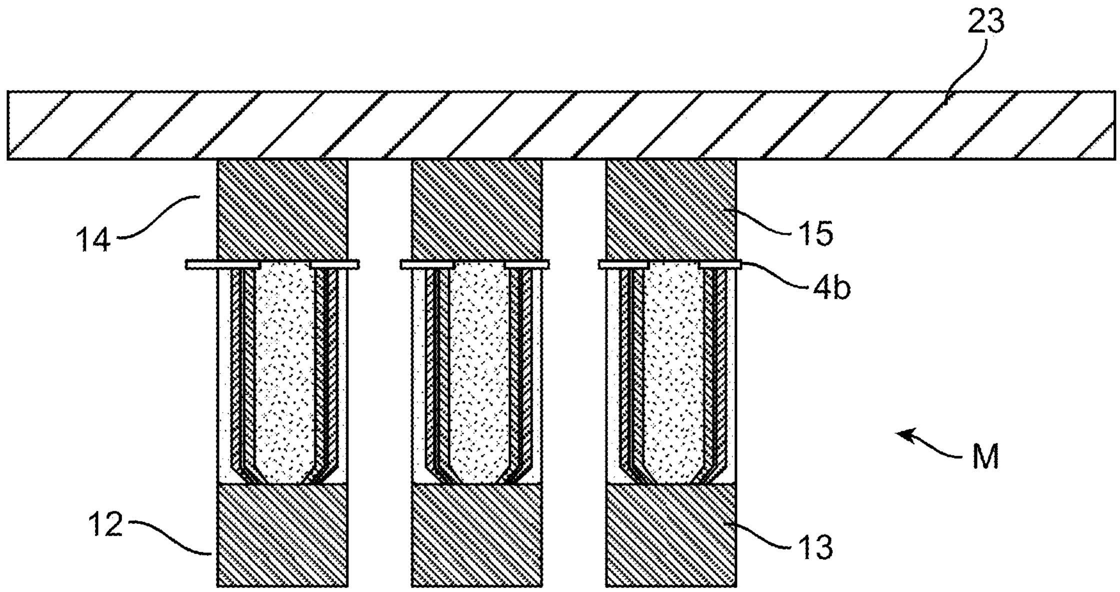

Contact 15 has at least two contact planes substantially parallel to the long side of the μ-rod, to which, on the one hand, a second contact area 19 of a carrier B can be easily connected mechanically and electrically and, on the other hand, a μ-rod M can be attached to the foil 23 shown in FIG. 33. Like the contact 13, the second contact 15 can also be cubic or cuboid.

After applying a foil 23 to which the contacts 15 are mechanically attached, the μ-rods can be transferred, stored or further processed. Contacting to the foil 23 can be done by adhesive forces but also by glue or similar. The first longitudinal ends 12 remain unchanged. In the next step, shown in FIG. 34, the bonding layer 21 is completely removed. As a result, the μ-rods now "hang" individually on foil 23 and can thus be easily transferred to a carrier or processed further in some other way. In an alternative embodiment, shown in FIG. 35, the bonding layer 21 is only partially removed, leaving the μ-rods slightly wrapped around it.

Figure 35:
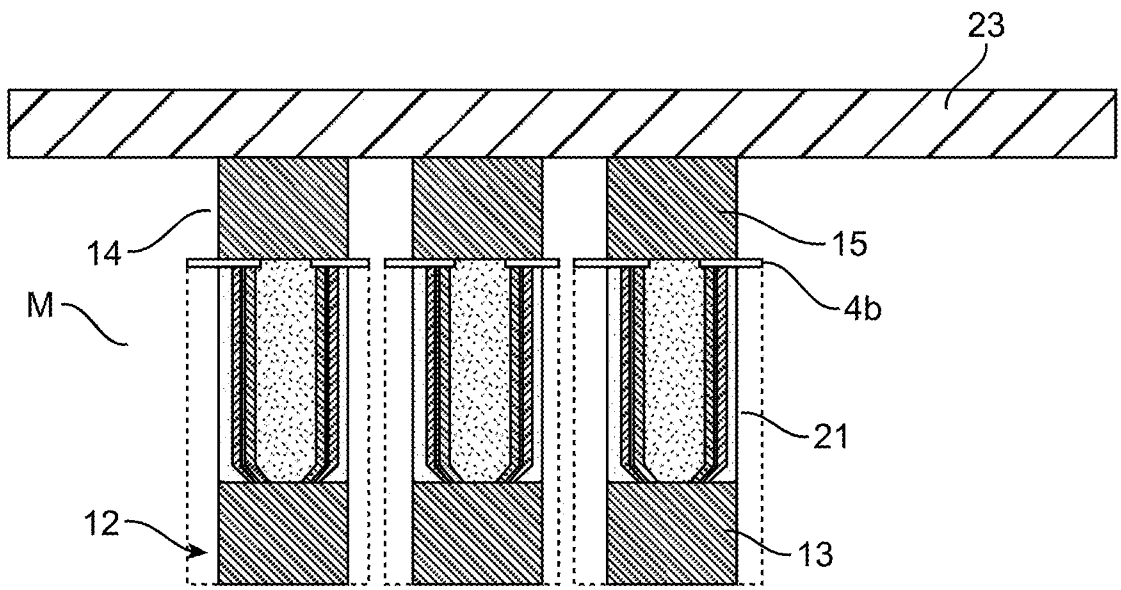

According to FIG. 35, the three contacted μ-rods fixed to the foil 23 have been separated in such a way that the bonding layer 21 has only been partially removed. The rods themselves are still wrapped in this layer and no longer touch each other. This means that the μ-rods are also separated here. The end of a respective first contact 13 that is turned away from the masking 4*b* is still uncovered.

Figure 36:
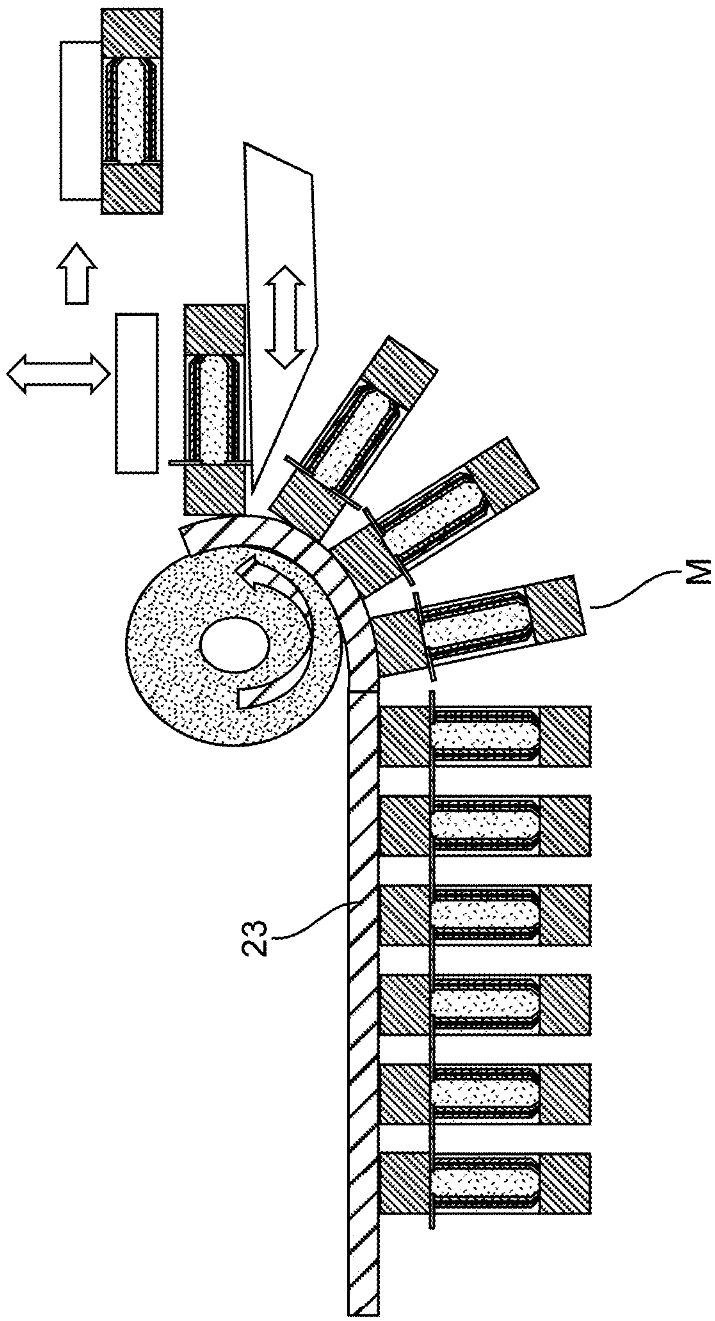
Figure 85:
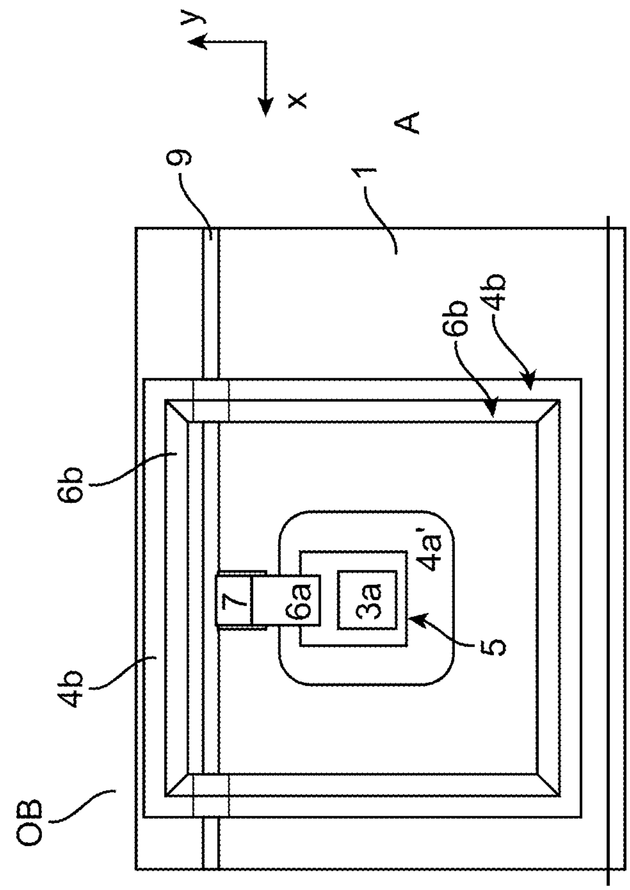
FIG. 85 illustrates a part of the first embodiment of the μ-LED according to the proposed principle as top view.

FIG. 36 shows a subsequent process step of a proposed process for manufacturing a proposed optoelectronic device in a cross-section. Groups of the separated μ-rods (M) are separated from the foil 23 and then lifted off by means of a mounting bar. For this purpose, the foil 23 is placed against a rotating roller and guided past it, whereby a deflection of a respective group facilitates detachment. The mounting beam can remove several e.g. several hundred μ-rods at once. In this example, different μ-rods are placed one after the other, i.e. into the drawing plane. The foil in FIG. 35 also extends into or out of the drawing plane, so that FIG. 85 shows a side view of this foil.

Figure 37:
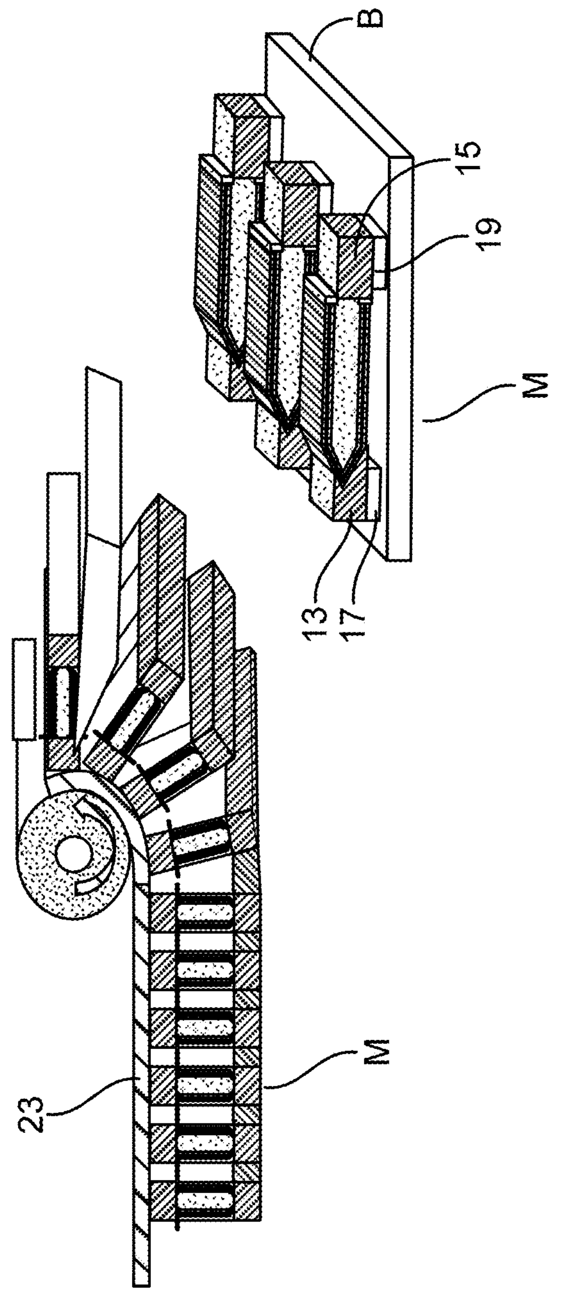

FIG. 37 shows the process step in which three μ-rods arranged side by side are transferred and attached to a carrier M. The μ-rods lifted from the folio 23 are placed in parallel on contact areas 17 and 19. In particular, contact 13 is bonded to area 17, contact 15 to area 19, thus creating an electrical and mechanical connection. Instead of a bonding process, a soldering or other fixing process can also be used. The bearing surface of contacts 13 and 15 is designed by the respective contact level in such a way that the contact rests flat on contact level 17 or 19. This reduces or prevents tilting. Depending on the process technology used and the effort involved, groups of several μ-rods up to several hundred can be transferred simultaneously.

Figure 38:
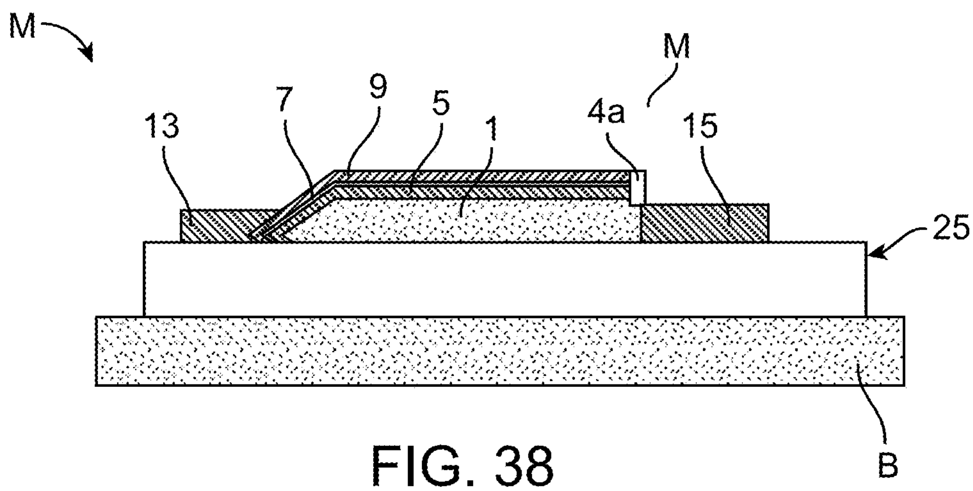
FIG. 38 shows another embodiment example of a horizontally oriented μ-rod according to some aspects in a longitudinal section.

FIG. 38 shows another example of a component arranged in this way from a side view. The horizontal μ-rod M connected parallel to a carrier B with a first contact 13 and a second contact 15 is shown with its core 1, its first layer 5, active layer 7 and second layer 9 as well as an insulation layer 4*a*. Below the μ-rod and now not visible, a reflective layer is also applied on or in the surface of carrier B. In addition, a reflective structure 25 is formed around the μ-rod. This has a bevelled wall similar to the structures shown in FIG. 85, 90 or 91. This allows light emitted from the side to be deflected upwards. As described in disclosure herein, the sidewalls may be metallic. Alternatively, the reflector structure can be designed with $TiO_2$ in a silicone matrix that reflects the light generated by active layer 7 away from carrier B.

Figure 39:
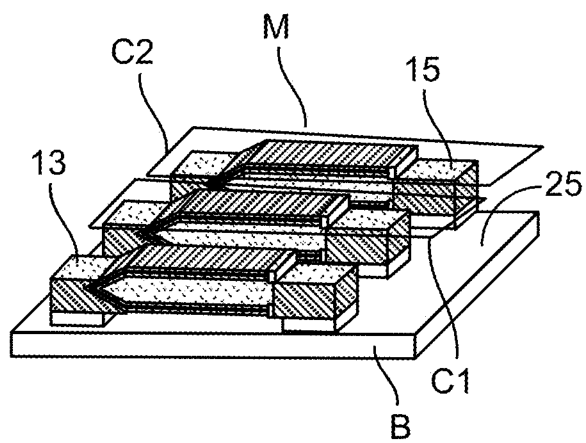
FIG. 39 illustrates a further embodiment example of a proposed group of three μ-LEDs with a converter layer on top of it according to some aspects explained.
Figure 40:
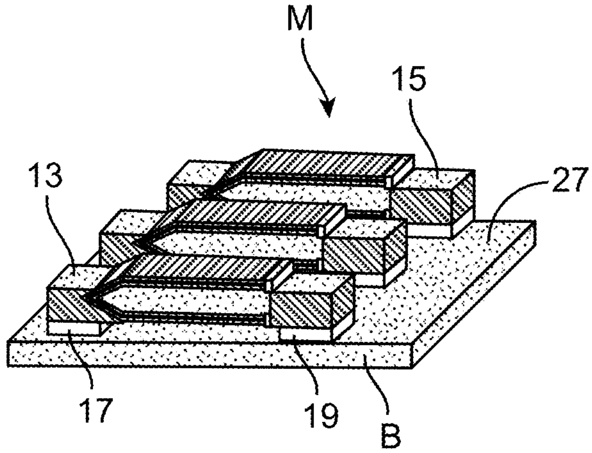
FIG. 40 shows another example of a group with three horizontally aligned μ-rods and a reflective layer on the carrier.

FIGS. 39 and 40 show further embodiments with three optoelectronic components arranged side by side in perspective. As explained above, the μ-rods can be configured to generate light of the same wavelength or different wavelengths.

FIG. 39 shows three μ-rods of the same design, connected in parallel to a carrier B, each with a first contact 13 and a second contact 15 on carrier B. All μ-rods M are also oriented parallel to each other. Two of the rods are additionally coated with a converter layer C1 or C2. This layer converts the blue light into red or green light. The surface of the carrier B is covered by a reflecting material. By means of the reflecting layer 25, additional light can be emitted away from carrier B and thus a light yield can be improved.

By contrast, in the version according to FIG. 40, support B is completely covered by a dark, absorbent layer 27. This improves the contrast.

Figure 41A:
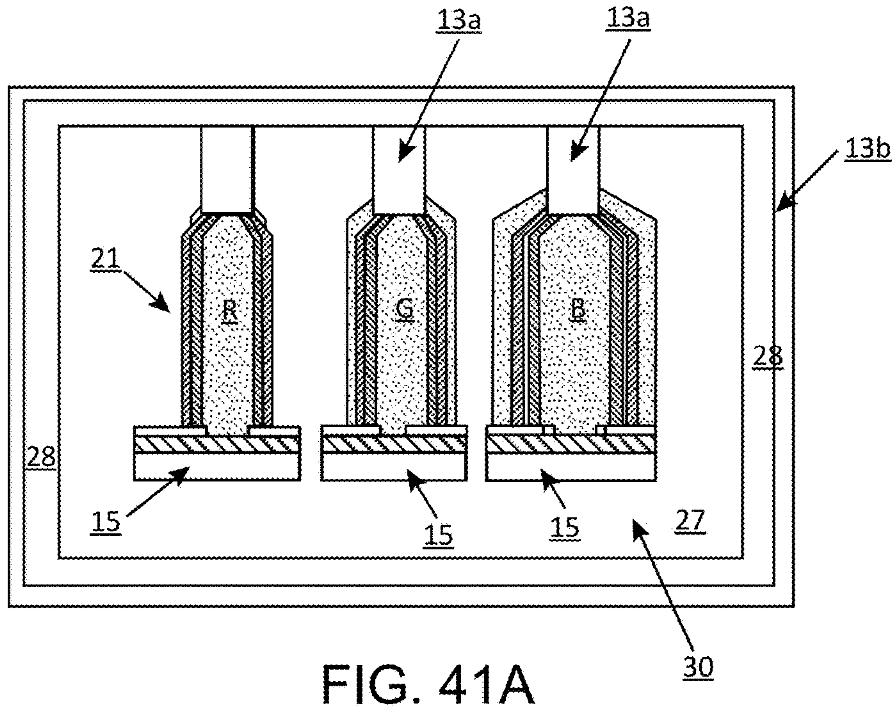
FIG. 41A shows a top view of a pixel array with three horizontally aligned μ-rods that are suitable for emitting light at different wavelengths.

FIG. 41A shows a top view of a pixel array with three horizontally aligned μ-rods that are suitable for emitting light at different wavelengths. The three μ-rods R, G, and B each have a different geometry with the length being the same and only the width changing. The length of the μ-rods can also be different to produce a uniform light intensity for a user. The three μ-rods R, G and B are connected to a respective connector on a carrier 27 via a first contact 15. A second contact is attached to a tip of each μ-rod. These contact a common metallic structure 28. The metallic structure is circumferential and has a reflective sloping surface similar to the design in FIG. 85. This causes light to be reflected away from the top. Furthermore, a photonic structure 30 is applied to the surface, which extends over the entire cavity formed by the circumferential metallic structure. It ends on the upper side of the circumferential structure 28, but can extend beyond it depending on the application.

Figure 41B:
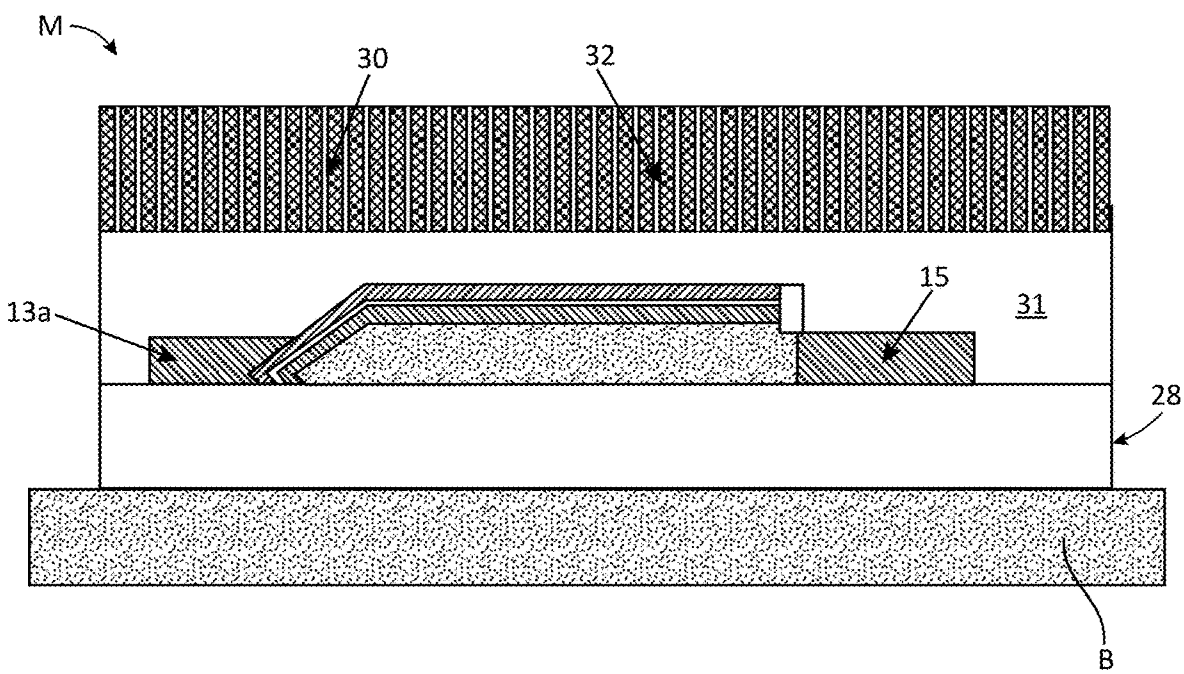
FIG. 41B is the side view of the embodiment of the previous figure.

In this context, FIG. 41B is the side view of the embodiment of the previous figure. The photonic structure 30 does not rest on the individual surfaces of the μ-rods, but is slightly spaced by a transparent dielectric layer. The dielectric layer extends at least over the surface of the μ-rods facing the main emission direction, but it can also fill the cavity and thus form a planar surface for the photonic structure 30. The latter can be placed on the surface, or applied to it epitaxially or otherwise. The height of the photonic structure is chosen appropriately.

Figure 42:
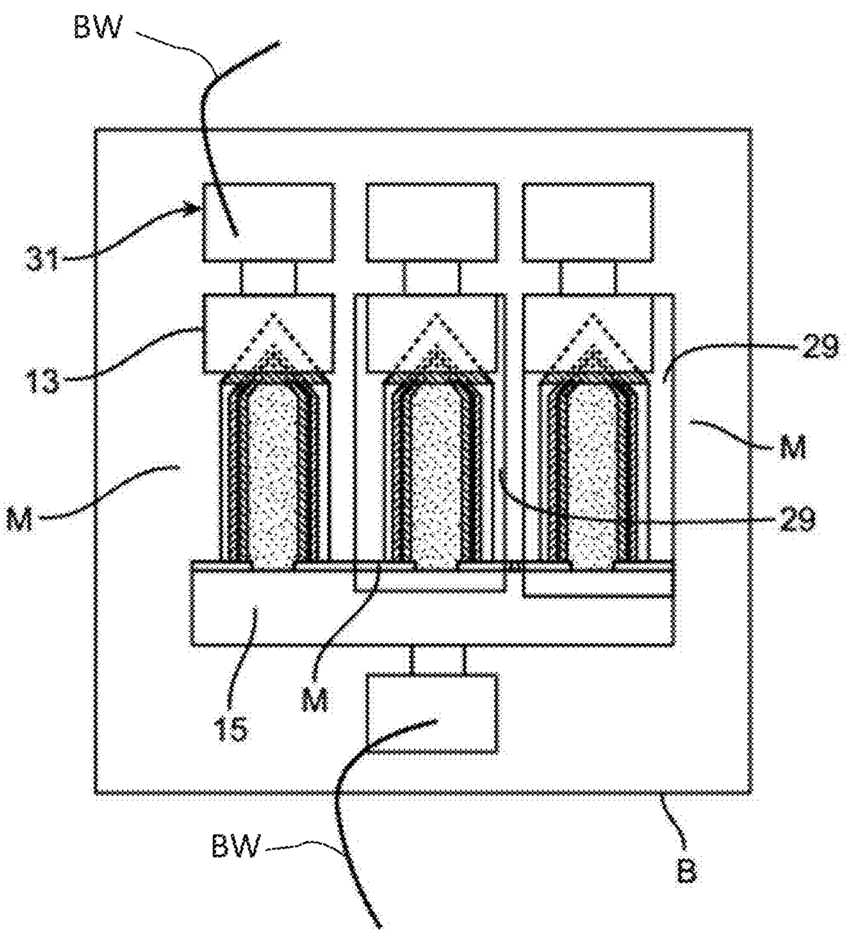
FIG. 42 illustrates another embodiment example based on some suggested aspects of a group of three aligned μ-rods, each forming a μ-LED in a top view.

FIG. 42 shows the embodiment similar to that of FIG. 39 in a top view. A respective μ-rod M is electrically and mechanically connected to its first contact 13 and the second contact 15 with contact areas on a carrier B. A red-green-blue light source is shown here, for example for a display or indicator. The three μ-rods M are identical in construction and emit blue light, for example. Using converter material 29, the blue light can be converted into red light or green light. In FIG. 42 the left μ-rod M, which is free of converter material, emits blue light, the middle μ-rod M, which is covered with a first converter material 29, emits red light, and the right μ-rod M, which is covered with a second converter material, emits green light. First and second contact areas 17 and 19 of carrier B are also connected to contact further areas for bonding. FIG. 42 shows two bonding wires BW at the top and bottom.

Figure 43:
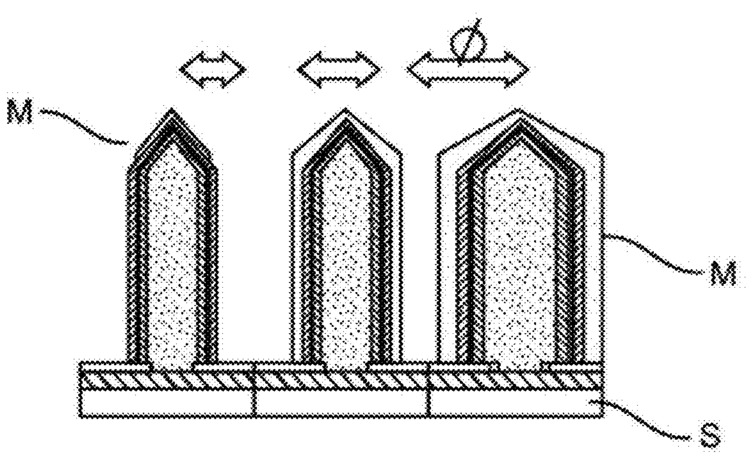
FIG. 43 shows a further embodiment example of a proposed group with three μ-rods in cross-section, which are configured to emit light of different wavelengths due to their different geometry.

FIG. 43 shows a further example of a proposed group with three μ-rods in cross-section. In these, the diameter of the grown structures is varied. This variation changes the color of the μ-rods. Thus, it is possible to produce several μ-rods M on one wafer in one epitaxial step, which emit different colors. The diameter of μ-rods M is varied in one-step during selective epitaxy, i.e. without changing a global growth parameter.

On a growth substrate S, three μ-rods M are generated for one emission of light of a certain wavelength with a spatial extension adapted to it. The length is substantially the same, but the diameter varies due to epitaxial growth. This results in a change in diameter and structure, which may result in a different color.

Figure 44:
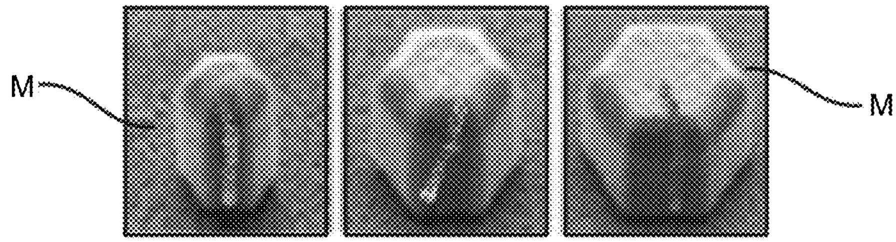
FIG. 44 illustrates the embodiment example of a group of three proposed μ-rods as an electron microscope image in a perspective view.

FIG. 44 shows an image of an electron microscope of such μ-rods of different sizes. The μ-rods are regular hexagons with a slightly tapered upper edge. This corresponds to the tip in the designs shown above. Depending on the embodiment, the length of the μ-rods corresponds to a diameter. Only in the left picture, the length is about twice the diameter of the μ-rods. The μ-rods are grown on a planar but insulating surface, where an area has been left out as a nucleus. The change of the geometry results in a different color, whereby the μ-rod with the smallest diameter has light with the largest wavelength. FIG. 44 shows a red emitter on the left, a green emitter in the middle and a blue emitter on the right.

Figure 45:
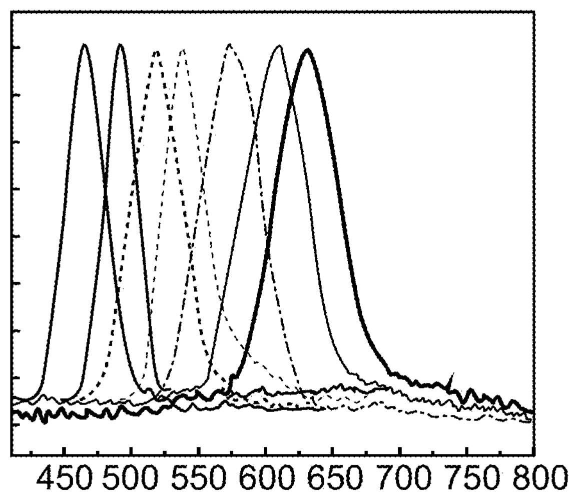
FIG. 45 shows a representation of emitted wavelengths of an embodiment example of a group of three proposed μ-rods.
Figure 46:
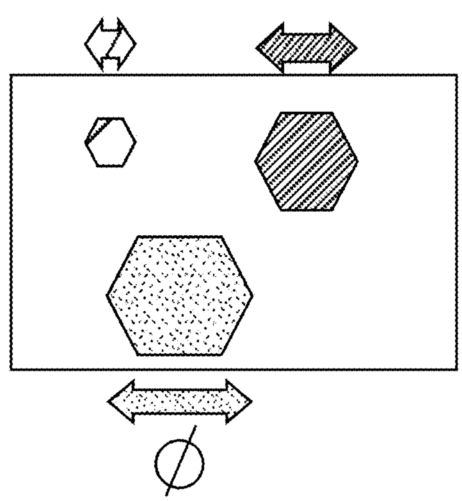
FIG. 46 illustrates another example of an embodiment example of a group of three proposed μ-rods in a cross-section, which together form a pixel.

From the geometries shown, there is thus a relationship between diameter and wavelength for a given length. As the diameter decreases, the wavelength of the light increases. FIG. 45 shows a representation of emitted wavelengths from 450 nm to approx. 650 nm at different diameters. This relationship is also shown again in FIG. 46. The diameter of the red light emitting ones is about half the diameter. There is a linear relationship between the diameter of the μ-rod and the wavelength of the emitted light in a small wavelength range. Besides the hexagon shown here as a surface geometry, another geometry can be grown. At small diameters, this hexagon is in practice a little less distinct due to the processes.

With this approach, μ-rods can be created for a larger area radiation and a higher light yield. For this purpose, the μ-rods are arranged along their longitudinal axis on a carrier. The longitudinal axis of the μ-rods thus runs essentially parallel to the longitudinal axis. In the designs shown here, the μ-rods are slightly spaced from the surface of the carrier by the slightly protruding contact areas.

Figure 47A:
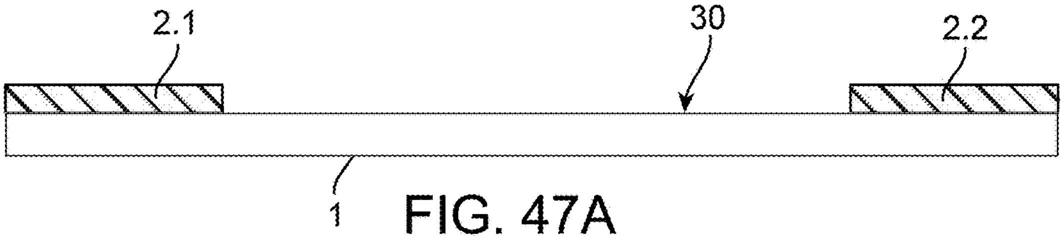
FIGS. 47A to 47D show an embodiment of a manufacturing process for a μ-LED, which is grown on a predefined molded layer of the carrier substrate.

FIGS. 47A to 47D show, in a schematically simplified manner, the production of an embodiment of an optoelectronic semiconductor device with a growth surface for red μ-LED, among other things. The growth base is a tellurium n-doped gallium arsenide (111)B epitaxial substrate 1, which, as shown in FIG. 47A, carries a lithographically structured dielectric mask 2.1, 2.2, for example made of SiOx and/or SiNx and/or SiOxNy. The opening 30 in the dielectric mask 2.1, 2.2 preferably comprises edge lengths of 50 nm to 100 μm.

Figure 47B:
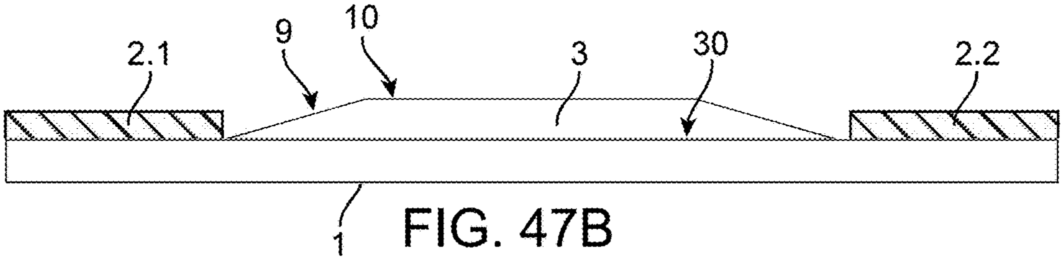

FIG. 47B shows a form layer 3 selectively epitaxially produced in the region of the original opening 30 in dielectric mask 2.1, 2.2 on the gallium arsenide (111)B epitaxial substrate 1, which comprises n-doped gallium arsenide. Alternatively, the form layer 3 is formed from n-doped aluminium gallium arsenide or n-doped aluminium gallium indium phosphide.

The form layer 3 has at least one {110} oriented side surface 9 extending to the opening edge of the dielectric mask 2.1, 2.2 and, for the design shown, additionally a (111)

oriented cover surface 10. Due to the arsenic termination of the gallium arsenide (111)B epitaxial substrate 1, a contour-precise form layer 3 can also be grown selectively epitaxially for the small opening 30 in the dielectric mask 2.1, 2.2 with low stress and a small number of lattice defects.

Figure 50:
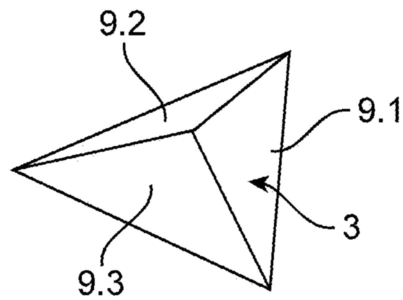
FIG. 50 is a first contour of the molded layer for the production of a μ-LED according to some aspects of the proposed concept.
Figure 51:
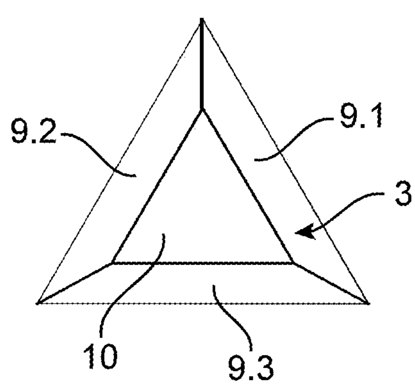
FIG. 51 shows an embodiment of a second contour of the mold layer for the production of a μ-LED.

The contours for the form layer are the form layer contours shown in FIGS. 50 and 51. FIG. 50 shows a form layer 3 with the contour of a three-sided hexagonal pyramid, whose side faces 9.1, 9.2, 9.3 are oriented with (−1−10), (−10−1) and (0−1−1). FIG. 51 shows a three-sided truncated pyramid as a further preferred contour of form layer 3 in plan view. The side faces 9.1, 9.2, 9.3 with the orientation (−1−10), (−10−1) and (0−1-1) and a top face 10 with the orientation (−1−1−1) are shown. To form the contours of the form layer according to FIGS. 50 and 51, the opening 30 in the dielectric mask 2.1, 2.2 is arranged in a corresponding triangular shape and aligned with an angular error <5° relative to the orientation of the gallium arsenide (111)B epitaxial substrate 1. The final contour of the form layer 3 is achieved in this configuration exclusively by selective epitaxial growth. For a further embodiment, a wet-chemical after-treatment for contour adaptation of the form layer 3 can follow the epitaxy step.

Figure 47C:
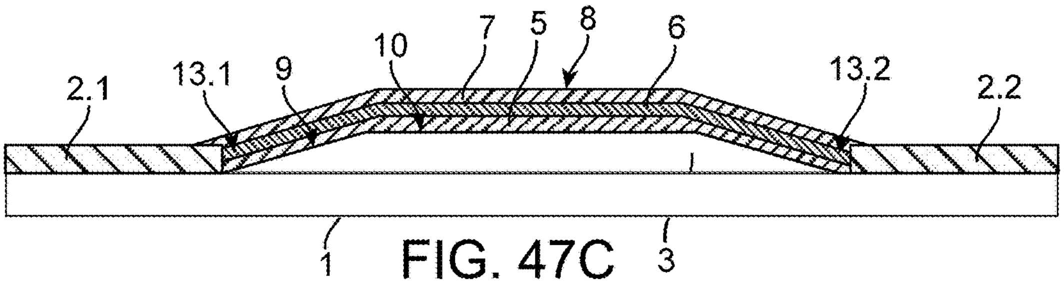

FIG. 47C shows the formation of a light-emitting Hetero structure 8 based on aluminium gallium arsenide (AlxGa1−xAs) and/or aluminium indium gallium phosphide (AlInGaP) by epitaxial growth on the three-dimensional form layer 3. This comprises a first conductive semiconductor layer 5 with n-doping, an active layer 6, in particular with quantum wells, and a second conductive semiconductor layer 7 with p-doping, which can be produced on the form layer 3 according to the invention with a low internal crystal strain and a reduced number of lattice defects. In addition to an increase in the fill factor due to the three-dimensionality and an improved light extraction for photons emitted parallel to the active layer 6, the edge enclosure of the light-emitting heterostructure 8 leads to a further increase in efficiency. It can be seen that the active layer 6 with the angular position at the edge region 13.1, 13.2, which is predetermined by the {110}, extends to the dielectric mask 2.1, 2.2. Non-radiative recombination is suppressed by the light-emitting heterostructure 8 closed at the edge regions 13.1, 13.2. This is especially the case for the preferably selected materials SiOx, SiNx or SiOxNy of the dielectric mask 2.1, 2.2.

The further process steps to produce a μ-LED, which includes the proposed optoelectronic semiconductor structure, are adapted to the chosen design. Subsequently, the same reference signs are used for matching components.

Figure 47D:
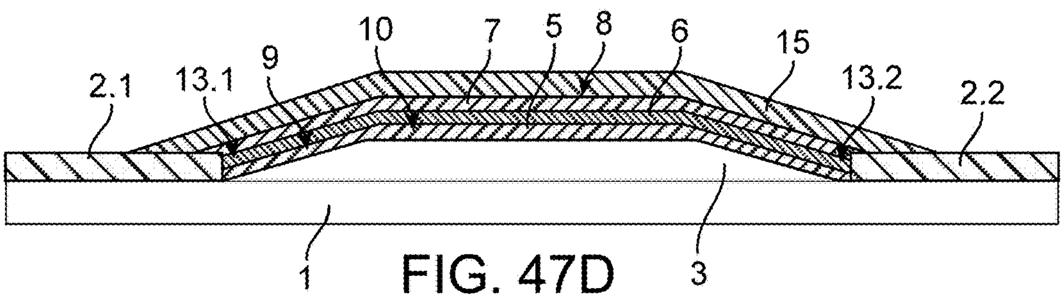

For the embodiment shown in FIG. 47D, a transparent contact layer 15, e.g. of indium tin oxide (ITO), is deposited flat on the light-emitting heterostructure 8. The further setup for a first design of a μ-LED 20, which generates light with a main emission direction 23 in the growth direction of the layer structure and is intended for placement on an optochip not shown in detail without separate wire bonding, is shown in FIG. 48.

Figure 48:
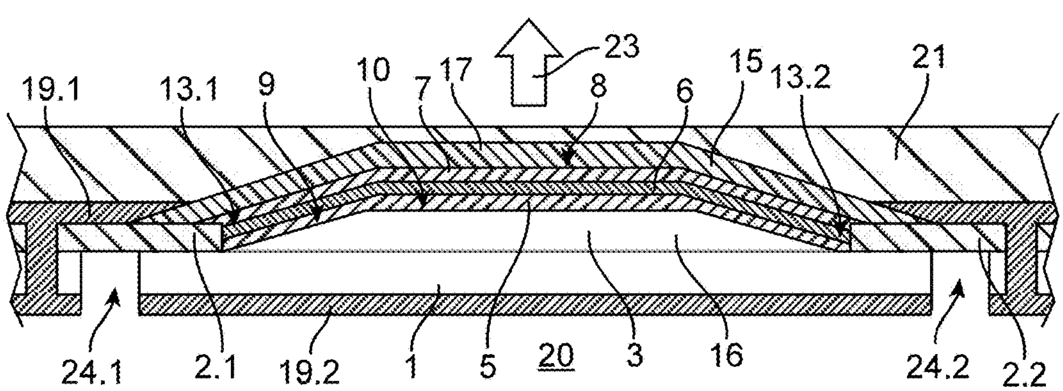
FIG. 48 illustrates a completed version of a μ-LED according to the proposed principle.

FIG. 48 shows a μ-LED 20 with the three-dimensional light-emitting heterostructure 8 described above, based on aluminium gallium arsenide (AlxGa1−xAs) and/or aluminium indium gallium phosphide (AlInGaP) for wavelengths in the range of 560 nm to 1080 nm. The light is emitted with the main radiation direction 23 through the transparent contact layer 15 made of indium tin oxide (ITO) and the areas above it of a carrier 21, which is formed of $Al_2O_3$, for example. The p-contact is made through the transparent contact layer 15 and the metallization 19.1, which is guided to the back of the gallium arsenide (111) B epitaxial substrate 1. The n-contact 16 is realized by the n-doped form layer 3, the n-doped gallium arsenide (111) B epitaxial substrate 1 and the metallization 19.1. To separate the contacts, a trench 24.1, 24.2 is provided between the rear areas of the metallization 19.1 and the metallization 19.2, cutting through the gallium arsenide (111) B epitaxial substrate 1 to the dielectric mask 2.1, 2.2, for the present embodiment made of SiOx, SiNx or SiOxNy.

Figure 49:
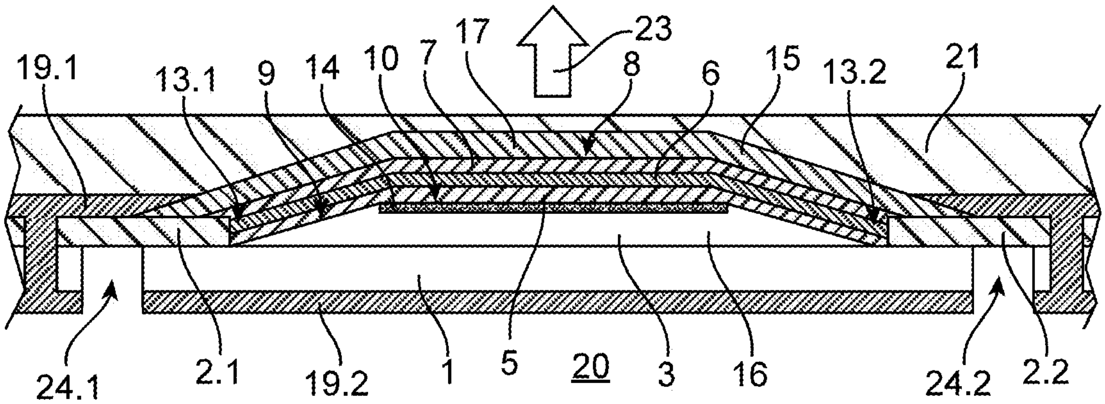
FIG. 49 shows a second version of a μ-LED grown on a predefined molded layer of the carrier substrate and shows some more aspects.

FIG. 49 shows a second variant of a μ-LED 20, which differs from the embodiment of the previous figure by a Bragg mirror stack 14 incorporated in the form layer 3. The Bragg mirror stack 14 is configured with a sequence of SiOx and SiNx layers and can be deposited during selective epitaxial growth of the form layer 3 and form an integral part of the form layer 3. The Bragg mirror stack 14 improves the light extraction for the main radiation direction 23 selected in the growth direction, for the embodiment the p-side.

Figure 52:
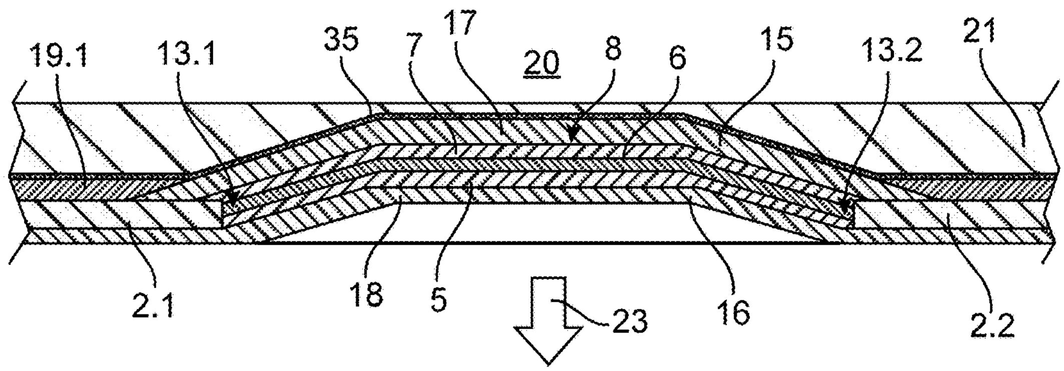
FIG. 52 shows a third embodiment of a μ-LED grown on a molded layer with some of the proposed aspects.

A third version of a μ-LED 20 with the three-dimensional light-emitting heterostructure 8 for single bonding is shown in FIG. 52. In contrast to the above-mentioned versions, the main radiation direction 23 is opposite to the growth direction of the layer system, in this case the n-side. For this purpose, the production of the light-emitting heterostructure 8 shown in FIGS. 47A to 47C can be carried out with undoped gallium arsenide (111) B epitaxial substrate 1. In this case, the selectively grown form layer 3 is also applied undoped. After the light-emitting heterostructure 8 has been grown epitaxially, a contact layer 15, for example of ITO, is deposited on it to produce a p-contact 17 and a metallization 19.1 is applied to contact it. In addition, a mirror layer 35, in particular a metal or Bragg mirror layer, is arranged in the area above the cover surface of the light-emitting heterostructure 8 and in particular below the carrier 21. The mirror layer 35 is thus preferably arranged directly above layer 15, 17. Alternatively, the contact layer 15 can also be reflective. For example, the carrier 21 can be made of $Al_2O_3$ and the carrier 21 is usually not transparent. After the layer system above the light-emitting heterostructure 8 is realized, the gallium arsenide (111) B epitaxial substrate 1 and the form layer 3 are removed. To complete the light source 20 shown in FIG. 52, a further transparent contact layer 18 made of ITO is applied to the underside of the layer structure as n-contact 16.

Figure 53:
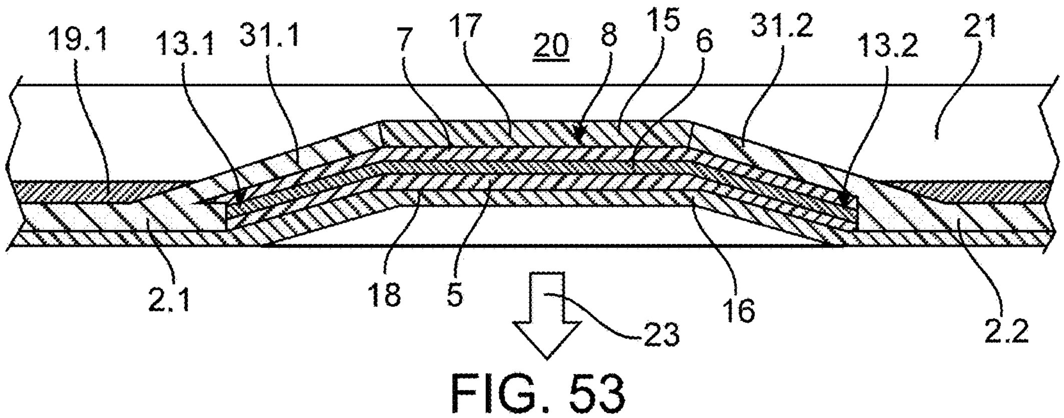
FIG. 53 is a fourth embodiment of a μ-LED epitaxially generated on a molded layer with a defined orientation of the carrier.

The fourth version of a μ-LED 20 shown in FIG. 53 is configured in the same way as the version in FIG. 52 with regard to the main radiation direction 23 against the growth direction of the layer system. In contrast to the latter, the carrier 21 is made of a material that is opaque for the wavelength range from 560 nm to 1080 nm of light emission of the light-emitting heterostructure 8 on the basis of aluminium gallium arsenide (AlxGa1−xAs) and/or aluminium indium gallium phosphide (AlInGaP), whereby the latter may consist of silicon or germanium, for example. Furthermore, 8 passivation layers 31.1, 31.2, for example of SiOx and SiNx, are present on the lateral surfaces of the light-emitting heterostructure.

Figure 54A:
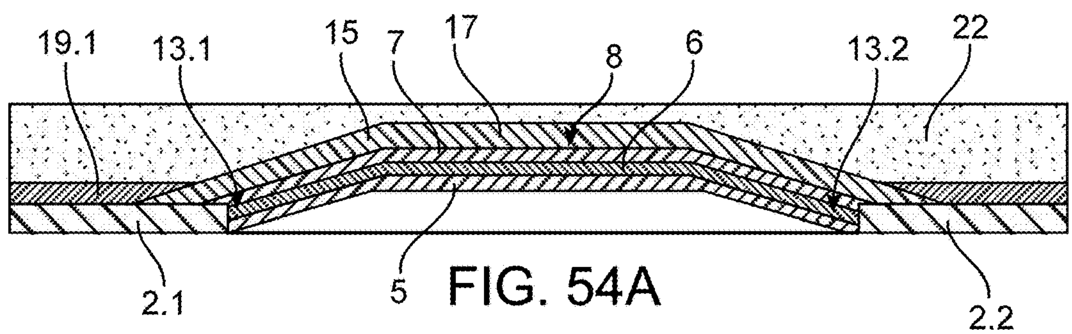
FIGS. 54A to 54B show a fifth embodiment of a μ-LED with some of the proposed aspects and an intermediate manufacturing step.
Figure 54B:
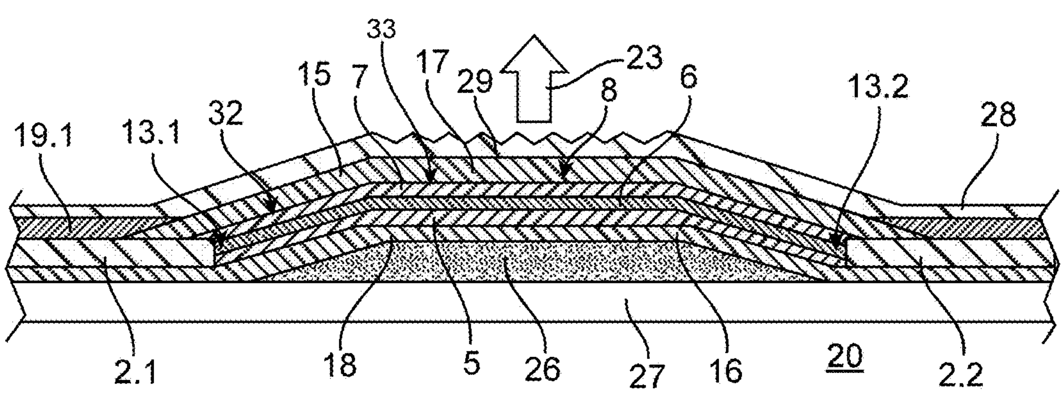

The fifth version of the μ-LED 20 shown in FIG. 54B comprises a main radiation direction 23 against the growth direction of the layer system and is adapted for double bonding. An intermediate step for its manufacture is shown in FIG. 54A, where a temporary carrier 22 is used and the removal of the gallium arsenide (111) B epitaxial substrate 1 and the selectively grown form layer 3 has already been performed. Starting from this, below the light-emitting heterostructure 8, a transparent contact layer 18, for example of ITO, and a carrier or carrier substrate 26, in particular in the form of a metallization 26, as planarization, and an n-contact

16 are applied, which are covered by a carrier or carrier substrate 27, for example of silicon, germanium or $Al_2O_3$. After these process steps have been carried out, the temporary carrier 22 can be removed, as shown in FIG. 54B, and replaced by a transparent protective layer 28 with a light conducting structure 29.

Furthermore, the embodiment shown in FIG. 54B includes optional Bragg mirror stacks in the area above the side surface 32 of the light-emitting heterostructure 8, so that light emission is central in the area of the top surface 33. Quantum wells or a quantum well structure in the active layer 6 can be located below the side faces 32 and the top face 33 for a possible embodiment or exclusively below the top face 33. For an alternative embodiment not shown in detail, the quantum wells or a quantum well structure are located exclusively below the side faces 32, whereby light is accordingly emitted laterally with a larger beam angle.

The versions shown here can also be arranged monolithically, i.e. in rows and columns. The μ-LEDs in FIG. 53 can also be planarized with a transparent material. Photonic crystal structures, converters or a combination of these are then applied to this material.

Figure 54C:
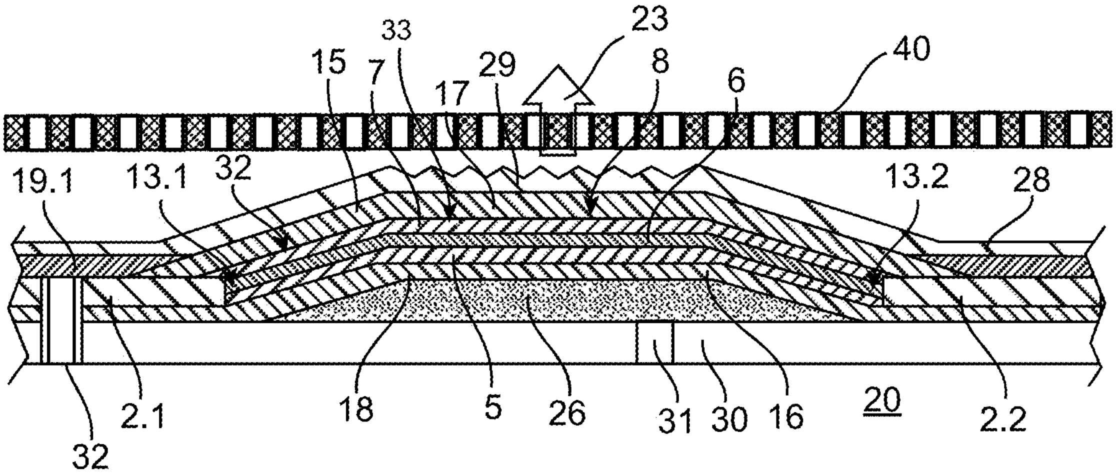
FIG. 54C shows a fourth embodiment of a μ-LED with an addition ally attached photonic crystal structure and a contact for electrical contact to a control circuit.

FIG. 54C shows an embodiment in which the roughened surface 29 has been completely planarized with another layer. A photonic crystal structure 40 is arranged on this layer, whose shape and formation corresponds to the embodiments disclosed here. The μ-LED is also removed from the carrier substrate and placed on a further substrate 30, which covers the contact areas 31 and 32 shown here. In particular, contact area 31 is arranged underneath the metallization 26 and contacts the n-doped layer electrically. A second contact area 32 is created by means of a generated via electrically insulated by layers 16 and 2.1 and contacts the metallization 19.1 and thus the p-doped layer. Both contact areas are connected to electrical structures in carrier 30, which are not shown further. These structures supply the μ-LED with power and control it.

Figure 54D:
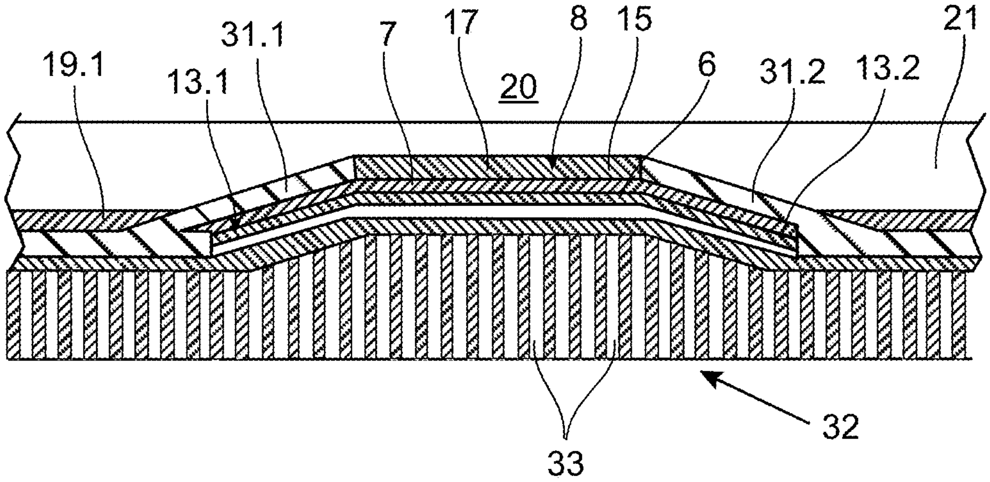
FIG. 54D shows an alternative embodiment, in which the photonic structure is arranged on the back.

The FIG. 54D is an alternative embodiment to FIG. 53. It comprises a rear light emission, so that the light generated in the active layer 6 is coupled out through the transparent layer 18 on the rear side. A light-shaping structure in the form of a photonic crystal 30 is applied to the surface of the rear layer 18. This comprises areas 33 and 34 with different refractive indices. In particular, the periodically arranged regions 33 and 34 are configured in such a way that they run along the surface of the rear light extraction layer 18 and thus also have a different thickness. Areas inside the central recess are thus deeper than areas outside. The thickness is selected so that sufficient light shaping can take place. The areas 33 and 34 with different refractive indexes are transparent. The light generated and shaped in this way is coupled out along surface 32. It should be mentioned at this point that at least some areas could also extend into layer 6. Thus, layer 6 can be much thicker than shown here. In some other configurations, first and/or second areas can also extend into the active layer. Providing and forming the photonic structure in the p- or n-semiconductor material enables a better optical coupling to the photonic structure, since otherwise a refractive index difference is too high and light is not or only slightly coupled into the photonic structure.

Figure 54E:
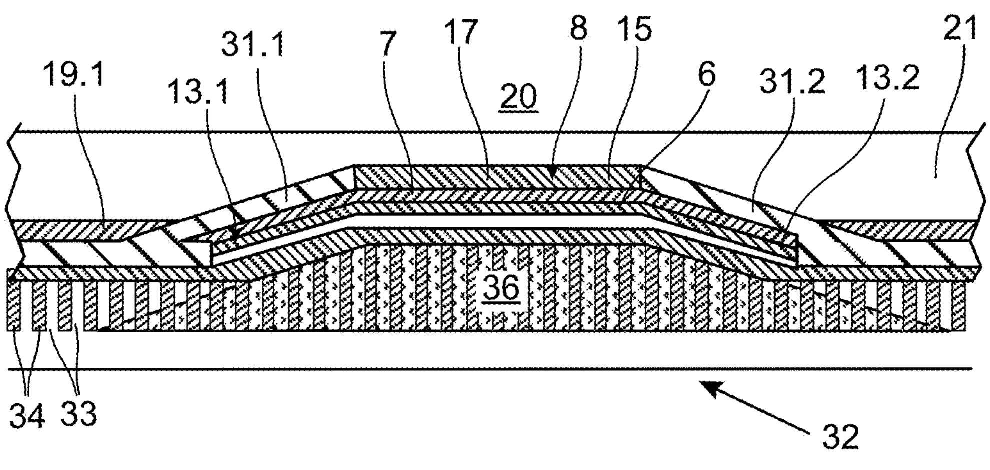
FIG. 54E shows another embodiment with photonic structure and converter material.

FIG. 54E shows another embodiment with a light-shaping structure. In this case, a converter layer 36 is inserted within the recess, i.e. along the transparent output coupler structure 16. The converter layer extends beyond the recess and thus also forms areas 33 of the photonic structure arranged above the recess with periodically alternating areas 33 and 34. The periodicity of the photonic structure is chosen so that it collimates converted light and radiates it downwards. In contrast, unconverted light is emitted at a different angle so that it can be filtered in a suitable manner. On the photonic structure is again a decoupling structure 32. In both embodiments, a microlens or other element can also be used as a light-shaping structure.

Figure 55A:
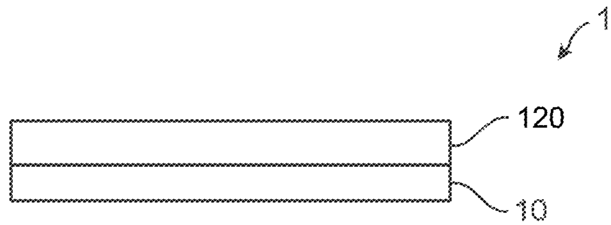
FIGS. 55A to 55E illustrate a embodiment with different process steps for producing quantum well intermixing in an active layer of a semiconductor body outside a region intended for light emission according to some aspects of the proposed concept.
Figure 55B:
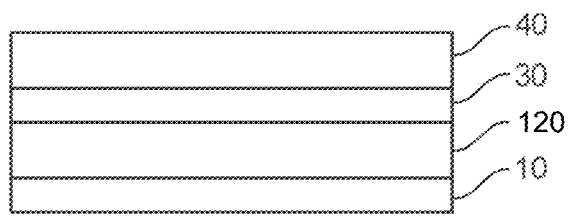
Figure 55C:
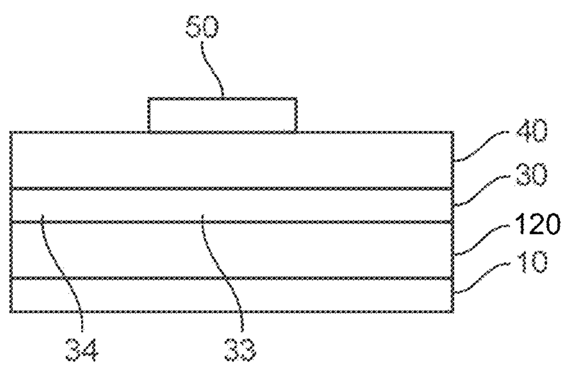
Figure 55D:
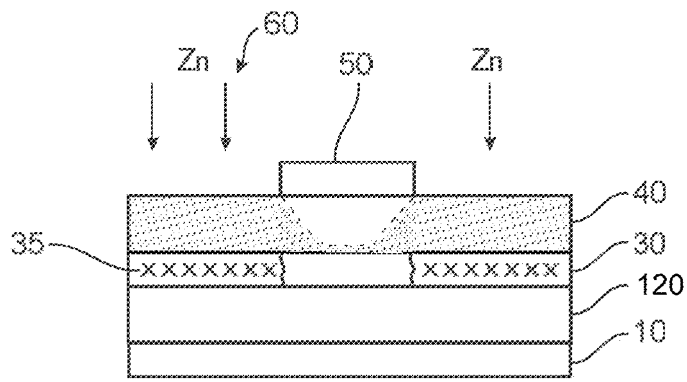
Figure 55E:
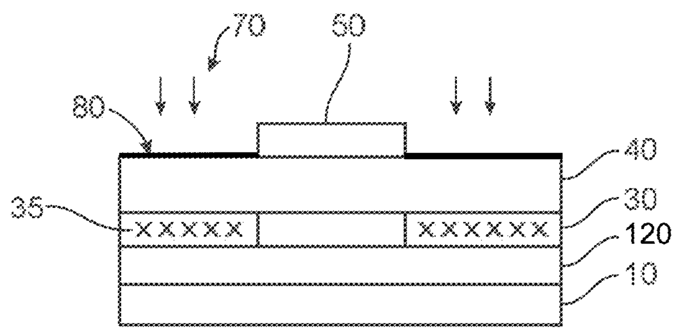

One measure to improve the low current behaviour is the Quantum Well Intermixing. FIGS. 55A to 55E show individual steps in a manufacturing process of an optoelectronic device, in particular a μ-LED, in which measures taken during or for quantum well intermixing prevent degradation in both the high-current and low-current ranges. As shown in FIGS. 55A to 55C, a semiconductor structure 1 is formed which is subjected to further process steps. In FIG. 55A, a growth substrate 10 is provided, such as a GaAs substrate, which is prepared for further growth steps. An n-doped layer 120 based on a III-V material system is then deposited on this substrate. Specifically, this can be In, Ga, Al, or a combination of these together with phosphorus P. The exemplary InGaAlP layer is n-doped and can also be provided with further layers and/or dopants (not shown here) to ensure a good electrically conductive contact and a low sheet resistance in the n-doped layer 120.

In FIG. 55B, an active layer 30 is subsequently applied. This comprises at least one quantum well in which radiative recombination takes place in one operation of the finished device, thus generating light. The at least one quantum well in the active layer 30 may also comprise a layer combination from the III-V semiconductor system, for example consisting of InGaAlP layers with different Al contents. Subsequently, a p-doped layer 40 is generated on the active layer. For this purpose, a first dopant is used, for example Mg or Zn. As with the n-doped layer 120, doping can be carried out during the manufacturing process by adding the dopant in the desired concentration. This has the advantage that doping profiles can already be created in the layers during growth, whereby the desired electrical properties can be better adjusted and impurities are reduced by more uniform crystal growth.

After providing the semiconductor structure 1 in the previous steps, a mask 50 is now applied to the p-doped layer in FIG. 55C and patterned accordingly. As shown, the patterned mask 50 covers a partial area on the surface of the p-doped layer and thus also overlies a first partial area 33 of the active layer. An adjacent subregion 34 of the active layer is not covered by mask 50. After patterning, a diffusion step is performed in FIG. 55D with first process parameters and a second dopant. This is for example Zn or an organic Zn compound.

The process parameters include temperature, pressure and concentration of the second dopant and can also vary during a given time period. They are chosen so that the second dopant is deposited on the surface not covered by mask 50 and diffuses into the p-doped layer 40. The diffusion process is now controlled by the first process parameters so that the second dopant diffuses through the layer 40 into the active layer and the quantum well. In some cases, it can also diffuse easily into the boundary region of the n-doped layer. However, the first subregion 33 of the active layer under the mask is not interspersed with dopant.

The first process parameters are chosen in such a way that diffusion creates an intermixing in the quantum well of the second subregion in the active layer, in which the energy gap of the quantum well is increased. In this example, the production of the individual layers, as well as the doping steps, is carried out by MOCVD processes. However, other manufacturing processes such as PVD, ion implantation or, much less frequently, MBE processes are also conceivable in subregions.

After completion of this procedure, an additional annealing step is now continued. Here, second process parameters are set, which in the embodiment include a higher temperature and the addition of a precursor 70. The latter can be provided by the above-mentioned procedures. This produces the structure shown in FIG. 55E. As a result of the previous diffusion process, the diffused Zn has displaced other atoms of the crystal lattice from their places and taken their place. The displaced atoms (mainly Ga) could be located in interstitial sites. It appears that these remain mobile and thus possibly form recombination centers for non-radiative recombination. By their movement, they could thus migrate to the first subregion 33 and there drastically reduce the efficiency of the device. This is supported by the observation that the efficiency drops early on even at low current densities.

Due to the additional annealing step at higher temperature these atoms become mobile. The addition of a precursor such as As now enables the displaced atoms (mainly Ga) to be bound on the surface, so that a thin layer 80 of GaAs is formed there. The atoms displaced to interstitial sites diffuse to the surface and are saturated by the precursor. This results in a concentration gradient towards the surface, since the concentration of free atoms is reduced there. Accordingly, the number of free atoms is reduced and thus the efficiency is kept stable even at low current densities. In addition, in the boundary region between the first and second subregion, quantum well intermixing decreases sharply over a short distance, resulting in a relatively steep energy barrier. This results in the structure shown in FIG. 55E, where a boundary is formed in a substantially direct line under photomask 50. Quantum well intermixing occurs only in the second subregion 34 of the active layer.

Figure 57:
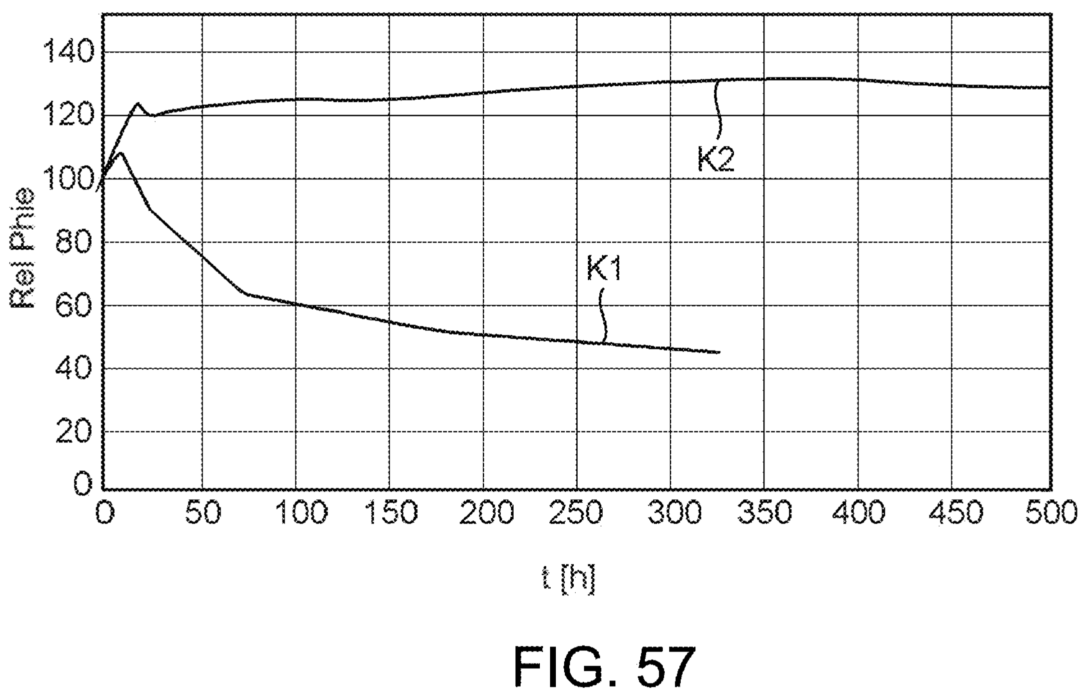
FIG. 57 is a diagram showing the course of a relative luminous intensity over time to illustrate a reduction in luminous intensity in optoelectronic components.

FIG. 57 shows a curve showing the relative luminous efficacy in relation to the service life of the component in operating hours. Curve K1 shows the characteristics of a component that has been processed in the conventional way without an additional annealing step. After only 200 hours, the initial value of curve K1 has already fallen to half.

Due to the temperature increase and the appropriate choice of precursor, the lattice atoms displaced by the diffusion step seem to be bound on the surface. Thus, the surface acts as a sink for the interstitial atoms. In simplified terms, it is possible that the displaced atoms diffuse preferentially from the active layer through the p-doped layer to the surface due to the changed process parameters, so that the concentration of potential non-radiative impurities in the active layer is reduced.

FIG. 57 shows in curve K2 the light yield of a component manufactured according to the process according to the invention over several hundred hours of operating time. The component was “cured” with a precursor containing a material of the V main Group such as phosphorus P or arsenic As and at an elevated temperature. The initial light output increases by approx. 20% after a short time and then remains constant for several hundred hours. The initial increase can be explained by healing of the crystal lattice caused by the current and local heating. Thus, the proposed process achieves a significant improvement, especially for components with small to very small dimensions.

Figure 56:
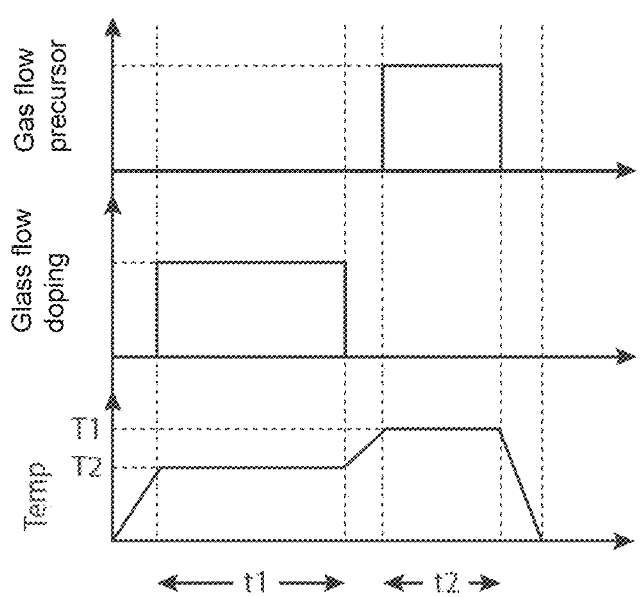
FIG. 56 shows the progression of various process parameters during a procedure according to the proposed principle.

FIG. 56 shows qualitatively the time course of a selection of the first and second process parameters, in detail the temperature T, the gas flow of the second dopant and the gas flow of the precursor during the annealing phase. During the time t1 the process chamber is kept at the temperature T1 and the second dopant, for example an organic Zn compound, is added. The temperature T1 is chosen so high that during this time t1 Zn diffuses through the p-doped layer into the active layer, where it leads to quantum well intermixing as described above. After the time t1 the addition of the dopant is stopped and the temperature is increased to the value T2. Depending on the profile, this increase can take place in a very short time window. Then the temperature T2 is kept constant during the time t2 and a precursor is added, which for example contains an element of the V main group. Period t2 is selected shorter than period t1 in this embodiment.

According to the inventors’ findings so far, the period t1 and the period t2 can be considered as decoupled. The time period t1 substantially determines the strength of the quantum well intermixing and the time period t2 substantially determines a reduction of the degradation behaviour of the component. Accordingly, the time period t2 should be long enough to achieve the desired effect. The temperature T2 also plays a role in the strength of the suppression of degradation. It is advantageous to select T2>T1, but the temperature T2 should not be too high, since the basic brightness of the components decreases from a limit temperature. The example shown in FIG. 56 serves to illustrate the proposed principle. In embodiments, different concentration or temperature and (not shown) pressure profiles can be used to first bring the dopant into the quantum well of the active layer and then to perform the annealing process.

FIGS. 58A to 58E show individual steps in a manufacturing process in which, by appropriate selection of the process parameters, a further Improvement of quantum well intermixing can be generated. It was found that by an application with simultaneous diffusion dopant diffuses into the active layer under a mask, but does not cause quantum well intermixing there. Thus, an increased density of impurities remains in the active layer under a mask, which is intended for light emission and leads to an accelerated aging process and a deterioration of the properties.

Figure 58A:
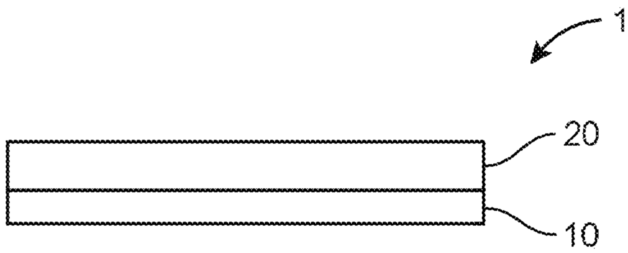
FIGS. 58A to 58F show an embodiment with different process steps for fabricating a semiconductor structure using quantum well intermixing according to some aspects of the concept presented.
Figure 58B:
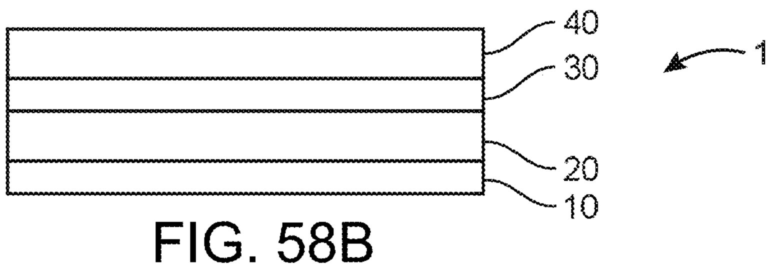
Figure 58C:
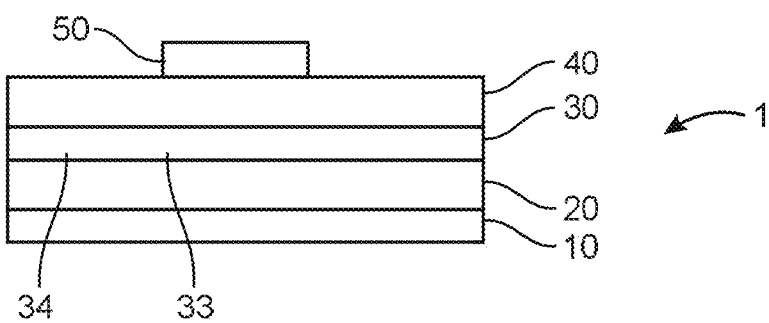

FIGS. 58A to 58C show a semiconductor structure 1, which is subjected to further process steps. In FIG. 58A a growth substrate 10 is provided, for example a GaAs substrate, which is prepared for further growth steps. These further steps can include the deposition of sacrificial layers, passivation layers or matching layers to different crystal structures. The substrate can also already contain or be prepared for line contacts or circuits.

An n-doped layer 20 based on a III-V material system is then deposited on the prepared substrate 10. The deposition is carried out in a MOCVD reactor, but other processes disclosed in this application may also be used for this purpose. For example, In, Ga, Al, or a combination of these together with phosphorus P is used as material. The exemplary InGaAlP layer 20 is n-doped and may be provided with additional layers and/or doping (not further shown here) to ensure good electrical contact and low sheet resistance in the n-doped layer 20.

In FIG. 58B, an active layer 30 is subsequently applied. This comprises at least one quantum well in which radiative recombination takes place in one operation of the finished device, thereby generating light. The at least one quantum well in the active layer 30 can also comprise a layer combination from the III-V semiconductor system, for example consisting of InGaAlP layers with different Al contents. Subsequently, a p-doped layer 40 is generated on the active layer 30. For this purpose, a first dopant is used, for example Mg or Zn. As with the n-doped layer 20, doping can be carried out during the manufacturing process by adding the dopant in the desired concentration. This has the advantage that doping profiles can be created in the layers already during growth, whereby the desired electrical properties can be better adjusted on the one hand and on the other hand, impurities are reduced by a more uniform crystal growth.

After providing the semiconductor structure 1 in the previous steps, a mask 50 is now applied to the p-doped layer in FIG. 58C and patterned accordingly. As shown, the patterned mask 50 covers a partial area on the surface of the p-doped layer and thus also overlies a first partial region 33 of the active layer. An adjacent subregion 34 of the active layer is not covered by mask 50. After patterning mask 50, the p-doped layer is doped with a second dopant by gas phase diffusion using a precursor with first and second process parameters. The second dopant is formed from Zn, e.g. an organic Zn compound.

Figure 58D:
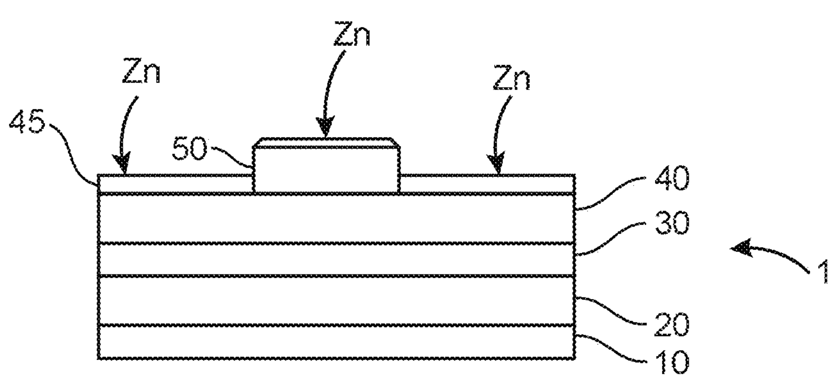

The process parameters for this second step include temperature, pressure and concentration of the second dopant and can also change during a given time period. They are chosen in such a way that after decomposition of the precursor the second dopant is deposited as layer 45 on the surface of the semiconductor structure and forms a thin layer there, but does not or hardly diffuse into the p-doped layer. For this purpose, for example, the temperature is chosen lower than in a later diffusion process. To provide the second dopant, the dopant is obtained from a decomposition of a precursor in the gas phase. This is done in a MOCVD or MOPVD reactor. The advantage of such a step is that the wafer remains in the reactor between the individual process steps and does not need to be transported. The resulting structure with a thin layer of Zn or another material as second dopant is shown in FIG. 58D.

Figure 58E:
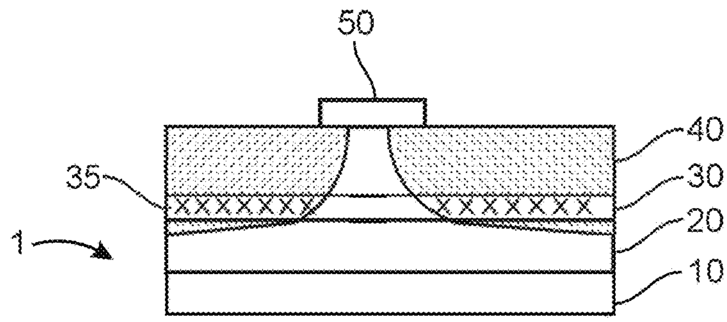

According to FIG. 58E, a separate diffusion process takes place after the dopant has been applied to the surface. The diffusion process is controlled by the process parameters so that the second dopant diffuses through layer 40 into the active layer and the quantum well. In some cases, it can also diffuse easily into the boundary region of the n-doped layer. During this process, the second dopant reaches the region under the mask by diffusion in layer 40 (stochastically distributed). However, the first subregion 33 of the active layer under the mask is not interspersed with dopant. Instead, a sharp edge is formed there, which surprisingly coincides substantially with the projection of mask 50 into the active layer.

The process parameters are chosen in such a way that diffusion creates an intermixing in the quantum well of the second subregion in the active layer, in which the energy gap of the quantum well is increased. In the boundary region between the first and second subregion the quantum well intermixing decreases sharply over a short distance, so that a relatively steep energy barrier is created.

By separating the application of the dopant from the subsequent diffusion step, a better control of the individual processes is achieved. In most cases, the deposition of the dopant takes place at a lower temperature than the subsequent diffusion. Thus, on the one hand, the amount of the dopant provided can be better adjusted and on the other hand, diffusion is independent of the gas phase reaction. In the later separate diffusion step, a suitable temperature profile is set so that a doping profile is obtained in which the diffusion barrier for charge carriers generated by the dopant is close to the energy barrier generated by quantum well intermixing.

Figure 58F:
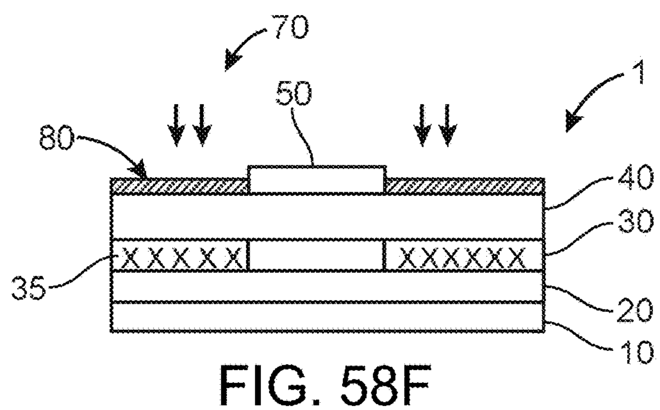

Once this procedure has been completed, an optional annealing step is now continued as shown in FIG. 58F. This involves setting third process parameters, including a higher temperature and the addition of an additional precursor 70 in the embodiment. This aspect is also described in detail in this application. As a result, of the previous diffusion process, the diffused Zn has displaced other atoms of the crystal lattice from their places and taken their place. The displaced atoms may be located in interstitial sites. It appears that these remain mobile and thus possibly form recombination centers for non-radiative recombination. Through their movement, they could thus migrate to the first subregion 33 and drastically reduce the efficiency of the device there. This is supported by the observation that the efficiency drops early on even at low current densities.

The lattice atoms displaced by the diffusion step are bound on the surface by the temperature increase and by the possibly optional, suitable choice of precursor. Thus, the surface acts as a sink for the interstitial atoms. In simplified terms, it is possible that, due to the changed process parameters, the displaced atoms diffuse preferentially from the active layer through the p-doped layer to the surface, so that the concentration of potential non-radiative impurities in the active layer is reduced. It was found that a precursor with a material of the V main group such as phosphorus P or arsenic As results in a significant increase in lifetime.

Figure 59:
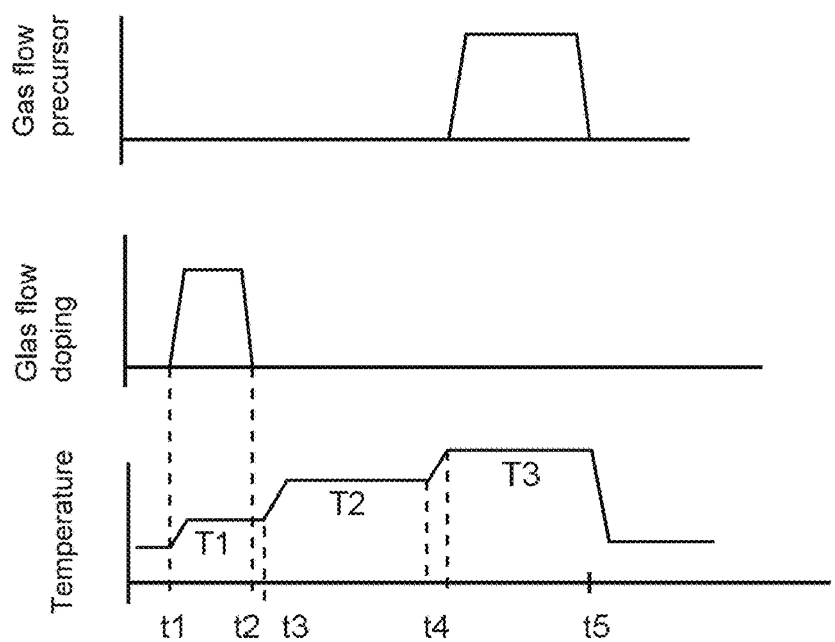
FIG. 59 shows an exemplary course of various process parameters during a procedure according to the proposed principle.

FIG. 59 shows qualitatively the time course of a selection of the process parameters, in detail the temperature T, the gas flow of the second dopant and the gas flow of the further precursor during the annealing phase. Between the time period t1 and t2, on the one hand, the temperature is kept at a first temperature T1 and, in addition, the dopant is added so that it can settle on the surface of the semiconductor structure. The temperature T1 is chosen in such a way that diffusion of the dopant into the semiconductor body does not take place or only to a very small extent. During this time, the further precursor is not added. At time t2, the dopant is switched off, while temperature T1 is maintained until time t3, which is a little later.

After time t3, the temperature is increased to the value T2. The temperature increase starts the diffusion process, i.e. the dopant deposited on the surface diffuses into the p-doped layer.

The temperature profile in this embodiment is substantially kept constant, but non-constant temperature profiles are also conceivable. Depending on the temperature profile, a dopant profile is set. In a next annealing step, the dopant is removed from the p-doped layer or the active layer and the quantum well by a third temperature T3 over a period of time. For this purpose, in addition to an increase in temperature, the further precursor is added, whose decomposition product combines with the displaced atoms on the surface. Due to the resulting concentration gradient of mobile, displaced atoms, these are removed from the quantum well of the active layer and bound at the surface.

Figure 60:
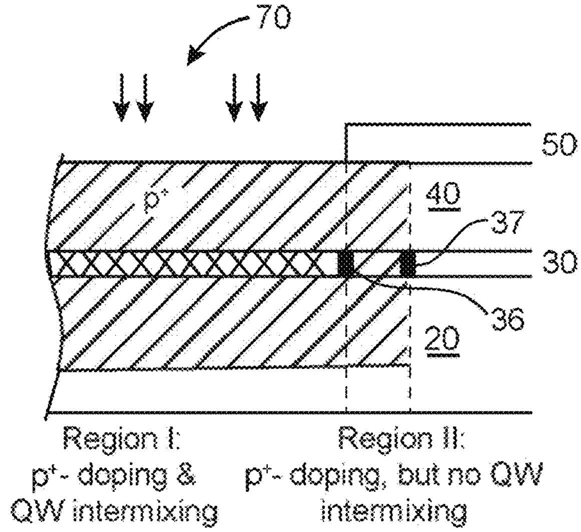
FIG. 60 shows a section of a semiconductor structure to explain various aspects of the concept presented.

FIG. 60 shows an overview of substantially aspects for a possible explanation of the proposed principle. During the diffusion of the dopant, an additional concentration of dopant material is formed in the p-doped layer. When incorporated into the crystal lattice, this dopant displaces atoms of the original semiconductor (e.g. the trivalent component) to interstitial sites. These interstitial atoms cause quantum well intermixing in the active layer, which increases the band gap. The local area of the quantum well intermixing is given by the mask, i.e. in the area below the mask no quantum well intermixing takes place in the quantum well as shown in FIG. 60. However, the diffusion of the dopant also causes increased doping in the region marked "Region II", thus forming a barrier to the lateral diffusion of charge carriers in the quantum well. This barrier is already partially below the mask and is thus locally offset from the boundary of quantum well intermixing. Thus, there are two barriers that reduce the lateral diffusion of charge carriers, one caused by the increased doping and the other by quantum well intermixing.

As shown in FIG. 60, boundary 36 of the quantum well intermixing and boundary 37 of the additional p-doping are locally offset, i.e. they do not coincide. From the point of view of carrier diffusion, this means that an increase in the barriers is also gradual. The separation between deposition of the dopant and diffusion now allows a change of the diffusion profile by a free choice of a suitable temperature profile during the diffusion process. Thus, for example, the barrier 37 can be shifted towards the barrier 36. This makes the barrier for carrier diffusion steeper at the boundary 50. Likewise, the density of impurities caused by the diffused material or the displaced atoms in the active layer is reduced by the specification of the process parameters. Additionally or alternatively, the electrical activation of the second dopant and thus the barrier caused by the additional p-doping can be increased by optimized process parameters during the diffusion process, which leads to a stronger reduction of the lateral charge carrier diffusion.

Figure 61:
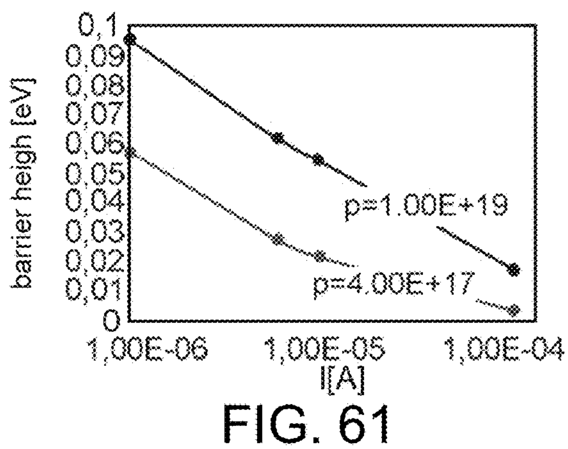
FIG. 61 is a diagram illustrating the barrier height as a function of the operating current at different doping levels to explain the concept presented.

FIG. 61 shows a simulation of the height of the doping barrier for LEDs with small dimensions (<10 μm) as a function of the doping concentration at low currents. The increased doping shows a significant increase of the doping barrier by a factor of almost two. Thus, charge carriers are effectively kept away from the edge region, but also from regions with an increased number of impurities due to the introduced second dopant.

Figure 62:
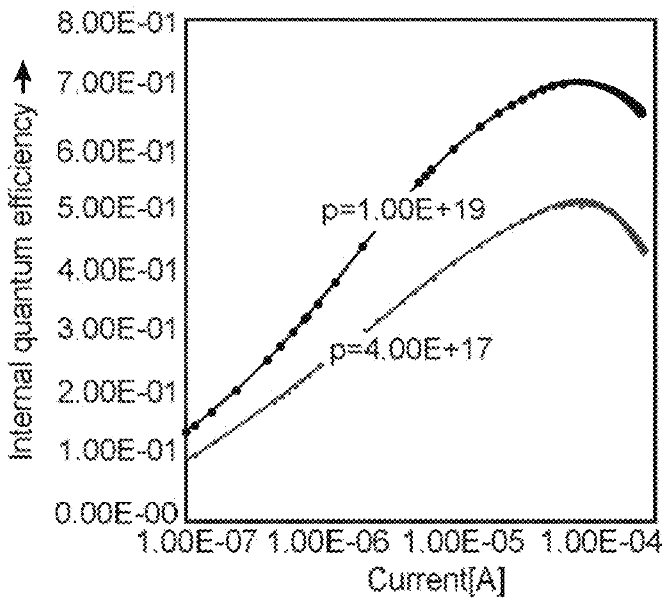
FIG. 62 is another diagram illustrating the quantum efficiency at different barrier heights to explain the concept presented.

This results in a higher internal quantum efficiency. FIG. 62 shows a diagram showing the internal quantum efficiency versus the current at different dopant concentrations. Clearly visible is the improved maximum at higher concentrations for a current in the range of about 0.1 mA.

With the proposed principle and the various measures, an improvement of an optoelectronic device is achieved in both low and high current efficiency. Imperfections in the optically active region of an active layer are reduced. At the same time charge carriers can be kept away from the edge of the device (or around the active layer) due to the higher diffusion barriers at the edge of the device, thus reducing the amount of non-radiative surface recombination. This is especially important for μ-LEDs with an edge length of 70 μm or less.

Figure 63:
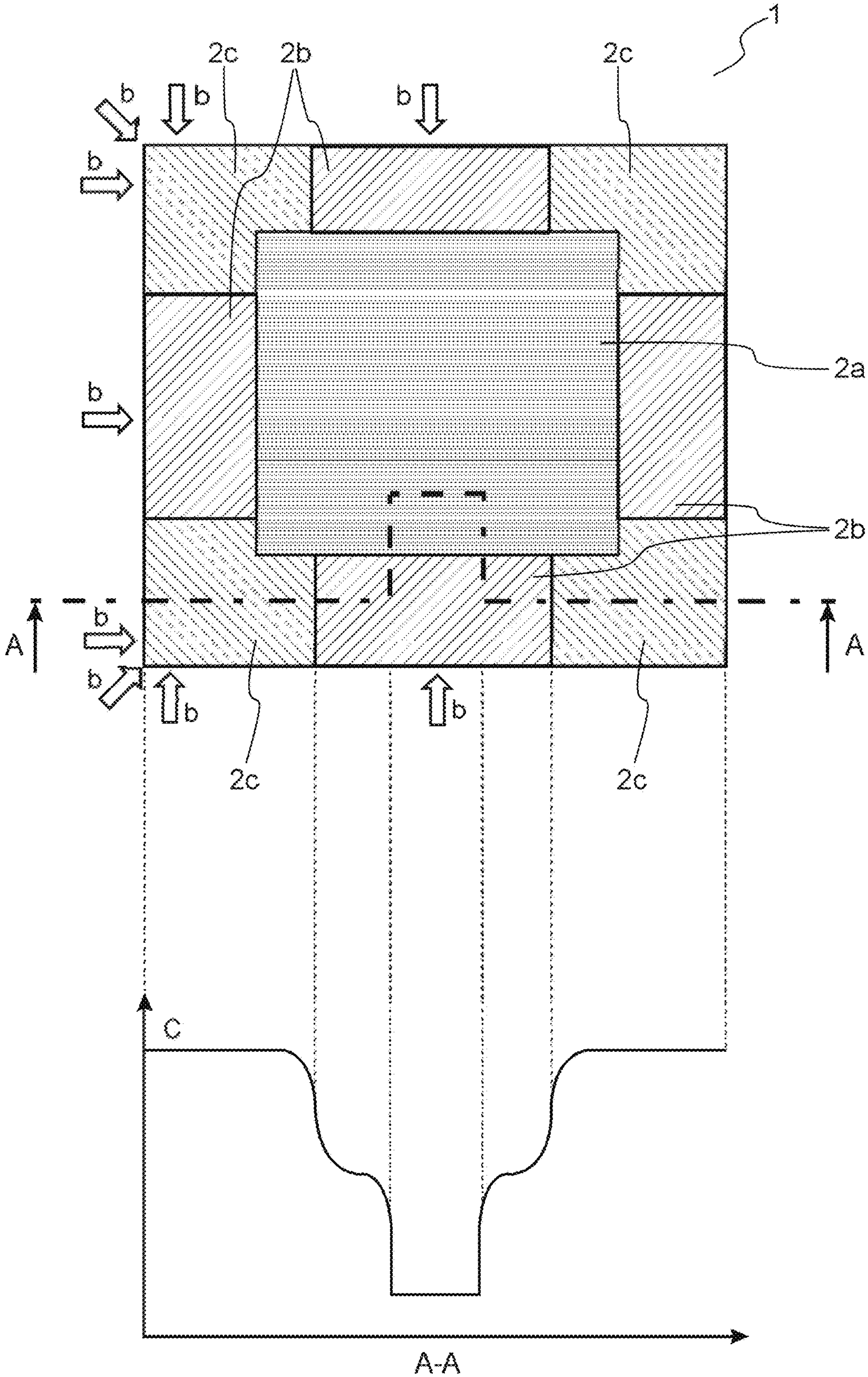
FIG. 63 shows a square μ-LED structure and corresponding cross-sectional profile of the dopant concentration to derive the proposed concept.

To explain the different aspects of a concentric arrangement of a quantum well intermixing FIG. 63 shows in contrast thereto a square LED which, contrary to the present invention, has several areas 2*b* and 2*c* in which quantum well intermixing takes place, but none of the second and third areas concentrically encloses the first area.

The first area 2*a* can be formed, for example, by applying a diffusion mask, possibly with the same or similar shape and size. For this purpose, a second dopant b is applied to the open areas 2*b* and 2*c* around the diffusion mask so that quantum well intermixing can take place in these areas. According to the above description, the edge of the square LED contains a higher impurity concentration in the corner areas 2*c* or shows a higher quantum well intermixing than, for example, in the middle of the side lengths 2*b*, since at the corners the impurities b can diffuse from more than one side. This results in the diffusion process in the regions 2*b* and 2*c*, which each have a different impurity concentration in the quantum well in the active layer 2. This effect leads to different quantum well intermixing in the regions 2*b* and 2*c* at the edge of the μ-LED and thus to different band gaps in the quantum well of the active layer 2, which reduces the power of the μ-LED.

This effect is illustrated by the cross-section of the μ-LED shown in FIG. 63 and the concentration of the second dopant b derived from it along the cross-sectional axis A-A. From this, it can be seen that the concentration of the second dopant b is higher in the corners, i.e. in the third areas 2*c*, than in the first and second areas 2*a*, 2*b*. A further drop in concentration occurs from the second region 2*b* towards the first region 2*a*. In a mirrored manner, a concentration increase from the first region 2*a* via the second region 2*b* to the third region 2*c* results corresponding to this concentration decrease.

However, this concentration course is only to be regarded as a qualitative course and does not represent absolute values or ratios between the dopant concentrations in the first, second and third ranges 2*a*, 2*b*, 2*c*. The negative effect of a different band gap due to the different quantum well intermixing in the regions 2*b* and 2*c* is solved by a modified geometry of the optoelectronic device 1, shown in FIG. 64. The two regions 2*a* and 2*b* of the optoelectronic device 1 are concentrically arranged and the second region 2*b* completely encloses the first region 2*a*.

The first area 2*a* is formed by applying an at least approximately circular diffusion mask, possibly of the same or similar shape and size. Subsequently, a second dopant b is applied to the exposed region 2*b* around the diffusion mask so that quantum well intermixing can take place in these regions. This shape allows a second dopant b introduced into the second region 2*b* to diffuse uniformly along the circumference of the two regions 2*a*, 2*b* into the second region 2*b* as homogeneously as possible and, unlike the angular shape of a μ-LED described above, there is not a higher impurity concentration or quantum well intermixing in the corners than, for example, in the middle of the side lengths of the μ-LED.

Figure 64:
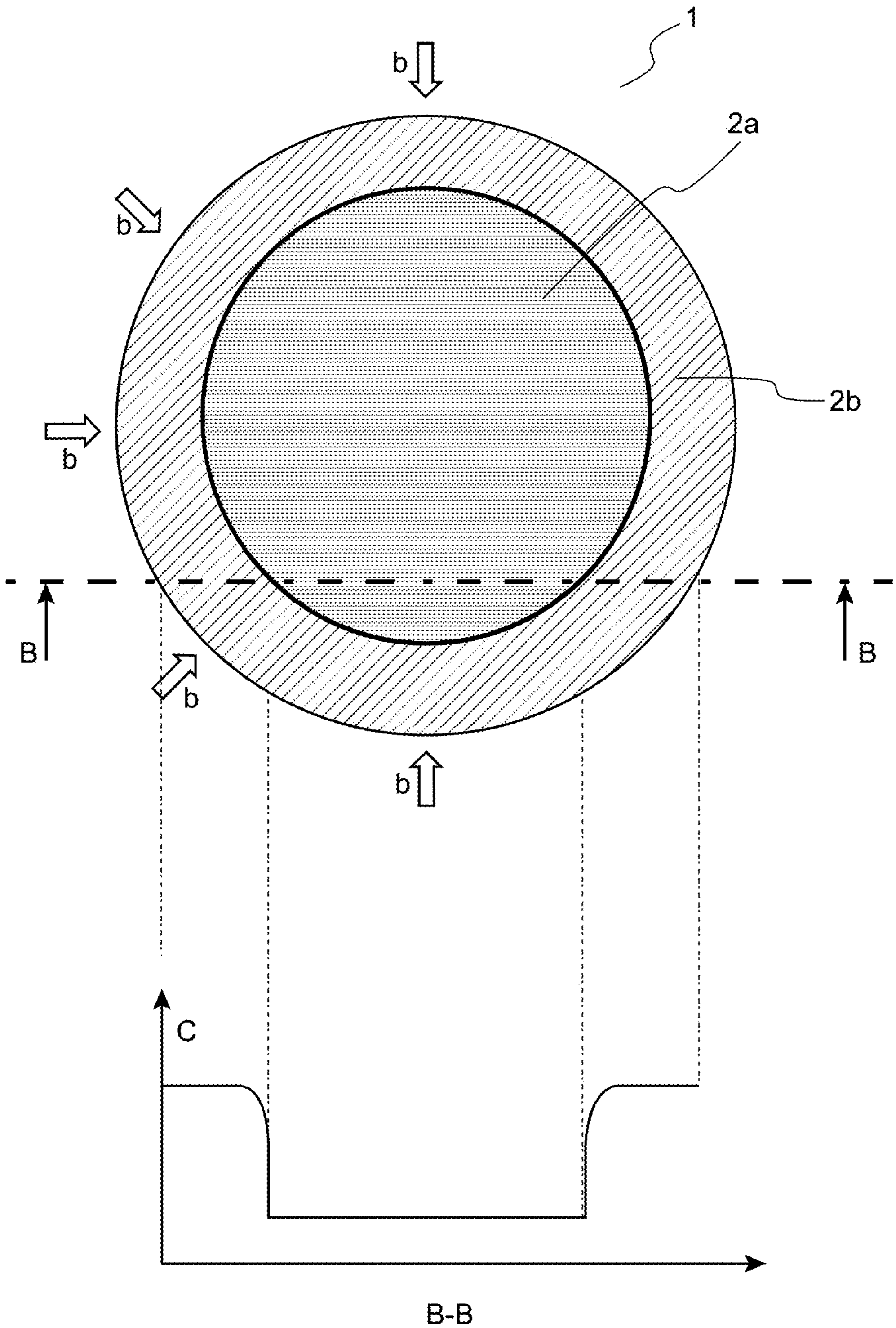
FIG. 64 shows a top view of an optoelectronic component semiconductor structure with a corresponding cross-sectional profile of the dopant concentration according to some aspects of the proposed principle.

This effect becomes clear when comparing FIG. 63 and FIG. 64, since in FIG. 63 the impurities/the second dopant b can diffuse in from more than one side at the four corners of the third region 2*c*, whereas in FIG. 64 the dopant b can diffuse vertically and equally distributed at any point of the outer circumference of the second region 2*b*.

Furthermore, FIG. 64 shows the corresponding cross-section of the optoelectronic device 1 and the concentration of the second dopant b derived from it along the intersection axis B-B. The concentration of the second dopant b is largely constant in the region of the second region 2*b* and decreases in a defined transition region from the second region 2*b* to the first region 2*a*. In the first region, in turn, the concentration of the second dopant b is largely constant and increases in a defined transition region from the first region 2*a* to the second region 2*b*. However, the concentration of the second dopant b can vary and does not represent any absolute values or ratios between the dopant concentrations in the first and second range 2*a*, 2*b*. Likewise, the defined transition region between the second and the first region can also vary and be both somewhat flatter and steeper.

The only decisive factor is that a largely sharp edge is formed in the transition region from the first region 2*a* to the second region 2*b* and that the dopant concentration in the first region 2*a* is largely zero or in a ratio of less than or equal to 2, for example less than or equal to 5 or even less than 10 to the dopant concentration in the second region 2*b*. In other words, the dopant concentration in the second region 2*b* is, for example, greater than or equal to 2, for example greater than or equal to 5 or also greater than 10 in relation to the dopant concentration in the first region 2*a*.

Figure 65A:
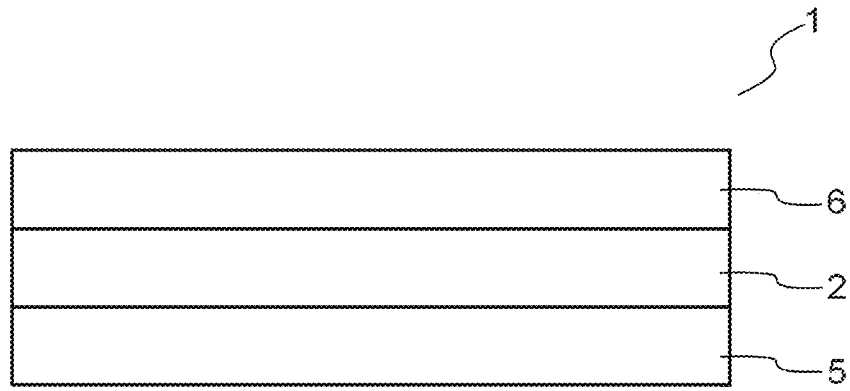
FIG. 65A to 65C shows different steps of a layered structure and thus a manufacturing process of the optoelectronic component under consideration of the proposed concept.
Figure 65B:
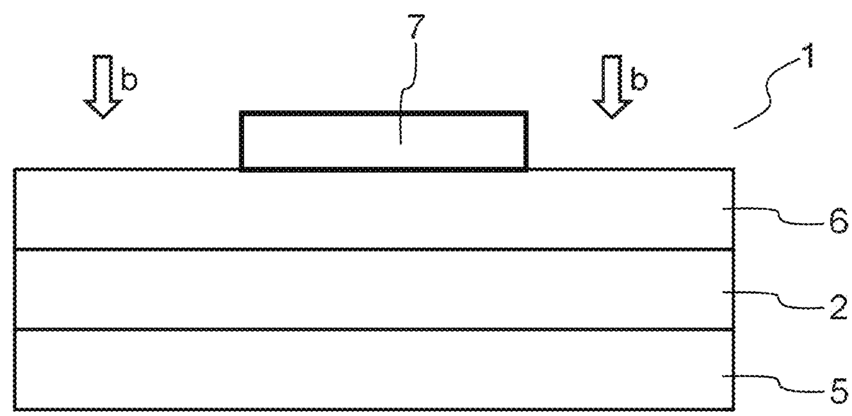
Figure 65C:
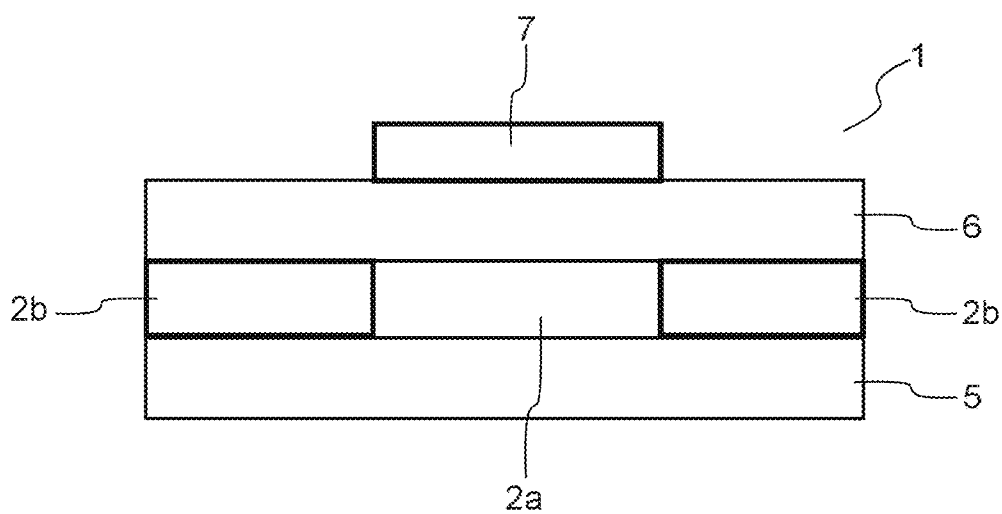

FIGS. 65A, 65B and 65C show the layer structure and the production of an optoelectronic device 1 as shown in FIG. 64. The optoelectronic device 1 comprises an n-doped first layer 5, a p-doped second layer 6, and an active layer 2 which is located between the n-doped first layer 5 and the p-doped second layer 6 and which comprises at least one quantum well.

By applying a diffusion mask 7, for example a dielectric such as silicon dioxide, silicon nitride, silicon oxynitride, aluminium oxide or for example a photomask, a corresponding mask with the circular shape substantially identical to the first region 2*a* is created on the surface of the p-doped second layer 6.

In another aspect, the surface can be covered with a thin layer before applying the photomask, which also serves as a photomask and can thus be used for processing. This can be done in some more complex arrangements to save process steps including especially new deposition or structuring of masks. Such a more complex structure would be the designs of FIGS. 158A and 158B. The thin additional layer is for example chrome. This is underetched, i.e. an etching process also removes part of the chromium layer, so that the mask and the thin chromium layer underneath can be used for two or more etching processes. In the same way, chromium can serve as a diffusion barrier for the second dopant.

Subsequently, the second dopant is applied and diffused. By applying and diffusing the second dopant b onto the remaining surface of the p-doped second layer 6, the second dopant b diffuses into the active layer 2 and forms the at least two regions 2*a*, 2*b* therein. Correspondingly, the two regions 2*a*, 2*b* in the active layer 2 result in the form of a projection of the diffusion mask 7, which is applied to the surface of the p-doped second layer 6, in the active layer 2.

Under suitable process conditions, the diffusion of the second dopant b into the active layer 2 causes the quantum well intermixing described above. The first region 2*a*, in particular the optically active region, results as the region which is located in direct projection below the diffusion mask 7 and into which substantially no second dopant b diffuses due to the diffusion mask 7.

The second region 2*b* is accordingly the region, which is located in direct projection below the region that is exposed as a free surface to the second dopant b around the diffusion mask 7.

Consequently, the second dopant b diffuses into the second p-doped layer 6, into the active layer 2, into the second region 2*b* and, depending on the doping profile and process parameters, partially also into a region of the n-doped layer 5 adjacent to the active layer 2.

From this it follows that the second region 2*b* contains the second dopant b and thus quantum well intermixing.

Figure 66:
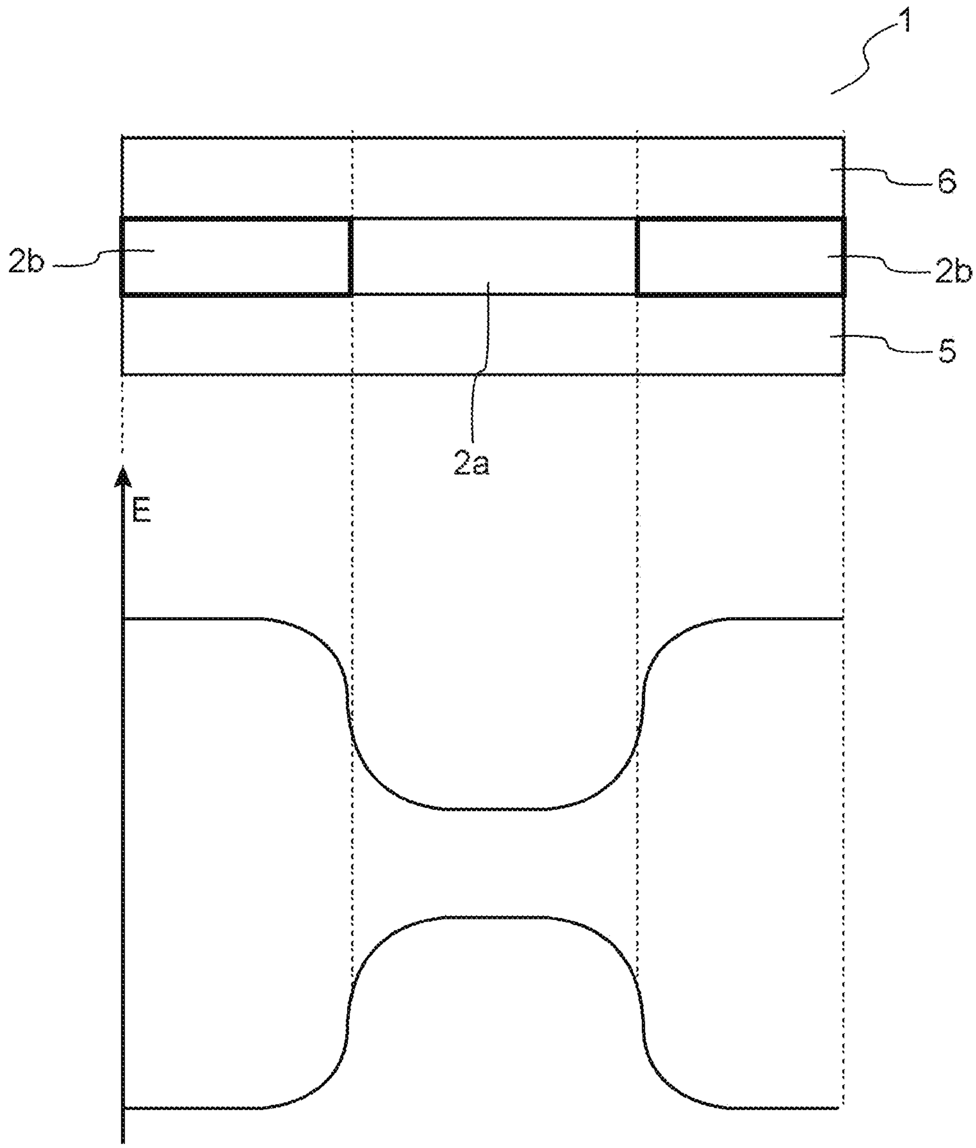
FIG. 66 is a representation of the band gap of the optoelectronic component according to the proposed concept.

FIG. 66 shows the layer structure of the optoelectronic device 1 after application of the diffusion mask 7 and diffusion of the second dopant b, and the band gap of the at least one quantum well in the active layer 2.

The energy of the band gap E is constant in the second area 2*b* viewed from left to right and drops in a defined transition area from the second area 2*b* to the first area 2*a*. In the first region 2*a*, the energy of the band gap E again comprises a constant value and rises in a defined transition region from the first region 2*a* to the second region 2*b*, wherein the energy of the band gap E of the second region 2*b* again assumes a constant value.

However, the band gap E energy curve shown may vary and does not represent absolute values or ratios between the band gap E energy in the first and second range 2*a*, 2*b*. Likewise, the defined transition region between the second and the first region can also vary and be both somewhat flatter and steeper.

The only decisive factor is that the energy of the band gap E of the first range 2*a* is smaller than that of the second range 2*b*, and that the energy of the band gap E in the first and second ranges 2*a*, 2*b* is substantially constant.

In addition to a geometrical consideration of how to improve the performance in the area of a single LED, the following provide examples on how to improve a quantum well intermixing at wafer level. μ-LED structures are produced independently of their later use as individual components or in monolithic form on wafer level. By means of the above-mentioned Zn diffusion and other measures, improvements in low and high current efficiency can be achieved by lowering the impurity density in the area of the later active layer and permanently binding or saturating impurity atoms.

Figure 67A:
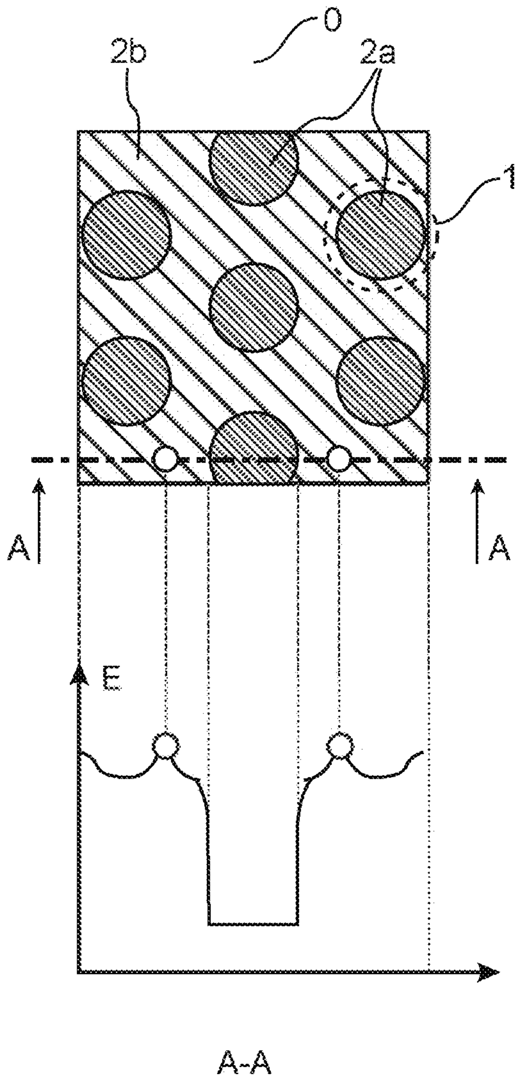
FIGS. 67A and 67B each illustrate a top view of a first version of a semiconductor structure suitable for light emission and associated cross-sectional profiles of the band gap of the semiconductor structure according to some aspects of the concept presented.

FIG. 67A shows the top view of a section of a first type of semiconductor structure 0, and the corresponding cross-sectional profile of the energy of the bandgap of the semiconductor structure along the intersection axis A-A. In semiconductor structure 0, a large number of first optically active regions 2*a* and a second region 2*b* are formed. The plurality of first optically active regions 2*a* are arranged spaced apart from one another in a hexagonal pattern and the one second region 2*b* encloses the plurality of first optically active regions 2*a* and is arranged in their interstices.

Furthermore, one optically active region 2*a* of each of the plurality of first optically active regions 2*a* of the semiconductor structure 0 forms part of each of a plurality of optoelectronic components 1. In this context, the optoelectronic components can be regarded as μ-LEDs due to their overall dimensions. The plurality of first optically active regions 2*a* can be formed, for example, by applying a mask or, for example, by applying mask segments possibly having the same or similar shape and size. Subsequently, a second dopant b is applied to the exposed second area 2*b* around the mask or around the mask segments so that a QWI can take place in this area. Due to the diffusion of the second dopant and the associated QWI in the second region, the energy of the band gap changes in this region compared to the regions in which no quantum well intermixing takes place.

The section of the semiconductor structure 0 shown in FIG. 67A and the band gap energy curve derived from it along the intersection axis A-A shows the band gap energy curve in the areas 2*a* and 2*b*. It can be seen that the band gap energy is greater in the second region 2*b* than in the first optically active regions 2*a*. A reduction in the energy of the band gap results from the second region 2*b* towards the first optically active region 2*a* and in a mirrored manner, corresponding to this reduction, an increase in the energy of the band gap results from the first optically active region 2*a* towards the second region 2*b*.

This and similar courses in the following, however, are to be regarded as qualitative courses only and do not represent absolute values or ratios of the energy of the band gap in the plurality of first optically active areas 2*a* and the second area 2*b*. Likewise, the transition region between the second and the first optically active region can also vary and be both somewhat flatter and steeper. The only decisive factor is that a largely sharp edge is formed in the transition region of the plurality of first optically active regions 2*a* towards the second region 2*b* and that the energy of the band gap in the plurality of first optically active regions 2a is smaller than the energy of the band gap in the second region 2b.

In other words, this means that a dopant concentration of the second dopant b in the second region 2b is greater than the dopant concentration of the second dopant b in the plurality of first optically active regions 2a.

Furthermore, FIG. 67A shows that the energy of the band gap in the second region 2b does not have a constant value, but has local maxima of the energy of the band gap in the regions where the largest possible distance between the plurality of first regions 2a occurs. This is due to the fact that the diffusion process and thus the quantum well intermixing takes place more efficiently in the region of larger areas exposed to the second dopant b than in smaller gaps between two first optically active regions 2a covered by, for example, a mask.

Figure 67B:
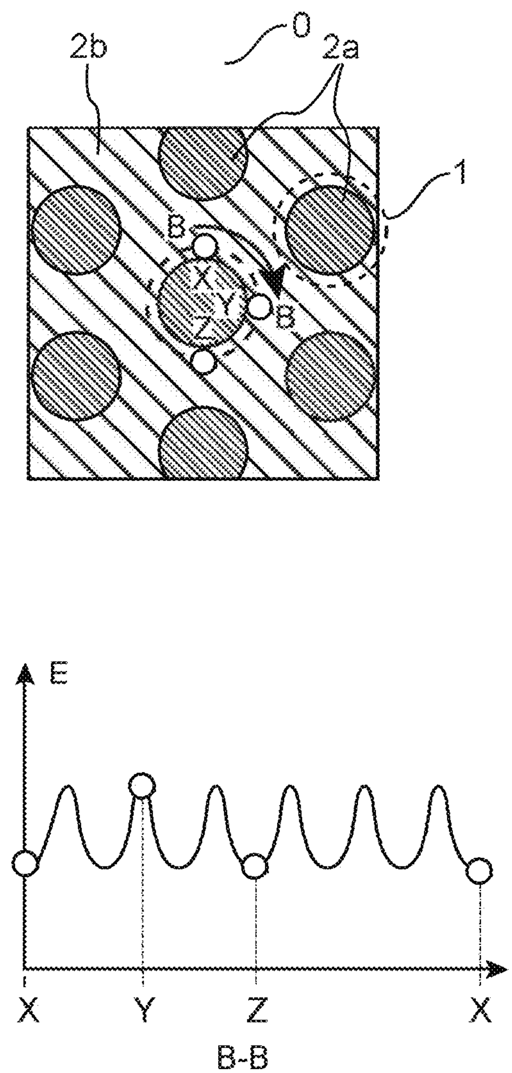

The section of the semiconductor structure 0 shown in FIG. 67B and the band gap energy curve along the intersection axis (B-B) derived from it shows the band gap energy curve along the circumference of an optoelectronic device 1. The intersection axis runs through the second region 2b. According to the above explanation, the energy of the band gap in the second region 2b does not have a constant value, but has maxima in the regions where the largest possible distance between the plurality of first regions 2a occurs and minima in the regions where the smallest possible distance between the plurality of first regions 2a occurs. In FIG. 67B, the regions of local maxima of the bandgap energy of the semiconductor structure are designated Y as an example, and the regions of local minima of the bandgap energy of the semiconductor structure are designated X and Z as examples.

In practice, however, it is desirable to achieve a band gap energy as homogeneous and constant as possible in the second region 2b of the semiconductor structure 0 and correspondingly along the circumference of an optoelectronic device 1. In the following, therefore, the three designs (FIGS. 68A and 68B, 69A and 69B and 70A and 70B) are presented, among others, to counteract the effect of local maxima of the bandgap energy in semiconductor structure 0. FIGS. 68A and 68B, 69A and 69B and 70A and 70B each show a plan view of a design form of semiconductor structure 0 of the invention and an associated cross-sectional profile of the energy of the bandgap of the semiconductor structure along the intersection axes A-A and B-B.

In addition to the example of a structure in FIGS. 67A and 67B, at least one third area 2c is formed in addition to the large number of first optically active areas 2a and the at least one second area 2b. This at least one third area 2c is in turn arranged in the spaces between the plurality of first optically active areas 2a.

Figure 68A:
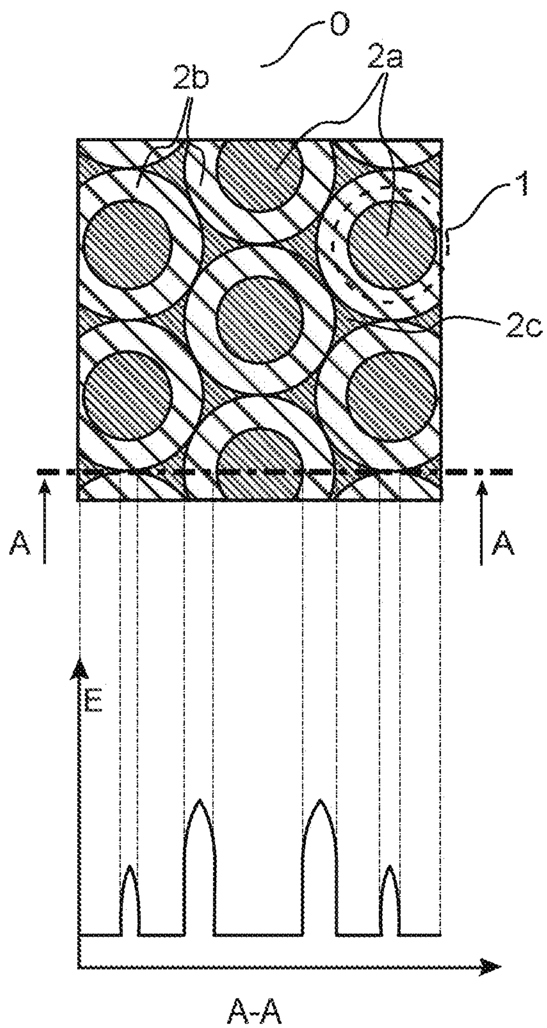
FIGS. 68A and 68B show a top view of a further embodiment of a semiconductor structure suitable for light emission with associated cross-sectional profiles of the band gap according to some aspects of the proposed concept.

More precisely, FIG. 68A shows a section of a semiconductor structure 0 with a plurality of first optically active regions 2a, a second region 2b and a plurality of third regions 2c. The plurality of first optically active regions 2a are spaced apart in a hexagonal pattern as described above. The second region 2b encloses the plurality of first optically active regions 2a in such a way that one each of the plurality of first optically active regions 2a is enclosed annularly and/or concentrically by the second region 2b. The second region 2b is divided, for example, into ring segments and is connected, for example, only point-wise to the next adjacent ring segment of the second region 2b. The plurality of the third area 2c is formed as a deltoid curve of three of the ring segments of the second area 2b.

The large number of first optically active areas 2a and third areas 2c can be formed, for example, by applying a mask or, for example, by applying mask segments possibly with the same or similar shape and size. Subsequently, a second dopant b is applied to the exposed second region 2b around the mask or around the mask segments, respectively, so that a QWI can take place in this region.

The section of the semiconductor structure 0 shown in FIG. 67A and the energy of the band gap along the intersection axis A-A shows the energy of the band gap in the areas 2a, 2b and 2c. This indicates that the band gap in the second region 2b is larger than in the first optically active regions 2a and third regions 2c. In the areas where the axis A-A intersects the second area 2b, a local increase of the band gap can be seen. The energy of the band gap is higher or lower depending on the area of the second region 2b intersected by the A-A axis.

However, this curve is to be regarded as a qualitative curve only and does not represent absolute values or ratios of the energy of the band gap of the plurality of first optically active regions 2a, the second region 2b and the plurality of third regions 2c. Likewise, the transition regions between the first optically active region, the second region 2b and the third regions 2c can also vary and be both somewhat flatter and steeper.

The decisive factor is that a largely sharp edge is formed in the transition region of the plurality of first optically active regions 2a towards the second region 2b and in the transition region from the third regions 2c towards the second region 2b and that the energy of the band gap in the plurality of first optically active regions 2a and third regions 2c is smaller than the energy of the band gap in the second region 2b. This means in other words that the dopant concentration of the second dopant b in the second region 2b is greater than the dopant concentration of the second dopant b in the plurality of first optically active regions 2a and third regions 2c.

Figure 68B:
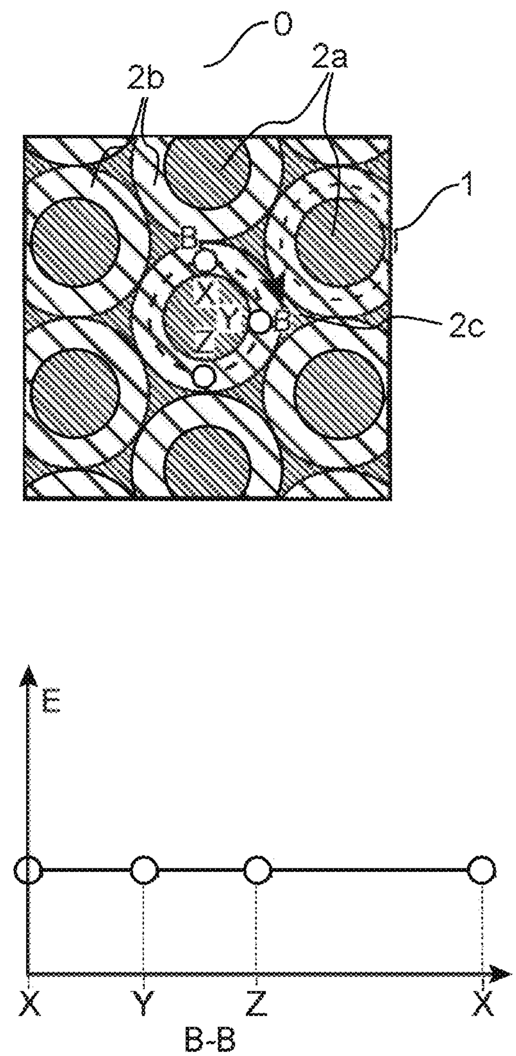

The section of the semiconductor structure 0 shown in FIG. 68B and the band gap energy curve derived from it along the intersection axis B-B shows the band gap energy curve along the circumference of an optoelectronic device 1. The intersection axis runs through the second region 2b. Contrary to the illustration in FIG. 67B, the energy of the band gap in the second region 2b shows less variation. By introducing the plurality of third regions 2c, it is achieved that in the region of the interstices of three of the plurality of first optically active regions 2a, the local maxima of the bandgap energy in the semiconductor structure 0 are less pronounced. Thus, a more uniform band gap energy can be achieved in the second region 2b. This in turn leads to an increase in performance of the optoelectronic components 1.

Figure 69A:
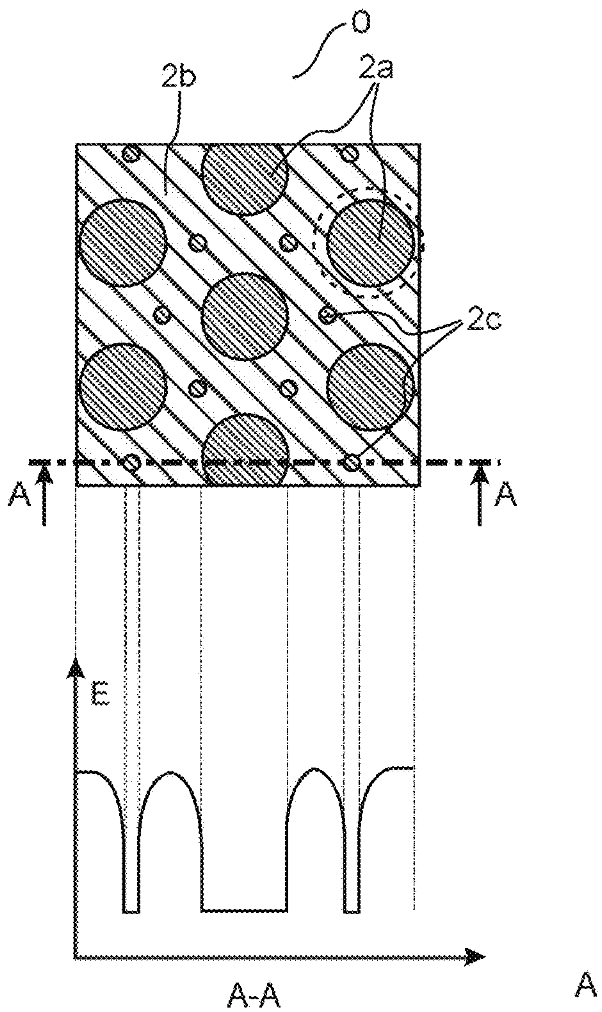
FIGS. 69A and 69B are a top view of a third embodiment based on some aspects of the proposed concept with associated cross-sectional profiles of the band gap.
Figure 69B:
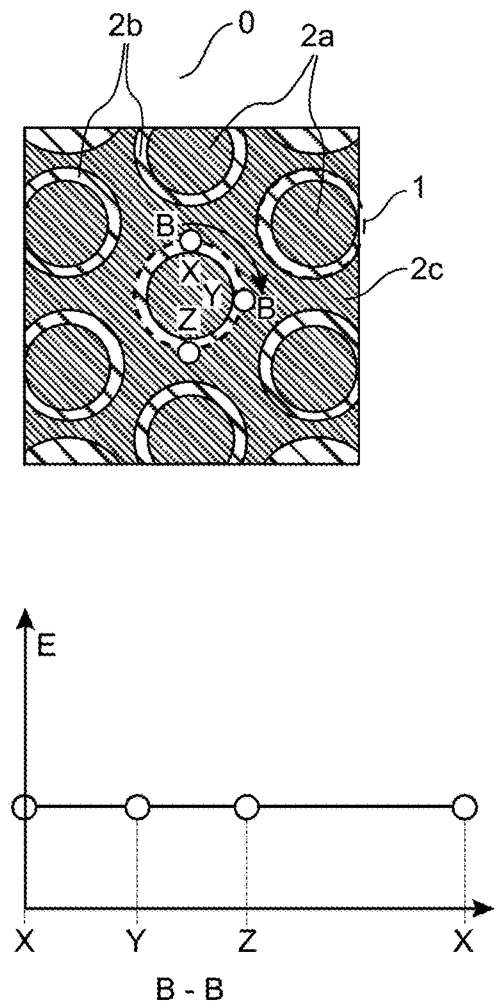

A further version of the semiconductor structure 0 according to the invention and the course of the energy of the band gap in the semiconductor structure 0 along the intersection axes A-A and B-B derived from it is shown in FIGS. 69A and 69B.

The plurality of the third areas 2c are formed circular in it and arranged in the middle of three of the plurality of first optically active areas 2a. Likewise, the term circular can also include elliptical, as well as oval and other rounded convex shapes. This arrangement of the plurality of third regions 2c serves, in analogue to FIGS. 68A and 68B, to reduce local maxima of the applied second dopant b to the semiconductor structure 0 in order to achieve a substantially uniform dopant concentration in the second region 2b. The circularly formed third regions 2c shown in FIG. 69A and arranged in the middle of three of the plurality of first optically active regions 2a in each case already show an increase in performance of the optoelectronic components 1.

Accordingly, the second region 2*b* does not result as continuous ring segments but fills the space between the plurality of first optically active regions 2*a* and third regions 2*c*.

The large number of first optically active areas 2*a* and third areas 2*c* can be formed, for example, by applying a mask or, for example, by applying mask segments possibly with the same or similar shape and size. For this purpose, a second dopant b is applied to the exposed second region 2*b* around the mask or around the mask segments, so that a QWI can take place in this region.

The section of the semiconductor structure 0 shown in FIG. 69A and the energy of the band gap along the intersection axis A-A derived from it shows the energy of the band gap in the areas 2*a*, 2*b* and 2*c*. From this, it can be seen that the energy of the band gap is greater in the second region 2*b* than in the first optically active regions 2*a* and third regions 2*c*. In the areas where the axis A-A intersects the second area 2*b*, a local increase of the band gap can be seen. Likewise, the transition regions between the first region, the second region 2*b* and the third regions 2*c* may vary and be both slightly flatter and steeper.

A decisive factor is that a largely sharp edge is formed in the transition region of the plurality of first optically active regions 2*a* towards the second region 2*b* and in the transition region from the third regions 2*c* towards the second region 2*b* and that the energy of the band gap in the plurality of first optically active regions 2*a* and third regions 2*c* is smaller than the energy of the band gap in the second region 2*b*. This means, in other words, that the dopant concentration of the second dopant b in the second region 2*b* is greater than the dopant concentration of the second dopant b in the plurality of first optically active regions 2*a* and third regions 2*c*.

The section of the semiconductor structure 0 shown in FIG. 69B and the band gap energy curve derived from it along the intersection axis indicated by the arrow shows the band gap energy curve along the circumference of an optoelectronic device 1. The intersection axis runs through the second region 2*b*. As shown in FIG. 68B, the energy of the band gap in the second region 2*b* again does not have a constant value.

Since the plurality of third areas 2*c* each cover a smaller area than the plurality of third areas 2*c* of the design in FIG. 68A, there are more pronounced local maxima in those areas where there is the greatest possible distance from the plurality of first areas 2*a* and third areas 2*c*. Similarly, local minima also occur in those areas where the smallest possible distance between the plurality of first areas 2*a* and third areas occurs. In FIG. 69B, the regions of local maxima of the bandgap energy of the semiconductor structure are designated X and Z as examples, and the regions of local minima of the bandgap energy of the semiconductor structure are designated Y as examples.

The decisive factor is that, compared to the embodiment in FIG. 67A, by the introduction of the large number of third regions 3*c*, the local maxima of the bandgap energy in the semiconductor structure 0 are smaller in magnitude, so that a comparatively homogeneous and constant energy of the bandgap along the circumference of an optoelectronic device 1 or within the second region 2*b* prevails in the semiconductor structure 0. This in turn already leads to an increase in performance of the optoelectronic components 1.

Furthermore, FIG. 69B shows that one optically active region 2*a* of each of the numerous first optically active regions 2*a* of the semiconductor structure 0 forms a part of each optoelectronic device 1.

Figure 70A:
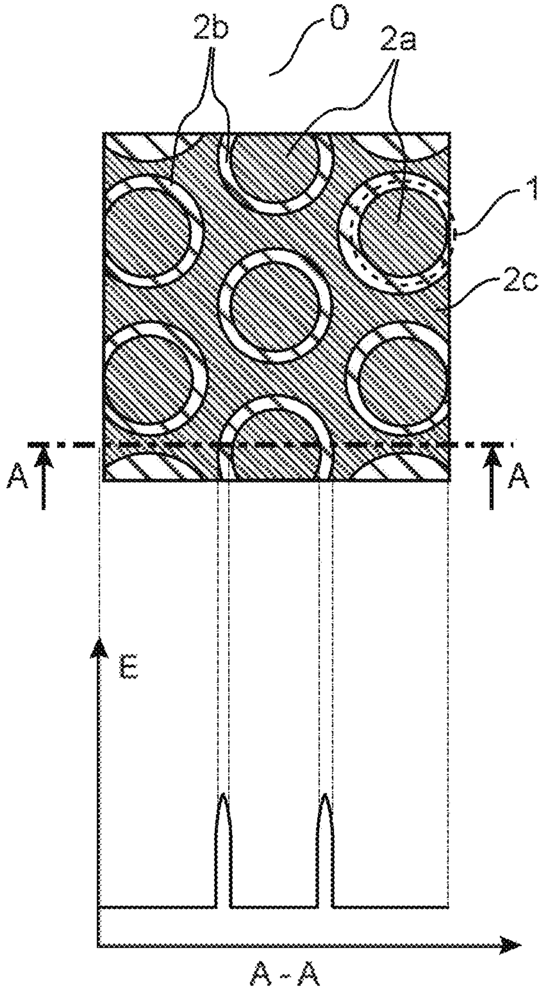
FIGS. 70A and 70B show a top view of a fourth embodiment of the semiconductor structure and associated cross-sectional profiles of the band gap of the semiconductor structures as realized in various aspects.
Figure 70B:
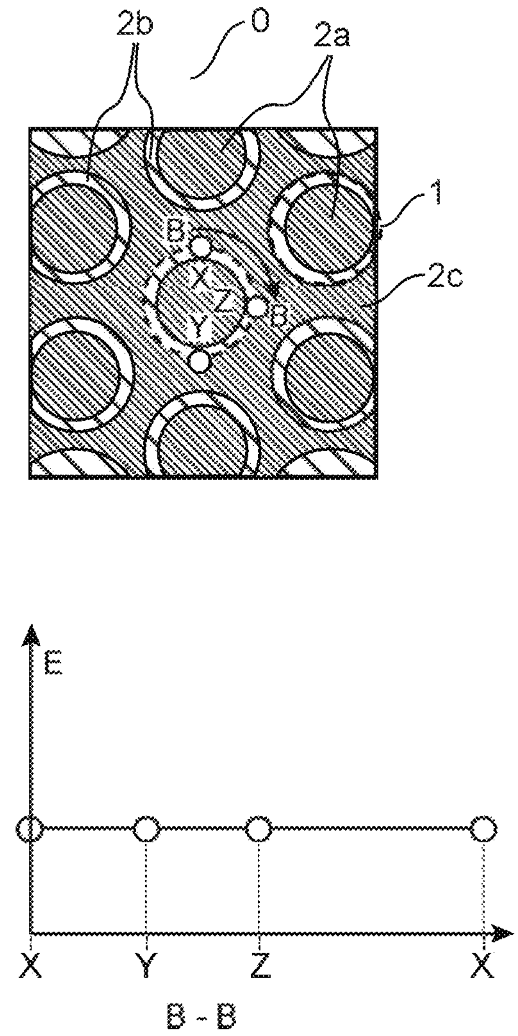

A further version of the semiconductor structure 0 according to the invention and the course of the energy of the band gap in the semiconductor structure 0 along the intersection axes A-A and B-B derived from it is shown in FIGS. 70A and 70B.

The plurality of first optically active areas 2*a* are each concentrically enclosed by a second area 2*b*. Correspondingly, a plurality of second areas 2*b* results, which are each arranged in a ring or circle around one of the plurality of first optically active areas 2*a*. Likewise, the term ring-shaped or circular can also include elliptical, as well as oval and other rounded convex shapes.

Furthermore, the semiconductor structure 0 has a third region 2*c*, which is located in the gaps between the plurality of first optically active regions 2*a* and second regions 2*b*. The plurality of first optically active regions 2*a* and the third region 2*c* can be formed, for example, by the application of a mask or, for example, by the application of mask segments possibly having the same or similar shape and size. For this purpose, the exposed second areas 2*b* around the mask or around the mask segments are exposed to a second dopant b so that a QWI can take place in this area.

This ring-shaped arrangement of the plurality of second regions 2*b* around one of the plurality of first optically active regions 2*a* and the third region 2*c* in each case avoids the formation of local maxima of the applied second dopant b in the region of the interstices of three first optically active regions 2*a* in each case. In this way, a substantially uniform dopant concentration can be achieved in the plurality of second regions 2*b*. This in turn leads to a substantially uniform QWI in the plurality of second regions 2*b*, which leads to an increase in the performance of the optoelectronic components 1.

The band gap energy curve along the intersection axis A-A shown in FIG. 70A shows that the band gap energy is greater in the second region 2*b* than in the first optically active regions 2*a* and the third region 2*c*. In the areas where the axis A-A intersects the second area 2*b*, a local increase in the band gap is visible.

However, this progression is to be regarded as a qualitative progression only and does not represent absolute values or ratios between the energy of the band gap of the plurality of first optically active regions 2*a*, the second region 2*b* and the third region 2*c*. Likewise, the transition regions between the first optically active region, the second region 2*b* and the third region 2*c* can also vary and be both somewhat flatter and steeper.

A decisive factor is that a largely sharp edge is formed in the transition region of the plurality of first optically active regions 2*a* towards the second regions 2*b* and in the transition region from the third region 2*c* towards the second regions 2*b* and that the energy of the band gap in the plurality of first optically active regions 2*a* and in the third region 2*c* is smaller than the energy of the band gap in the second regions 2*b*.

This means in other words that the dopant concentration of the second dopant b in the second region 2*b* is higher than the dopant concentration of the second dopant b in the plurality of first optically active regions 2*a* and the third region 2*c*.

The section of the semiconductor structure 0 shown in FIG. 70B and the band gap energy curve derived from it along the intersection axis B-B shows the band gap energy curve along the circumference of an optoelectronic device 1. The intersection axis runs through the second region 2*b*. In contrast to the illustration in FIGS. 67B, 68B and 69B, the energy of the band gap in the second region 2*b* comprises a largely constant value. By introducing the third region 2*c*, it is avoided that local maxima of the applied second dopant b are formed in the area of the interstices of each of the three first optically active regions 2*a*, and thus no local maxima of the bandgap energy in the semiconductor structure 0 arise. Thus, a substantially uniform band gap energy can be achieved in the second region 2*b*.

Figure 71A:
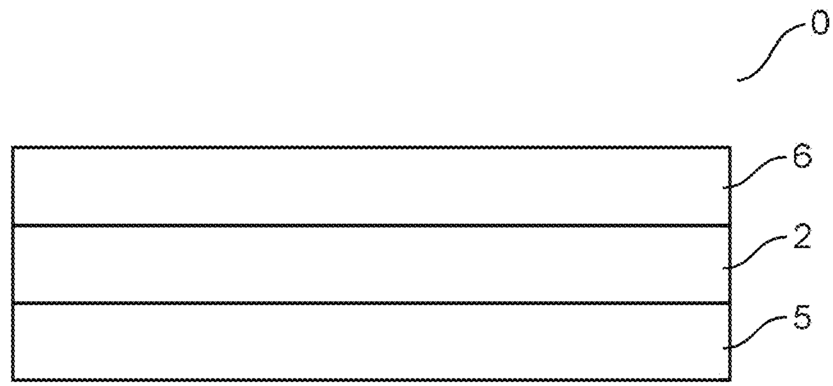
FIGS. 71A to 71C illustrate a layered structure and a process for the manufacture of one or more optoelectronic components, in particular μ-LEDs, according to some aspects of the concept presented.
Figure 71B:
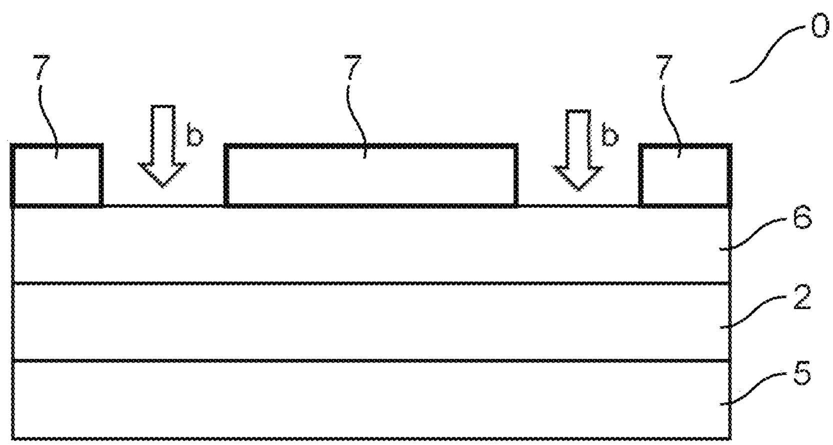
Figure 71C:
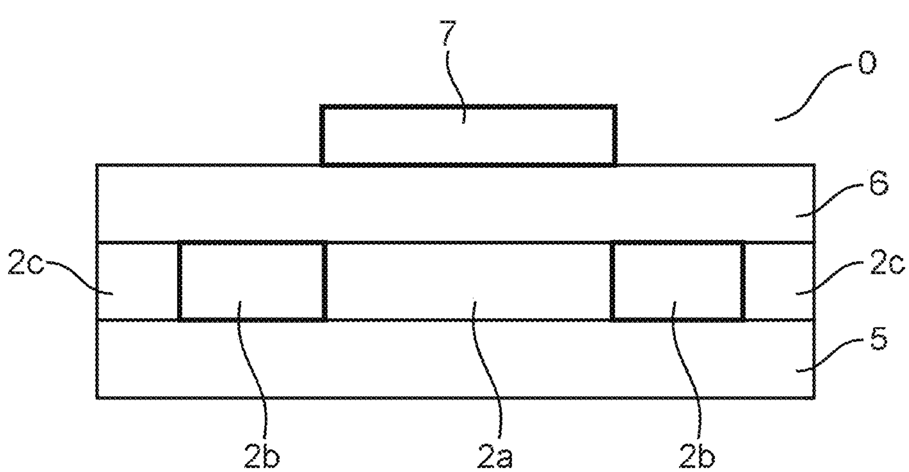

FIGS. 71A, 71B and 71C show the layered structure and correspondingly the production of a semiconductor structure 0 as shown in FIGS. 68A, 69A and 70A. The semiconductor structure 0 comprises an n-doped first layer 5, a p-doped second layer 6 containing a first dopant and an active layer 2, which is arranged between the n-doped first layer 5 and the p-doped second layer 6 and which has at least one quantum well. The layers are deposited, for example, epitaxially on a carrier substrate not shown here. In addition to the layers shown here, further layers, contact layers, sacrificial layers and the like can be provided.

FIG. 71B shows the next step in which a structured mask 7 is applied. The mask is pierced in some places so that dopant b is introduced there. Diffusion of the second dopant b into the active layer 2 causes the QWI described above.

By applying a mask, or rather, by applying mask segments 7, for example a dielectric or a photoresist mask, to the surface of the p-doped second layer 6 and the subsequent diffusion process, the structure shown in FIG. 71C is created. It shows a number of optically active regions below mask 7 with surrounding second regions 2*b* and the at least one third region 2*c*. As mentioned above, the structure and the build-up result from the structuring of the applied mask 7. The second dopant b diffuses through the p-doped second layer 6 and into the active layer 2, forming the regions 2*a*, 2*b* and 2*c* therein. Correspondingly, the regions 2*a*, 2*b* and 2*c* in the active layer 2 are formed in the active layer 2 in the form of a projection of the mask or the mask segments 7, respectively, which is deposited on the surface of the p-doped second layer 6.

The plurality of the first optically active regions 2*a* and the at least one third region 2*c* result as the regions which are located in direct projection below the mask or the mask segments 7 and into which essentially no second dopant b diffuses due to the mask or the mask segments 7.

The at least one second region 2*b* results accordingly as the region which is located in direct projection below the region which is exposed to the second dopant b as a free surface around the mask or the mask segments 7. Consequently, in the at least one second region 2*b*, the second dopant b diffuses into the second p-doped layer 6, into the active layer 2 and, depending on the doping profile and process parameters, partially also into a region of the n-doped layer 5 adjacent to the active layer 2.

It follows that the at least one second region 2*b* has the second dopant b and thus a QWI.

Figure 72:
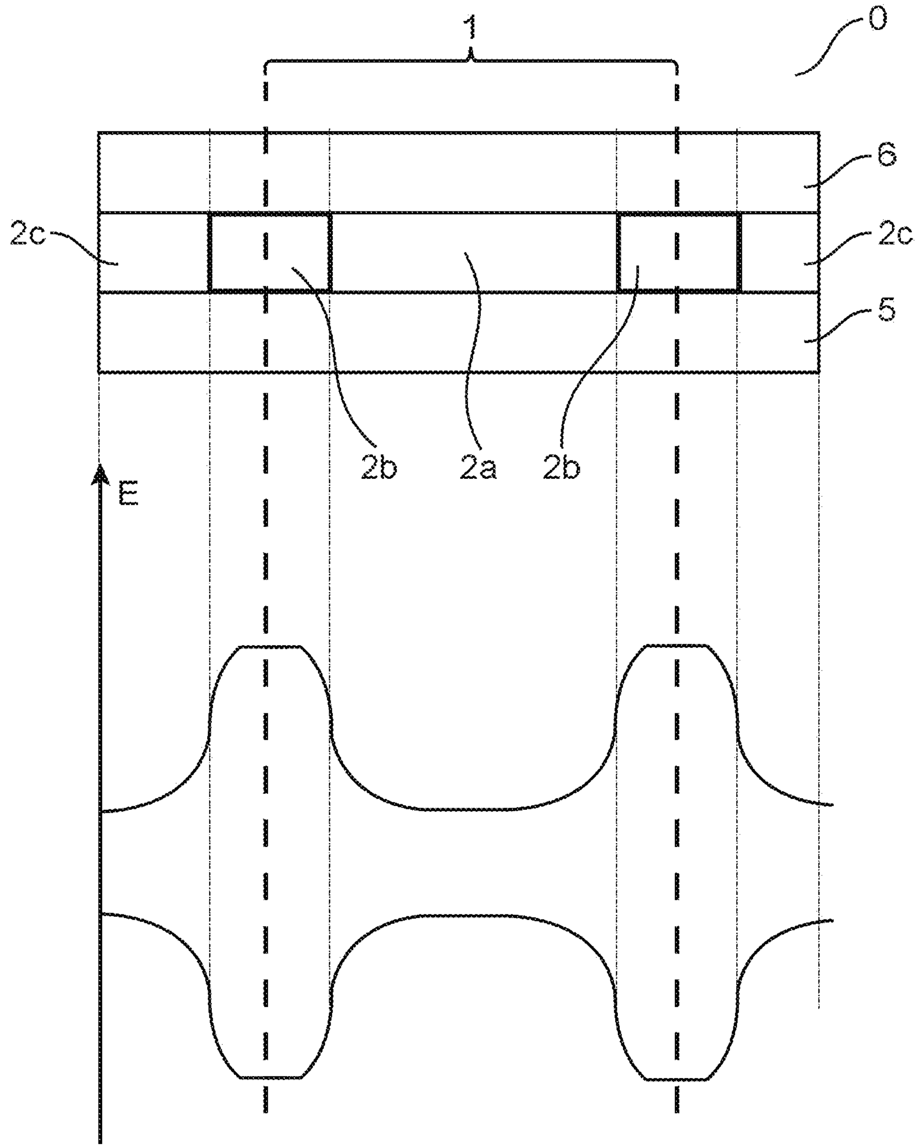
FIG. 72 is a representation of the band gap of the semiconductor structure according to the proposed concept.

In addition to the layer structure of the semiconductor structure 0 after application of the mask or the mask segments 7 and diffusion of the second dopant b, FIG. 72 shows the band gap of the at least one quantum well in the active layer 2. Shown is the energy of the band gap E in vertical direction of the diagram over the cross-section of the semiconductor structure 0 in horizontal direction of the diagram.

The energy of the band gap E is constant in the third region 2*c* viewed from left to right and increases in a defined transition region from the third region 2*c* to the second region 2*b*. In the second region 2*b*, the energy of the band gap E comprises a constant value and then decreases in a defined transition region from the second region 2*b* to the first optically active region 2*b*, wherein the energy of the band gap E of the first optically active region 2*a* assumes a constant value. In a mirrored manner, corresponding to this course, there is an increase in the energy of the band gap E in a defined transition region from the first optically active region 2*a* to the second region 2*b* and a decrease in the energy of the band gap E in a defined transition region from the second region 2*b* to the third region 2*c*.

However, the represented course of the energy of the band gap E may vary and does not represent absolute values or ratios between the energy of the band gap E in the first optically active regions 2*a*, the at least one second region 2*b* and the at least one third region 2*c*. Likewise, the transition region between the at least one second region 2*b* and the first optically active regions 2*a* and the transition region between the at least one second region 2*b* and the at least one third region 2*c* can also vary and be both somewhat flatter and steeper.

A decisive factor is that the energy of the band gap E of the first optically active regions 2*a* and of the at least one third region 2*c* is smaller than that of the at least one second region 2*b*, and that the energy of the band gap E is substantially constant in the respective first optically active regions 2*a* and the at least one second region 2*b* along the circumference of region 2*a*.

Figure 73:
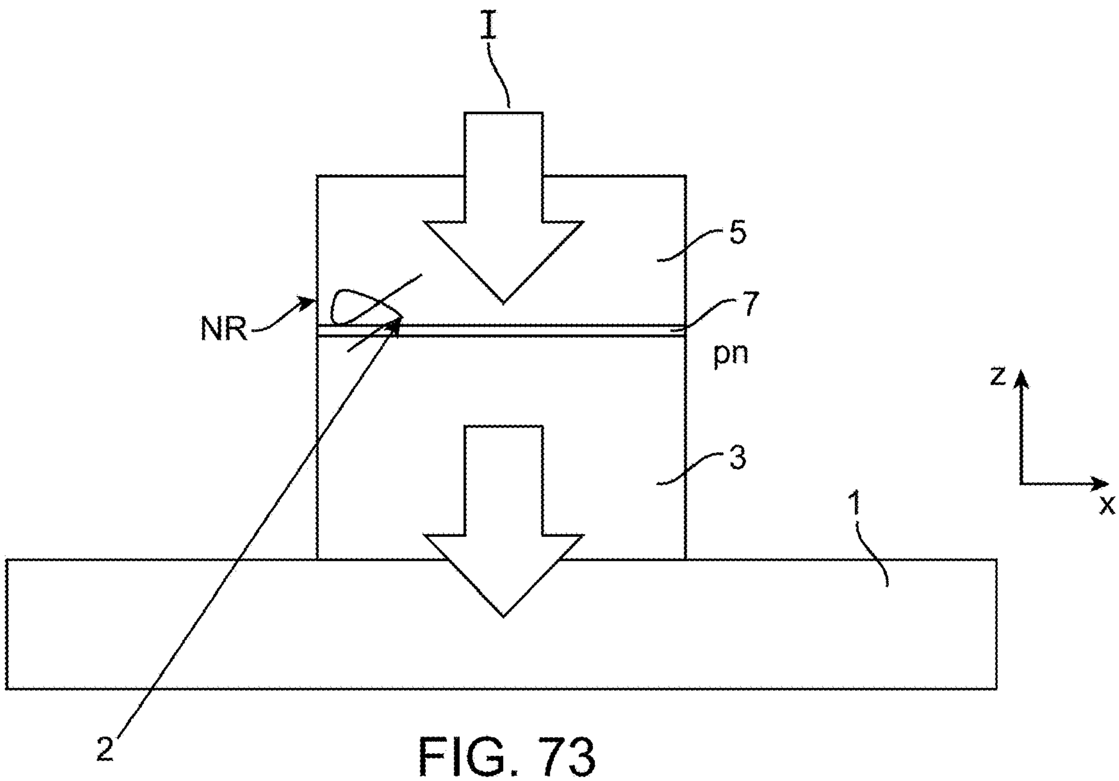
FIG. 73 illustrates an embodiment of a conventional optoelectronic component, for example an LED.

Before aspects of the magnetic constriction is explained, reference is made to FIG. 73. The figure shows an embodiment of a conventional light-emitting diode. The light emitting diode is supplied with power, whereby an electric current flows from the top of the light emitting diode, represented here by thick arrows, to an active layer with a so-called pn junction. In addition to radiative recombination, undesirable non-radiative recombination NR takes place there, which should be avoided or reduced in intensity. The non-radiative recombination result from the diffusion of charge carriers to the edge, whereby the defect density at the edge is increased or other effects occur. This diffusion of charge carriers to the edge is indicated by the reference sign 2. NR reduces the quantum efficiency and is essentially converted into heat. Especially, with small chips the ratio of radiative recombination to non-radiative recombination becomes worse. It is therefore desirable to develop methods to constrict the charge carriers and limit them to the center.

Figure 74:
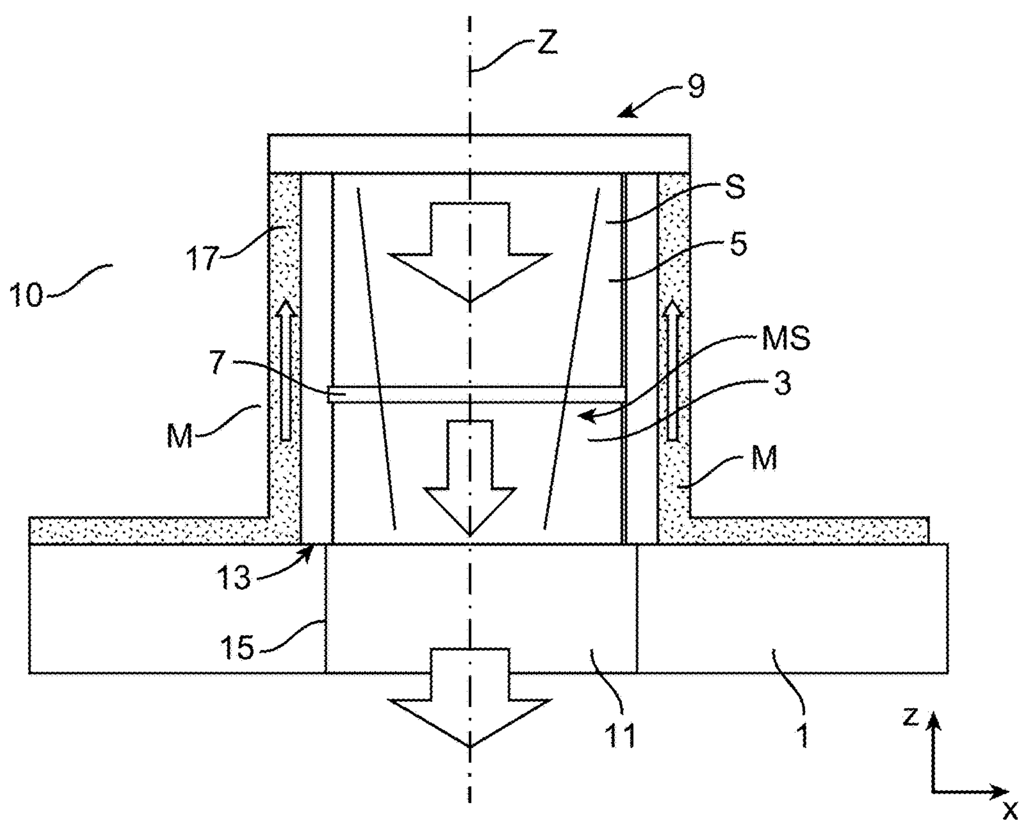
FIG. 74 is a longitudinal section of a first embodiment of an optoelectronic device or μ-LED with a current constriction according to some aspects of the presented concept.

FIG. 74 shows a longitudinal section along an X-Z plane of a first embodiment of an optoelectronic device 10 of the invention. The device is formed as a layer stack S, which has a first layer 3 on a carrier 1, on which an active layer 7 is deposited and on which a second layer 5 has been deposited. A first contact 9 is formed on a surface area of the second layer 5 facing away from the carrier 1 and a second contact 11 is formed on the first layer 3 by means of the carrier 1. The first layer 3 is n-doped and the second layer 5 is p-doped, so that in particular the first contact 9 forms the anode and the second contact 11 the cathode. Here, the layer stack S comprises an electrically insulating coating 13 and a passivating coating 15 along its lateral surface and on the side facing the carrier 1. The first contact can, for example, have ITO (indium tin oxide), so that light generated in the active layer is emitted upwards.

Furthermore, the device comprises a magnetizing element M, which provides magnetic field lines along the X-Y plane when current flows along the Z-axis of the (entire) stack of layers S. The magnetizing element M comprises a number of strip-shaped current lines 17 running along the Z-axis and along the lateral surface of the layer stack S. Depending on the direction of the current (i.e. depending on the function of contact 9 as anode or cathode) a current flow runs along the current lines and antiparallel through the stack of layers. In this way, the charge carriers, especially electrons, repel each other. The resulting magnetic current constriction MS, a kind of "electron lens", is illustrated by two lines running towards each other.

Figure 75:
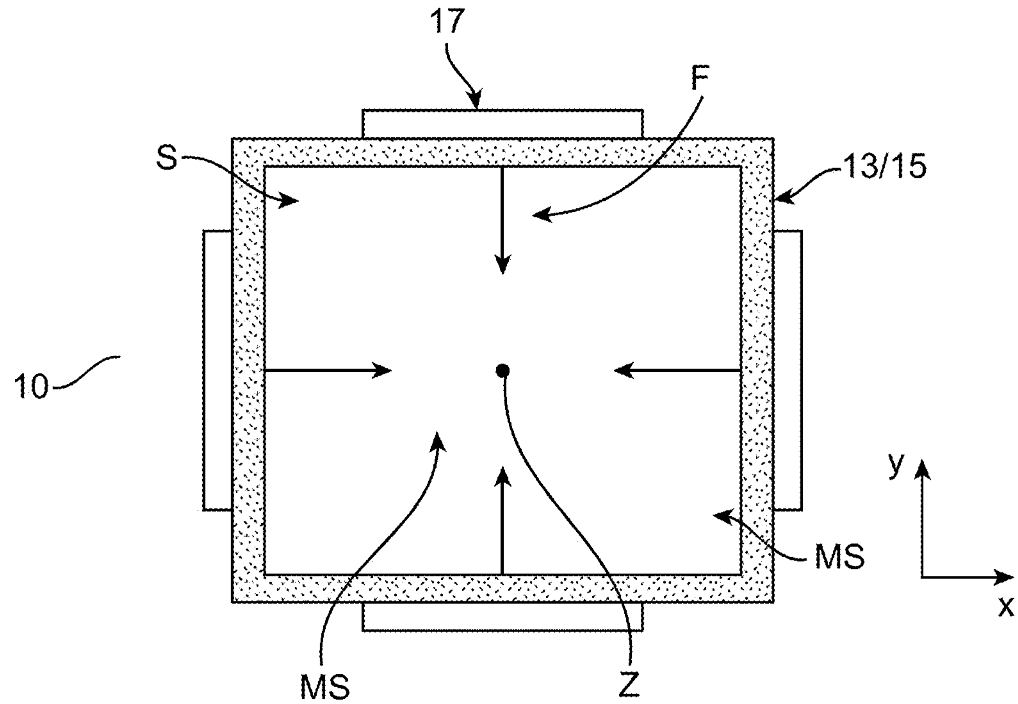
FIG. 75 shows a top view cross-section of the first embodiment of the μ-LED.

FIG. 75 shows a cross-section along an X-Y plane of the first embodiment of the optoelectronic device 10 of the invention. In the center of the X-Y cross-sectional plane extends the Z-axis along which a current flows along an optoelectronic device 10. In the form of conductor strips or conductor bands, current lines 17 are generated along the lateral surfaces of the layer stack S. Here, a total of four current lines 17 are formed on the cuboidal layer stack S, whose currents flow antiparallel to the current through a light-emitting diode, for example. These current lines 17 form a magnetizing element M, whereby the charge carriers, for example electrons, flowing in the optoelectronic component 10 move in the direction of a carrier 1 and are deflected in the direction of the Z-axis as a result of the magnetic fields generated along an X-Y plane by the current lines 17. In this way, forces F act on the charge carriers, in particular electrons, which are displaced from the edge of the device 10. This results in a constriction of the current distribution (a magnetic current constriction MS) and a kind of "electron lens" is created in such a way that non-radiative recombination at chip edges or mesa edges of the optoelectronic device 10 is reduced. The outer surface of the optoelectronic component also comprises an electrically insulating coating 13 and a passivating coating 15.

Figure 76:
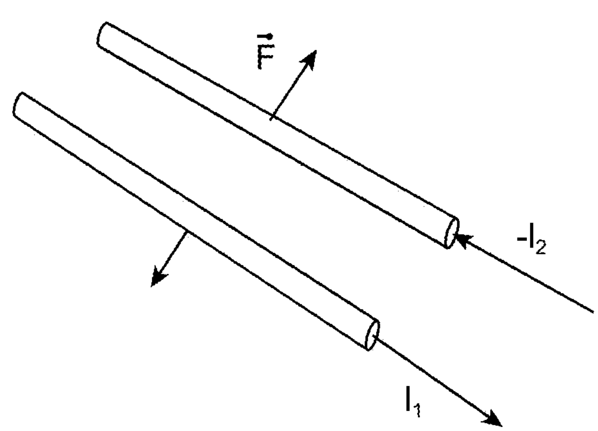
FIG. 76 shows a representation of the mode of operation of the first embodiment.

FIG. 76 shows an illustration of the mode of operation of the first embodiment. The antiparallel current I1 to −I2 in the two lines produces a force F that moves the two lines away from each other. The magnetic fields that arise around the two lines due to the currents act. The same is true for the embodiment shown in FIG. 74 and FIG. 75.

Figure 77:
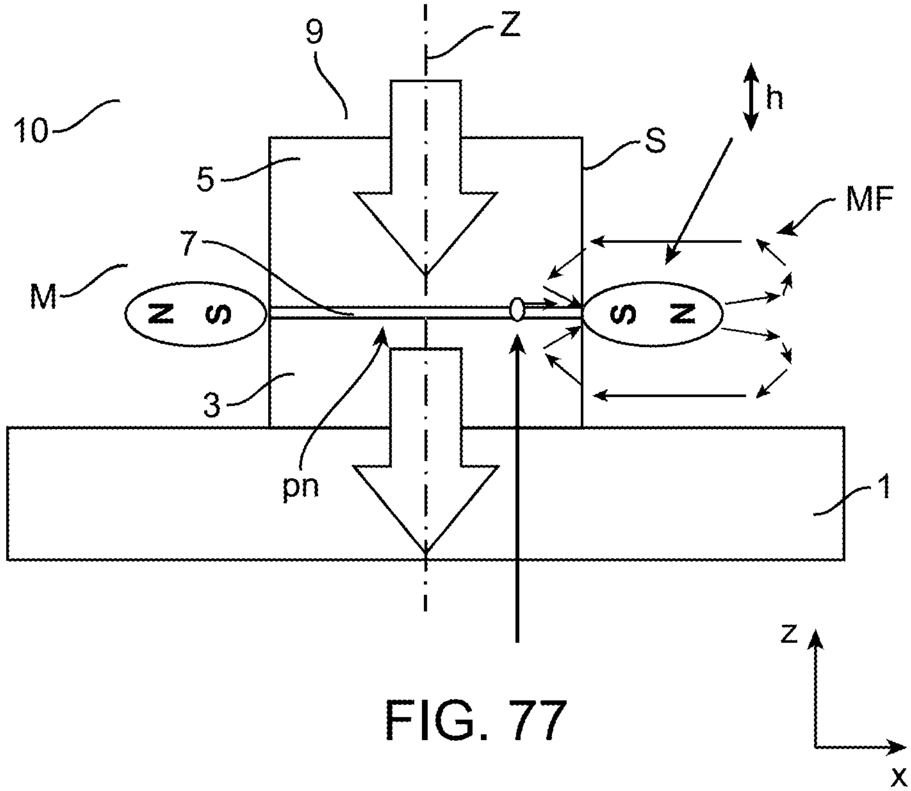
FIG. 77 illustrates a longitudinal section of a second embodiment of a μ-LED with magnetic elements for current constriction.

FIG. 77 shows a longitudinal section of a second embodiment of an optoelectronic component that is in accordance with the invention. A magnetizing element M is here formed in the region of an active layer 7 in the form of four permanent magnetic dipoles. This position can be varied in height h to provide magnetic forces specifically within the active layer 7 with the quantum wells. In this way, magnetic field lines MF, especially along the Z-axis, can be specifically impressed against the main direction of motion of the charge carriers and thus in a region in front of the active layer 7. The south poles of the magnetic field lines are facing the active layer 7 and the north poles are facing away from the active layer 7. The poles can also be reversed. The course of the generated magnetic fields MF causes the preferred direction of movement of an electron along a Y-axis to run out of the drawing plane or the X-Z plane. Thus, a random movement of an electron without the respective magnetic field due to diffusion to the edge of the active layer 7 of the layer stack S is deflected into a lateral direction of movement by means of the targeted force of the magnetic field. This results in a preferential direction of random diffusion to the opposite other edge of the active layer 7 of the layer stack S, where the electron is diverted away from the edge there again, since the force there then acts again in a different lateral direction. In this way, an electron in the active layer 7 can be deflected along a spiral line in the direction of the Z-axis, especially if a large number of permanent magnet dipoles along the edge region of the active layer 7 in the X-Y plane frame or circumferences the active layer 7. A layer stack S can be created as a cuboid or alternatively as a cylinder, for example. In principle, alternative geometric shapes of the layer stack S such as cones, truncated cones or pyramids are also possible. According to this embodiment, the first contact 9 provides an anode.

The positioning of the permanent magnet dipoles along the Z-axis is selected to increase the reduction of non-radiative recombination. In principle, the magnetic dipoles used can be horizontal along an X-Y plane or vertical along a Z-axis.

Figure 78:
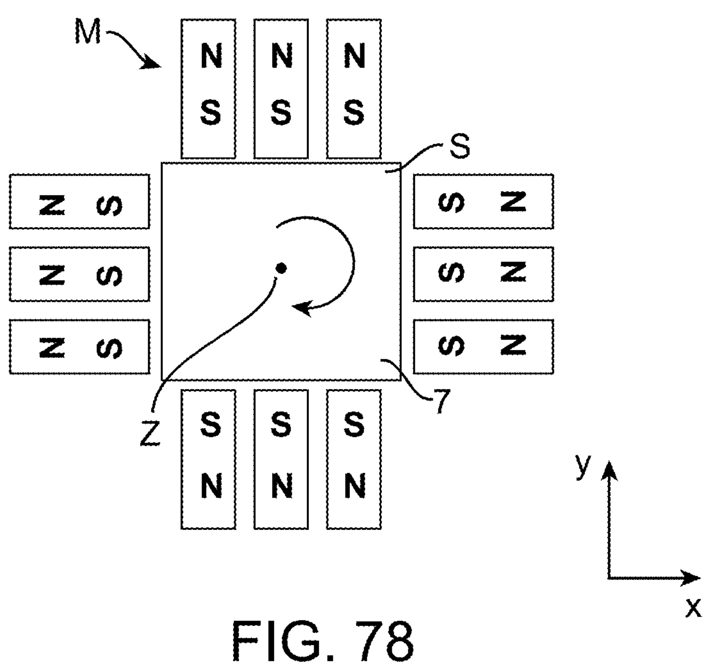
FIG. 78 shows a top view cross-section of the second embodiment of the μ-LED.

FIG. 78 shows a cross-section of the second embodiment of the optoelectronic device 10 according to FIG. 77. FIG. 78 shows the arrangement of a large number of permanent magnet dipoles along the edge region of the active layer 7 in the X-Y plane. The layer stack S is here framed or enclosed by twelve permanent magnet dipoles NS in the area of the active layer 7, for example. Z represents the vertical Z-axis arranged in the center of the X-Y cross-sectional area, around which electrons can move along a spiral line in the direction of the Z-axis due to diffusion and the force effect of the magnetic fields of the permanent magnet dipoles NS. The magnetic fields of the permanent magnet dipoles NS run from the respective north pole N to the south pole S, with the magnetic fields in the region of the south poles S acting into the edge region of the X-Y cross-sectional area of the active layer 7 of the layer stack S. Accordingly, a magnetizing element M is created here by means of the permanent magnetic dipoles described above.

Figure 79:
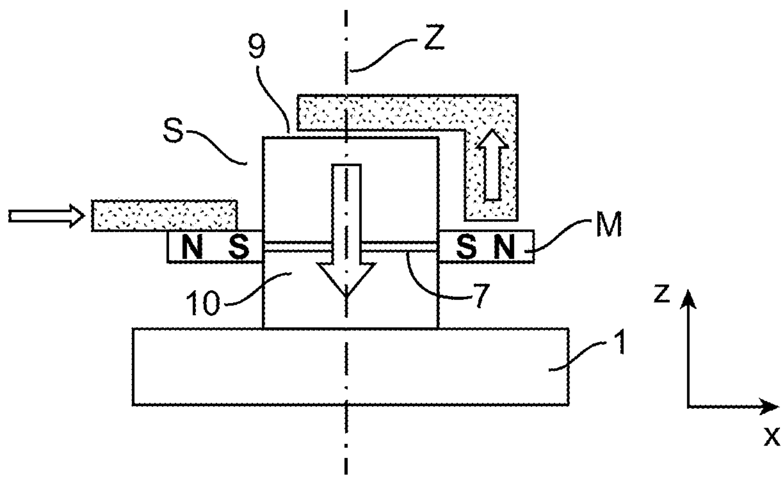
FIG. 79 shows a longitudinal section of a third embodiment of a μ-LED with further aspects of current constriction.

FIG. 79 shows a longitudinal section along an X-Z plane of a third embodiment of an optoelectronic component 10 according to the invention. In contrast to the second embodiment, electromagnetic dipoles are used here instead of permanent magnet dipoles, whereby their current flow is provided in particular by means of the current flow through the optoelectronic component 10. The first contact 9 is designed here as an anode. The technical current flow runs at the level of the active layer 7 into the electromagnets and flows around the layer stack S in order to flow then antiparallel to the current through the optoelectronic component 10 or through the exemplary μ-LED along the Z-axis to the anode. In this way, the concept of an "electron lens" according to the first embodiment can be combined with the magnetic effect in the active layer 7 according to the second embodiment. Manganese can be used as an example of a magnetic material, which is magnetized by means of a current flow.

Figure 80:
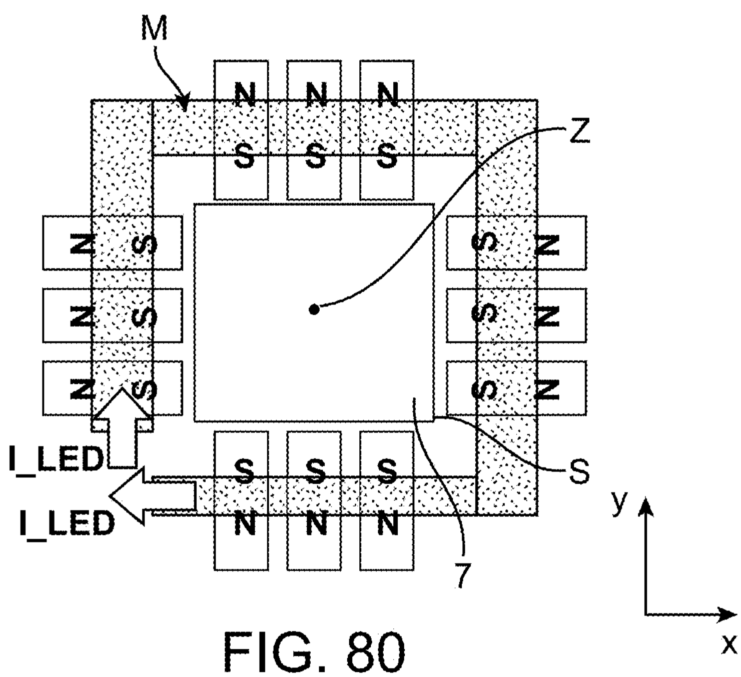
FIG. 80 shows a cross-sectional view of the third embodiment of the μ-LED.

FIG. 80 shows a cross-section along an X-Y plane of the third embodiment of the optoelectronic device 10 according to the invention. The electromagnetic dipoles SN are arranged along the X-Y plane around the layer stack S along the Z-axis at the level of the active layer 7 of the optoelectronic device 10, which may be a μ-LED chip LED. Twelve electromagnets are also proposed here. The electric current is fed in at the bottom left of FIG. 80, in particular the current that also flows through the optoelectronic component 10. This current $I_{LED}$ can also be fed in FIG. 80 bottom left after at least one circulation of the layer stack S and at least one circulation of the electromagnet dipoles NS or alternatively one circulation of magnetic, especially ferromagnetic, material, to the anode or the first contact 9.

FIG. 79 and FIG. 80 show the magnetizing element M in the region of an active layer 7, with magnetic field lines running towards one pole, in this case the south pole, of a magnetic dipole being provided in its edge region. The effect of the magnetic fields on charge carriers here is similar to that of the second embodiment according to FIG. 77 and FIG. 78. The magnetizing element M provides magnetic field lines by means of which the moving charge carriers, in particular electrons, are kept away from edge regions of X-Y cross-sectional areas of the layer stack.

Figure 81:
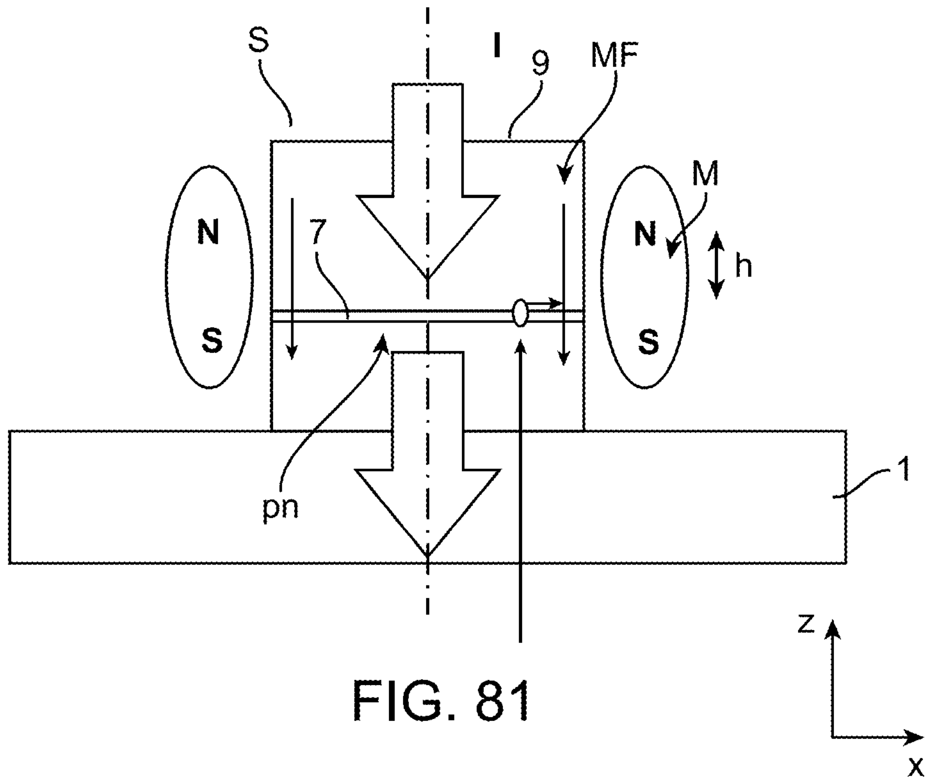
FIG. 81 illustrates a longitudinal section of a fourth embodiment of an optoelectronic device or μ-LED according to some aspects of the proposed concept.

FIG. 81 shows a longitudinal section along an X-Z plane of a fourth embodiment of an optoelectronic device of the invention 10. The magnetization element M provides magnetic field lines by which the moving charge carriers are kept away from edge areas of X-Y cross-sectional surfaces of the layer stack S. The magnetizing element M is arranged in the Z-direction at the level of an active layer 7. The magnetic field lines MF are provided in the edge region of the active layer 7 running along the Z-axis. The position of the magnetizing element M can be varied in height along the Z-axis in order to define and generate the forces on the charge carriers, in particular electrons, specifically within the quantum well of the active layer 7. For example, the magnetizing element M may have been displaced against the main direction of motion of the charge carriers in a region in front of the active layer 7.

The magnetizing element M is created as a magnetic material, especially manganese, surrounding the layer stack S along an X-Y plane in the region of an active layer 7. The magnetic material is deposited on a lateral surface of the layer stack S and may have been magnetized by an external magnetic field. A deposition of the magnetic material can be carried out, for example, by MOVPE (metal organic gas phase epitaxy), MBE (molecular beam epitaxy) or similar methods.

The course of the generated magnetic fields MF causes the preferred direction of movement of an electron along a Y-axis to run in particular out of the drawing plane or the X-Z plane.

Thus, a random movement of an electron without the respective magnetic field MF due to diffusion to the edge of the active layer 7 of the layer stack S is deflected into a lateral direction of movement by the targeted force of the magnetic field MF. This results in a preferential direction of random diffusion to the opposite other edge of the active layer 7 of the layer stack S, where the electron is diverted away from the edge there again, since the force there then acts again in a different lateral direction. In this way, an electron in the active layer 7 can be deflected in particular along a spiral line in the direction of the Z-axis, especially if magnetic material along the edge region of the active layer 7 frames or circumferences the active layer 7 in the X-Y plane. In this case, a layer stack S can be created as a cuboid or alternatively as a cylinder, for example. In principle, alternative geometric shapes of the layer stack S such as cones, truncated cones or pyramids are also possible. According to this embodiment, the first contact 9 provides an anode. The magnetic material acts as a dipole, with magnetic field lines running from an upper north pole along the Z-axis towards a lower south pole along the layer stack S. The magnetic field lines MF penetrate the edge region of the layer stack S and the active layer 7, which is created as a pn junction region.

Figure 82:
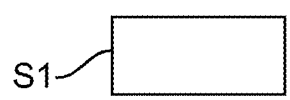
FIG. 82 shows an embodiment of a proposed process for manufacturing a μ-LED with current constriction.

FIG. 82 shows an example of a proposed method. In the method, a main direction of movement of charge carriers along an axis runs perpendicularly through the active layer of a μ-LED. Diffusion of carriers to the edge of the active layer is counteracted by a magnetic field, which keeps the carriers away from edge areas of X-Y cross-sectional surfaces of the active layer.

Among other aspects, the crosstalk of light into adjacent pixels is also important. Sometimes light is emitted from the side of the μ-LED, so that crosstalk reduces the contrast of a μ-display. Likewise, light emitted or radiated from the side often cannot leave the structure due to refractive index jumps. In addition, many applications require a Lambertian radiation characteristic of the display so that the display appears equally bright when viewed from all sides. Therefore, it is suggested to improve the radiation pattern by adding the active layer or the μ-LED surrounding reflective layers or mirrors can be reached. In other words, μ-LED structures can be provided with a circumferential mirror to improve the radiation characteristics.

Figure 84:
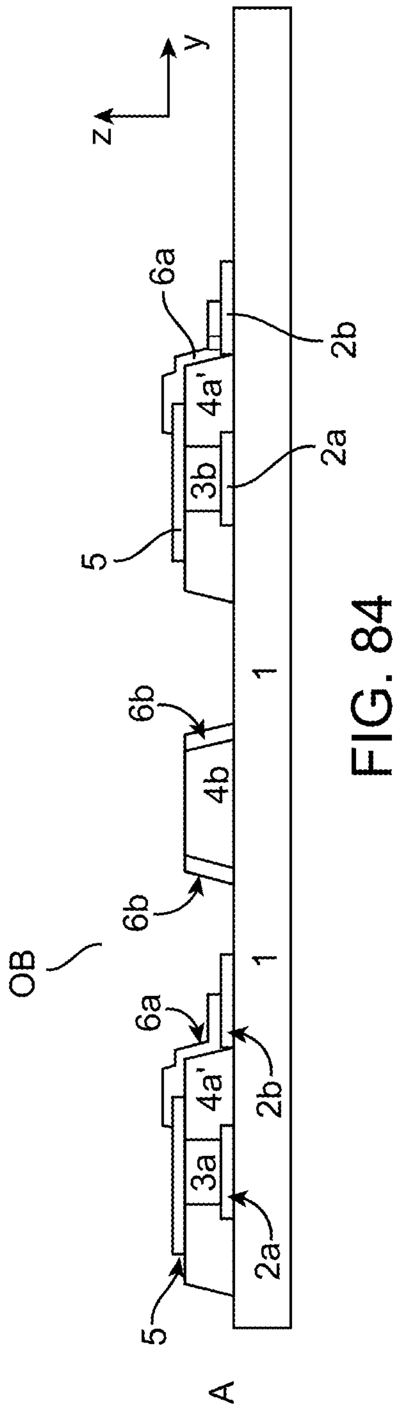
FIG. 84 shows a first embodiment of an array of two μ-LEDs with an intermediate reflector structure in cross-section according to some aspects of the proposed concept.

FIG. 84 shows a first embodiment of a proposed array in a Y-Z cross section. This can, for example, be produced using the processes described in this application. The μ-LEDs which are disclosed in this application may be used instead. In a Y-Z cross section, two electrically contacted μ-LEDs 3*a* and 3*b* are manufactured on a substrate 1, whereby a μ-reflector structure 4*b* is formed on the substrate 1 in a central area between the two processed μ-LEDs 3*a* and 3*b*. The edge angle of the μ-reflector structure 4*b* is adapted to a required optical output. For example, the edge angle can depend on the distance between the μ-LED and the μ-reflector structure 4*b*. The two electrically contacted μ-LEDs 3*b* together with the central coated μ-reflector structure 4*b* each form an optoelectronic component OB. In contrast to μ-LED 3*a*, *p*-LED 3*b* can emit light of other wavelengths. Reference mark 4*a*' denotes an enclosure. It goes without saying that further μ-LED components can also be arranged in this embodiment, for example three, so that they then form the subpixels of a pixel of a μ-display.

During the manufacturing process, the flanks of the μ-reflector structure 4*b* have been coated with a second metal mirror layer 6*b* together with the first metal mirror layers 6*a* of the μ-LEDs, resulting in the shown structure.

The μ-reflector structure 4*b*, was generated from a planarization layer 4. The component also comprises the first metal mirror layer 6*a*, which as respective metal bridges lead from a second contact area 2*b* to a contact layer 5 of a second contact of the μ-LEDs. The second metal mirror layers 6*b* only cover the edges of the μ-reflector structure 4*b*. In addition, an area close to the substrate 1 can be omitted in the second metal mirror layers 6*b* to avoid short circuits with conductor paths on the substrate 1. Substrate 1 can also include electrical structures for driving the μ-LEDs, as described here in this application. If substrate is made of or includes Si or another material that is generally not compatible with the μ-LEDs, matching layers are also provided. This means that the μ-LEDs either have been directly generated on carrier 1 or have been transferred to it. The transfer processes and anchor structures shown here, for example, would be suitable for this.

FIG. 85 shows a first embodiment of a proposed optoelectronic device OB as a top view of an X-Y plane. This top view can represent the left optoelectronic device OB according to FIG. 84. The optoelectronic device is a subpixel and together with others it forms one pixel each. The latter are arranged with further pixels in several rows and columns. These thus form an array or μ-display.

Each pixel comprises identically constructed μ-LEDs, which can be electrically connected to control them individually. According to FIG. 83 and FIG. 84, an optoelectronic device OB with second metal mirror layers 6*b* coated μ-reflector structure 4*b* surrounding a μ-LED. The μ-LED is arranged centrally for this purpose. Other geometric shapes such as rectangles, circles or triangles or polygons are also possible.

The edge of the μ-reflector structure 4*b* facing the μ-LED 3*a* is here covered by a second metal mirror layer 6*b*. In the plan view, a border 4*a*' appears along the X-Y plane around the μ-LED 3*a*. Like the μ-reflector structure 4*b*, this border 4*a*' was formed from the material of a planarization layer 4. Starting from a contact layer 5, a first metal mirror layer 6*a*, in particular in the form of a strip, extends to a second contact region 2*b* formed on a substrate 1, which may be covered by a coating 7 for sealing or encapsulation. As an example, an electrical conductor track 9 is shown to which the second contact area 2*b* can be electrically connected. The metal mirror layers 6*a* and 6*b* can have the same material or stack of layers.

Figure 86:
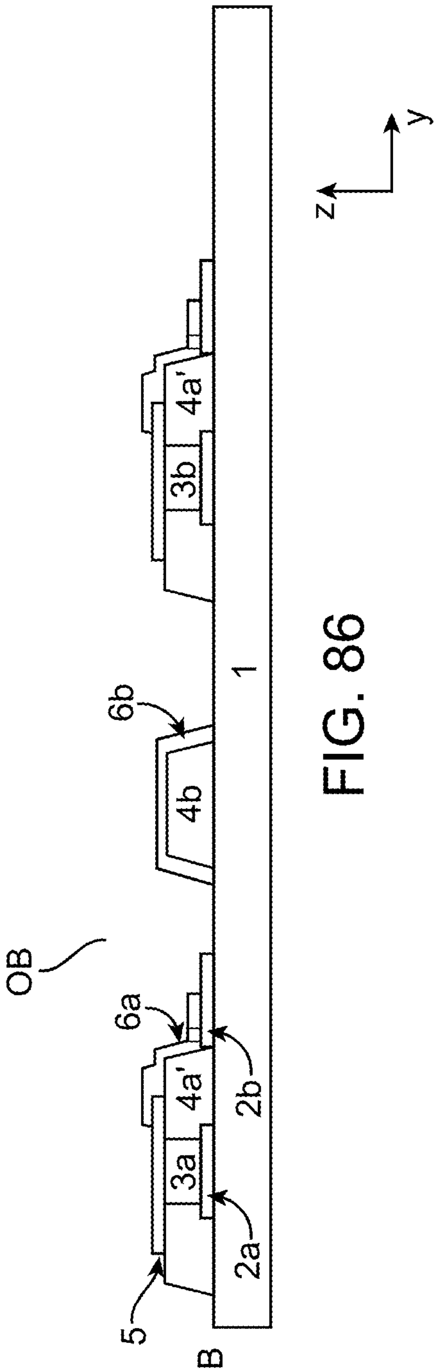

FIG. 86 shows a second embodiment of a proposed array in a cross-section of a Y-Z plane. In contrast to FIG. 84, here a μ-reflector structure 4*b* is covered with a second metal mirror layer 6*b* along its entire originally free surface. This means that not only the flanks, but also the main surface facing away from substrate 1, are covered by a continuous second metal mirror layer 6*b*. The μ-LEDs in FIG. 86 are constructed in the same way as in FIG. 84.

Figure 87:
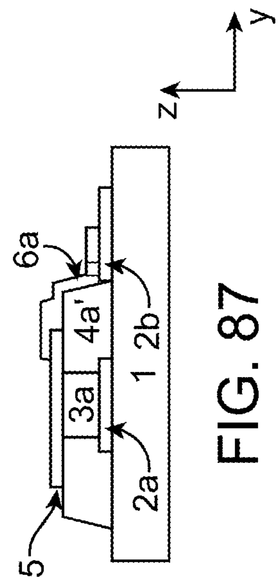
FIG. 87 is a cross-sectional view of the first embodiment of the proposed electrically contacted μ-LED.

FIG. 87 shows again the essential aspects of the μ-LED in a cross-section along the Y-Z plane. On one side of a substrate 1 extending along an X-Y plane, a first contact 2*a* is connected to a semiconductor layer 3*a* of the μ-LED. The active zone is also located in layer 3*a*. A second contact is formed by the transparent layer 5, which is electrically connected to the first metal mirror layer 6*a*. Along the X-Y plane, around the body 3*a*, mechanically contacting it, the electrically insulating enclosure 4*a*' is formed, along which the contact layer 5 and the first metal mirror layer 6*a*, in particular in the form of strips, run.

Substrate 1 can itself be a semiconductor and contain electrical structures for control. Alternatively, it can also be produced as a passive matrix or active matrix backplane and contain glass, a polyimide or PCBs (Printed Circuit Boards). The first contact area 2*a* for the contact near the substrate can contain Mo, Cr, Al, ITO, Au, Ag, Cu and alloys of these. The second contact area 2*b* for the second contact of the μ-LED 3*a* facing away from the substrate 1 can also comprise Mo, Cr, Al, ITO, Au, Ag, Cu and alloys thereof.

The μ-LEDs shown here are either identical or realized with different material systems, so that they emit different colors during operation. For example, red, green and blue (RGB), red, green, blue and white (RGBW) can be arranged on substrate 1. By using converter materials, the same light emitting diodes can be used, which nevertheless produce different light. Reference mark 4*a*' denotes the remainder of a planarization layer 4 to provide a surround 4*a*' to which a contact layer 5 can be applied for a top contact. The enclosure 4*a*' can also optionally passivate mesa edges of the semiconductor layers of body 3*a*, for example by means of spin-on dielectrics or by means of a photoresist.

Figure 88:
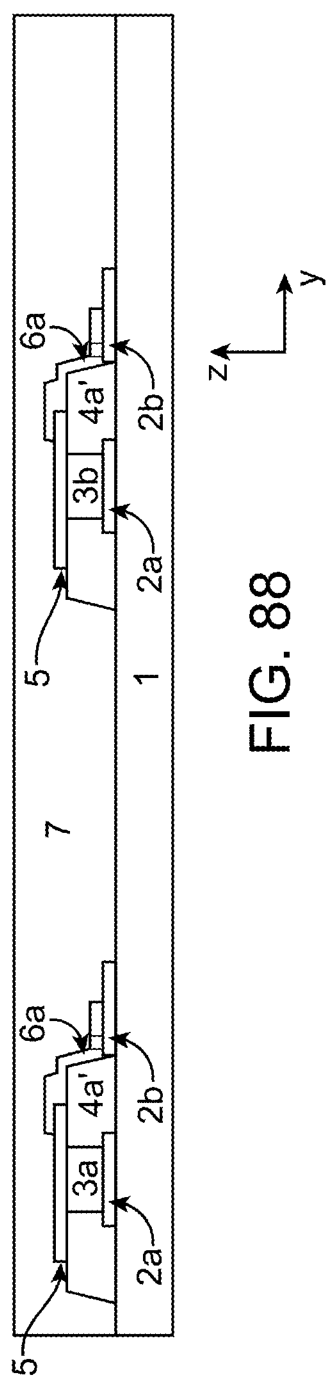
FIG. 88 illustrates further aspects of the proposed concept in a third embodiment of a proposed array in cross-section.

FIG. 88 shows a third embodiment of a proposed array in cross-section along a Y-Z plane. In contrast to the first embodiment shown in FIG. 84 and the second embodiment shown in FIG. 86, no μ-reflector structures 4*b* are formed here. On the other hand, a coating 7 is formed for sealing/encapsulation of the contacted μ-LEDs 3*a*, 3*b* and/or for optical out-coupling. The element is structured here (not shown) and has a photonic crystal structure from the top side, so that the radiation characteristic is improved. Layer 7 is electrically insulated from the other structures. The coating 7 can contain scattering particles or converter materials. It is usually applied after the μ-LEDS has been manufactured and then planarized.

Figure 89:
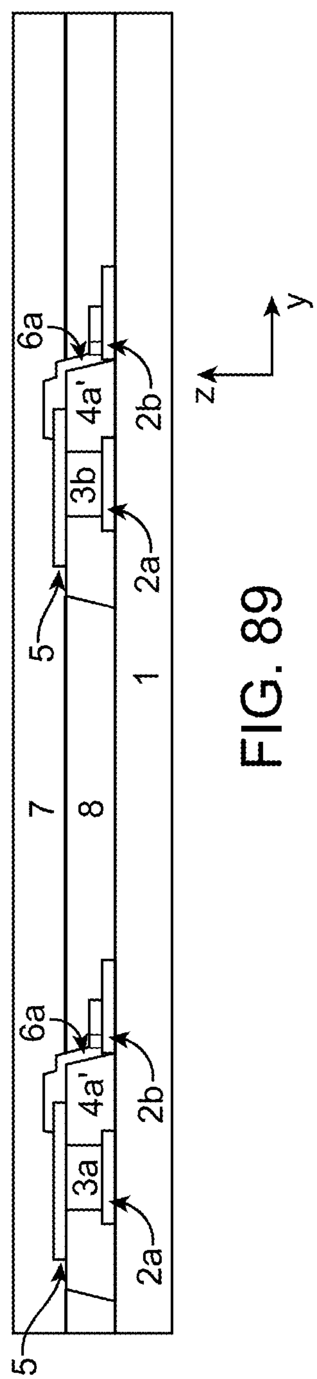
FIG. 89 shows a fourth embodiment of a proposed array in cross-section.

FIG. 89 shows a fourth embodiment of a proposed array in cross-section along a Y-Z plane. In addition to this, a black encapsulation 8 is formed between the μ-LEDs 3*a*, 3*b* under a coating 7, which was applied to seal/encapsulate the contacted light-emitting body 3*a*, 3*b* and/or for optical output. No coated μ-reflector structures 4*b* are shown here. These μ-reflector structures 4*b* may be formed on other areas of the array not shown here.

Figure 90:
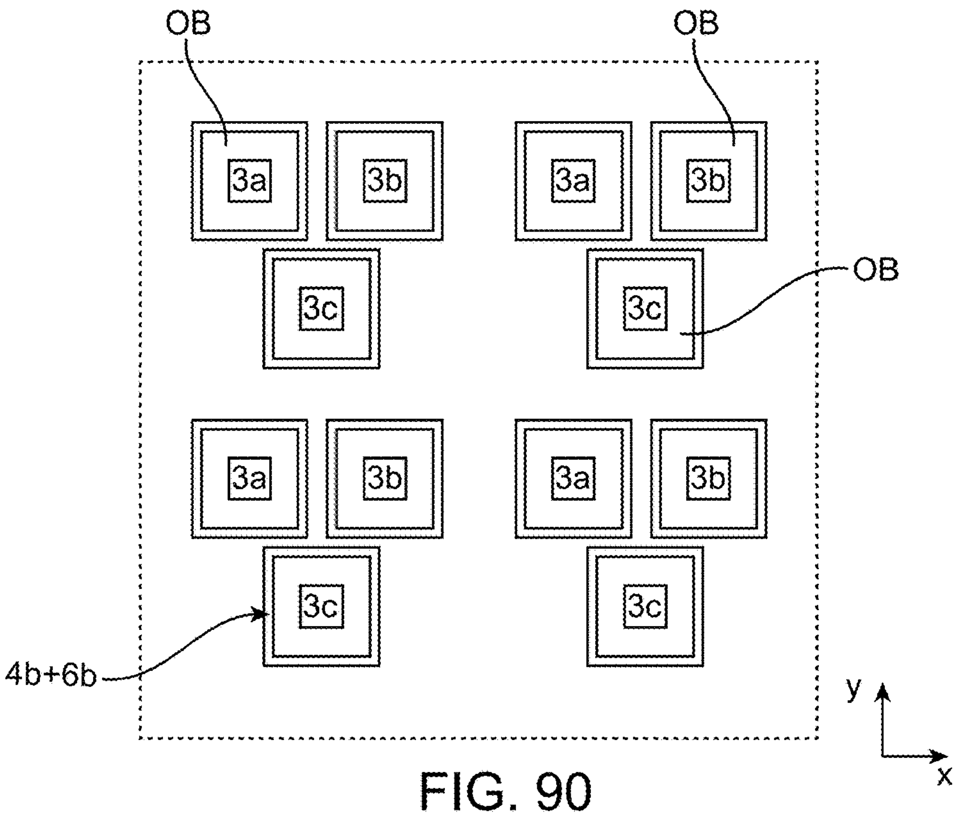
FIG. 90 is an embodiment with several suggested arrays in a top view to illustrate further aspects.

FIG. 90 shows an example of an array in a top view with a plurality of such μ-LEDs, each forming 4 pixels. This embodiment concerns in particular the shape and arrangement of the μ-reflector structures 4*b*. According to FIG. 90, each subpixel is framed individually by a μ-LED with a μ-reflector structure 4*b* having a second metal mirror coating 6*b*. The distance between μ-reflector structure 4*b* and the respective μ-LED in this example is 5 times the chip edge length. However, other distances are also possible; in particular, the subpixel can be surrounded by the μ-reflector structure with a distance of only one μm.

Each pixel comprises three subpixels 3*a*, 3*b* and 3*c* for the emission of red, blue and green light. The pixels have the same shape and are arranged in columns and rows. They thus form a μ-display or a module of such a display. In order to avoid visible artefacts during light emission, which can occur due to periodic subpixel arrangement, the subpixels 3*a*, 3*b* and 3*c* can be arranged differently or permuted contrary to the representation shown here. In addition, the shape of the μ-reflector structures 4*b* is not based on square footprints.

Figure 91:
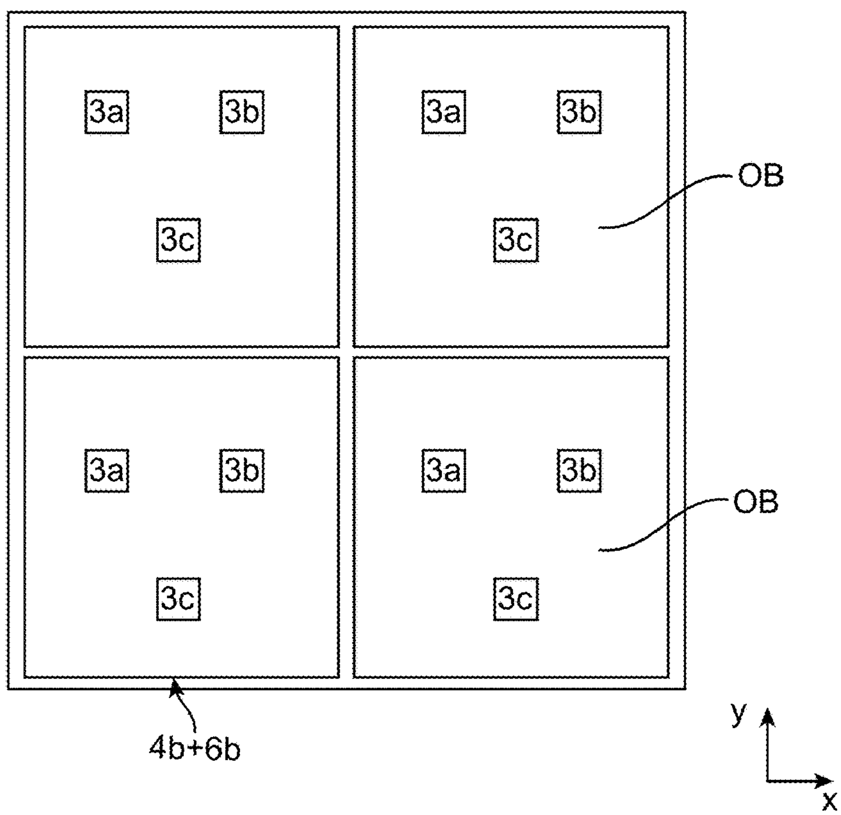
FIG. 91 shows another embodiment of a proposed array in a top view.

FIG. 91 shows a sixth embodiment of a proposed array in a top view. Here, the μ-reflector structures 4*b* are configured to enclose an entire pixel, for example with the μ-LEDs 3*a*, 3*b*, 3*c*.

Because of the now different distance, the flank angles of the coated μ-reflector structures 4*b* are different compared to the embodiment of FIG. 90. Depending on requirements, the flank angle of the centrally arranged μ-reflector structures may also be different from the surrounding frame. It should be noted, however, that in both versions, considerably more such structures are combined and formed as pixels.

Figure 92:
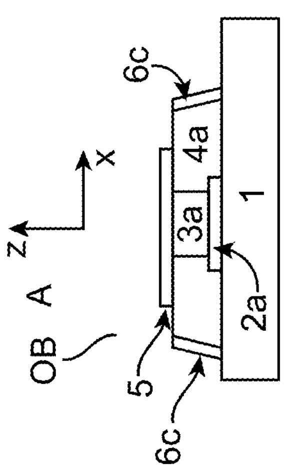
FIGS. 92 to 94 show various embodiments of a μ-LED in cross-section, arranged in a proposed array.
Figure 93:
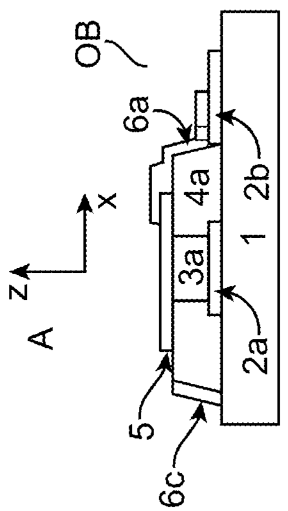

FIGS. 92 to 93 show further embodiments of an optoelectronic component OB, how they can be configured and combined as subpixels.

Figure 94:
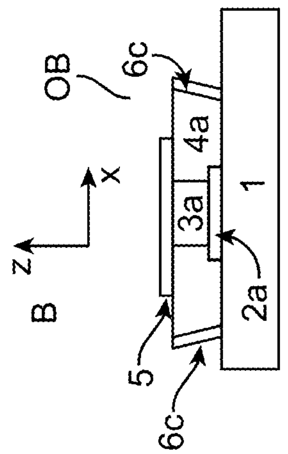

In FIG. 92 the μ-LED is formed with an additional metal mirror layer 6*c* on the side flank of the bezel 4*a*. The side flank forms a truncated pyramid and tapers towards the top. The metal mirror layer can also serve as a contact for contact 5. FIG. 93 shows the second embodiment already described. FIG. 94 shows a third embodiment. In this example, the flanks of the reflector structure 4*a* are also bevelled, but in such a way that the circumference increases with increasing distance from carrier 1. The shape of the flanks and their steepness adjust the extraction of light from the body.

Figure 95:
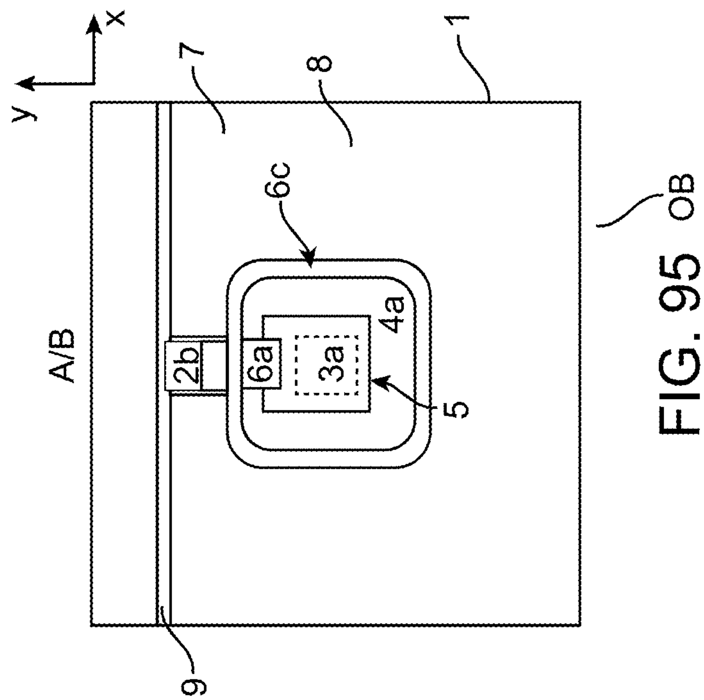
FIG. 95 shows the embodiments of FIGS. 93 and 94 as top view.

FIG. 95 shows an advanced embodiment based on the third embodiment according to FIG. 94 in a top view. In this example, the second metal mirror layer 6*c* applied to the reflector structure 4*a* are surrounded and framed by a black layer 8, in particular a black casting. This may, for example, extend in particular near the substrate 1 at the foot of a reflector structure 4*a*. In addition, a coating 7 is deposited on the surface for sealing and optical out-coupling. The edge of the μ-reflector structure 4*a* is covered by a second metal mirror layer 6*c*. Starting from a contact layer 5, a first metal mirror layer 6*a* extends in particular in the form of a strip to a second contact region 2*b* formed on a substrate 1, which may be covered by an optically transparent coating 7 for sealing or encapsulation. As an example, an electrical conductor track 9 is shown to which the second contact area 2*b* is electrically connected. The metal mirror layers 6*a* and 6*c* can have the same material or layer stack.

Figure 83:
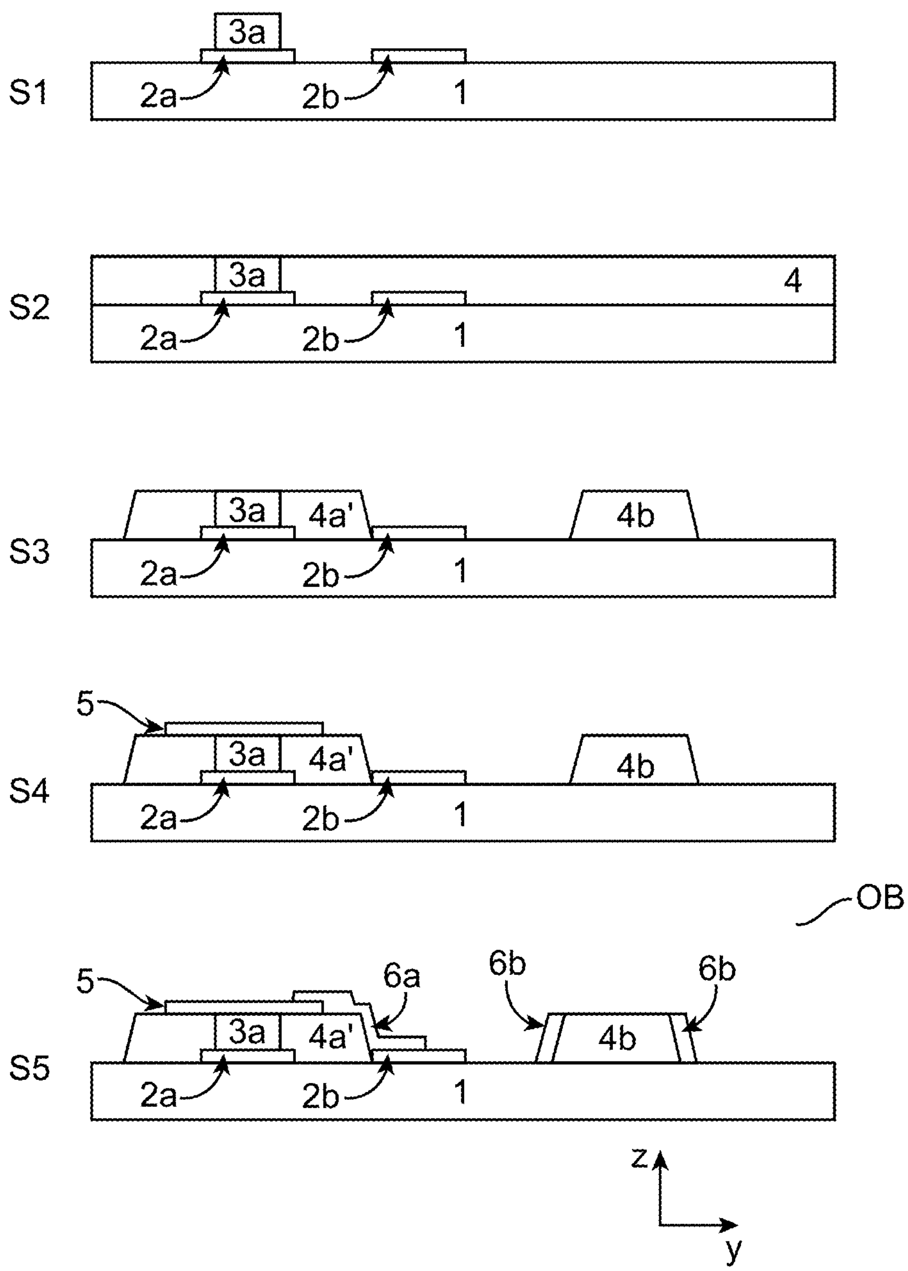
FIG. 83 shows different steps of an execution example of a proposed process for the production of a μ-LED with a circumferential reflector structure.

FIG. 83 shows an embodiment of a proposed process for manufacturing an optoelectronic device OB and a μ-LED. The steps shown can be applied to a large number of individual μ-LEDS so that they can be manufactured together in larger numbers.

In a first step S1, a first contact area 2a and a second contact area 2b is made on one side of a substrate or carrier. The carrier may in turn have circuits or other internal structures. The contact areas can be created by, among other things, patterning a photoresist layer and removing the areas that are not exposed afterwards, so that parts of the substrate are exposed. The contact areas 2a and 2b are then deposited as a metallic layer. A body 3a is also deposited on one of the contact areas. The body 3a comprises two oppositely doped semiconductor layers with an active layer for generating light arranged in between. In some aspects, this body can be manufactured separately and then be transferred onto this area by means of a transfer process. In another aspect, the layers are applied to the surface of substrate 1, structured and thus the bodies are formed.

In a second step S2, a planarization layer 4 is applied to form a μ-reflector structure 4b which completely surrounds the body 3. If necessary, the layer 4 is planarized to be planar with the surface of body 3a. The layer 4 is then structured to create a surround 4' around the body 3. This border essentially extends to the second contact area 2b. In addition, a more distant border 4b is created. The side flanks of the border are bevelled. The slope of the edges can be used to control light extraction or the direction of reflection. In step S4, a contact surface 5 is applied to the surface of the body 3a and adjacent areas. This comprises a transparent but conductive material Finally, in a fifth step S5, an electrically connecting metal mirror layer 6a is applied to the contact layer 5. The metal mirror layer extends over the edging 4a' to the second contact area 2b and contacts it. In addition, a second metal mirror layer 6b is simultaneously applied to the side flanks of the μ-reflector structure 4b. Through structuring and processing, the surface of the surrounding ridge 4 remains free of the metal. In other embodiments, this can also be done differently in order to obtain an electrical connection between the metal mirror layer on both side flanks.

Figure 96:
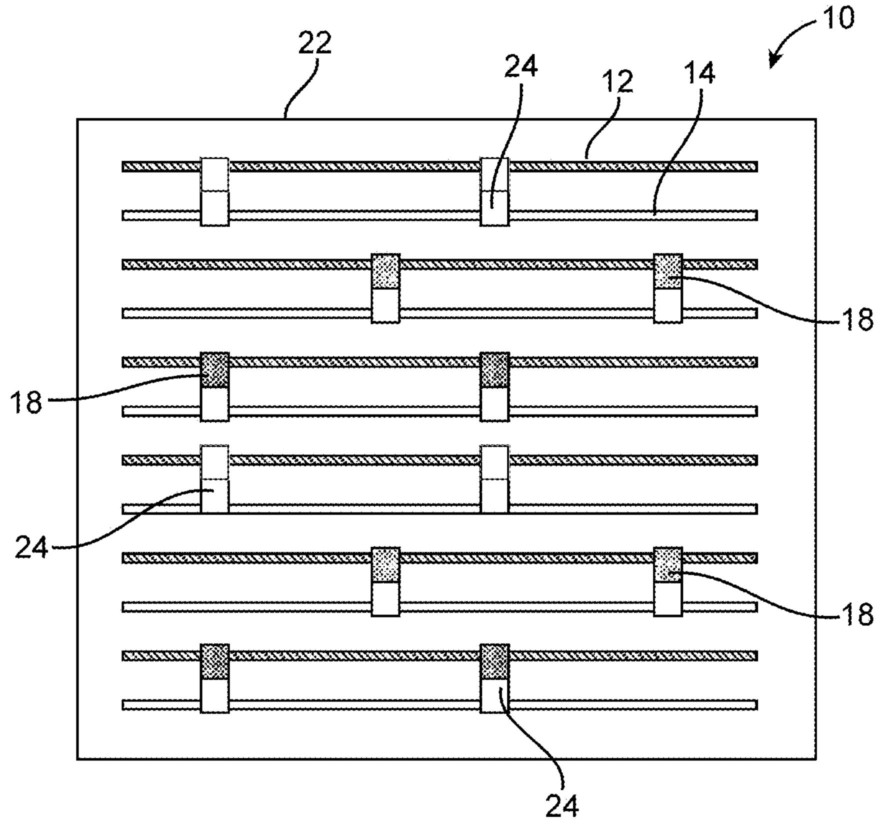
FIG. 96 shows a section of a μ-display with several μ-LEDs and a transparent contact layer formed as a common cathode in top view to explain some aspects.

FIG. 96 shows a section of a μ-display with several μ-LEDs and a transparent contacting layer formed as a common cathode in top view.

Figure 97A:
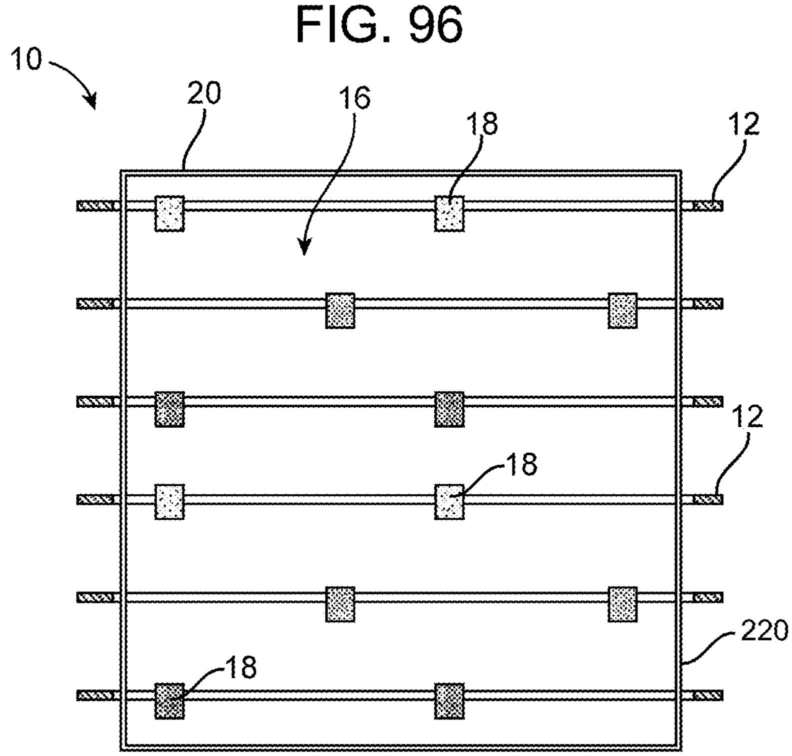
FIGS. 97A and 97B illustrate some pixel elements with μ-LEDs and contact layer and two tracks according to some aspects of the proposed concept.

In FIG. 97A, the large number of individual contacts is combined in a common contact layer 16. This contacting layer 16 is flat, at least partially electrically conductive and, as a common cathode, contacts the top sides and the electrical contacts 220 of the μ-LEDs 18 on their top side. Due to the partially transparent embodiment of the contacting layer 16, light emitted by the μ-LED 18 can at least partially pass through the contacting layer 16. Accordingly, in one aspect an arrangement or contacting of vertical μ-LEDs with a transparent and electrical cover layer is provided.

It can be seen that due to the possibility of contacting the μ-LEDs 18 by means of contact 20 on their respective top side, the previously necessary conductor structures 14 for the cathode can be omitted and thus more space is available. In the example shown here, a connecting conductor 20 for contacting layer 16 is provided for the electrical contacting of contacting layer 16. With the common contacting layer 16, the processing of individual single contacts for each individual μ-LED 18 can be omitted and instead be realized with a common contacting layer 16, which is easier to manufacture.

Figure 97B:
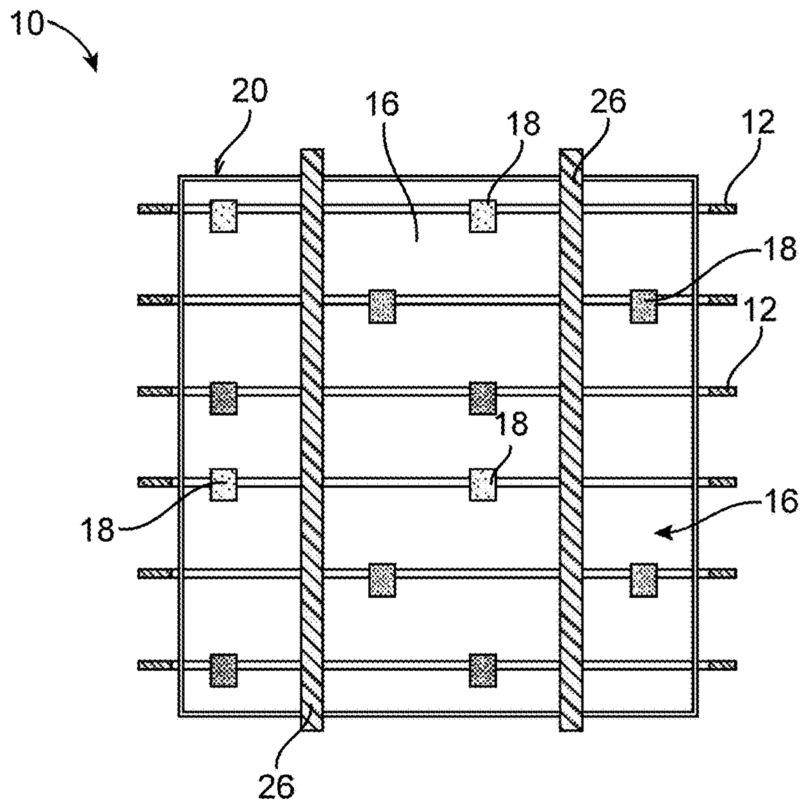

FIG. 97B shows a variant of the optical pixel element 10, which has been further developed according to the invention. The basic structure corresponds to the pixel element according to FIG. 97A, whereby a common contact layer 16 together with a connecting conductor 20 forms the common cathode for the μ-LEDs 18 below. In the example shown here, two parallel conductor tracks 26 are provided at the contacting layer 16.

These conductive tracks 26 have a higher electrical conductivity than the material of the contacting layer 16, so that a total resistance of the total arrangement of contacting layer 16 and conductive track 26 is reduced compared to contacting layer 16. In other words, the conductor tracks 26 bridge areas of the electrically less conductive contacting layer 16. In principle, the conductor tracks 26 can be configured in a wide variety of shapes, for example straight, curved, meandering and similar, and also vary in width and thickness.

Trace 26 can also be configured as a combination of a number of individual thin conductors analoguous to the stranded wire. It can be seen that the conductors 26 are arranged outside a primary radiation area 28 (see FIG. 98A and FIG. 98B), so that they do not shadow or hinder the emission of light from pixel element 10 or μ-LEDs 18.

Figure 98A:
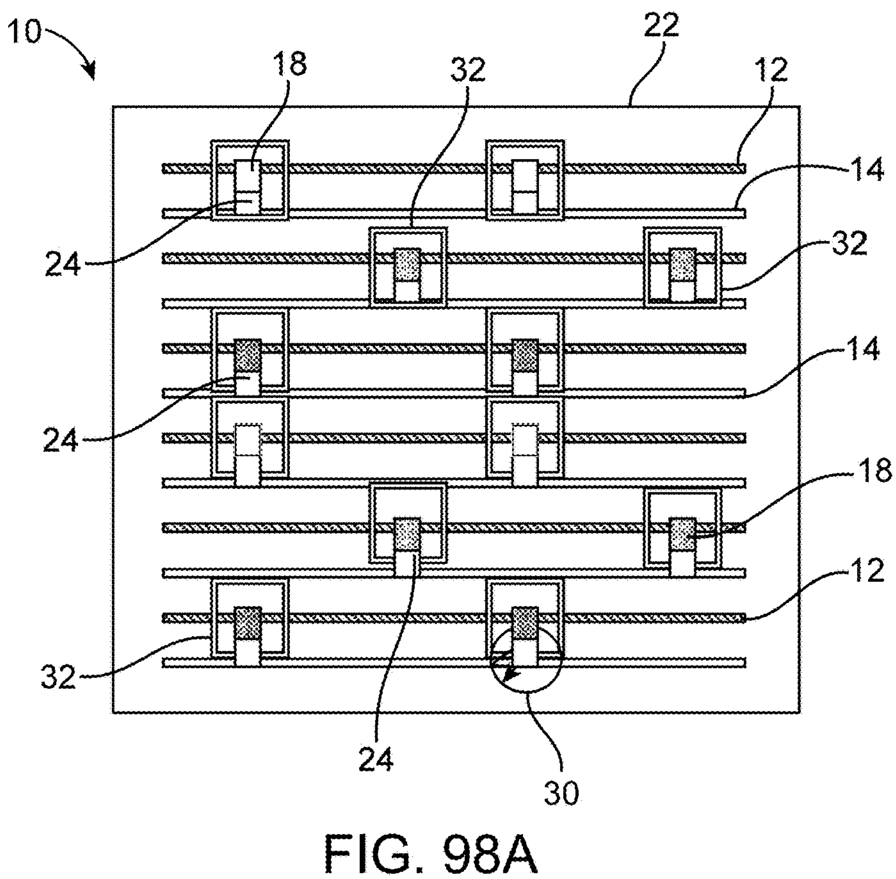
FIG. 98A shows a section with several pixel elements with μ-LEDs, conductor structures for anode and cathode, and μ-LEDs with beam-shaping elements in top view.

FIG. 98A shows a structure of a pixel element 10 in which conductor structures 12 for the anode are arranged parallel to conductor structures 14 for the cathode on a carrier substrate 22. In contrast to the construction of the well-known pixel element 10 in FIG. 96 with horizontal μ-LEDs (whose contacts on the underside directly contact the leads 14 and 12), here the upper contact, i.e. the contact of the respective μ-LED 18 facing away from the carrier substrate, is connected to the lead structure 14 of the cathode via a partially transparent contact. In addition, a beam-shaping element 32 is provided here for each μ-LED 18. This beam-shaping element 32 can also be understood as a so-called decoupling structure. In this respect, this representation is similar to the embodiments in FIG. 90 or 95 and others. The contacting can also be realized in a similar way.

Due to the geometric design of the beam-shaping element, for example as a structure surrounding the μ-LED 18, a certain size of opening is necessary for a desirable shape of the emitted light. This size can in turn cause undesired spatial overlaps between the conductor structure 14 of the cathode and the beam-shaping element 32 in an overlap area 30. This is particularly possible because both conductor structures 12 for the anode and conductor structures 14 for the cathode must be simultaneously provided on the carrier substrate 22.

It should be mentioned that the conductor structures 12 for the anode and conductor structures 14 for the cathode could also be assigned in reverse order. This means that the electrical contact 20 of the μ-LEDs 18 on the upper side can be configured as cathode or anode. Accordingly, the conductor structures 12, 14 must be configured as anode conductor structure or as cathode conductor structure.

Figure 98B:
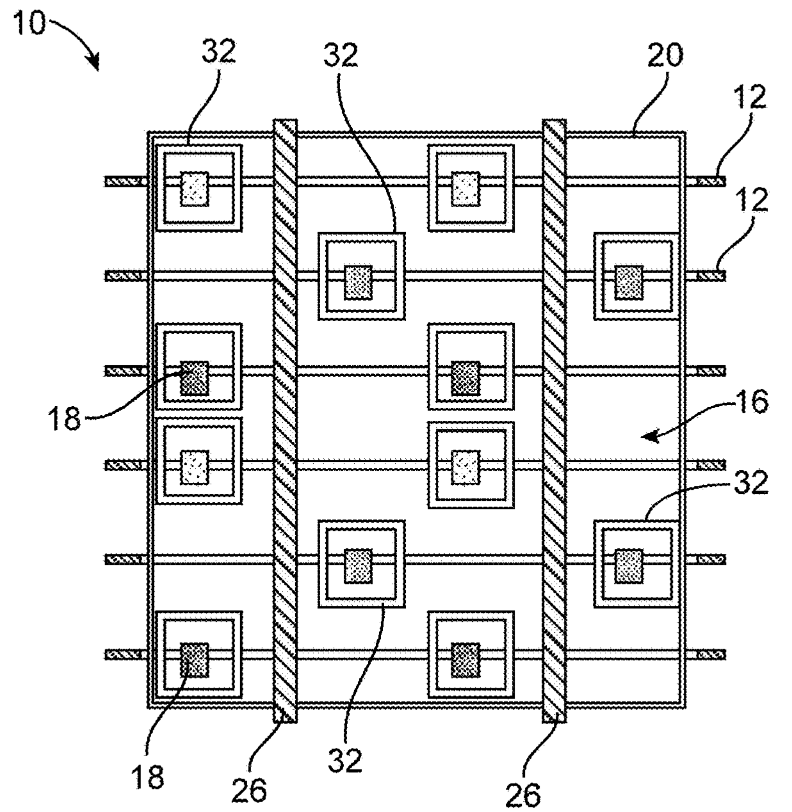
FIG. 98B shows a further complementary arrangement of the embodiment of the previous figure.

FIG. 98B shows the basic structure of a pixel element 10 from FIG. 97B with two parallel tracks 26. The vertical μ-LEDs contact the contact tracks 12 and the conductive transparent layer (not shown here). By omitting the conductive structures 14, more space is available for beam forming elements 32, so that no undesired overlapping or electrical contacting occurs.

Figure 99:
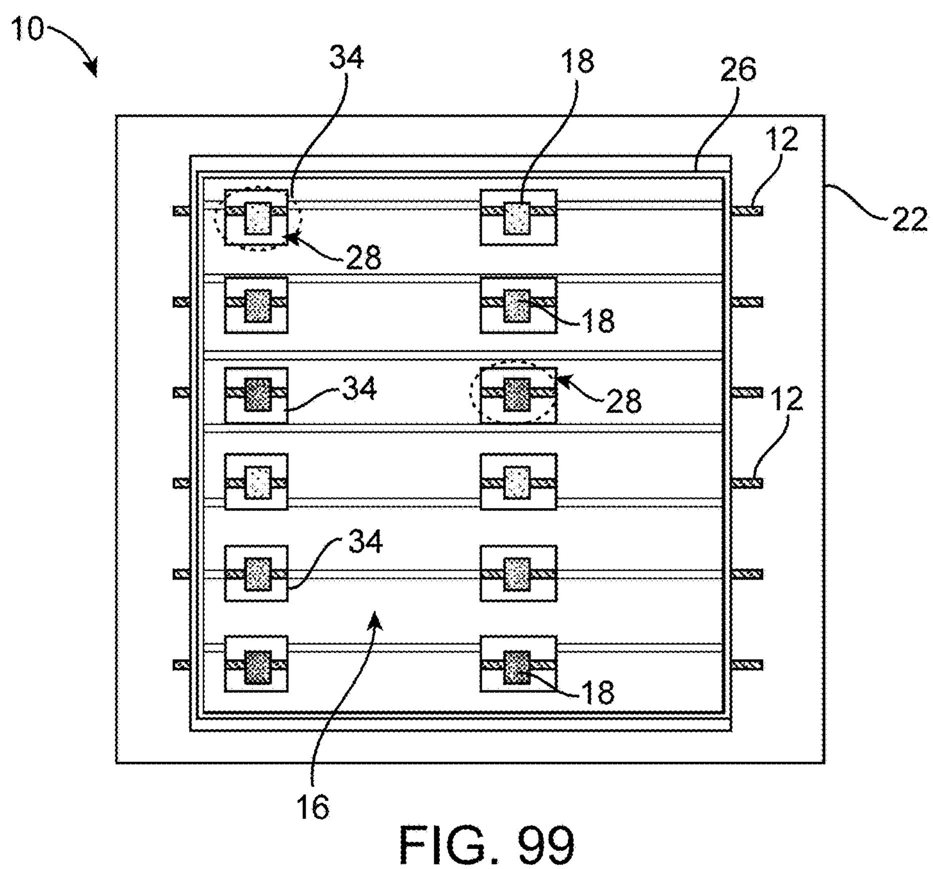
FIG. 99 is a plan view of a section of a μ-display with pixel elements with a contact layer and recesses in the area of the μ-LEDs according to some aspects of the proposed concept.

FIG. 99 shows another version of the optical pixel element 10. While the basic design of the pixel element with μ-LEDs 18, conductor structures 12 for the anode and a carrier substrate 22 corresponds to the example shown in FIG. 97A, here conductor track 26 is configured as a continuous surface over a large number of μ-LEDs 18. In the area of the respective primary beam areas 28, recesses 34 are provided for beam-shaping. In other words, these recesses 34 are intended to pass the light emitted by the respective μ-LED 18. In this way, separate beam-shaping elements 32

(see, for example, FIG. 183) can be omitted, since this function can now be performed by the recesses 34.

Figure 100A:
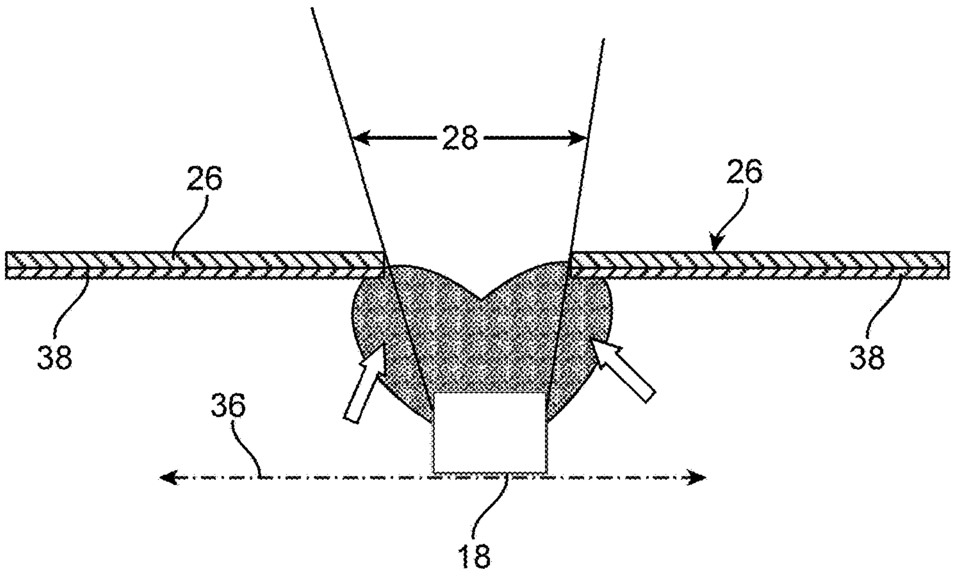
FIG. 100A shows a vertical sectional view through a pixel element with a μ-LED, traces and radiation areas as shown in FIG. 99 to illustrate further aspects.

In FIG. 100A the aspect of beam-shaping for light emitted by a μ-LED 18 is explained in more detail. A vertical sectional view shows a μ-LED 18 arranged on a carrier substrate 22 (not shown). This emits light transverse to a carrier substrate plane 36 in a direction away from the carrier substrate 22. In the example shown here, the μ-LED has a heart-shaped propagation characteristic. However, it is desirable that the light is only emitted in a primary emission range 28 of the μ-LED 18. One or more conductor paths 26 are used here to shade unwanted light components. These can be reflective or absorptive on the lower side. In another aspect, the conductor path comprises a light-absorbing layer 38 on its underside. This layer can prevent or reduce further unwanted reflections or crosstalk between adjacent μ-LEDs 18.

Figure 100B:
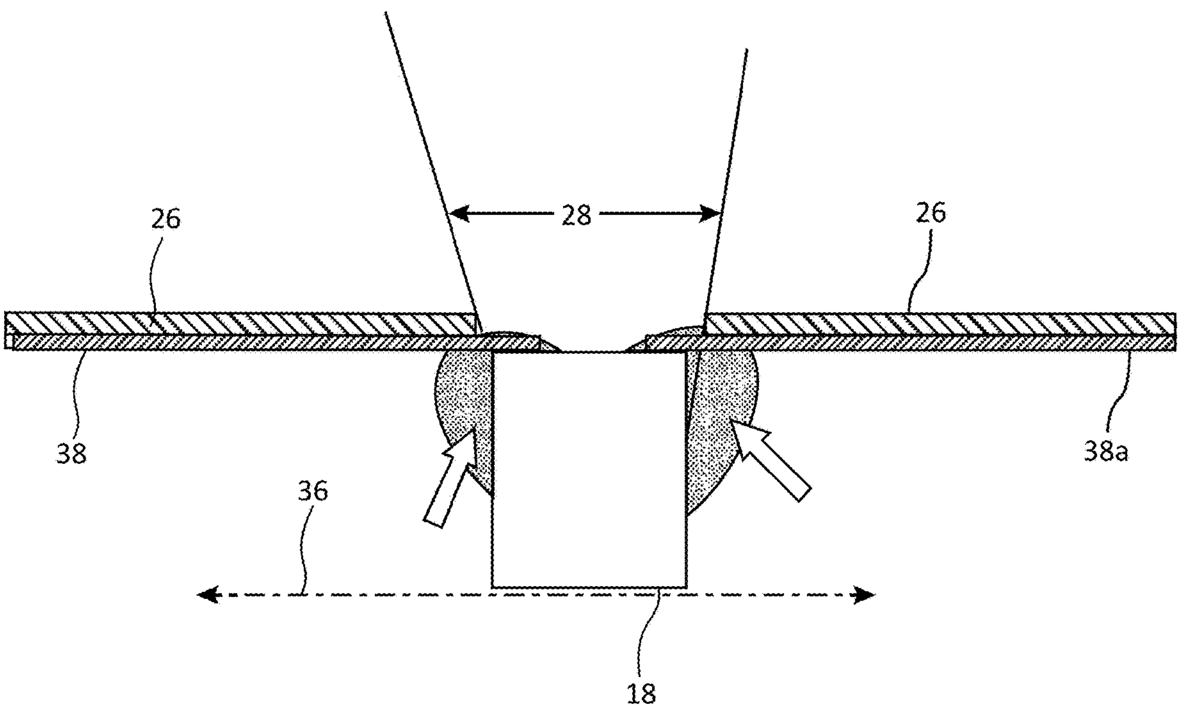
FIG. 100B is an alternative embodiment for limiting the radiation area of a μ-LED.

An alternative embodiment is shown in FIG. 100B. In this context, it is intended that a transparent conductive layer 38*a* as shown in FIG. 100B partially overlaps the μ-LED and thus securely connects the upper contact. At the same time a beam-shaping is achieved by the reflective conductive layer.

Figure 101A:
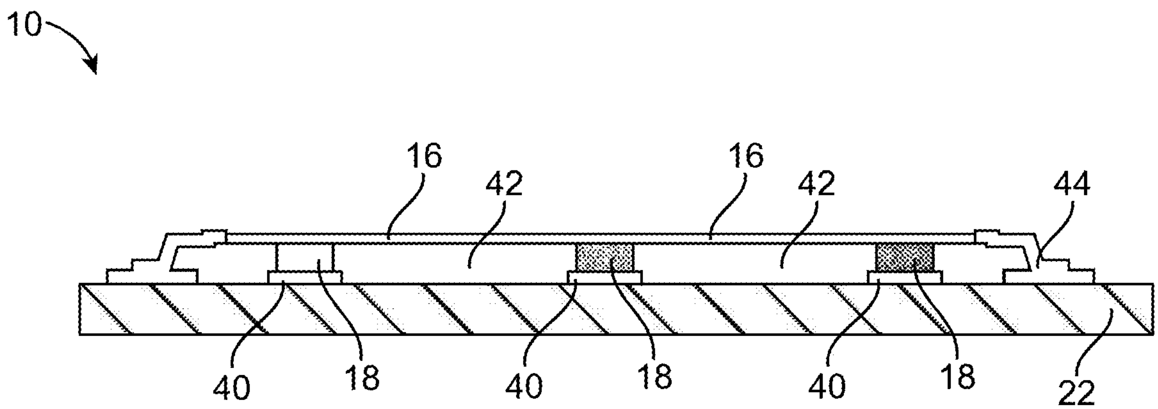
FIG. 101A shows a vertical sectional view through a pixel element with three μ-LEDs and transparent cover electrode according to some aspects.

FIG. 101A shows a vertical section through a pixel element 10 in longitudinal direction. Three μ-LEDs 18 can be seen, which are connected to a carrier substrate and the corresponding conductor structure 12 for the anode via anode contacts 40. A planarization layer 42 has a height of 2-4 μm, for example. Due to the overall planar structure, the height of the μ-LEDs including anode contact 40 can also be in this size range. A flat electrically at least partially conductive and at least partially light-transparent contact layer 16 is provided on one top side.

Since contact layer 16 represents a common cathode connection or anode connection, it must be electrically connected to the external connection elements accordingly. For this purpose, a connecting element 44 is to create an electrical connection between the contacting layer 16 and a connecting element of the carrier substrate 22. In this example, the element is arranged at the edge of the pixel element 10. A connection element of the carrier substrate 22 can be, for example, a suitable conductive surface or also conductor structures, which allow, for example, the connection of external components or supply lines for the pixel element 10.

Figure 101B:
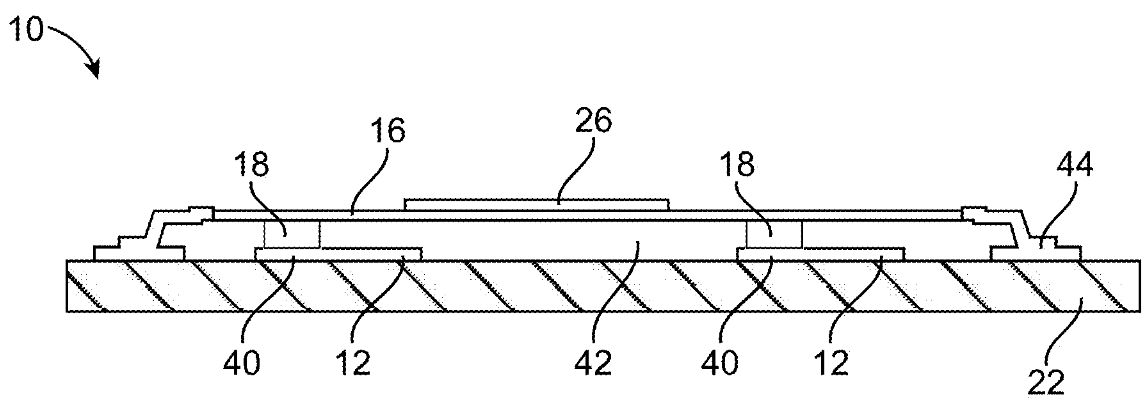
FIG. 101B shows a 90 degree rotated vertical sectional view of a pixel element with a trace according to some aspects of the presented concept.

FIG. 101B shows pixel element 10 of FIG. 101A, with the view rotated by 90°. In addition, a trace 26 can be seen here, which is located in a gap between two emitter chips 18, so that it is outside a primary emission area 28 (see for example FIG. 100A) of the respective μ-LED 18. Here and in the following FIGS. 101C to 101G, connecting elements 44 are provided at the edge of pixel element 10.

Figure 101C:
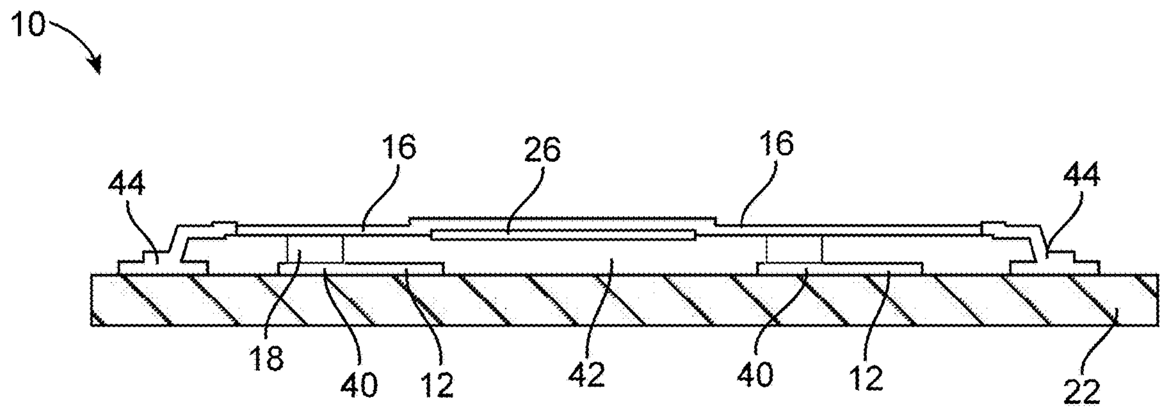
FIG. 101C is an embodiment of a pixel in vertical sectional view with a conductor lead below a stepped contact layer.
Figure 101D:
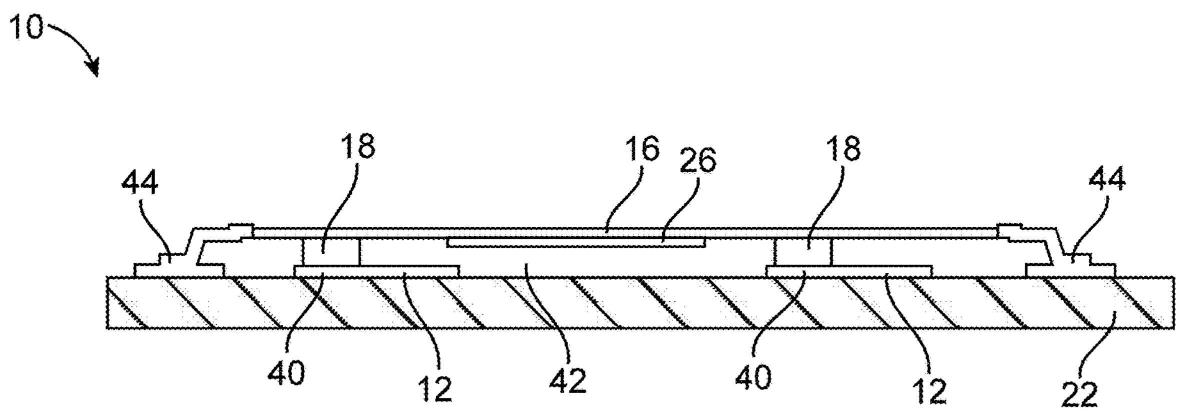
FIG. 101D shows a pixel in vertical sectional view with a conductor lead below a plane contact layer.

FIG. 101C and FIG. 101D show examples of how the conductor track 26 can be arranged at the contact layer 16. In FIG. 101C, track 26 is partly embedded in planarization layer 42 and partly on the underside of contact layer 16. Here the contacting layer 16 is processed with a stepped elevation above the conductor track 26.

The embodiment of the pixel element 10 in FIG. 101D basically corresponds to the embodiment of the pixel element 10 in FIG. 101C, whereby here the contacting layer 16 is configured to be completely flat and the conductor track 26 is provided on a lower side of the contacting layer 16. In this case, the conductor track 26 is embedded in an area of the planarization layer 42.

Figure 101E:
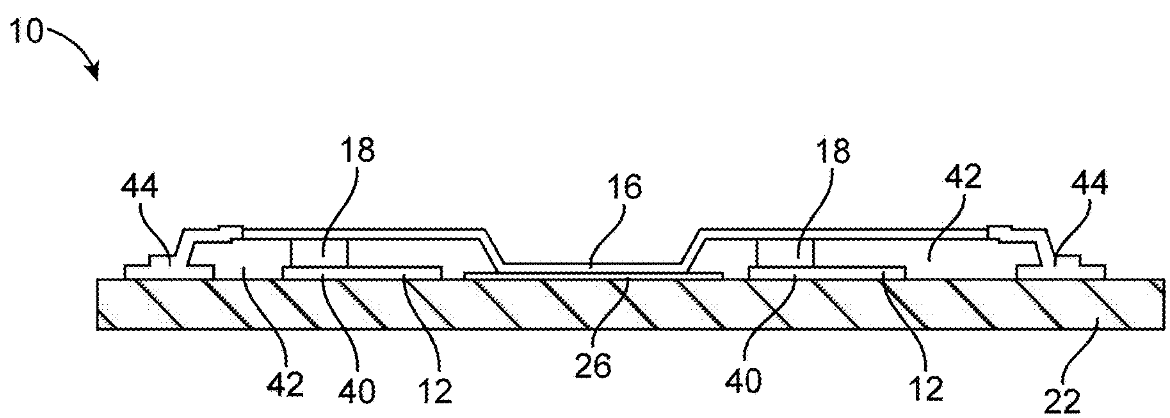
FIG. 101E shows an embodiment with two pixel elements in vertical sectional view with a conductor lead on the carrier substrate.

In FIG. 101E the planarization layer 42 is interrupted in an area between two adjacent emitter chips 18. This provides the option of placing the trace 26 directly on the carrier substrate 22. The contacting layer 16 is therefore intended as the layer above. This design variant can, for example, make it easier to provide the conductor path 26 already during the production of the carrier substrate 22.

Figure 101F:
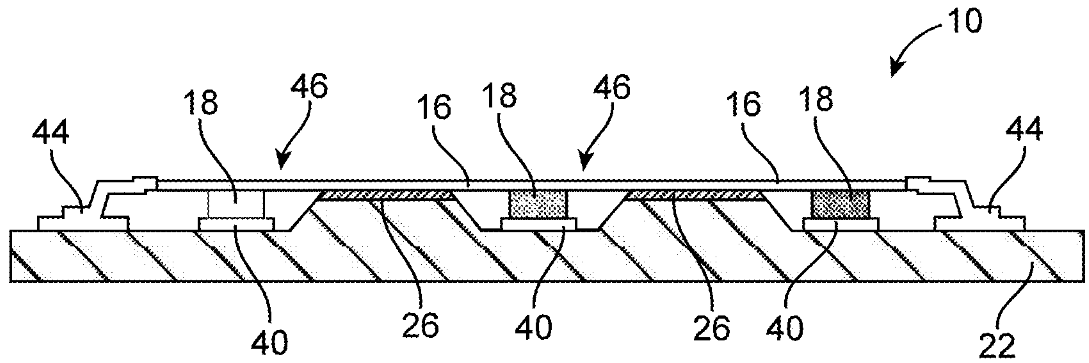
FIG. 101F shows a pixel element in vertical sectional view with three μ-LEDs, arranged in cavities of the carrier substrate in a planar arrangement according to some aspects.
Figure 101G:
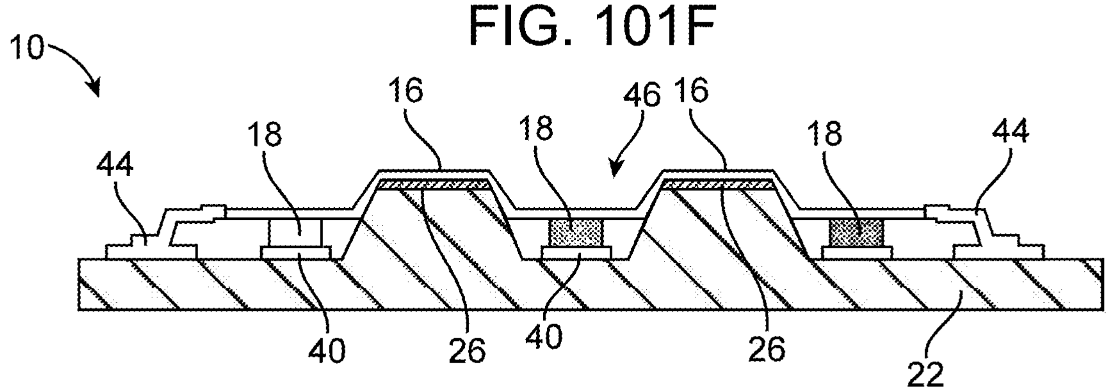
FIG. 101G is a pixel in vertical sectional view with three μ-LEDs arranged in cavities of the carrier substrate with raised interstitial walls.

FIG. 101F and FIG. 101G each show an example for the arrangement of μ-LEDs 18 in cavities 46 of the pixel element 10 or the carrier substrate 22. Instead of a cavity, an elevation can also be provided. The latter is similar to the shape in FIGS. 103A to 105.

Figure 101H:
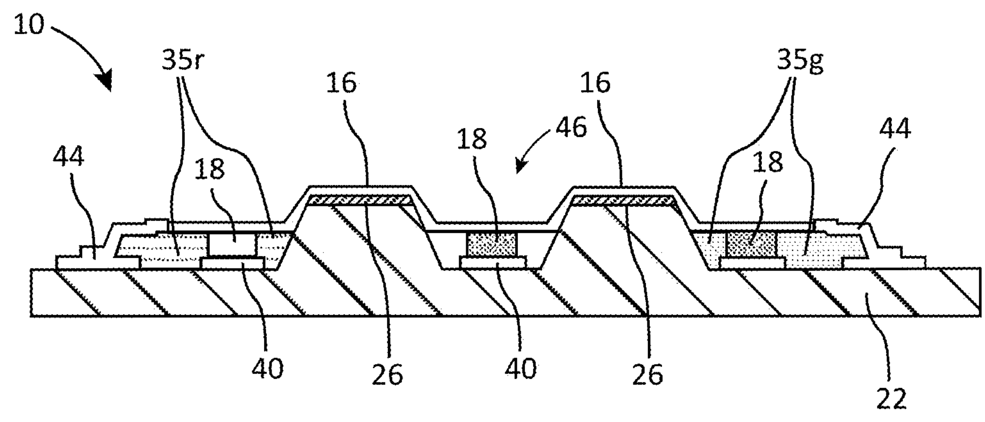
FIG. 101H represents a complementary execution of a pixel to the previous figure, in which a remaining space within the cavity is filled with converter material.

FIG. 101H represents a complementary version of a pixel to the previous figure, in which a remaining space within the cavity is filled with a converter material 35*r* and 35 each. The converter material extends to the ceiling electrode, but can also be provided above the ceiling electrode to convert light radiating upwards. In this way, a planar surface can be created with the converter material. In one embodiment, the converter material is realized with quantum dots, which are filled into the cavity as powder or emulsion. Quantum dots can be formed in powder form, sometimes much smaller than some conventional inorganic dyes, making them suitable for μ-LEDs.

Optionally, tracks 26 can be provided in the elevations 48 between two cavities 46. The arrangement of the μ-LEDs 18 in cavities 46 can have particular advantages with regard to the radiation characteristics, since light emitted in a lateral direction can be reflected on the side surfaces of the elevations 48 of the cavities.

Figure 102A:
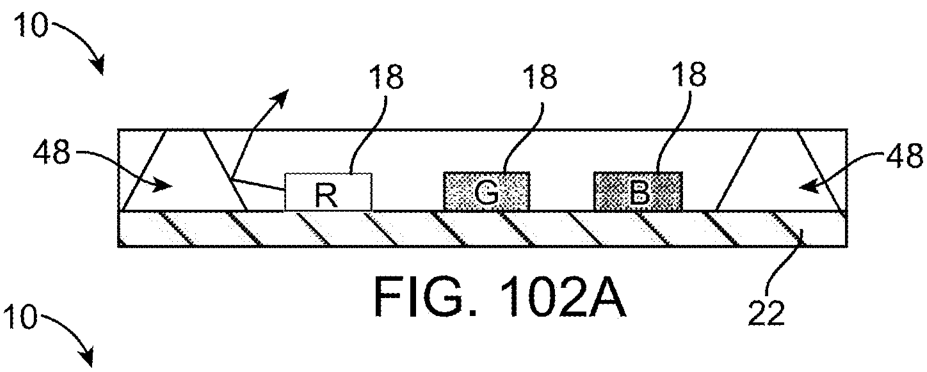
FIGS. 102A to 102C show different arrangements of μ-LEDs on a carrier substrate and reflection behaviour of emitted light on sidewalls of cavities according to some aspects of the presented principle.
Figure 102B:
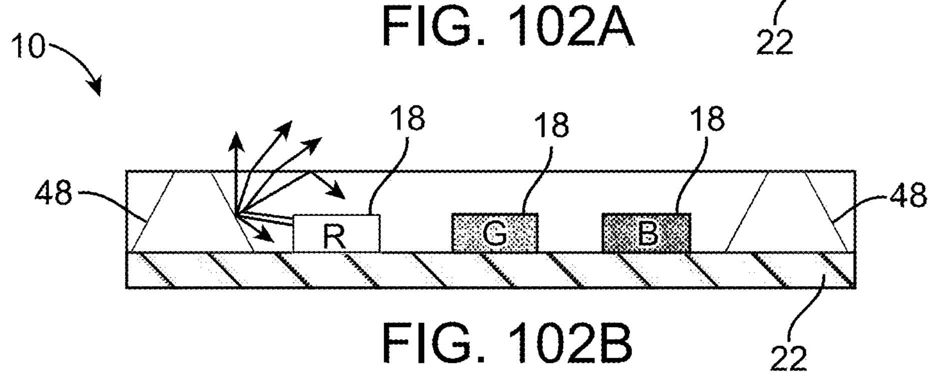

In FIG. 102A, the side surface of the elevation 48 is smooth, so that light emerging from the side of a μ-LED 18, for example, is reflected once and is deflected advantageously in the direction away from the carrier substrate 22. In FIG. 102B, a material of the side surface of the elevation 48 is configured to cause multiple reflections of the incident light in different directions. In FIGS. 102A and 102B, the bumps 48 are placed at the edge of a pixel element 10 or at the edge of an array of several μ-LEDs 18.

Figure 102C:
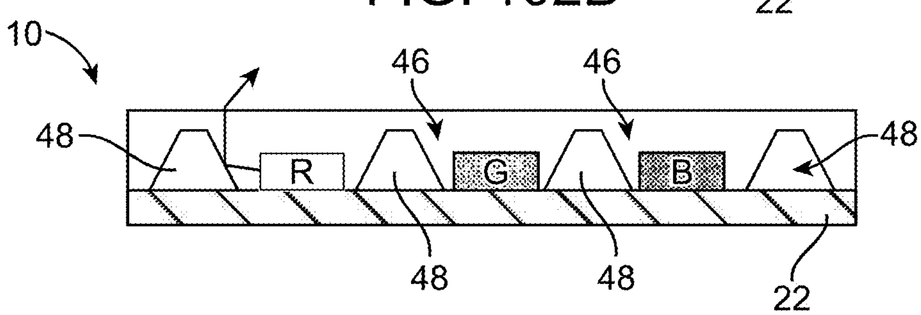

FIG. 102C shows an example in which elevations 48 are provided between two adjacent μ-LEDs 18 each. By optically separating the respective μ-LED 18 within a pixel element 10 by the shading effect of the elevation 48, crosstalk, for example, can be achieved, thus improving the contrast of a display. These versions of FIG. 101 are also similar to the examples of FIGS. 103A to 105, so the various aspects of the designs shown there can be combined with one another.

The aspects presented above for a reflecting mirror can also be applied to other designs of μ-LED realizations, for example to the vertical μ-LEDs with circumferential structure.

Figure 103A:
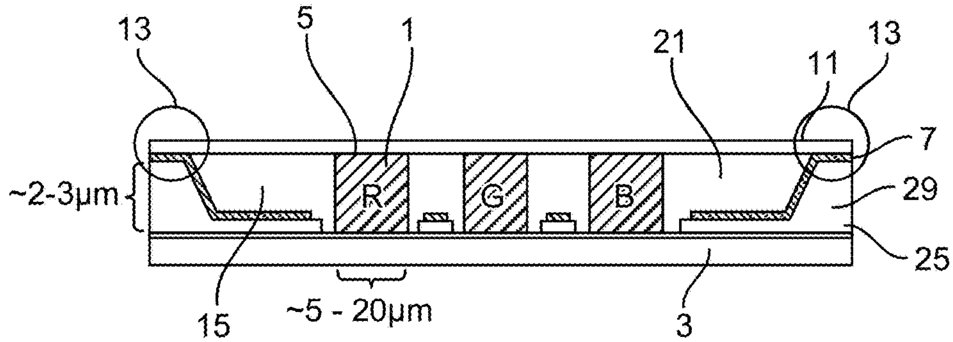
FIG. 103A illustrates a representation of a pixel of three vertical μ-LEDs with a circumferential structure and a cover electrode according to some aspects of the proposed concept.

FIG. 103A shows a version of a pixel cell with a common cover electrode and a circumferential structure, which on the one hand allows fast switching times by a suitable current conduction and on the other hand radiates the generated light in a main radiation direction by a mirror coating. The arrangement according to FIG. 103A shows three so-called μ-LED dies, whereby a first die provides 1 red light, a second die green light and a third die blue light. They thus form subpixels of a pixel cell. For simplicity, the individual dies are shown in series, but other arrangements are also possible, for example in a triangular shape. Furthermore, the dies are the same size. A single die 1, especially a cubic die 1, can have an edge length of about 3 to 70 μm, 5 to 30 μm and 5 to 20 μm respectively. The height of a die 1, for example, can preferably be between 0.5 μm-5 μm, 1-3 μm or approx. 2 to 3 μm. This is also due to the simplicity of the embodiment, as the size can also vary depending on the design. However, they should have the same height so that further process steps do not require additional measures. The μ-LED dies have a vertical design, i.e. they have their two contacts on different sides, as shown in the figure on the top and bottom side.

The μ-LED dies are arranged on a common substrate 3. For this purpose, the μ-LED dies are electrically connected with their first contact to a contact not shown here on or in the substrate. The substrate can be a semiconductor substrate or a backplane or similar. In the substrate are the leads, which lead to the contacts for the μ-LED dies. In addition to supply lines, power sources and/or control electronics can also be formed in the substrate. It is useful to have such current sources for each μ-LED die directly underneath it. This results in a certain amount of space. Accordingly, the circuits may only have a small size. Examples and concepts for this are disclosed in this application and can be provided in substrate 3. Part of the structures and supply lines are configured in TFT technology.

The pixel cell with its three μ-LED dies is embedded in a cavity or surrounded by a border. Such borders can also be seen in FIGS. 90 and 91.

On the left and right sides of FIG. 103A, 3 bumps 29 are formed on the substrate. Such protrusions 29, which provide a cavity or recesses, may be made of polyimide or other non-conductive material. They surround the dies on all sides and thus form the border of the pixel. The sidewalls are slightly bevelled and thus run at an angle to the normal of the surface. In addition to the linear course of the side surface shown here, they can also show a parabolic course.

In addition, an additional electrical insulation layer 25 is provided between the generated elevations 29 and the substrate 3 for better mechanical strength. A conductive reflective layer 7 is applied to the insulation layer or the elevation 29. This extends not only over the lateral surface of the elevation 29, but also along a region of the substrate surface and between the μ-LED dies. However, the reflective layer is spaced apart here so that a short circuit or unintentional contact with the tube chips is avoided. In addition, the mirror coating is also provided on an upper side of the elevation in area 13. Mirroring 7 is configured as a metal mirror, which can have Al, Ag and AgPdCu and the same in particular. Other materials can be metals or alloys of Al, Ag, Nd, Nb, La, Au, Cu, Pd, Pt, Mg, Mo, Cr, Ni, Os, Sn, Zn or alloys or combinations thereof.

The space 15 between the elevation or in the cavity and between the μ-LED die is now filled with a transparent, non-conductive material 21 and reaches up to the height of the contacts 5 of the μ-LED die. Material 21 forms an insulating layer. The insulation layer can be applied by spin-on glass or similar techniques. Depending on the requirements, the insulating material can then be removed up to the height of the contacts 5 and the reflective layer so that these are exposed and a planar surface is formed. Finally, a transparent, electrically conductive layer is created on the second contact 5 of the μ-LED dies and the insulating layer 21, which provides a cover electrode 11. The transparent layer can have ITO and/or IGZO and the like, for example. Other examples of cover electrode materials are transparent conductive oxides such as metal oxides, zinc oxide, tin oxide, cadmium oxide, indium doped tin oxide (ITO), aluminum doped tin oxide (AZO), $Zn_2SnO_4$, $CdSnO_3$, $ZnSnO_3$, $In_4Sn_3O_{12}$ or mixtures of different transparent conductive oxides.

The cover electrode 11 extends over the entire insulation layer 21 and overlaps with the reflective layer in the areas 13. The large-area direct contact with the underlying metal mirror coating 7 creates a good current coupling, so that the distance that the current must travel through the transparent conductive layer 11 is only short. This means that the generally greater surface resistance of the transparent conductive layer 11 does not have such a great effect. Due to the planar surface to which the cover electrode 11 is applied, the material can be easily sputtered on or applied by means of a "spin-on glass (SOG)" top contact process. This enables a planar coating with the ITO cover electrode 11, so that tear-off edges are avoided, for example during a so-called thermal shock test. However, it is useful in this production process that both the mirror coating 7 and the contacts 5 are exposed and are contacted directly by the material 11.

Figure 104:
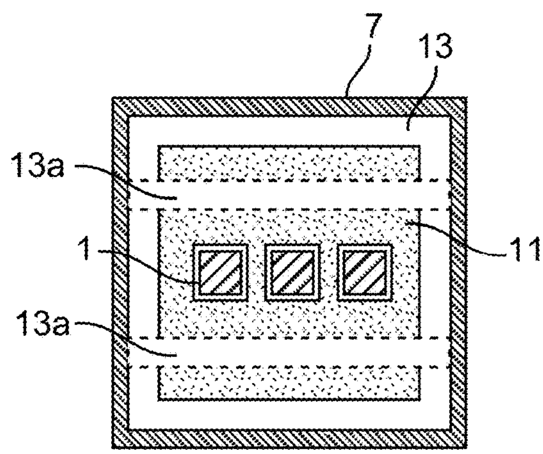
FIG. 104 shows a top view of the device of the previous figure.

FIG. 104 shows a top view of the embodiment as shown in FIG. 103A. In the middle of the arrangement the three μ-LED are arranged in a row. These are contacted by means of a cover electrode 11, which is electrically contacted in an overlap area 13 with a mirror coating 7 or a metal mirror layer. The border through the elevation or cavity is substantially square. This results in a smaller distance between the two outer μ-LED chips and the elevation. In one embodiment, it may be more appropriate to form the border as a rectangle. This is indicated in FIG. 104 by the dashed areas 13*a* in which the elevation lies and in which the cover electrode is in contact with the mirror coating. This makes the distance between the μ-LED chips and the border more even.

Figure 105:
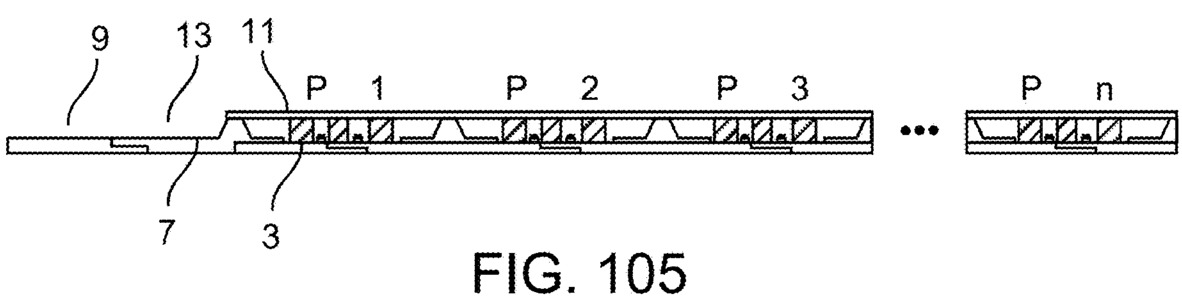
FIG. 105 shows a cross-section of a section of an array with several pixels and a cover electrode.

FIG. 105 shows an arrangement of several pixels P1, P2, P3 . . . Pn arranged along a row. The pixels P are separated from each other by an elevation, so that optical crosstalk is at least reduced. In cross-section, three μ-LED dies 1 are formed for each pixel, which are designed to emit light of different wavelengths during operation. These are fixed and electrically contacted between a substrate 3 and a cover electrode 11. The direct electrical contact of the cover electrode 11 with the mirror coating 7 is formed according to the design shown in FIG. 103A.

The mirror coating 7 is electrically connected to the cover electrode 11 on each of the elevations separating the pixels.

Outside the pixel cells and the row of pixels, the mirror coating is connected to a leftmost control contact 9 of the substrate 3. The control contact 9 forms a contact area at which further contacting can take place. In other examples, contact 9 is led into the substrate where further circuits and control elements are arranged. Due to the low surface resistance caused by the metallic mirror coating, the total voltage drop across the supply lines is reduced. With a suitably guided current flow, parasitic capacitances are reduced and switching times for driving the μ-LED dies can be effectively reduced. The pixel arrangement shown in FIG. 105 further minimizes optical scattering between pixels and thus so-called optical crosstalk.

Figure 106:
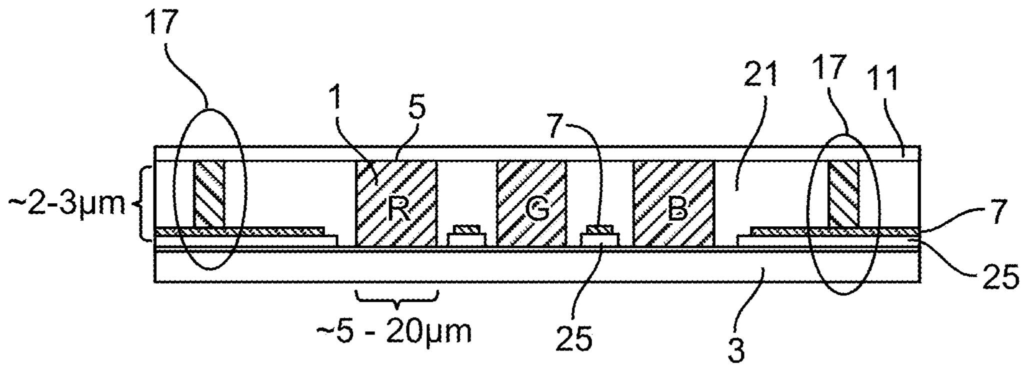
FIG. 106 is a second embodiment of a pixel with several μ-LEDs and a transparent cover electrode according to further aspects of the proposed principle.

FIG. 106 shows a further embodiment of a proposed device. FIGS. 103A to 105, where the same reference signs show the same characteristics. In this embodiment, no elevation or cavity is provided on the substrate, i.e. the mirror coating and the supply line run substantially planar along the surface of substrate 3. Three μ-LED dies 1 are arranged on substrate 3 and electrically connected to contacts not shown. The mirror coating 7 surrounding the dies 1 is electrically separated from the substrate 3 by a transparent but electrically insulating layer 25. The μ-LED chips are surrounded by an insulating layer 21. The layer is transparent and extends in every direction over the substrate up to the height of the contacts 5 of the μ-LED dies. The upper contacts of the μ-LED dies 1 are electrically contacted by a cover electrode 11, which is configured as a transparent ITO cover contact and rests on the insulation layer. Furthermore, several conductive vias are created above the mirror coating 7, the mirror coating 7 is electrically contacted with the cover electrode 11. The vias are filled with a metal to keep the surface resistance low.

In some aspects, the vias are merely openings in the insulation layer. However, trenches or the like can also be provided in the insulation layer, which reach up to mirror coating layer 7.

If these are formed at least partially circumferentially around the pixel and then filled with a reflective material, light guidance can be achieved in addition to good current injection. In this design, the height of the μ-LED dies plays a lesser role, provided they are of the same height, since they do not have to be adapted to a cavity or elevation.

Figure 107:
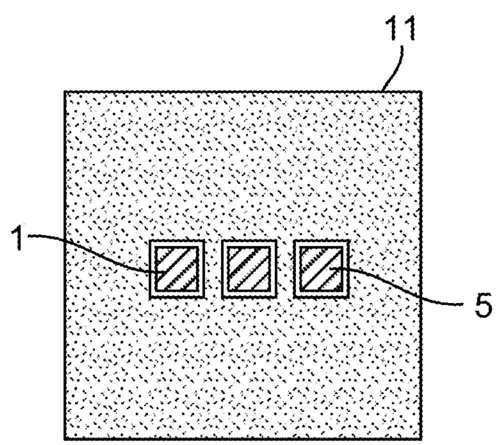
FIG. 107 shows a top view of the embodiment of the previous figure.

FIG. 107 again shows the structure shown in FIG. 106 in plan view. The pixel is configured as a square so that the distance from the middle die to the edges of the pixel is approximately the same. Reference mark 5 indicates the electrical contacts 5 of the μ-LED dies 1 to the transparent cover electrode 11. Here too, a mirror coating 7 (not shown) may surround the area around the μ-LED dies.

Figure 108:
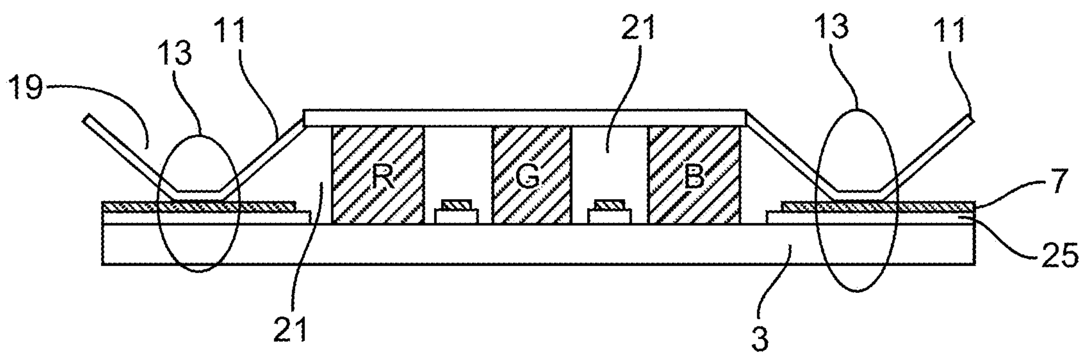
FIG. 108 illustrates a third embodiment of a pixel in cross-sectional view.

FIG. 108 shows another example of a proposed embodiment in cross-section. According to this example, the cover electrode 11 is configured as an ITO cover contact, which in turn has been applied planar over the contacts 5 of each μ-LED die. An insulation layer 21 surrounds each die. However, the insulation layer has been removed in the edge area of the pixel and has a sloping side edge. This creates an opening 19 that reaches up to the reflective layer 7 and exposes it in a larger, i.e. not only point-shaped, area. The larger this exposed area, the larger is the later contact area with the cover electrode 11.

In other words, the planar isolation layer is removed in the area between two pixels and above the reflective layer 7. This can be done by an etching process, for example with RIE. The created openings 19 have edges 23 with a flat opening angle. After opening, the cover electrode 11 is applied to the insulating layer and thus extends over the planar surface and the side surface of the insulating layer. Alternatively, a metal layer can be applied to the side surface, which contacts the cover electrode 11 at the upper edge of the insulation layer.

With a thicker insulation layer 21, the opening 19 with its side flank should be designed so that the upper angle is relatively flat, i.e. comparable to an inverted flat cone. The flat bevel angle prevents the ITO layer 11 from "tearing off" at the edge of the openings 19. The same applies to the angle between the side flank and the mirror coating layer 7.

The generated pixel element has such contacts and overlaps at several points, especially all around, so that the subpixel or pixel is also enclosed. In addition, further subsequent layer(s), for example a scattering layer, or clear lacquer layer with different refractive index can be provided in the openings, which in the embodiment, for example, lead to an improvement of the contrast, in which the lateral waveguide of light emitted from the chip side edges can be used for light extraction and does not propagate up to neighboring pixels.

Figure 109:
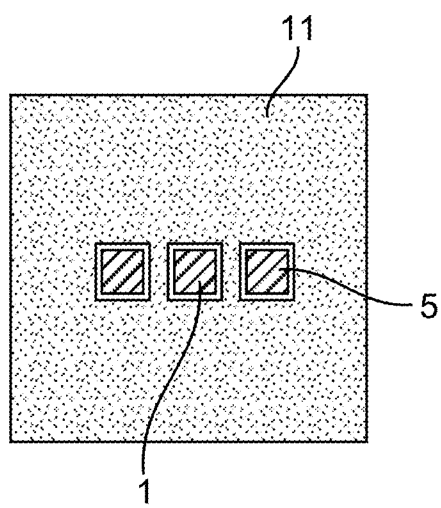
FIG. 109 shows a top view of the embodiment of the previous figure.

FIG. 109 shows the embodiment according to FIG. 108 in top view. Three subpixels, each provided by a micro light-emitting diode die 1, have electrical contacts 5 on a side facing away from the substrate 3. These can be electrically coupled outside the pixel by means of a transparent cover electrode 11.

Figure 110:
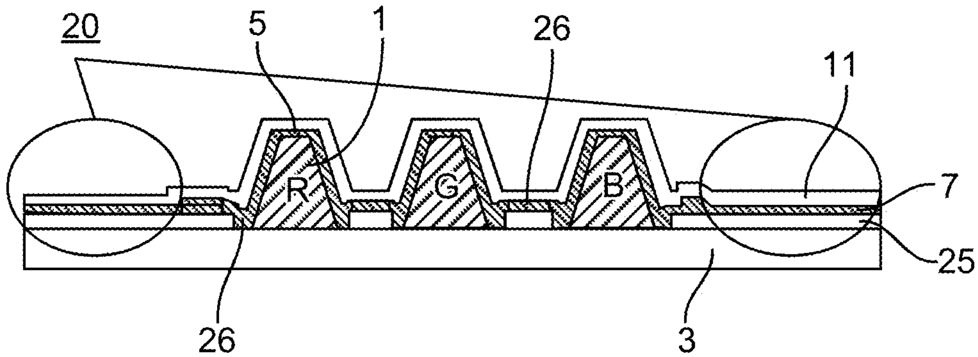
FIG. 110 shows another illustration of an embodiment of a pixel according to the proposed concept.

FIG. 110 shows another example of a device with three μ-LED dies 1 arranged in a row. Each of the μ-LED chips is designed as a truncated pyramid. Its base area decreases slightly with increasing height. Thus, the μ-LED dies have a slightly bevelled side edge.

The surface of the side edges of each of the μ-LED dies 1 is covered with a thin transparent and insulating layer 26. However, this does not extend to the upper second contact 5, so that it is exposed. The inorganic insulating layer 26 can be produced by chemical vapor deposition, for example. Alternatively, the layer 26 can also be produced with ALD-based (Atomic Layer Deposition) layers such as SiNx, SiOx, $Al_2O_3$, $TiO_2$, $HfO_2$, $TaO_2$ and $ZrO_2$. The inorganic layer can also consist of multiple layers, namely ALD-CVD-ALD or CVD-ALD or ALD-CVD. The ALD layer can also intrinsically consist of a multilayer stack (a so-called nanolaminate). Such an ALD nanolaminate would then consist of a multilayer layer stack of e.g. two different ALD layers and ALD materials, whereby, for example, the individual layers are typically only 3 nm-10 nm thick, according to A-B-A-B-A or similar.

In the vicinity of the substrate 3, 25 mirror coatings 7 are applied to electrical insulation layers, which are also formed near the dies 1. In sufficient distance to the die chips, openings 20 are formed in the insulation layer 26 on the left and right side of the pixel. This exposes the mirror coating layer 7. Finally, a cover electrode made of the conductive transparent material is applied to the top side and the side edges. This also extends over the openings in the insulating layer 26, and is thus in contact with the metallic layer 7 over a large area. In this way, the direct electrical contact of the cover electrode 11 with the mirror coating 7 can be created.

Figure 111:
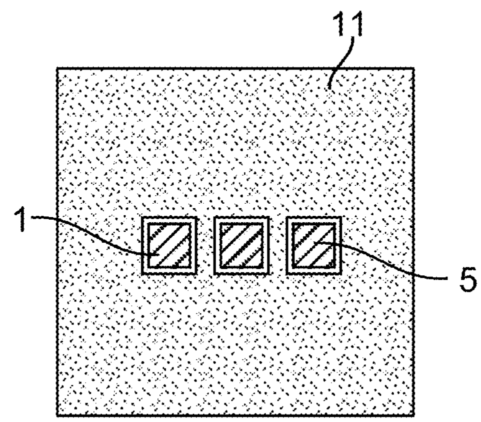
FIG. 111 is a top view of the embodiment of the previous figure.

FIG. 111 shows the arrangement according to FIG. 110 as top view. FIG. 111 shows three subpixels or dies 1, whose electrical contacts 5 facing away from the substrate 3 can be electrically contacted by a transparent cover electrode 11.

Figure 103B:
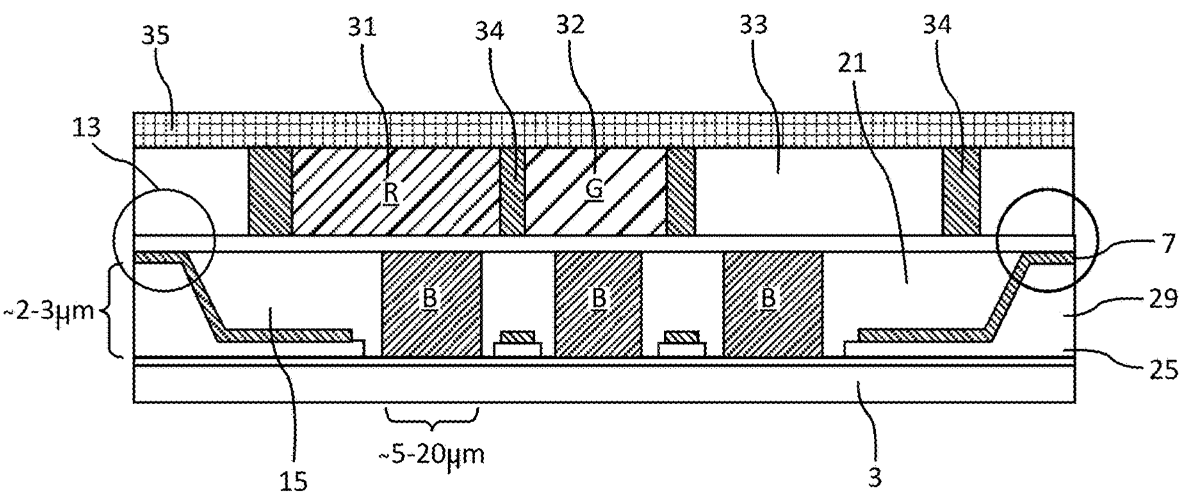
FIG. 103B shows another embodiment similar to FIG. 103A with additional converters and light extraction structures, thus realizing further aspects of this disclosure.

FIG. 103B presents a version that is provided with additional structures. The arrangement is similar to the embodiment in FIG. 103A, although no further explanation is given. In contrast to that embodiment, however, three μ-LED chips of the same type are applied to the substrate and electrically contacted. The μ-LED dies are configured to emit light of a blue wavelength during operation. A structured insulation layer 30 is applied to the cover electrode 11. This improves the light output of the μ-LED dies. Since μ-LED dies of the same type are used in this embodiment, the light must be converted into other colors to obtain an RGB pixel.

For this purpose, 30 converter materials are applied to the layer to convert the light into the appropriate wavelength. In detail, this is a first converter layer 31, which is located above the left blue μ-LED die. A green converter layer 32 is provided above the centrally arranged μ-LED die. Finally, a further transparent layer 33 is arranged above the right μ-LED die. This is not necessary in itself, but the transparent layer creates a planar surface. The converter materials contain an inorganic dye or quantum dots. To reduce optical crosstalk, the individual converter layers, or the converter layer 32 from the transparent layer, are separated by a thin reflective layer 34. Although it is possible that light from other dies than the component directly below may also enter the converter layer, this can be reduced by a low design or by raising the conductor path structures between the components. In addition, the coupling-out layer 30 can also be structured in such a way that it couples out more light that enters layer 30 at a steep angle, i.e. substantially from below. The pixels here are arranged quite close together. If the distance is slightly greater or the arrangement is different from the one in a row, the converters and reflective layers 31 to 34 can be arranged so that they are evenly distributed over the pixel. This would also place the outermost reflective layers 34 above the elevation.

Above the converter structure there are now one or more further structured layers 35, which (not shown here) also partially extend into the converter structure. The converted light can couple well into the structure 35. The structured layers 35 are used for light collimation and shaping, so that converted or unconverted light exits substantially steeply, i.e. preferably at perpendicular angles to the substrate surface. The structured layers 35 can, for example, have a photonic structure that provides a virtual bandgap for light propagating parallel to the surface. This collimates the light.

Several of the pixels shown here can be arranged in columns and rows to form an individually controllable μ-LED module.

Figure 112:
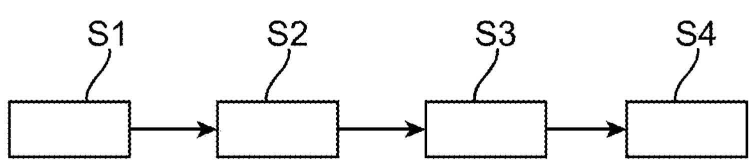
FIG. 112 is a process sequence with various steps for producing a pixel according to the proposed principle.

FIG. 112 shows an example of a method for the production of a μ-pixel. In a first step S1, a substrate with a number of contacts is provided on the surface. The substrate can contain further lines, control or switching elements as described above. In one aspect, an elevation can be created on the substrate that surrounds the μ-LED die to be attached later and thus optically separates a pixel from adjacent elements.

In step S2, one or more μ-LED dies are mounted on the substrate and their first contacts are electrically connected to contacts on or in the substrate. The μ-LED dies are designed in a vertical configuration, i.e. their contacts are on opposite sides. The μ-LED dies can be arranged in series, but other arrangements are also possible. Possible examples are shown in FIGS. 103A and B and 110 and 111.

In step S3, a mirror coating layer is deposited on the substrate surface, which is electrically connected to an electrical control contact on the surface of the substrate and at least partially covers the surface. The mirror coating layer can be applied at least partially to the sidewalls of the elevation or cavity, in particular those facing the μ-LED dies. Finally, in step S3 a transparent cover electrode is placed on the further contact, which electrically contacts the mirror coating.

In order to prevent the cover electrode from being torn off, step S2 or S3 also provides for the μ-LED dies to be surrounded by an insulating layer after the mirror coating has been applied or the μ-LED dies have been attached. The height of this insulating layer corresponds to the height of the μ-LED dies, so that a planar surface is created. The generation of the insulating layer is done with the measures disclosed here to create a transparent non-conductive layer, such as spin-on glass or similar. A planar surface is created by removing the insulating layer back to the upper contacts of the μ-LED dies and the mirrored layer. This step can involve mechanical or chemical techniques. The cover electrode is then applied to the transparent insulating layer.

Contacting can take place in an overlapping contact of the cover electrode surface and a mirroring surface in the area of the elevation or at the end of the cavity facing away from the at least one μ-LED die. Alternatively, a series of vias can be provided in the insulating layer, which when filled with metal creates a connection between the cover electrode and the mirror coating. The vias can also be trenches, which expose the mirror coating.

In further steps, one or more structured layers can be deposited on the cover electrode, which comprise a photonic crystal or quasi-crystal structure and are configured to suppress or reduce light that radiates parallel to a surface of the substrate. Alternatively, the cover electrode itself can be patterned to either improve light extraction, collimate light or emit light directed away from the substrate surface. Finally, the application of converter material over the μ-LED dies is possible.

Nano light emitting diode arrays applied in a matrix arrangement and comprise vertical layered nanopillars or nano rods offer the possibility to generate an emission of light in a very small space. In these embodiments, light is emitted by the active layer essentially in any direction in space. Due to the small size and the associated low light force of a single nanopillar, it is advisable to redirect light in a suitable way in order to generate sufficient light intensity.

Figure 113:
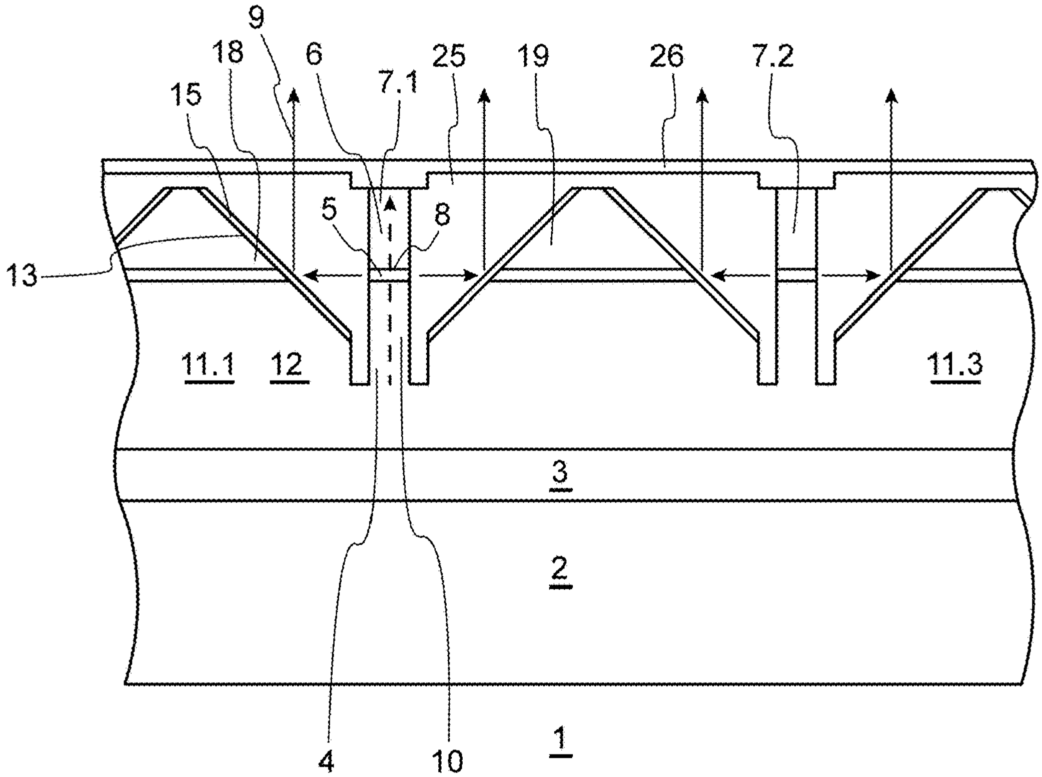

FIG. 113 shows a first version of a μ-LED arrangement 1 as a sectional view, which realizes such a light guidance and thus on the one hand increases the light intensity and on the other hand reduces crosstalk. Shown are two nanocolumns 7.1, 7.2, which are part of a matrix array 28 on a carrier substrate 2. The carrier substrate is formed, for example, with $Al_2O_3$, glass, silicon, GaAs, SiC, ZnO. A III-V semiconductor system is preferably used as material of the semiconductor sequence 10 of the nanocolumns 7.1, 7.2. In particular (AlxInyGa1−x−y)N, InyGa1−x−y)N, GaN, InN, AlN, InGaN, AlGaN, AlInN or AlInN can be used. An n-contact layer 3 is provided between the semiconductor sequence 10 and the carrier substrate 2. The contact layer 3 is continuous in this configuration. However, this can also be structured so that each nanopillar can be contacted individually. In this context, the carrier substrate can also be designed with additional elements and structures. Arrangements and designs are part of this disclosure and can be used for this purpose.

The nanopillars 7.1, 7.2 have a longitudinal extension in the longitudinal direction 8, which runs parallel to the surface normal of the carrier substrate 2, which clearly exceeds their transverse extension. The transverse diameter of the nanocolumns 7.1, 7.2 is 1 μm for the present embodiment, whereby even smaller structures with sub[μm] dimensions are possible. The semiconductor sequence 10 comprises an n-doped semiconductor layer 4, an active layer 5, which typically comprises a quantum well structure, and a p-doped semiconductor layer 6. For variations not shown in detail, several active layers stacked on top of each other may be present.

The active layer 5 takes the form of a quantum disk and generates electromagnetic radiation when energized, which, as indicated by arrows in FIG. 113, comprises a laterally directed component. In accordance with the invention, reflector devices 11.1, 11.2, 11.3 are provided laterally to the nanopillars 7.1, 7.2 with respect to the longitudinal direction 8, which deflect the radiation emission transversely to the longitudinal direction 8 at least partially into a main radiation direction 9 running parallel to the longitudinal direction 8, so that an angle-limited radiation through the p-contact layer 26 results. In this way, precollimation is achieved, which leads to improved coupling efficiency for projection optics not shown in detail and following in the beam path.

The reflector device 11.1, 11.2, 11.3 is formed by a shaped layer 12 with a truncated pyramid shape and a metallic reflecting layer 15, for example of gold, silver or aluminium, on a reflector surface with a 45° position relative to the main radiation direction 9. In addition, reflector devices 11.1, 11.2, 11.3 are provided for each nanopillar 7.1, 7.2 on opposite lateral sides. For the section shown in FIG. 113, a first reflective optical element 18 on the reflector device 11.1 and a second reflective optical element 19 on the reflector device 11.2 are shown. Furthermore, the top view of the matrix arrangement 28 shows that the nanopillar 7.1 is laterally surrounded by further reflector devices 11.4, 11.6.

Figure 114:
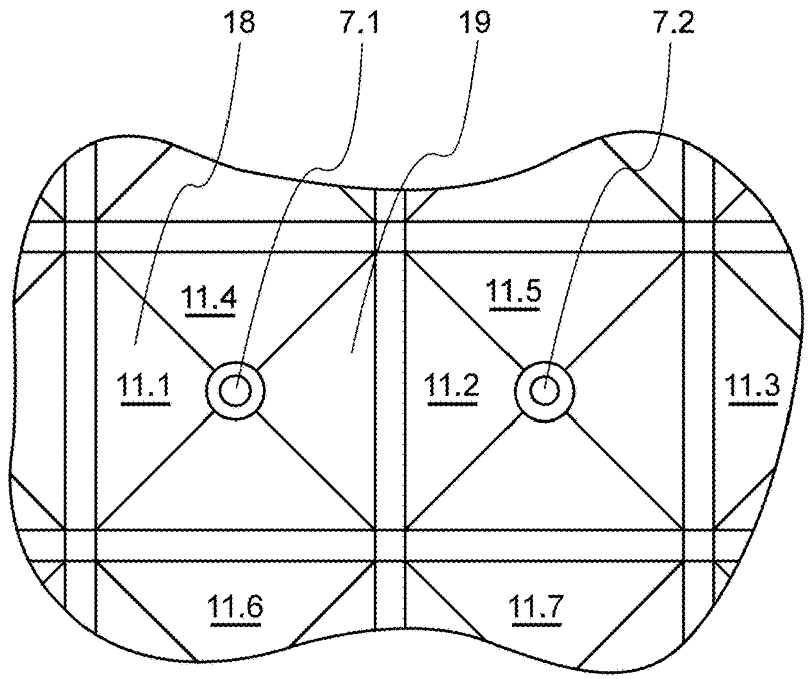

Correspondingly, the opposite reflector devices 11.5, 11.7 are also present for the nanopillar 7.2. FIG. 114 shows the top view of such a μ-LED arrangement 1.

Figure 115A:
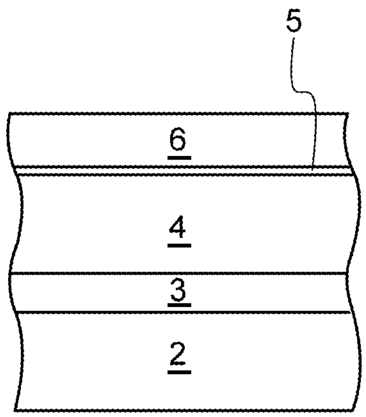
Figure 115B:
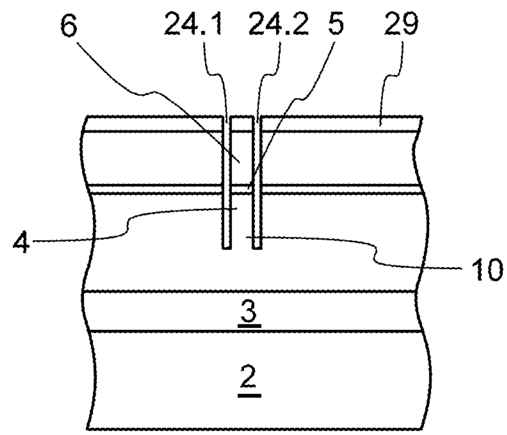
Figure 115C:
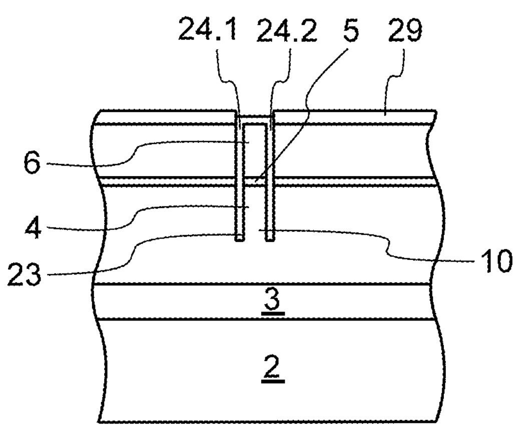
Figure 115D:
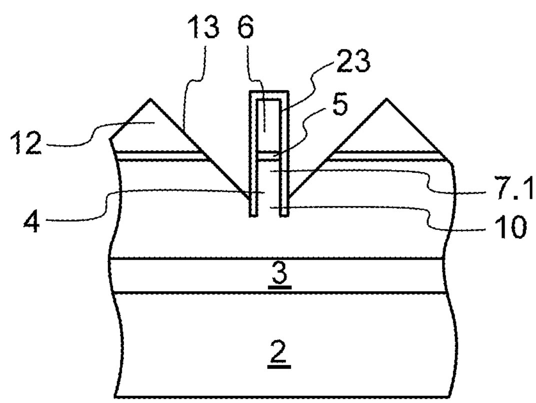
Figure 115E:
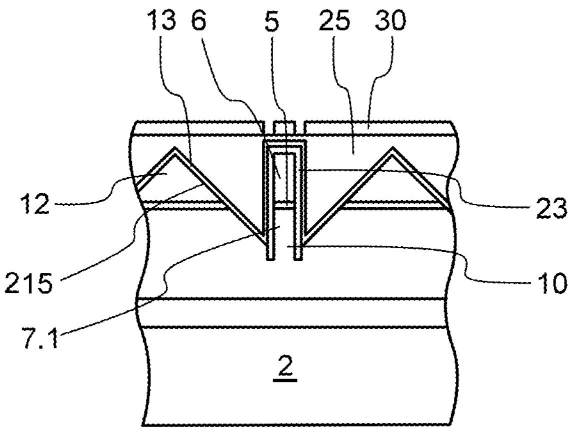
Figure 115F:
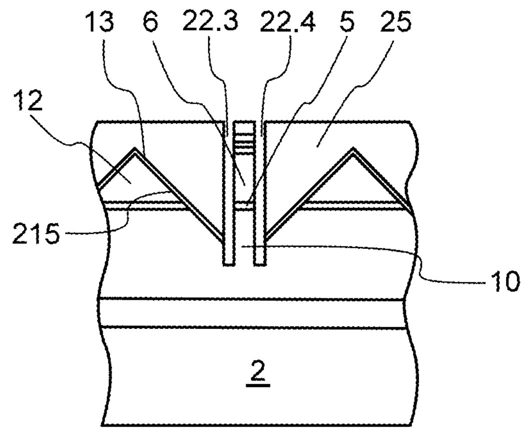
Figure 115G:
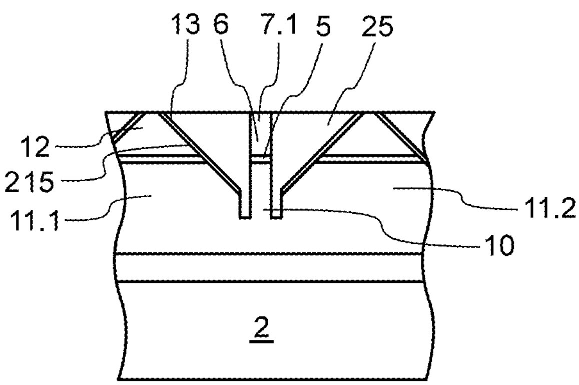
Figure 115H:
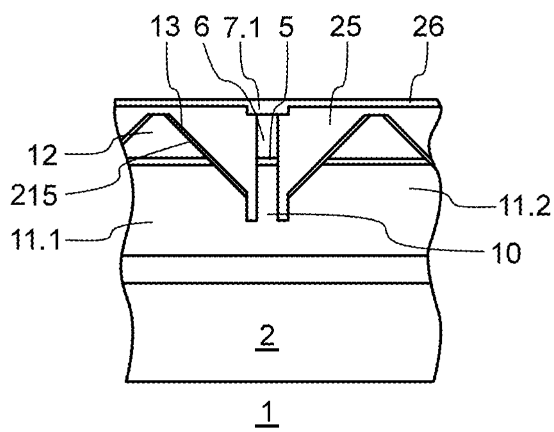

The figure sequence 115A to 115H shows the production of the first version of the μ-LED array 1 and clarifies some aspects. Starting from the extended planar stratification shown in FIG. 115A, a trench structure 24.1, 24.2 is created by dry etching and with the aid of the etch mask 29 shown in FIG. 115B. This trench structure 24.1, 24.2 extends into the n-doped semiconductor layer 4 and an etch stop layer 23, for example of SiNx, is formed in this layer (FIG. 115C). As a further step, an anisotropic wet etching process is used to structure the angular reflector surface 13 of a shaped layer 12. FIG. 115D shows the exposure of the semiconductor sequence 10 of the nanopillar 7.1 protected by the etch mask 29 with a high aspect ratio. Then, as shown in FIG. 115E, a metallic reflection layer 215 is deposited on the reflector surface 13 and planarization is carried out with a transparent electrical insulator 25, for example made of spin-on glass (SOG), SiO2 or epoxy resin. Another etch mask 30 is then applied to this to remove the etch stop layer 23 for the dry etching shown in FIG. 115F. The resulting trench structure 22.3, 22.4 is again filled in by the transparent electrical insulator 25. After removal of the etch mask 30, isotropic etching is carried out over a large area until, as shown in FIG. 115G, the p-doped semiconductor layer 6 of the semiconductor sequence 10 is exposed and can be covered by a p-contact layer 26. As shown in FIGS. 115G and 115H, these steps also produce the final contour of the reflector devices 11.1, 11.2 arranged laterally to the nanopillar 7.1.

Figure 116A:
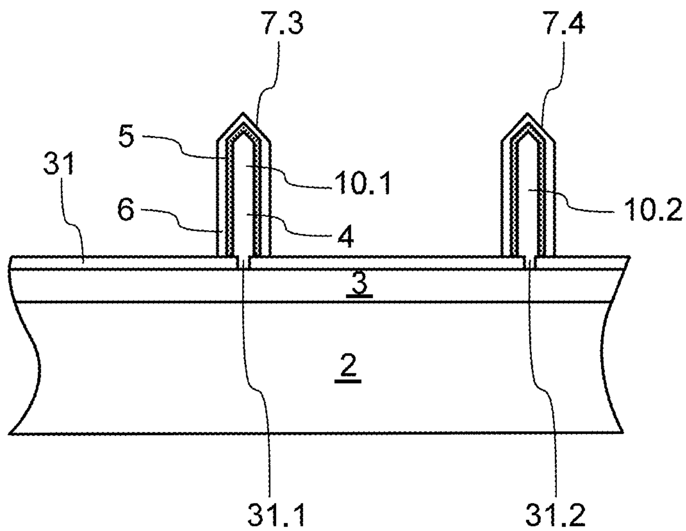

FIGS. 116A to 116D show the epitaxial production of a second version of μ-LED array 1 according to some other aspects. As shown in FIG. 116A, the n-contact layer 3 additionally serves as an epitaxial substrate, whereby an electrically insulating, structured substrate layer 31, for example of SiNx, is present, which comprise openings 32.1, 32.2 to the epitaxial substrate. From these, lateral epitaxial overgrowth takes place by means of hybrid gas phase epitaxy (HVPE), molecular beam epitaxy (MBE) or metal organic gas phase epitaxy (MOCVD) up to beyond the edges of the openings 32.1, 32.2 in the structured substrate layer 31, the process parameters being set in such a way that a semiconductor sequence 10.1, 10.2 with a high aspect ratio grows up to form the nanocolumns 7.3, 7.4. These have an n-doped semiconductor layer 4 in the form of a column core, which carries the active layer 5. This is surrounded on the outside by a p-doped semiconductor layer 6 forming a shell.

Figure 116B:
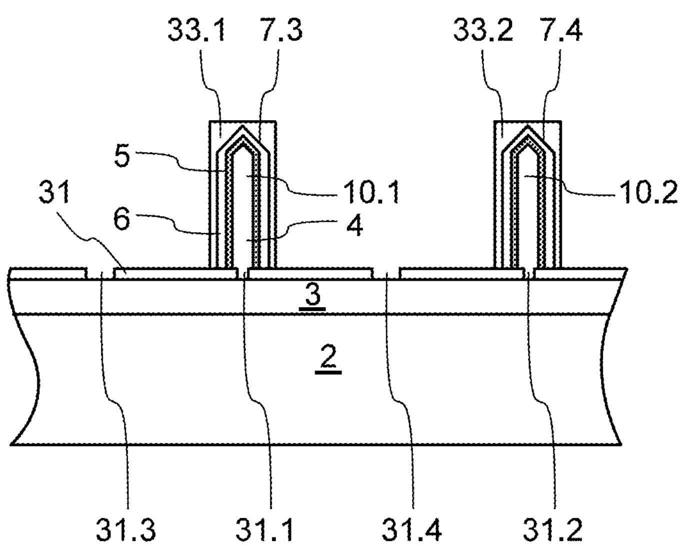
Figure 116C:
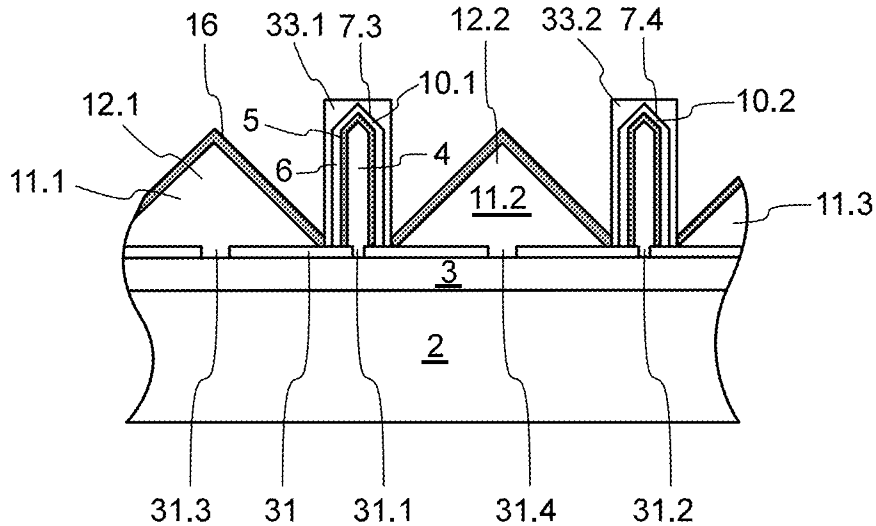
Figure 116D:
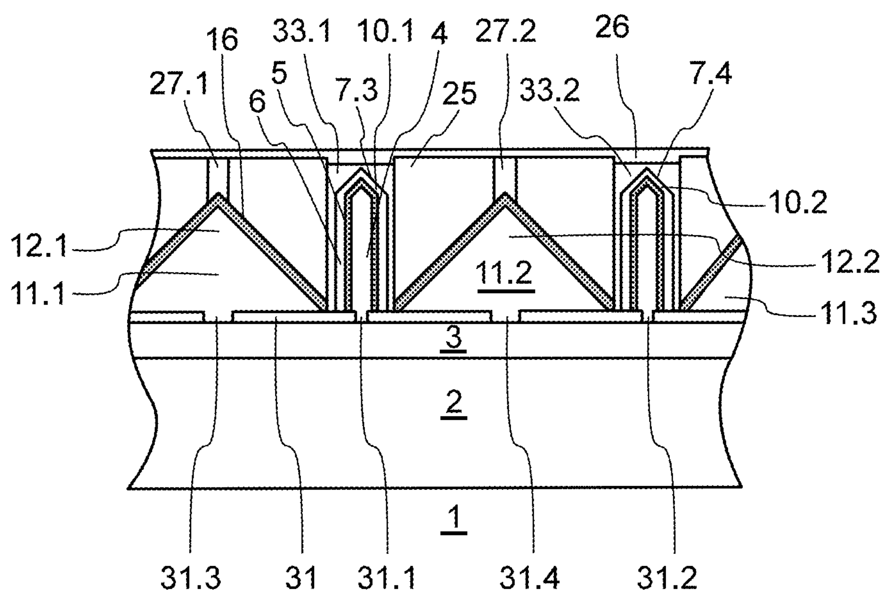

FIG. 116B shows the encapsulation of the nanopillars 7.3, 7.4 by means of passivation 33.1, 33.2 in the form of a transparent conductive layer. Additionally, further openings 32.3, 32.4 are created in the structured substrate layer 31 by dry etching. The etching masks used for this are not shown in detail. The epitaxial growth described below starts from the epitaxial substrate in the area of the openings 32.3, 32.4 and is controlled in such a way that the shaped layers 12.1, 12.2 shown in FIG. 116C and arranged as pyramids are created. In the following step, these are covered by a Bragg mirror 16 as shown in FIG. 116C to produce a reflector device 11.1, 11.2, 11.3. Then, as shown in FIG. 116D, a transparent electrical insulator 25 is deposited on the surface and structured to form the optical separating elements 27.1, 27.2 between adjacent nanopillars 7.3, 7.4. The μ-LED array 1 is completed by a p-contact layer 26, which is also transparent and electrically conductive.

Figure 117A:
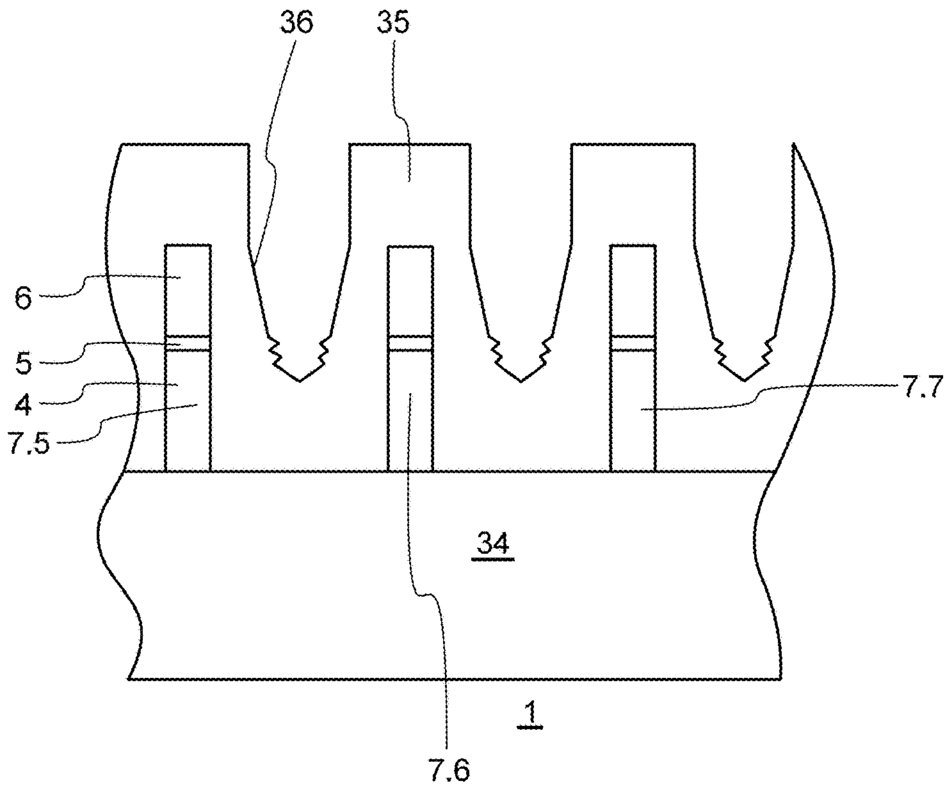
Figure 117B:
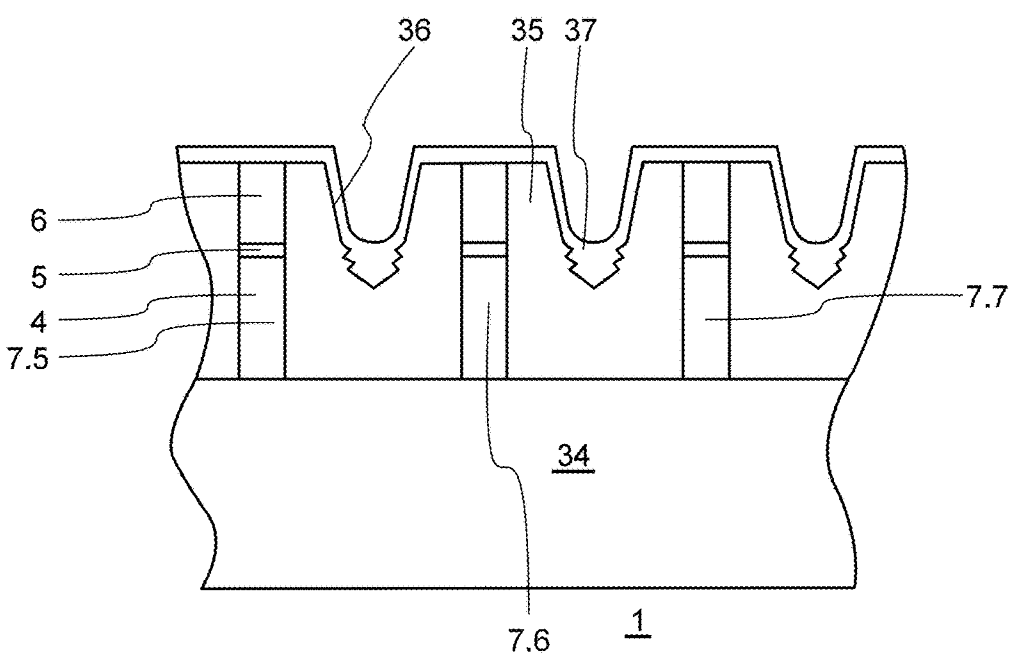
Figure 117C:
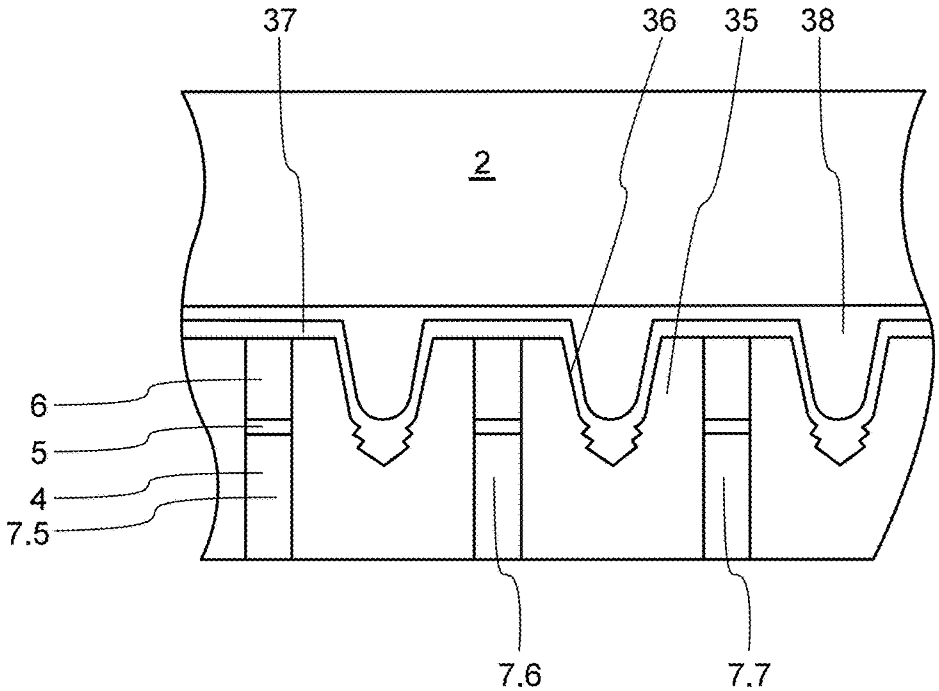
Figure 117D:
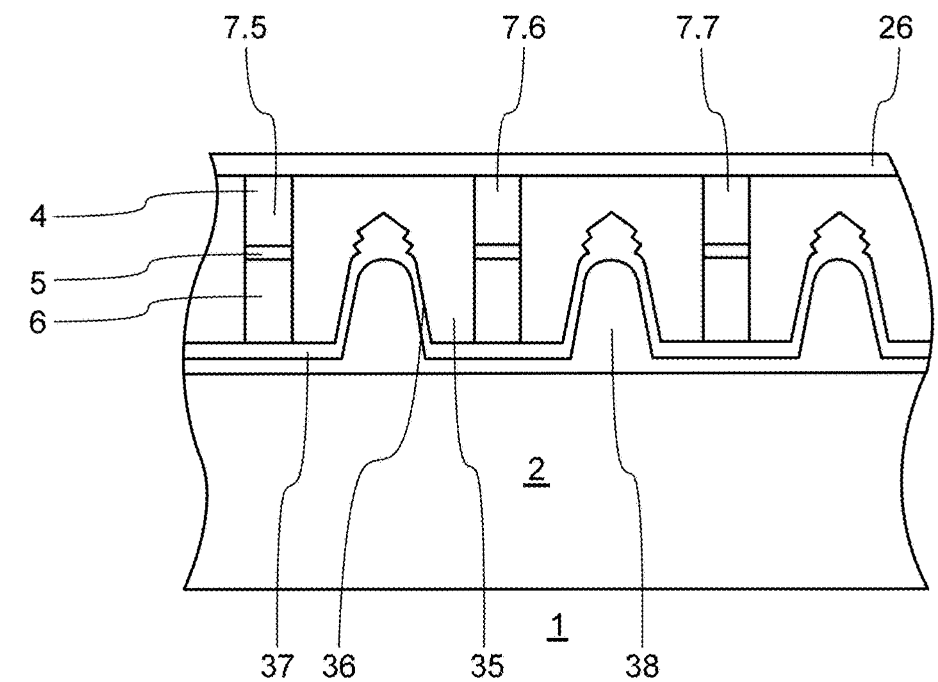

FIGS. 117A to 117B show the production of a third version of a μ-LED array 1 by nano-stamping and using a flip-chip technique. FIG. 117A shows an array with nanocolumns 7.5, 7.6, 7.7 on a transfer substrate 34. The epitaxially grown or lithographically structured nanocolumns 7.5, 7.6, 7.7 each comprise an n-doped semiconductor layer 4, an active layer 5 and a p-doped semiconductor layer 6. The array with nanocolumns 7.5, 7.6, 7.7 is covered by a nanopunch substrate 35 with imprinted structures 36. As shown in FIG. 117B, this is removed over a large area up to the p-doped semiconductor layer 6 by an etching process, whereby the impressed structures 36 are protected by structured etch stop layers, which are not shown in detail. After removal of the etch stop layers, a metallization 37 is applied for the electrical contacting and for mirroring the impressed structures 36. Then a planarization with an intermediate layer 38 is applied, on which a carrier substrate 2 is attached. The next step is to remove the transfer substrate 34, resulting in the state shown in FIG. 117C. The μ-LED array 1 is completed with a p-contact layer 26 as shown in FIG. 117D.

Figure 118:
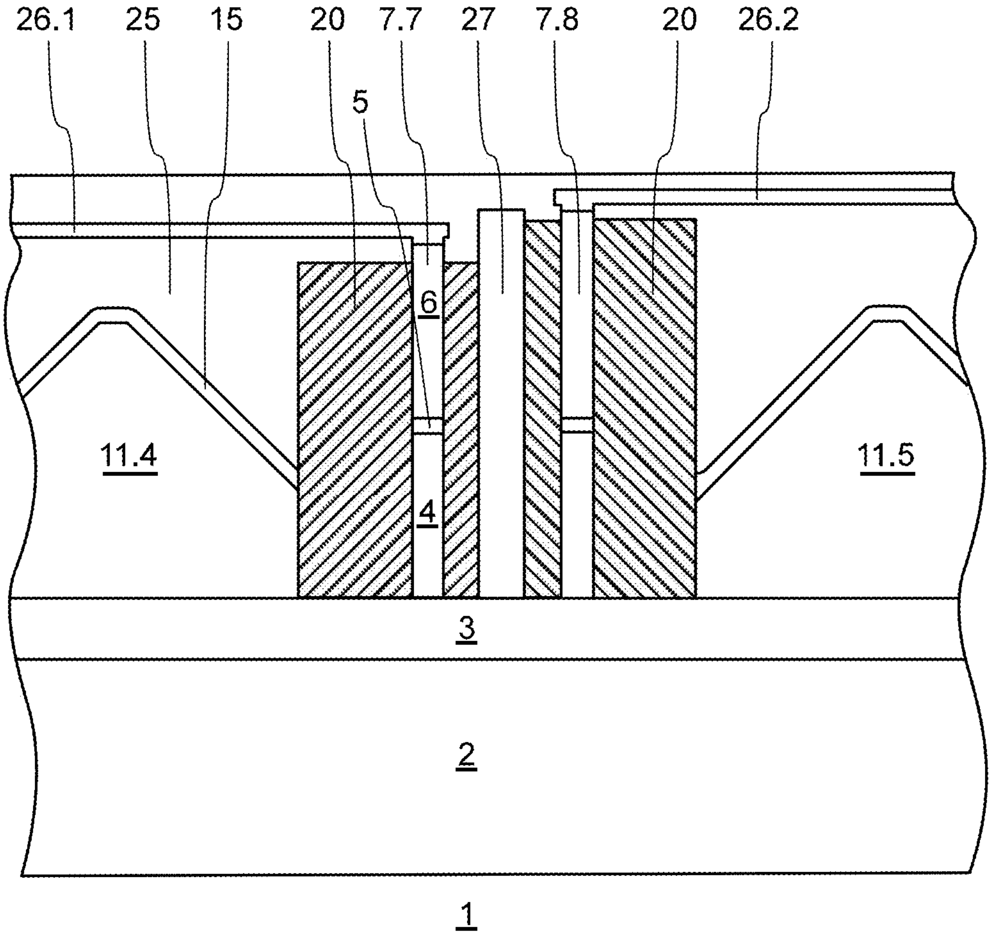

FIG. 118 shows a further development of the μ-LED arrangement 1 with nanopillars 7.7, 7.8 according to the invention, for which a reflector device 11.4, 11.5 for deflection and precollimation of the lateral radiation of the respective active layer 5 is arranged on one lateral side only. An optical separating element 27 between the nanopillars prevents crosstalk. The nanocolumns 7.7, 7.8 have electrically separated p-contact layers 26.1 and 26.2 and can be controlled separately. Furthermore, the nanopillar 7.7 is embedded in a first wavelength conversion element 20, which comprises an emission characteristic that differs from a second wavelength conversion element 21 surrounding the nanopillar 7.8.

Figure 119A:
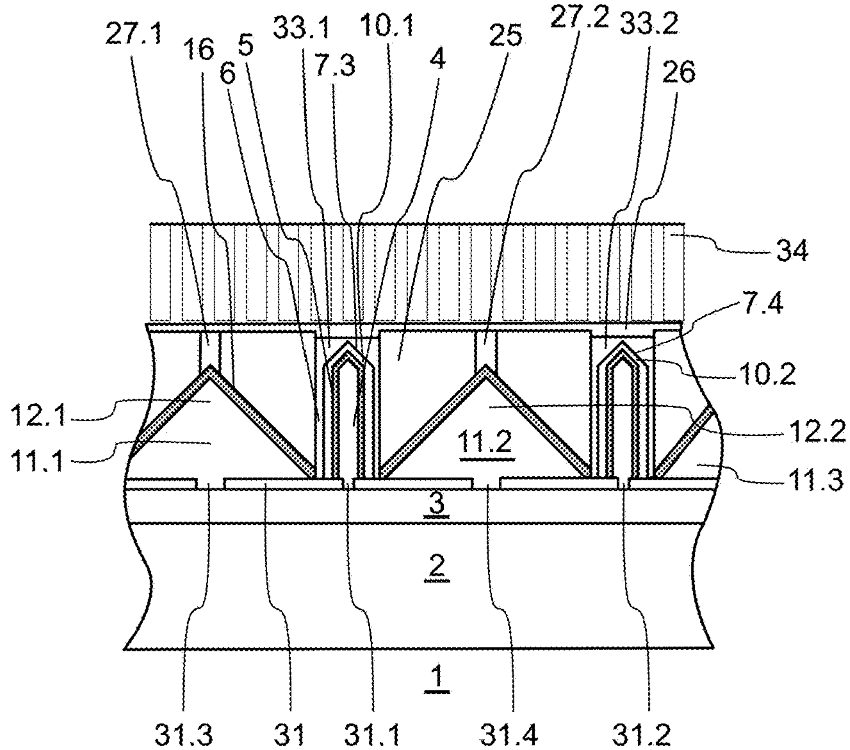
Figure 119B:
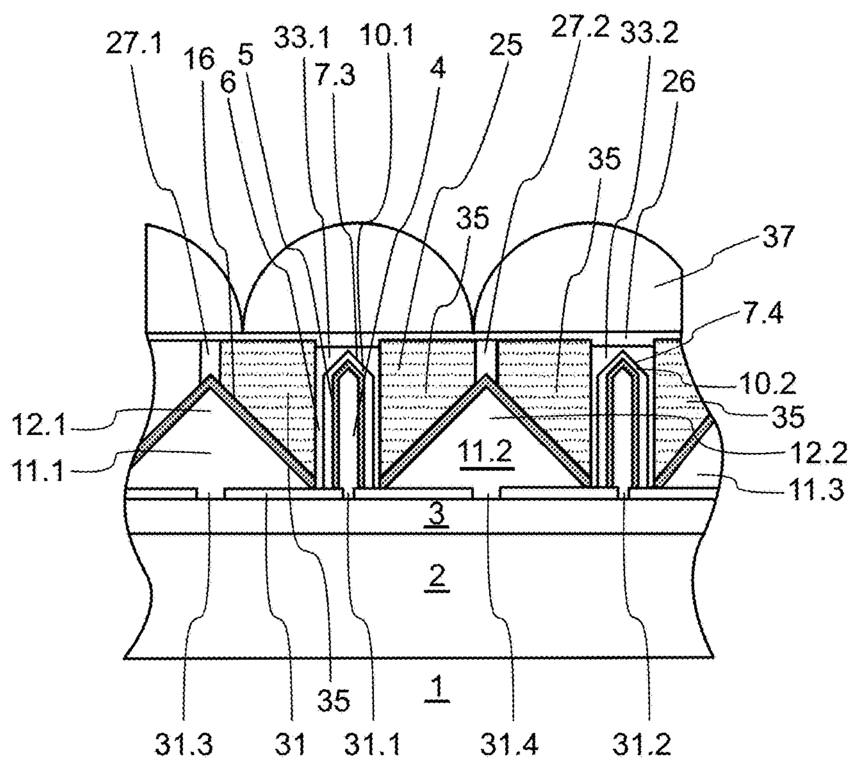

FIG. 119A illustrates a supplement with additional measures to shape light and improve directionality. The μ-LED arrangement includes a light-shaping structure on the surface or light-emitting surface. The structure includes areas 33 and 34 with different refractive indexes. Thus, light coming from column 7 or the reflective layer of structure 16 is formed. Depending on the design of the structure, light can thus be emitted in a defined direction. The structure is formed by a photonic structure. The periodicity of the areas is chosen so that it is in a defined relation to the wavelength of the emitted light. To take the refractive index jump into account, the photonic structure extends into the material of the arrangement (not shown here). Finally, FIG. 119B shows another alternative embodiment based on the example in FIG. 116D. Here, a converter material 35 is inserted into the spaces between column 7 and reflector structures. The converter material in this example is formed by quantum dots. Such quantum dots are available in powder form or as an emulsion and are of a size sufficiently small to fill the gap sufficiently. Grain size of the quantum dots is an essential size here, since conventional inorganic dyes often have a grain size at which there is a risk of misalignment or the like due to the edge structures.

Special processing of the inorganic dyes by the inventors by means of grinding and other mechanical processes, however, allow a reduction of inorganic dyes to a sufficient size. The quantum dots or the dyes can be applied by conventional methods. For example, in one process an emulsion with quantum dots is sputtered on and distributed over the surface. The quantum dots thus also deposit in the interstitial spaces and fill them. In a next step, photoresist is applied and structured. Then the quantum dots are removed outside the desired spaces. If a structured photomask from a previous process step is already in place, this can also be used and the quantum dots are deposited directly into the interstices.

The steps of photoresist structuring and quantum dot insertion can be repeated for further colors. In this way, not only RGB pixels can be produced with the three basic colors, but also 4 colors are possible to make better use of the available color space.

In a further step, microlenses are applied to the converter layer of the other. The microlenses can be structured in a similar way. In this example, the microlens covers one μ-LED array each, but it can be provided that one lens covers all subpixels of one pixel, e.g. 4 subpixels in an extended color space or with one redundant subpixel in a 2×2 matrix.

In monolithically arranged μ-LEDs, for example in a display, crosstalk can be reduced by reflective interface between the individual pixels or μ-LEDs. At the same time, light is emitted in the main emission direction, thus improving efficiency. The optoelectronic device shown in FIG. 120, which in the example described below is a μ-display array 11, comprises a variety of these proposed optoelectronic devices 13. The optoelectronic devices 13 are further processed μ-LEDs, each of which forms a pixel or subpixel of the μ-display. Although a μ-display arrangement 11 is referred to below, this is only an example and the optoelectronic device is not limited to this example.

Each optoelectronic device 13 has a light source 315, which is a semiconductor device consisting of several semiconductor layers. Because of its dimensions and function, the semiconductor device is also called a μ-LED. Among other things, the semiconductor layers form an active zone for generating light in a manner known per se (not shown). The light sources 315 are arranged in an array on a carrier 17. Due to the array-like arrangement, the light sources 315 form several rows or columns of light sources on the carrier 17.

It may be envisaged that each light source 315 and thus each device 13 emits light at a specific wavelength, i.e. in a specific color, from a number of possible wavelengths or colors. A device 13 that emits light in a certain color can be considered a subpixel of a pixel. The pixel may have further sub-pixels, each of which is formed by adjacent light sources or devices and emits light in the other possible colors.

For example, to create an RGB pixel (RGB for red, green, blue), three light sources 315 can form a pixel, with one of the light sources 315 emitting light in red color, one of the light sources 315 emitting light in green color and one of the light sources 315 emitting light in blue color. In this way, an RGB display arrangement can be formed.

Figure 120:
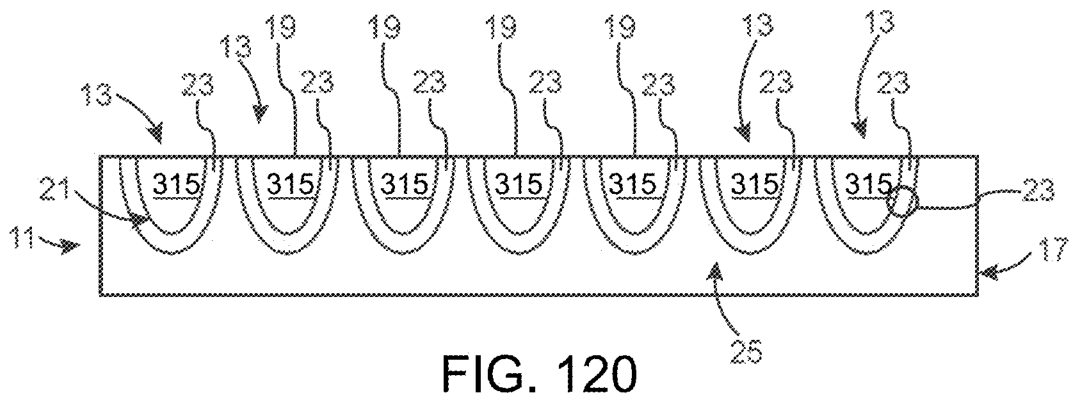

The material 25 of the support 17 surrounds each light source 315 except for its upper surface 19; the light-emitting surface for the light produced is provided on the upper surface 19 of each light source 315 not surrounded by material 25. The light source 315 is functionally separated from the support 25 by an interface 21. The boundary surface 21, as shown in FIG. 120, limits the light source 315 to the sides and downwards and thus comprises the entire outer surface of each light source 315 with the exception of the upper surface 19. In the example shown in FIG. 120, the boundary surface comprises a shape corresponding to the surface of a partial ellipsoid. This is only an example, as other surface shapes are also possible. A parabolic shape of the interface is also conceivable. In both cases, however, light is emitted in the direction of the main emission surface 19, i.e. upwards as shown in the figure.

The material 25 of carrier 17 may have filling material. The material 25 may also include electrical equipment, such as conductive tracks in one or more planes, to supply and control light sources 315 individually with electrical current. The material 25 need not therefore be a homogeneous material, but may be an arrangement of several materials. Additional electronic circuits such as supply or control circuits can be formed in material 25.

For each light source 315, a dielectric reflector 23 is arranged at interface 21, which at least partially reflects the light generated in the active zone of the respective light source 315. The light generated in a light source 315 can therefore not or only slightly escape through the boundary surface 21 into the substrate 21. Rather, the light is, at least to a predominant extent, reflected back into the light source 315 at the interface 21 and travels around in the light source 315 until it is emitted upwards through the light exit surface. The light yield can thus be increased by using the reflector 23.

Figure 121:
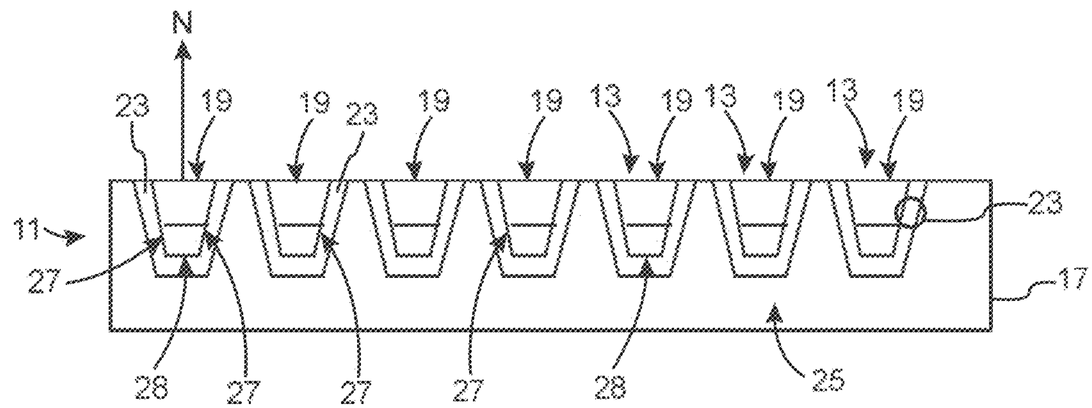

The display arrangement 11 according to FIG. 121 differs from the variant of FIG. 120 mainly in that the light sources 315 have a different, approximately pot-shaped or trapezoidal cross-section. The boundary surface 21 therefore comprises a side surface 27 running around the respective light source 315 in the circumferential direction and a bottom surface 28 opposite the top surface 19. The circumferential direction runs around a normal N, which extends perpendicularly to the upper side 19.

In the display arrangement 11 shown in FIG. 121, a dielectric reflector 23 is arranged on both the side face 27 and the underside 28. A dielectric reflector 23 thus completely surrounds each light source 315 except the top 19. In modified versions, a dielectric reflector 23 may be provided on the side face 27 only or on the bottom face 28 only.

Figure 122:
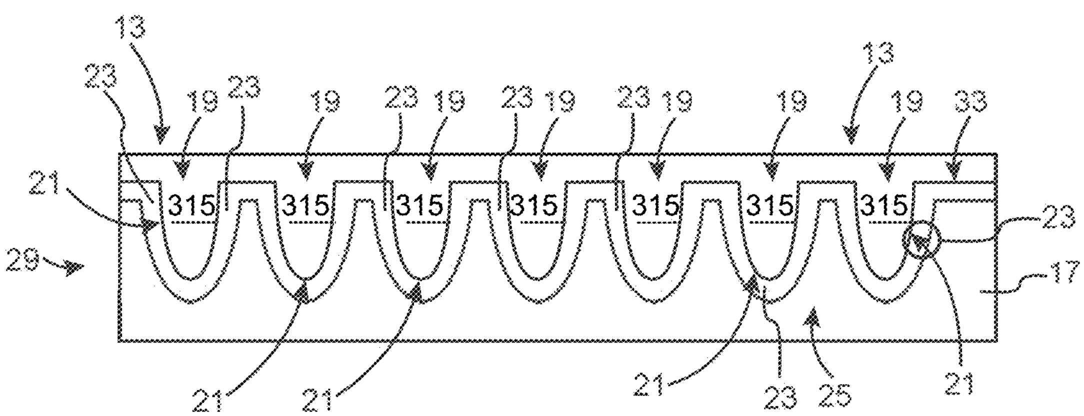
Figure 123:
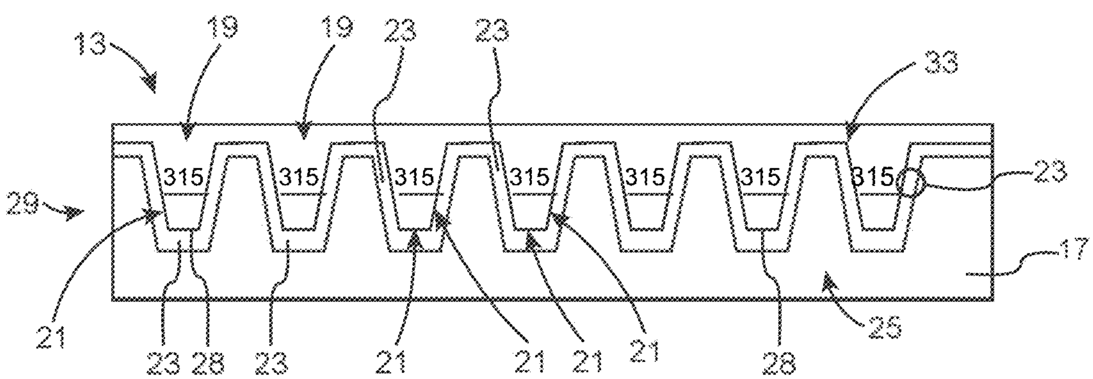

In contrast to FIGS. 120 and 121, which show exemplary variants of display arrangements 11 with a large number of arrayed optoelectronic devices 13, FIGS. 122 and 123 show monolithic arrays 29. The monolithic array 29 shown in FIG. 122 comprises optoelectronic devices 13, which are constructed in the corresponding manner as the optoelectronic devices of FIG. 120. In addition, the monolithic array 29 shown in FIG. 123 comprises optoelectronic devices 13 constructed in the same manner as the optoelectronic devices of FIG. 121. Identical reference marks are therefore used for corresponding elements.

In the variants of FIGS. 122 and 123, a continuous, at least partially transparent top layer 33 may be placed over the light sources 315 and support 17. In addition, the cover layer is conductive and thus forms a common connection for all light sources 315.

Figure 124:
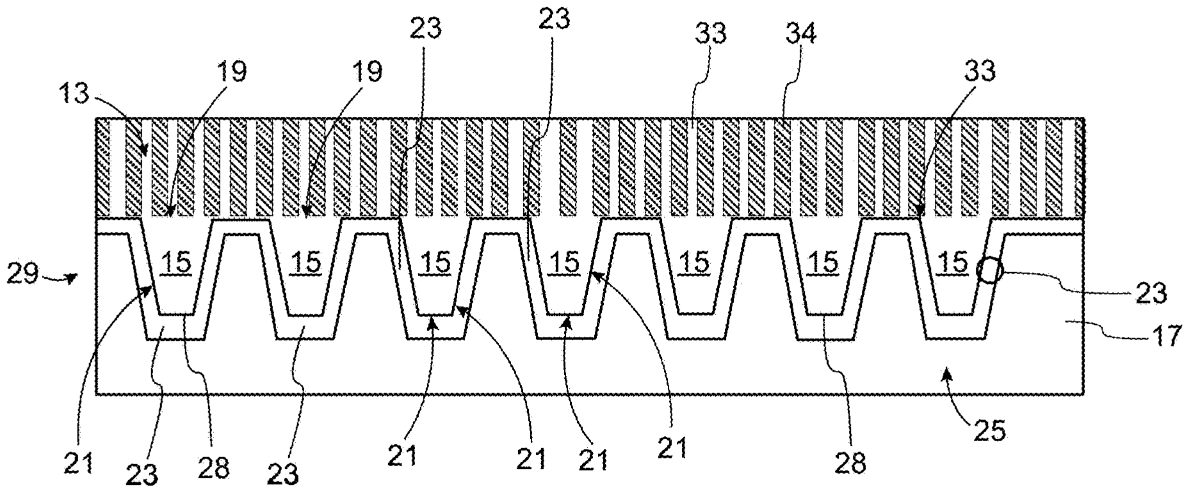

FIG. 124 is a supplement to the embodiment of FIG. 123, where a light-shaping structure is integrated in the upper side 19, and especially in the semiconductor material. The light-shaping structure comprises a periodic arrangement of areas with different refractive indices. This periodic arrangement may be one or more of the structures disclosed in this application. In the version shown, the periodic structure is integrated in the semiconductor material in the surface region. For this purpose, a structure is etched into the semiconductor material, which is then filled with a second material with a different refractive index, thus forming a photonic crystal. It is useful to form the photonic crystal in the semiconductor material itself, because in this way there is no additional refractive index jump between the semiconductor material and the photonic crystal, which would reduce the efficiency in certain cases. The height of the photonic structure is approximately the same as the wavelength, i.e. it is in the range of a few 100 nm, depending on the wavelength of the emitted light in the material. The material in the filled areas should be transparent to keep the light absorption as low as possible. In this context, also converter material, e.g. quantum dots in an emulsion, can be introduced into the etched areas so that the periodic structure has both light shaping and light converting properties.

The example of a light-shaping structure with its different aspects shown here can be transferred to further embodiments of μ-LED arrangements, pixels or even arrays with such.

Figure 125:
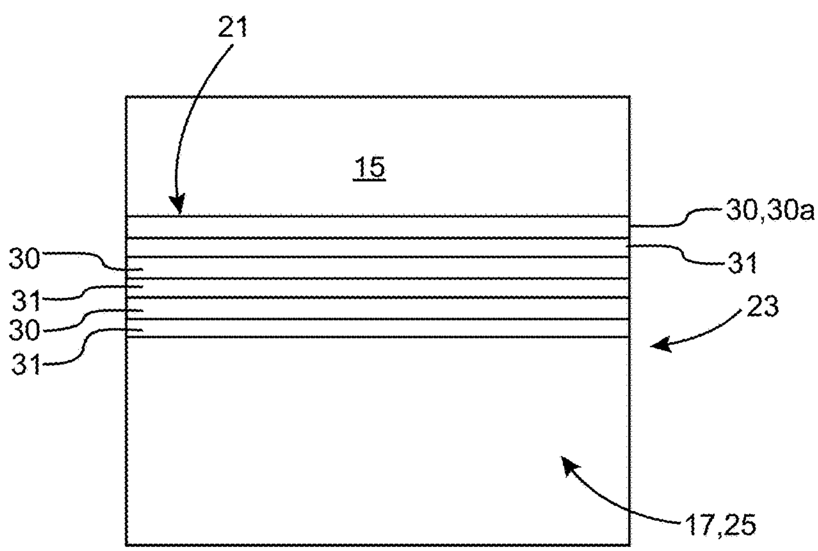

FIG. 125 shows a cross-sectional view of a dielectric reflector 23, which consists of a periodic sequence of two alternately arranged layers 30, 31, located between the interface 21 of the light source 15 and the material 25 of the carrier 17. The layers 30, 31 are each formed by a dielectric, the optical refractive index of the dielectric of the layers 30 being different from the optical refractive index of the dielectric of the layers 31. In the example shown, three layers 30 and three layers 31 are provided, whereby a different number of layers, for example, 1, 2, 3, 4, 5, 6, 7, 8, 9 or 10 layers each, can also be provided. For example, only one high refractive layer can be provided between two low refractive layers. For very small pixels, there may not be enough space for more than one high refractive index layer between two low refractive index layers.

The layers 30, 31 can be arranged to form a Bragg mirror. The maximum reflectivity for the wavelength of the light emitted by the associated light source 15 is achieved when layers 30, 31 have an optical thickness of a quarter of the wavelength. The optical thickness corresponds to the product of the refractive index and layer thickness.

The production of layers 30, 31 can be carried out by means of atomic layer deposition, for example. By deposition in layers, target thicknesses of the individual layers 30, 31 can be achieved precisely. In particular, layers 30, 31 can be made correspondingly thin so that the above condition can be met, according to which layers 30, 31 should have an optical thickness of a quarter of the wavelength. Thus, very efficient reflectors can be produced. The method of atomic layer deposition also allows a uniform overmoulding of the interface 21, so that, for example, even narrow gaps can be lined with a high aspect ratio. In addition, remaining gaps to the carrier material 25 can be filled with filler material.

In a modified embodiment, the first, lowest layer 30*a*, which directly abuts the interface 21, can be deposited using another technology, such as CVD or PE-CVD. This allows unevenness of the interface 21, for example a rough surface resulting from an etching process, to be covered by a more conformal deposition. The remaining layers 30, 31 can then be applied over the smooth layer 30*a* by atomic layer deposition.

In the variants shown in FIGS. 120 to 123, a dielectric reflector 23, as shown as an example in FIG. 125, causes light to be reflected at least partially back into the interior of light source 15, in particular light that strikes the reflector 23 perpendicularly. The light generated in the light source 15 can thus not, or to a lesser extent, escape through the interface 21 to the side and/or downwards into the material 25 of the support 17. The light reflected back remains in the light source 15 and escapes to a large extent upwards through the light exit surface. The light yield can therefore be increased.

The term light is broadly understood herein and refers in particular to electromagnetic radiation produced by a particular light source. In particular, the term light may include not only visible light but also infrared and/or ultraviolet light.

A further aspect is concerned with improving the radiation characteristics of a μ-LED, which comprises a dielectric filter with additional reflecting sides.

FIG. 126 schematically shows a cross-section of an optoelectronic component 10. In the following, the design, function and manufacture of the optoelectronic component 10 are described.

The optoelectronic component 10 contains a pixel 11 with an LED semiconductor element 12 in the form of a μ-LED. The LED semiconductor element 12 contains an active zone 13, which is configured to generate light, and has a height in the range of 1 to 2 μm. The LED semiconductor element 12 has a first main surface 14, a second main surface 15 opposite the first main surface 14, and for example, four side surfaces 16. The side surfaces 16 are each bevelled in the lower area so that they form an angle α of less than 90° with the first main surface 14 in the bevelled area. The active zone 13 is at the level of the bevel.

A layer 17 is arranged on the first major surface 14 of the LED semiconductor element 12, which contains a random or deterministic topology. Alternatively, a corresponding topology can be etched into the first major surface 14 of the LED Semiconductor Element 12.

Above layer 17, another layer not shown in FIG. 126 is deposited, which has a different refractive index than layer 17. Layer 17, in combination with the layer deposited above it, causes light that does not exit from the LED semiconductor element 12 perpendicular to the first main surface 14 to be deflected in other directions, for example by reflection at the interface between layer 17 and the layer above it. In addition, the layer arranged above layer 17 has the function of providing a smooth surface to which dielectric mirror layers can be applied.

Above the layer 17 and the layer above it with the smooth upper surface is a dielectric filter 18, which consists of a stack of dielectric layers and is configured in such a way that it only transmits light components within a predetermined angular cone, while flatter rays are reflected. The angle cone is aligned with its axis perpendicular to the first main surface 14 of the LED semiconductor element 12.

Furthermore, a reflective material 19 is deposited on all side surfaces 16 of the LED semiconductor element 12, which is electrically conductive and consists of a metal, for example. The reflective material 19 is in contact with the n-doped area of the LED semiconductor element 12. Below the second main surface 15 of the LED semiconductor element 12, there is a reflective layer 20, which is also electrically conductive. The reflective layer 20 is in contact with the p-doped area of the LED element 12.

The bevelled side surfaces 16 of the LED semiconductor element 12 are covered by an electrically insulating first material 21. The electrically insulating first material 21 is located between material 19 and layer 20 and provides electrical insulation between the n and p contacts of the LED semiconductor element 12. In addition, the material 21 has a low refractive index to reflect light emerging from the LED element 12 at the tapered side faces 16.

The layer formed from the reflective material 19 is configured in such a way that it completely surrounds pixel 11 in the horizontal direction and extends over the entire pixel 11 in the vertical direction. This means that the reflective material layer 19 extends from the bottom of the electrically insulating first material 21 through the LED semiconductor element 12 to the top of the dielectric filter 18. Any light that exits laterally from the pixel 11 is reflected back through the reflective material 19 so that high directionality light can only exit at the top of the optoelectronic device 10.

FIGS. 127A and 127B schematically show an optoelectronic component 30 in a top view from above and in cross-section. The optoelectronic device 30 contains a large number of pixels 11 as described above. The pixels 11 are arranged in an array and separated from each other by the reflective material 19, which extends through the optoelectronic device 30 in a grid-like manner. An external terminal 31 is provided on one side of the optoelectronic device 30, which allows the n areas of the LED semiconductor elements 12 to be contacted from outside the optoelectronic device 30. In the present embodiment, the anodes of the LED semiconductor elements 12 are connected to each other, which is called common anode arrangement. A common cathode arrangement in which the cathodes are connected to each other is also possible.

The array of pixels 11 is placed on a carrier 32. The carrier 32 comprises a p-contact connector 33 for each p-contact, so that the p-contacts of each of the pixels 11 can be controlled individually, for example by an IC. The optoelectronic device 30 allows a very high pixel density. FIGS. 128A, 128B and 128C show an optoelectronic device 40 in a top view from above and in a cross-sectional view respectively. Two different variants are shown in FIGS. 128B and 128C.

The optoelectronic device 40 contains a plurality of pixels 11, the pixels 11 not being directly adjacent to each other as in the optoelectronic device 30 shown in FIGS. 127A and 273B, but spaced apart. Each pixel 11 in the optoelectronic device 40 is completely covered on its four side surfaces by the reflective material 19. The space between the pixels 11 is filled with an electrically insulating second material 41, for example a moulding material. In the optoelectronic component 40, the LED semiconductor elements 12 are configured as μ-LEDs.

The n-contacts of the μ-LEDs in pixel 11 can be connected to the bottom or top side or between top and bottom side of the optoelectronic device 40. In FIG. 128B, pixel 11 is placed on a carrier 42, which has n-contact connectors 43 integrated into it, connecting the n-contacts of pixel 11. In addition, the carrier 42 comprises a p-contact connector 44 for each p-contact, so that the p-contacts of each pixel 11 can be controlled individually. The carrier 42 can also contain an IC. The spaced-apart arrangement of the LED semiconductor elements 12 in the optoelectronic device 40 also permits contacting in which both the n-contact and the p-contact of each pixel 11 can be individually driven.

FIG. 128C shows an alternative variant, in which a carrier 45 contains only individual p-contact connectors 46 for each pixel 11 arranged on the carrier 45. Of course, P-doped and n-doped layers can also be swapped. On the electrically insulating second material 41, traces 47 are arranged in a grid pattern, connecting the n-contacts of the pixels 11 to each other and leading to an external terminal 48, which is located on one side of the optoelectronic device 40, as shown in FIG. 128A.

FIG. 129A shows an embodiment in which an essentially rectangular semiconductor element or μ-LEL 12 has a 19' dielectric layer formed on two opposite sides. A plan view in FIG. 129B shows that the dielectric elements 19 and 19' are alternately placed around the semiconductor element 12 and the dielectric filter 18. The dielectric elements 19 and 19' are designed differently. Element 19' comprises at least one electrically conductive partial area, for example in the form of a surface along the sidewall of the μ-LED 12 or also in the form of several strips running along the sidewall. Element 19 is not electrically connected to the μ-LED 12 and therefore does not contribute to the power supply of element 12.

The current direction is indicated by the arrow in FIG. 129A. The current flows both to the surface and from there through the dielectric filter 18 into the semiconductor layer to the active region. Alternatively, the conductive portion of the dielectric element is connected to a contact layer on the μ-LED. The contact layer could, for example, be located between the dielectric filter and the μ-LED and be designed as a cover electrode, as shown in FIG. 129A by the thin unmarked layer between elements 12 and 18. In both cases, the contact layer serves to spread the current over the entire surface.

The current flow generates a magnetic field so that charge carriers moving through the layers of μ-LED 12 feel a force towards the center of the structure.

FIGS. 130A and 130B illustrate a configuration, in which the dielectric layer 19 is arranged around a μ-LED, which is essentially cylindrical in shape. The μ-LEDs are monolithic at regular intervals, thus forming a μ-LED array or μ-display. The dielectric element 19 is non-conductive, i.e. the current is conducted to the μ-LEDs through leads arranged on the surface. For this purpose, the lines 32 run between the individual μ-LEDs. Supply lines 33 connect the lines 32 with a conductive dielectric filter 18, which in turn is in electrical contact with one of the semiconductor layers of the μ-LED. In order to keep the current away from the edge region and thus from the dielectric element 19 on the lateral surface of the μ-LED an additional quantum well intermixing is proposed. The design and process of such a quantum well intermixing is shown in this disclosure in several examples. Quantum well intermixing surrounds the active region (shown in FIG. 130B by the slightly wider line) and produces a change in the band gap around the active region. As a result, the charge carriers "see" an energy barrier, which pushes the charge carriers towards the center of the μ-LED 12.

In the following, various devices and arrangements as well as methods for manufacturing, processing and operating as items are again listed as an example. The following items present different aspects and implementations of the proposed principles and concepts, which can be combined in various ways. Such combinations are not limited to those listed below:

1. A light emitting device:

an electrically conductive structure comprising an upper major surface and a lower major surface separated from the upper major surface by a distance;

a cavity in the electrically conductive structure and which has a width and length;

a semiconductor layer stack along the first main direction, which is arranged in the cavity and extends at least over the upper main surface, the semiconductor layer stack having an active area;

a first electrical contact;

a second electrical contact;

the length of the cavity is based substantially on n/2 of a wavelength of light to be emitted during operation, where n is a natural number 2. Light emitting device according to item 1, wherein the active region of the semiconductor layer stack is located between the upper and lower major surfaces within the cavity.

3. Light-emitting device according to any of items 1 to 2, wherein the semiconductor layer stack is arranged substantially in the center of the cavity, in particular with its center at about half the cavity length.

4. Light emitting device according to any of the preceding items, the second electrical contact extending beyond the lower major surface of the electrically conductive structure.

5. Light emitting device according to any of the preceding items, the second contact being an n-contact and the first contact being a p-contact.

6. Light emitting device according to any of the preceding items, wherein the semiconductor layer stack has a diameter of its footprint within the active region which is smaller than a wavelength emitted during operation.

7. Light emitting device according to item 6, wherein the semiconductor layer stack forms a nanowire light emitting device.

8. Light emitting device according to any of the preceding items, wherein the semiconductor layer stack comprises a reflective layer on at least two opposite sides, or the at least two opposite sides face a reflective region of the longitudinal sides of the cavity.

9. Light-emitting device according to any of the preceding items, wherein the cavity, on the side adjacent to the lower major surface, is partially closed, and forms a recess within the electrically conductive structure.

10. Light emitting device according to item 9, wherein the cavity comprises a hole for the semiconductor layer stack to extend therethrough.

11. Light emitting device according to any of the preceding items, wherein the semiconductor layer stack is insulated in the cavity and a space between a part of the semiconductor layer stack and the electrically conductive structure is filled with at least one of:

air or other insulating gas; and insulating material.

12. Light-emitting device according to any of the preceding items, wherein the semiconductor layer stack comprises a passivation applied to its sidewall.

13. Light emitting device according to any of the preceding items, the stack of semiconductor layers extending below the lower major surface 14. Light emitting device according to any of the preceding items objects, wherein the semiconductor layer stack comprises a substantially rectangular base area.

15. Light emitting device according to any of the preceding items, wherein the active region of the semiconductor layer stack comprise a quantum well structure.

16. Light emitting device according to any of the preceding items, further comprising a transparent insulating layer applied at least to the upper major surface of the electrically conductive structure;

a contact layer applied to the transparent insulating layer, which is in electrical contact with the first electrical contact.

17. Light emitting device according to item 16, wherein the transparent insulating layer covers the lower major surface, the second contact of the semiconductor layer stack and the transparent insulating layer forming a substantially flat surface by covering the lower major surface.

18. Light emitting device according to any of items 16 or 17, further comprising a metastructure disposed on the contact layer.

19. Light-emitting device according to any of the preceding items, further comprising at least a color filter mounted above the upper major surface, in particular a band-pass filter for a narrow color range;

a converter mounted above the upper major surface to convert light of a first wavelength to light of a second longer wavelength;

a light-shaping structure arranged above the upper major surface, in particular a dielectric structure, a microlens spanning the cavity or a photonic structure.

20. μ-LED array comprising at least two light-emitting devices according to any of the preceding items, wherein said at least two elements share at least one of the following structures and/or layers the electrically conductive structure;

the transparent insulating layer applied at least to the upper major surface of the electrically conductive structure;

the contact layer applied to the transparent insulating layer;

the color filter placed above the upper main surface; and a converter located above the upper main surface.

21. μ-LED array according to any of the preceding items, wherein the cavities of the at least two light-emitting devices are of substantially equal length.

22. μ-LED array according to any of items 20 to 21, wherein the cavity of one of said at least two light emitting devices is disposed substantially parallel to another of said at least two light emitting devices.

23. μ-LED array according to any of items 20 to 22, wherein the cavity of one of said at least two light emitting arrays is substantially perpendicular to the other of said at least two light emitting devices.

24. μ-LED array according to any of the preceding items, wherein the second contacts of each of the at least two light emitting devices are contacted separately.

25. μ-LED array according to any of the preceding items, wherein the color filter of one of said at least two light emitting arrays is different from a color filter of another of said at least two light emitting devices.

26. μ-LED array according to any of the preceding items, wherein the converter of one of said at least two light emitting arrays is different from a converter of another of said at least two light emitting devices.

27. μ-LED array according to any of the preceding items, further comprising a carrier having at least two contacts for electrically contacting the respective second contacts of the at least two light emitting devices mounted on the carrier.

28. μ-LED array according to any of the preceding items, forming the light emitting device for a light guide device according to one of the following items.

29. μ-LED arrangement according to any of the preceding items, in which contact elements are located on or adjacent to a side opposite the opening of the cavity, and further comprising a carrier with contact areas on an upper side, to which the contact elements for electrical contacting are applied, wherein the carrier has several current drivers or other circuits for supplying power to the semiconductor layer stack.

30. μ-display with a μ-LED array according to any of the preceding items, having features of a control or drive circuit according to any of the following items and features of a light guide device according to any of the following items.

31. Method for producing a μ-LED device, comprising the steps of:

forming pairs of polyhedron or prism shaped coated volumes of material on a growth support; and forming a converter material between the material volumes of a pair to emit a specific color, the converter material matched to this color.

32. Method according to item 31, characterised by Depositing an active layer to the material volumes, and adding an additional layer to this to maintain the coated material volumes.

33. Method according to any of the preceding items, characterised by forming metallization for each pair for electrical contacting of p-contacts with p-contact areas and n-contacts with n-contact areas.

34. Method according to any of the preceding items, characterised by

Forming a growth layer on the growth carrier, which comprises areas free of masking to which pairs of material volumes are grown.

35. Method according to item 34, characterized in that the growth layer comprises an n-doping and especially GaN;

the masking comprises silicon dioxide or silicon nitrogen;

the material volumes comprises the same material as the growth layer;

the active layer comprises In- or Al—GaN-MQW (multi quantum wells)

the additional layer comprises a p-doping and especially GaN.

36. Method according to any of the preceding items, characterised by generating the material volumes with their longitudinal axes parallel to each other and parallel to the growth support and in the same shape as each other.

37. Method according to any of the preceding items, characterised by depositing of first mirror-like metallization, in particular those providing solder, on the sides of the coated material volumes facing away from the growth carrier, whereby the p-contacts, in particular strip-shaped ones, are formed.

38. Method according to any of the preceding items, characterised by depositing a solder metallization layer on a main surface of a flat carrier, wherein the solder metallization layer is connected, in particular bonded, to the first metallization of the material volumes forming the p-contacts.

39. Method according to any of the preceding items, characterised by removing the growth carrier, especially by laser (LLO (Laser-Lift-Off)).

40. Method according to one of the preceding items, characterised by removing the growth layer and the masking, in particular by etching (RIE (reactive ion etching) or ICP (inductively coupled plasma etching)).

41. Method according to any of the preceding items, characterised by depositing, carried out on the side of the removed growth carrier, a passivation layer, in particular comprising $SiO_2$, which in particular completely covers the surfaces of the side.

42. Method according to item 41, characterised by removing, in particular strip-shaped, areas of the passivation layer along the longitudinal axes of the material volumes on their surfaces facing away from the carrier; and depositing second metallization, especially strip-shaped ones, forming n-contacts on the exposed areas of the material volumes.

43. Method according to item 41 or 42, characterised by depositing sidewall mirror metallization at and along the passivation layer vertically out of longitudinal axes of the n-contacts, along a sidewall of the passivation layer perpendicular to the substrate.

44. Method according to item 43, characterised in that the sidewall mirror metallization are produced alternately facing away from and towards each other along a transverse axis with two adjacent coated material volumes.

45. Method according to item 43 or 44, characterised in that a free interspace, along a transverse axis in the case of two adjacent coated material volumes in which the sidewall mirror metallization are produced facing away from each other, is filled by means of the respective converter material.

46. Method according to any of the preceding items, characterised in that an electrical connection is formed at and along the passivation layer from the n-contacts, the sidewall mirror metallization and metallic intermediate connections deposited as third metallization to, in particular strip-shaped n-contact regions deposited as fourth metallization.

47. Method according to any of the preceding items, characterized in that an electrical connection is formed to n-contact regions, in particular strip-shaped n-contact regions deposited as fourth metallization on and along the passivation layer from the n-contacts, the sidewall mirror metallization and metallic intermediate connections deposited as third metallization to n-contact plated-through holes to the other side of the carrier.

48. Method according to any of the preceding items, characterised in that an electrical connection is formed on and along the passivation layer from the n-contacts and the sidewall mirror metallization to n-contact plated-through holes to the other side of the carrier to n-contact areas, in particular strip-shaped n-contact areas deposited as fourth metallization.

49. Method according to any of the preceding items, characterised in that the n-contact vias are electrically insulated by the passivation layer from the solder metallization layer and the substrate.

50. Method according to any of the preceding items, characterised by removing in particular strip-shaped areas of the passivation layer covering the solder metallization layer;

depositing, in particular strip-shaped, fifth metallization on the exposed areas of the solder metallization layer to form a p-contact area, which is electrically connected to the p-contacts by means of the solder metallization layer.

51. Method according to any of the preceding items, characterised by removing, in particular strip-shaped, areas of the carrier covering the solder metallization layer;

depositing, in particular strip-shaped, fifth metallization on the exposed areas of the solder metallization layer to form a p-contact area produced as a p-contact vias to the side of the carrier remote from the material volumes, which is electrically connected to the p-contacts by means of the solder metallization layer.

52. Method according to item 51, characterized in that the p-contact vias are formed in the area of a respective converter material.

53. Method according to any of the preceding items, characterised in that at least some to all metallization comprise the same material, and that, optionally, the second metallization and the sidewall mirror metallization comprise Al or Ag.

54. Pixel arrangement comprising at least one subpixel comprising a pair of two adjacent μ-LEDs spaced apart by a gap, wherein the μ-LEDs are adapted to emit light into the gap;

a converter material arranged inside the gap.

55. Pixel arrangement according to item 54, in which the μ-LEDs comprise the shape of a polyhedron or a prism of coated material volumes and comprise an active layer at least along the side facing the gap.

56. Pixel arrangement according to any of the preceding items, in which the μ-LEDs comprise a reflective layer on the side facing away from the gap 57. Pixel arrangement according to any of the preceding items, in which the μ-LEDs comprise a common terminal layer adapted to supply current to the active layer 58. Pixel arrangement according to item 57, in which the common terminal layer extends below a bottom of the gap isolated from the common terminal layer and/or in which a portion of the common terminal layer extends between the active layer of each μ-LED and the converter material, respectively.

59. Pixel arrangement according to any of the preceding items, in which a contact layer on the side facing away from the interspace extends in the direction of an emission side and there contacts the volume of material for supplying current to the active layer.

60. Pixel arrangement according to any of the preceding items, in which the converter material fills the gap at least up to an upper side of the material volumes.

61. Pixel arrangement according to any of the preceding items, in which a transparent cover layer covers the pair of sub-pixels and the gap between them.

62. Pixel arrangement according to one of the preceding items, further comprising:

two further subpixels, each comprising a pair of two μ-LEDs adjacent and spaced apart by a gap, the μ-LEDs being adapted to emit light into the gap;

a converter material different from the first converter material in at least one of the gaps.

63. Pixel arrangement according to item 62, in which at least one of the contact layers of a μ-LED of a subpixel extending on the side facing away from the gap is opposite a contact layer of a μ-LED of another subpixel.

64. Pixel arrangement according to item 62 or 63, in which the three sub-pixels are arranged substantially parallel to each other; or one sub-pixel is arranged substantially perpendicular to the two remaining sub-pixels.

65. Pixel arrangement according to one of the preceding items, further comprising a photonic structure according to features of one of the following items, which in particular comprises periodic areas of different refractive index.

66. Pixel arrangement according to item 65, in which the photonic structure comprises at least one of the following characteristics:

the photonic structure is a two-dimensional crystal, the photonic structure comprises a superlattice along at least one direction.

67. Pixel arrangement according to any of the preceding items, further comprising a plurality of contact elements on a side facing away from the emission side, which are connected to contact areas of a carrier, the carrier comprising at least one current driver circuit, in particular according to any of the following items, for each pair of μ-LEDs 68. Pixel arrangement according to item 67, further comprising a device for electronically driving a plurality of μ-LEDs according to any of the following items, the μ-LEDs of the device being formed by pairs of μ-LEDs.

69. Pixel arrangement according to any of the preceding items, characterised in that the pixel arrangement has been generated by a method according to one of the previous methods.

70. μ-LED arrangement comprising at least one μ-rod arranged along a carrier, wherein the μ-rod forms an elongated core having a first doping along a longitudinal axis, and the core is coated outwardly from a layer stack from a first longitudinal end to a second longitudinal end free from the layer stack, wherein the at least μ-rod is electrically and mechanically connected at the first longitudinal end to a first contact region of the carrier by means of the layer stack and a first contact, and is electrically and mechanically connected at the second longitudinal end to a second contact region of the carrier by means of the core and a second contact, the layer stack being electrically insulated from the second contact by an insulating layer.

71. μ-LED arrangement according to item 70, wherein the μ-rod for an emission of light of a certain wavelength comprises a geometry adapted thereto, and is constructed in particular as at least one polyhedron, in particular as a prism or parallelepiped, the first longitudinal end terminating in particular as a pyramid, truncated pyramid, obelisk or wedge.

72. μ-LED arrangement according to any of the preceding items, characterised in that the μ-rod for an emission of light of a certain wavelength comprises a spatial extension adapted thereto, in particular a certain diameter perpendicular to the longitudinal axis.

73. μ-LED arrangement according to any of the preceding items, characterised in that the μ-rod is covered by a converter material matched to an emission of light of a certain wavelength.

74. μ-LED arrangement according to any of the preceding items, characterised in that a reflective layer, in particular a layer comprising $TiO_2$ in a silicone matrix, is formed on the μ-rod and/or on the carrier;

or in that a dark, in particular black, layer is formed on the μ-rod and/or on the carrier.

75. μ-LED arrangement according to any of the preceding items, characterised in that a transparent layer, in particular an ITO-jacket, is arranged on the μ-rod and/or on the carrier.

76. μ-LED arrangement according to any of the preceding items, characterised in that a housing is produced on the μ-rod and/or on the carrier, in particular as a casting compound.

77. Pixel element with three μ-LED arrays according to any of the preceding items, in which the three components are electrically and mechanically connected to one another and/or to the carrier in parallel to contact areas of the carrier, the three electronic components being configured to emit light of at least one wavelength.

78. Pixel element according to the preceding item, in which each of the three μ-LED arrangements is configured to emit light and the frequency of an emitted light is different.

79. Pixel element according to any of the preceding items, in which the first longitudinal ends of the μ-rods of the three μ-LED arrays are connected to a common terminal.

80. Pixel element according to any of the preceding items, in which a reflective circumferential structure, in particular a circumferential structure according to features of one of the subsequent items is formed around the three μ-LED arrangements.

81. Pixel element according to item 80, in which the reflecting circumferential structure forms a connection for a contact area at the first or second longitudinal end of the μ-rods of the three μ-LED arrays 82. Pixel element according to any of the preceding items, further comprising a photonic structure, in particular according to features of one of the subsequent items, which is arranged above the μ-LED arrays.

83. Method of manufacturing a μ-LED array comprising the steps of:

Creating a μ-rod which is arranged along a carrier, wherein the μ-rod forms an elongated core having a first doping along a longitudinal axis, and the core has been coated outwardly from a layer stack from a first longitudinal end to a second longitudinal end free from the layer stack, wherein Connecting the μ-rod at the first longitudinal end by means of the layer stack and a first contact to a first contact area of the carrier Connecting the μ-rod at the second longitudinal end by means of the core and a second contact to a second contact region of the carrier, the layer stack being electrically insulated to the second contact by means of an insulating layer.

84. Method according to item 83, wherein the step of generating a μ-rod comprises Creating the layer stack from a core outwards as a first layer comprising the first doping, an active layer and a second layer comprising a second doping.

85. Method according to items 83 or 84, further comprising:

generating a group of, in particular three identical, μ-rods, as in particular decreasing in cross-section perpendicular to the longitudinal axis towards a first longitudinal end and/or terminating at the first longitudinal end with a point or edge or a plane.

86. Method according to any of the preceding items, further comprising generating a group of, in particular three, μ-rods each with different diameters and/or different geometry on the growth substrate, in particular by means of selective epitaxy, such that they are configured to emit light of different wavelengths.

87. Method according to any of the preceding items, comprising:

producing a first transparent contact, in particular a p-contact, at the first longitudinal end of a respective μ-rod remote from the insulating layer, in particular epitaxially and in particular by means of a seed layer photo-structured by means of oxygen plasma etching and/or in particular by means of electroplating or sputtering, wherein at least one contact plane is formed in particular at the first contact.

88. Method according to item 87, further comprising surrounding the group of μ-rods with a connecting layer, in particular a thermoplastic connecting layer, from the first longitudinal end to the insulation layer, the first longitudinal ends temporarily abutting a replacement carrier;

removing a growth substrate.

89. Method according to any of the preceding items, further comprising producing a second transparent contact, in particular an n-contact, at the second longitudinal end of a respective μ-rod facing the insulating layer, in particular by means of electroplating or sputtering, wherein at least two contact planes is formed in particular on the second contact.

90. Method according to any of the preceding items, characterised by transferring the group of μ-rods to a foil; and fixing the second contact of a respective μ-rod, in particular with a contact plane, to the foil.

91. Method according to item 90, further comprising a separating the μ-rods of the group, whereby the compound layer is at least partially removed.

93. Method according to item 90 or 91, further comprising lifting from the film of groups of, in particular three, separated μ-rods, and electrically and mechanically connecting them by means of their first contacts and their second contacts, in particular by means of contact planes, to first contact areas and second contact areas of the carrier, parallel to each other and/or parallel to the carrier.

94. Method according to item 93, characterized in a simultaneously lifting and simultaneously electrical and mechanical connecting of approximately 500 to 1500 groups of μ-rods.

95. μ-LED comprising a three-dimensional light-emitting heterostructure having a first conductive semiconductor layer, an active layer and a second conductive semiconductor layer; characterized in that the light-emitting heterostructure comprises aluminium gallium arsenide and/or aluminium gallium indium phosphide and/or aluminium gallium indium phosphide arsenide; and wherein the light-emitting heterostructure is formed three-dimensionally by growing on a molding layer comprising a {110} oriented side surface selectively epitaxially deposited on a gallium arsenide (111)B epitaxial substrate, wherein optionally a flat top surface {111} may be provided.

96. μ-LED according to item 95, in which the molding layer comprises gallium arsenide and/or aluminium gallium arsenide and/or aluminium gallium indium phosphide and/or a Bragg mirror stack.

97. μ-LED according to any of the preceding items, characterized in that the molding layer is wet-chemically post-processed after selective epitaxial deposition on the gallium arsenide (111)B epitaxial substrate.

98. μ-LED according to any of the preceding items articles in which the shape of the molding layer forms a three-sided pyramid whose side faces comprises the orientation (−1−10), (−10−1) and (0−1−1).

99. μ-LED according to any of the preceding items articles, characterized in that the molding layer comprises a (111) or (−1−1−1) oriented surface.

100. μ-LED according to item 99, in which the molding layer forms a three-sided truncated pyramid, the side faces of which comprise the orientation (−1−10), (−10−1) and (0−1−1) and the top face (10) of which comprises the orientation (−1−1−1).

101. μ-LED according to any of the preceding items, characterized in that a projection of the light-emitting heterostructure onto the gallium arsenide (111)B epitaxial substrate has an edge length of <100 μm and preferably <20 μm.

102. μ-LED according to any of the preceding items, in which the light-emitting heterostructure extends to a dielectric mask deposited on the gallium arsenide (111)B epitaxial substrate for selective epitaxial deposition of the mold layer.

103. μ-LED according to any of the preceding items, characterized in that a transparent contact layer is applied above the light-emitting heterostructure for a main radiation direction in the growth direction of the layer stack.

104. μ-LED according to any of the preceding items, characterized in that for a main radiation direction opposite to the growth direction of the layer stack below the light-emitting heterostructure there is a layer stack with a transparent contact layer applied after the removal of the gallium arsenide (111)B epitaxial substrate and an at least partial removal of the mold layer.

105. μ-LED according to item 104, in which a converter material is applied to the transparent contact layer in a region below or above the active layer in the main radiation direction.

106. μ-LED arrangement according to any of the preceding items, with a μ-LED according to any of the preceding items and further comprising a photonic structure, in particular with features according to one of the subsequent items, which is applied to a surface of the transparent contact layer.

107. μ-LED array according to any of the preceding items, with the photonic structure extending over the conversion layer 108. μ-display arrangement for a wavelength in the range of 560 nm to 1080 nm comprising at least one μ-LED according to any of the preceding items, arranged in particular in rows and columns.

109. Method of producing an optoelectronic semiconductor device, in particular a μ-LED comprising a three-dimensional light-emitting heterostructure with a first conductive semiconductor layer, an active layer and a second conductive semiconductor layer;

characterised in that on a gallium arsenide (111)B epitaxial substrate, a shaped layer having a {110} oriented lateral surface is grown by selective epitaxy; and the light-emitting heterostructure is formed three-dimensionally by growing aluminium gallium arsenide and/or aluminium gallium indium phosphide layers on the mold layer.

110. Method of producing an optoelectronic semiconductor device according to item 109, characterised in that the mold layer is formed by gallium arsenide and/or aluminium gallium arsenide and/or aluminium gallium indium phosphide and/or a Bragg mirror stack.

111. Method of producing an optoelectronic semiconductor device according to one of the items 109 or 110, characterised in that the molded layer is wet-chemically reworked after the selective epitaxial deposition on the gallium arsenide (111)B epitaxial substrate.

112. Method of producing an optoelectronic component, in particular a μ-LED, comprising the steps:

- providing a semiconductor structure comprising a first n-doped layer, a second p-doped layer and an active layer with at least one quantum well disposed therebetween, wherein the p-doped layer comprises a first dopant;
- applying of a structured mask on the semiconductor structure;
- doping of the p-doped layer with a second dopant with first process parameters, so that quantum well intermixing is generated in areas of the active layer over which no area of the patterned mask is located;
- annealing with second process parameters different from the first process parameters, especially without further addition of the second dopant.

113. Method according to item 112, in which the second dopant comprises Zn and comprises the same doping type as the first dopant.

114. Method according to any of the preceding items, in which the second process parameters comprise a temperature greater than a temperature of the first process parameters.

115. Method according to any of the preceding items, in which the first and/or second process parameters comprise at least one of the following parameters:

Temperature;
Temperature change over a defined period;
Pressure;
Pressure change over a defined period of time;
Composition of a gas;
Duration;
Combination of these;

and the first process parameters differ from the second process parameters in at least one parameter other than the duration.

116. Method according to any of the preceding items, in which the mask is formed locally from a suitable layer of the semiconductor structure by a patterning step.

117. Method according to any of the preceding items, wherein the step of curing further comprises:

- adding of a precursor comprising an element from the fifth main group, in particular P or As.

118. Method according to any of the preceding items, in which the second dopant comprises Zn or Mg.

119. Method according to any of the preceding items, in which the semiconductor structure comprises a III-V semiconductor material having at least one of the following material systems:

InP;
GaP;
InGaP;
InAlP;
GaAlP; and
InGaAlP.

120a. μ-LED, μ-LED arrangement, or semiconductor layer stack according to any of the preceding items, in particular items 1 to 107, or one of the subsequent items, which comprises a semiconductor structure that has been produced by a method according to any of the preceding items.

120b. μ-LED, comprising:

- a semiconductor structure comprising a III-V semiconductor material, comprising:
- an n-doped layer,
- a p-doped layer and
- an active layer with at least one quantum well disposed in between,
- wherein the p-doped layer comprises a first dopant;
- a central region in the active layer laterally surrounded by a second region in the active layer whose band gap is greater than that of the central region;

wherein a second dopant is introduced into the second region, which produces quantum well intermixing in the at least one quantum well of the active layer located in the second region.

121 μ-LED, μ-LED arrangement, or semiconductor layer stack according to any of the preceding items, in particular items 1 to 107 or one of the subsequent items, which has a central region in the active layer which is laterally surrounded by a second region in the active layer whose band gap is greater than that of the central region;

wherein a second dopant is introduced into the second region, which produces quantum well intermixing in the at least one quantum well of the active layer located in the second region.

122. μ-LED according to any of the preceding items, in which a patterned mask is arranged on a partial area of the p-doped layer, which is located above the central area in the active layer.

123. μ-LED according to item 122, in which a size of the mask corresponds substantially to a size of the central area.

124. μ-LED according to item 122, in which a layer of a III-valent material of the III-V semiconductor material and an element of a precursor material, in particular P or As, is formed on a surface of the region of the p-doped layer not covered by the mask.

125. Method of producing an optoelectronic component, in particular a μ-LED, comprising the steps:

providing a semiconductor structure, comprising a first n-doped layer, a second p-doped layer and an active layer with at least one quantum well disposed in between, wherein the p-doped layer comprises a first dopant;

applying a structured mask on the semiconductor structure;

doping of the p-doped layer with a second dopant so that quantum well intermixing is generated in areas of the active layer over which no region of the patterned mask is located;

wherein the doping of the p-doped layer with a second dopant is carried out by a gas phase diffusion using a precursor with the second dopant and comprises the following steps:

depositing of the second dopant on the surface of the p-doped layer by decomposition of the precursor at a first temperature selected such that substantially no diffusion of the second dopant into the p-doped layer takes place;

Diffusing of the deposited second dopant into the p-doped layer at a second temperature which is higher than the first temperature 126. Method according to item 125, in which the second dopant comprises Zn or Mg and comprises the same doping type as the first dopant.

127. Method according to any of the preceding items, in which the amount of the second dopant deposited is chosen such that it diffuses substantially completely into the p-doped layer during diffusion.

128. Method according to any of the preceding items, in which the amount of the second dopant is chosen such that in regions of the active layer over which no region of the patterned mask is located, a barrier to the lateral diffusion of charge carriers generated by the second dopant is greater than a barrier caused by quantum well intermixing.

129. Method according to any of the preceding items, wherein doping the p-doped layer with a second dopant comprises the step:

Healing of the semiconductor structure after diffusion of the second dopant into the p-doped layer at a third temperature higher than the second temperature.

130. Method according to any of the preceding items, in which the mask is formed locally by a suitable layer of the semiconductor structure by a structuring step.

131. Method according to any one of the articles 129 to 130, wherein the step comprises curing:

providing a further precursor comprising an element from the fifth main group, in particular P or As and/or Forming a layer of an III-V semiconductor material on the surface of the p-doped layer.

132. Method according to any of the preceding items, in which during the steps of depositing, diffusing and annealing at least one of the following parameters is selected differently:

Temperature change over a defined period of time during one of the above steps;

Pressure;

Pressure change over a defined period of time during one of the above steps;

Composition of a gas;

Combination of these.

133. Method according to any of the preceding items, in which the semiconductor structure comprises a III-V semiconductor material having at least one of the following material systems:

InP;

GaP;

InGaP;

InAlP;

GaAlP; and

InGaAlP.

134. μ-LED, comprising:

a semiconductor structure comprising a III-V semiconductor material, comprising an n-doped layer, a p-doped layer and an active layer with at least one quantum well disposed in between, wherein the p-doped layer comprises a first dopant;

a central semiconductor region in the active layer, laterally surrounded by a second semiconductor subregion in the active layer, the band gap of which is greater than that of the central region;

wherein a second dopant is introduced into the second subregion, which mediates quantum well intermixing in the at least one quantum well of the active layer located in the second subregion;

wherein a barrier for the lateral diffusion of charge carriers is formed in defined regions of the active layer, which barrier is composed of a barrier produced by the second dopant and of a barrier produced by quantum well intermixing.

135. μ-LED according to item 134, where the defined areas are formed by a structured mask applied during manufacture.

136. μ-LED according to item 134, characterized in that the doping barrier produced by the second dopant is greater than the barrier produced by quantum well intermixing.

137. μ-LED according to any of the preceding items, in which a patterned mask is arranged on a first subarea of the p-doped layer, which is located above the central region in the active layer.

138. μ-LED according to any of the preceding items, in which a size of the mask is substantially equal to a size of the central area.

139. μ-LED according to any of the preceding items, in which a layer of a III-valent material of the III-V semiconductor material and an element of a precursor material, in particular P or As, is formed on a surface of a partial region of the p-doped layer lying above the defined region.

140. μ-LED according to any of the preceding items, wherein the active layer is formed by a light-emitting heterostructure of aluminum gallium arsenide and/or aluminum gallium indium phosphide and/or aluminum gallium indium phosphide arsenide, and the light-emitting heterostructure is formed three-dimensionally by growing on a molded layer comprising a {110} oriented side surface selectively epitaxially deposited on a gallium arsenide (111)B epitaxial substrate.

141. μ-LED according to any of the preceding items, in which at least one of the p- and n-doped layers has a cuboid or ingot shape and the active layer extends along at least one sidewall and in particular over two sidewalls and one main side.

142. μ-LED arrangement having a μ-LED and with a photonic structure, in particular having features according to one of the subsequent items, on a side lying in a main emission direction of the μ-LED, and having a contact region on the side opposite the main emission direction.

143. μ-LED arrangement according to item 141, in which the μ-LED is surrounded by a circumferential reflective structure, in particular with features according to any of the preceding items 144. Use of a μ-LED in one of the arrangements following one of the preceding items.

145. μ-LED comprising:

an n-doped first layer, a p-doped second layer doped with a first dopant, an active layer which is disposed between the n-doped first layer and the p-doped second layer and which comprises at least one quantum well;

whereby the active layer is divided into at least two areas, wherein a second region concentrically encloses a first region, and wherein the at least one quantum well in the active region has a larger band gap in the second region than in the first region, and wherein the band gap is modified in particular by quantum well intermixing.

146. μ-LED according to the preceding item, further comprising a second dopant, which is substantially uniformly arranged in the second region.

147. μ-LED according to any of the preceding items, where the second dopant in the second region is in the second p-doped layer, in the active layer and is at least partially formed in a region of the n-doped first layer adjacent to the active layer.

148. μ-LED according to any of the preceding items, wherein the at least two areas are at least approximately circular in shape.

149. μ-LED according to any of the preceding items, wherein the second region comprises a substantially uniform band gap change modified by the quantum well intermixing.

150. μ-LED according to any of the preceding items, wherein the first region comprises substantially no quantum well intermixing.

151. μ-LED according to any of the preceding items, wherein quantum well intermixing decreases in a defined transition region from the second region to the first region.

152. μ-LED according to any of the preceding items, characterised in that the second dopant is different from the first dopant.

153. μ-LED according to any of the preceding items, characterized in that the second dopant is formed from a group comprising at least one of the following elements: Mg, Zn, Cd.

154. μ-LED arrangement with a plurality of μ-LEDs according to any of the preceding items and with a photonic structure arranged on a side lying in a main emission direction, in particular with features according to any of the subsequent items and with a contact area on the side opposite the main emission direction.

155. μ-LED arrangement comprising a plurality of μ-LEDs according to any of the preceding items, in which a photonic structure is formed on a main emission side by a periodic array of columnar elements having a first refractive index surrounded by material having a second refractive index, at least some of the columnar elements being located above the active layer, in particular above the first region.

156. μ-LED arrangement according to item 153, in which at least one of the plurality of μ-LEDs is surrounded by a circumferential reflecting structure, in particular with features according to any of the preceding items.

157. Use of a μ-LED in an arrangement, in particular as a stack of semiconductor layers according to any of the preceding items.

158. Method for producing an optoelectronic component, in particular a μ-LED, comprising the providing a semiconductor structure with an in particular n-doped first layer, a second layer doped with a first dopant, in particular p-doped, and an active layer arranged in between;

applying a substantially circular diffusion mask to the in particular p-doped second layer to define a first, optically active region in the active layer surrounded by a second region of the active layer; and creating a quantum well intermixing in the second area of the active layer.

159. Method according to item 158, wherein the step of generating a quantum well intermixing comprises:

Diffusing of a second dopant into the second in particular p-doped layer, into the active layer in the second region and at least partially into a region of the in particular n-doped layer adjacent to the active layer;

160. Method according to any of the preceding items, wherein, by applying the diffusion mask to the in particular p-doped second layer and by diffusing the second dopant into the second in particular p-doped layer, into the active layer in the second region and at least partially in a region of the in particular n-doped layer adjacent to the active layer, quantum well intermixing takes place only in the second region.

161. Method according to any of the preceding items, whereby the diffusion mask is formed by a dielectric.

162. Method, according to any of the preceding items, characterized in that the second dopant is different from the first dopant.

163. Method, according to any of the preceding items, in which the first layer is p-doped and the second layer is n-doped.

164. Method according to any of the preceding items, characterized in that the second dopant is formed from a group comprising at least one of the following elements: Mg, Zn, Cd.

165. A semiconductor structure comprising:

an n-doped first layer, a p-doped second layer doped with a first dopant, an active layer which is disposed between the n-doped first layer and the p-doped second layer and which has at least one quantum well, wherein the active layer of the semiconductor structure is divided into a plurality of first optically active regions, at least one second region and at least one third region, and wherein said first plurality of optically active regions are spaced apart in a hexagonal pattern, and wherein the at least one quantum well in the active region has a larger band gap in the at least one second region than in the plurality of first optically active regions and the at least one third region, and wherein the band gap is modified in particular by quantum well intermixing, and wherein the at least one second region encloses the plurality of first optically active regions, and wherein said at least one third region is located in the spaces between said plurality of first optically active regions.

166. Semiconductor structure according to the preceding item, wherein the plurality of first optically active regions are at least approximately circular in shape.

167. Semiconductor structure according to any of the preceding items, wherein a plurality of second regions each concentrically encloses one of said plurality of first optically active regions.

168. Semiconductor structure according to any of the preceding items, wherein a plurality of second areas are at least approximately circular in shape.

169. Semiconductor structure according to any of the preceding items, wherein a plurality of third regions are arranged such that each of the plurality of third regions is located in the center of exactly three first optically active regions.

170. Semiconductor structure according to the preceding item, wherein each of the plurality of third regions is at least approximately circular in shape.

171. Semiconductor structure according to item 170, wherein each of the plurality of third regions at least approximately represents the shape of a deltoid curve formed by exactly three of the plurality of second regions, each of which is at least approximately circular.

172. Semiconductor structure according to any of the preceding items, wherein one optically active region each of the plurality of first optically active regions forms part of a respective optoelectronic component.

173. Semiconductor structure according to any of the preceding items, further comprising a second dopant substantially uniformly arranged in at least one second region.

174. Semiconductor structure according to any of the preceding items, wherein the second dopant is present in at least one second region in the second p-doped layer, in the active layer and is at least partially formed in a region of the n-doped layer adjacent to the active layer.

175. Semiconductor structure according to any of the preceding items, wherein said at least one second region has a substantially uniform band gap modified by said quantum well intermixing.

176. Semiconductor structure according to any of the preceding items, wherein the plurality of first optically active regions and the at least one third region have a substantially identical band gap.

177. Semiconductor structure according to any of the preceding items, wherein the plurality of first optically active regions are substantially free of quantum well intermixing.

178. Semiconductor structure according to any of the preceding items, wherein said at least one third region comprises substantially no quantum well intermixing.

179. Semiconductor structure according to any of the preceding items, wherein quantum well intermixing decreases in a defined transition region from the at least one second region to the plurality of first optically active regions.

180. Semiconductor structure according to any of the preceding items, characterised in that the second dopant is different from the first dopant.

181. Semiconductor structure according to any of the preceding items, characterized in that the second dopant is formed from a group comprising at least one of the following materials: Mg, Zn, Cd.

182. Semiconductor structure according to any of the preceding items, further comprising an out-coupling structure, in particular a photonic structure on a side lying in the main radiation direction.

183. μ-LED arrangement having a semiconductor structure according to any of the preceding or following items 184. A method for producing a semiconductor structure comprising, providing a semiconductor structure comprising an n-doped first layer, a p-doped second layer doped with a first dopant and an active layer disposed therebetween;

applying a mask to the p-doped second layer to define a plurality of first optically active regions in the active layer surrounded by at least one second region of the active layer and to define at least one third region located in the spaces between the plurality of first optically active regions;

creating quantum well intermixing in the at least one second region of the active layer.

185. Method for producing a semiconductor structure according to item 184, the step of generating quantum well intermixing comprising:

Diffusing of a second dopant into the p-doped second layer, into the active layer in at least one second region and at least partially into a region of the n-doped layer adjacent to the active layer.

186. Method for producing a semiconductor structure according to any of the preceding items, wherein quantum well intermixing takes place only in the at least one second region by applying the mask to the p-doped second layer and by diffusing the first dopant into the p-doped second layer into the active layer in the at least one second region and at least partially in a region of the n-doped layer adjacent to the active layer.

187. Method for producing a semiconductor structure according to any of the preceding items, whereby the mask is formed by a mask of dielectric (e.g. $SiO_2$, $Si_3N_4$, . . . ).

188. Method for producing a semiconductor structure according to any of the preceding items, characterized in that the second dopant is different from the first dopant.

189. Method for producing a semiconductor structure according to any of the preceding items, characterized in that the second dopant is formed from a group comprising at least one of the following elements: Mg, Zn, Cd.

190. Method for producing a semiconductor structure according to any of the preceding items or an optoelectronic device, in particular a μ-LED according to any of the preceding items, further comprising:

applying of a photonic structure, in particular a photonic structure with features according to any of the preceding items on a side of the semiconductor structure or the optoelectronic component lying in the main emission direction.

191. Method for producing optoelectronic devices from a semiconductor structure according to any of the preceding items, comprising, separating, especially by an etching process of the individual optoelectronic components.

192. μ-LED, or optoelectronic device, comprising a stack of layers in which layers extending along an X-Y plane are stacked together along a Z-axis perpendicular to the X-Y plane;

wherein a main direction of movement of charge carriers, in particular electrons, runs along the Z-axis of the layer stack; wherein a magnetizing element provides magnetic field lines by means of which the moving charge carriers are kept away from edge regions of X-Y cross-sectional areas of the layer stack.

193. μ-LED according to any of the preceding items, in particular according to any of the items 120a to 191, wherein a main direction of movement of charge carriers, in particular electrons, along a Z-axis passes through the μ-LED;

and a magnetizing element provides magnetic field lines by means of which the moving charge carriers are kept away from edge regions of X-Y cross-sectional areas of the layer stack.

194. μ-LED according to item 193, characterized in that the magnetizing element of at least one part along the Z-axis of the stack of layers providing magnetic field lines along the X-Y plane.

195. μ-LED according to item 193 or 194, characterized in that the magnetization element in the region of an active layer and/or against the main direction of movement of the charge carriers in a region in front of the active layer provides the magnetic field lines running towards a pole of a magnetic dipole, in particular south pole, or along the Z-axis.

196. μ-LED according to any of the preceding items, characterized in that the magnetising element provides the magnetic field lines in the edge regions of the X-Y cross-sectional surfaces of the layer stack, or that the magnetising element is arranged on at least two opposite side surfaces of the layer stack.

197. μ-LED according to one of the items 194 to 196, characterized in that the magnetizing element has a number of current lines on a lateral surface of the layer stack, wherein a current flow of one current line at a time is provided antiparallel to the current flow through the μ-LED.

198. μ-LED according to item 197, characterized in that the number of current lines runs along the Z-axis, circulates the stack of layers along an X-Y plane and, in particular, four, six or eight current lines are formed.

199. μ-LED according to item 197 or 198, characterized in that the current lines are generated in stripes.

200. μ-LED according to any of the preceding items, characterized in that the magnetizing element is provided by means of a number of permanent magnet dipoles rotating the layer stack along an X-Y plane, in particular arranged in the region of the active layer and/or against the main direction of movement of the charge carriers in a region in front of the active layer; and/or in that the magnetizing element is created by means of a number of electromagnets circulating the layer stack along an X-Y plane, in particular arranged in the region of the active layer and/or against the main direction of movement of the charge carriers in a region in front of the active layer, the current flow of which electromagnets is provided in particular by means of the current flow through the optoelectronic component; and/or in that the magnetizing element was deposited as a magnetic material, in particular manganese, circulating the layer stack along an X-Y plane in the region of an active layer and/or against the main direction of movement of the charge carriers in a region in front of the active layer on a lateral surface of the layer stack and magnetized by means of an external magnetic field.

201. μ-LED according to any of the preceding items, characterized in that the layer stack has an electrically insulating and/or passivating coating.

202. μ-LED according to any of the preceding items, characterized in that the stack of layers on a carrier comprises a first layer on which an active layer is produced, to which a second is attached, wherein in particular a first contact is formed on a surface region of the second layer facing away from the support, and wherein in particular a second contact is formed by means of the carrier on the first layer.

203. μ-LED according to item 202, characterized in that the first layer is n-doped and the second layer is p-doped, and in particular the first contact is provided as anode and the second contact as cathode.

204. μ-LED according to any of the preceding items, in which the magnetizing element has dielectric properties so that light generated in the layer stack is reflected by the magnetizing element.

205. Method for reducing non-radiative recombination, in particular in the region of an active layer of a μ-LED, in which layers extending along an X-Y plane are stacked together along a Z-axis perpendicular to the X-Y plane;

wherein a main direction of movement of charge carriers runs along the Z-axis;

wherein by means of a magnetizing element a provision of magnetic field lines is carried out, by means of which the charge carriers are kept away from edge regions of X-Y cross-sectional areas of the layer stack.

206. Method according to any of the preceding items characterized by forming a number of current lines on a lateral surface of the layer stack in such a way that a current flow of one current line in each case flows antiparallel to the current flow through the optoelectronic component.

207. Method according to any of the preceding items, characterised by forming of a number of permanent magnet dipoles on a lateral surface of the layer stack.

208. Method according to any of the preceding items characterised by forming a number of electromagnets on a lateral surface of the layer stack. 209. Method according to any of the preceding items, characterised by forming of a magnetic material on a lateral surface of the stack of layers.

210. Method for producing at least one optoelectronic component, in particular a μ-LED arrangement, comprising the following steps:

generating a first contact area and a second contact area on a surface of a substrate 1, wherein a light emitting body is vertically created and its first contact is connected to the first contact area;

generating of a reflector structure surrounding the light-emitting body at a distance generating a first metal mirror layer and a second metal mirror layer, wherein the first metal mirror layer electrically connects a contact layer attached to a second contact of the light-emitting body to the second contact region, and the second metal mirror layer is formed on the circumferential reflector structure.

211. Method according to item 210, further comprising: applying of a planarization layer to form the reflector structure; and optional removal of the planarization layer over the second contact area, so that it remains openly accessible for the first metal mirror layer 212. Method according to item 211, comprising:

structuring of the planarization layer to form the reflector structure, which encloses the light-emitting body in a mechanically contacting manner;

applying of the electrically connecting first metal mirror layer additionally to the reflector structure, especially electrically conductive to the second metal mirror layer.

213. Method according to item 212, in which the enclosure frames the light-emitting body at a distance, in particular greater than five times the edge length of the light-emitting body.

214. Method according to item 212, comprising applying of the second metal mirror layer on the main surface of the reflector structure facing away from the substrate.

215. Method according to any of the preceding items, characterised by applying the second metal mirror layer to the edges of the reflector structure.

216. Method according to item 215, in which a light extraction is adjusted by an angle of inclination of the edges of the reflector structure.

217. Method according to item 216, comprising a generating the edges of the reflector structure in such a way that the circumference of the reflector structure increases with increasing distance from the substrate; or generating the edges of the reflector structure in such a way that the circumference of the reflector structure decreases with increasing distance from the substrate.

218. Method according to any of the preceding items, further comprising applying a black layer, in particular an encapsulation layer, to the substrate, between edges of reflector structures, in particular up to the height of the edges.

219. Method according to any of the preceding items, further comprising applying and optional structuring of a coating for sealing, encapsulation and/or optical coupling to the substrate or to the black layer, in particular up to a height above the first metal mirror layer.

220. Method according to any of the preceding items, in which the layers are structured in the middle by means of photolithography.

221. μ-LED arrangement comprising:

a light-emitting body, wherein said light emitting body is vertically generated and a first contact of said light emitting body is connected to a first contact area on one side of a substrate;

on the same side of the substrate, a second contact of the light-emitting body remote from the substrate is connected to a second contact region by means of a transparent contact layer and a first metal mirror layer;

a reflector structure surrounding the light emitting body, a second metal mirror layer being attached to the reflector structure.

222. μ-LED arrangement according to item 221, wherein the reflector structure encloses the light-emitting body in mechanical contact along the X-Y plane, and in particular the first metal mirror layer is electrically conductive to the second metal mirror layer.

223. μ-LED arrangement according to item 221 or 222, characterized by an enclosure which encloses the light-emitting body in a mechanically contacting manner, and the reflector structure frames the enclosure at a distance, in particular between 1 and 10 times, in particular more than five times of the edge length of the light-emitting body, the first metal mirror layer and the contact layer being additionally attached to the enclosure.

224. μ-LED arrangement according to any of the preceding items, in which three light-emitting bodies each form a sub-pixel of a pixel.

225. μ-LED arrangement according to any of the preceding items, in which the transparent contact layer is a transparent cover electrode extending over the light-emitting body to a top surface of the reflector structure.

226. μ-LED arrangement according to any of the preceding items, further comprising a converter material disposed at least partially over the light-emitting body.

227. μ-LED arrangement according to any of the preceding items, further comprising a light-shaping structure, in particular a microlens or a photonic structure having first and second regions of different refractive index, wherein one of the first and second regions extends at least partially into or is formed by the semiconductor material of the light-emitting body or is formed by the converter material.

228. μ-LED arrangement according to any of the preceding items, in which a cavity is formed by the circumferential reflector structure, in which the light-emitting body is arranged and a remaining space in the cavity is filled with a converter material, in particular of quantum dots.

229. μ-LED display having a plurality of μ-LED arrangement according to any of the preceding items or which have been produced by any of said methods and are arranged in rows and columns in a pixel array, a plurality of pixels each being surrounded by the reflector structure, the sidewalls of which are bevelled and provided with a metal mirror layer.

230. Pixel with a μ-LED arrangement according to any of the preceding items with three vertically arranged light emitting bodies surrounded by a reflector structure arranged on a carrier substrate.

231. Pixel for generating a pixel of a display, comprising:

a μ-LED arrangement according to any of the preceding items articles, in particular any of articles 221 to 229, wherein a conductor track is provided on the second contact layer forming the contacting layer, which track is electrically connected to the contacting layer over its surface;

wherein the electrical conductivity of the conductive path is greater than an electrical conductivity of the contacting layer.

232. Pixel for generating a pixel of a display, comprising a flat carrier substrate;

at least one μ-LED, which is arranged on the carrier substrate wherein at least one μ-LED is adapted to emit light transverse to a carrier substrate plane in a direction away from the carrier substrate;

wherein the at least one μ-LED has an electrical contact on its upper side directed away from the carrier substrate;

wherein the pixel has an at least partially electrically conductive flat contacting layer on the upper side of the at least one μ-LED, which is electrically connected to the electrical contact of the at least one μ-LED;

wherein the contacting layer is at least partially transparent for the light emitted by the at least one μ-LED;

wherein a conductor track is provided on the contacting layer, which is electrically connected to the contacting layer over its entire surface;

wherein the electrical conductivity of the conductive path is greater than an electrical conductivity of the contacting layer.

233. Pixel according to item 231 or 232, wherein the conductor track is arranged between two μ-LEDs arranged adjacent on the carrier substrate outside a primary emission area.

234. Pixel according to item 231 or 232, wherein the conductor track is configured to absorb and/or reflect light components outside the primary emission range for beam-shaping of the at least one μ-LED.

235. Pixel according to any of the preceding items, wherein the conductor track has a light-absorbing layer on its side facing the carrier substrate.

236. Pixel according to any of the preceding items, wherein the conductor track extends over a plurality of μ-LEDs in area and recesses are provided on the conductor path in the region of the respective primary emission areas of the μ-LEDs for passing the light emitted by the respective μ-LEDs.

237. Pixel according to any of the preceding items, the conductor track being deposited on a side of the contacting layer facing away from the carrier substrate.

238. Pixel according to any of the preceding items, wherein the conductor track is deposited on a side of the contacting layer facing the carrier substrate.

239. Pixel according to item 238, where the conductor track is applied to the carrier substrate.

240. Pixel according to any of the preceding items, wherein the at least one μ-LED is disposed in a cavity of the carrier substrate and the conductive path is disposed outside the cavity.

241. Pixel according to any of the preceding items, where a converter material is arranged in the cavity.

242. Pixel according to any of the preceding items, wherein a connecting element for electrically connecting the contacting layer to a terminal element of the carrier substrate is provided at the pixel element.

243. Method of manufacturing pixel elements for producing a display, comprising providing a flat carrier substrate and generating a plurality of light-emitting components, in particular μ-LEDs on the carrier substrate, each with an electrical contact on the upper side facing away from the carrier substrate;

applying of an at least partially electrically conductive flat contacting layer which is electrically connected to the electrical contacts of the plurality of light-emitting components;

wherein the contacting layer is at least partially transparent for the light emitted by the plurality of light-emitting components;

providing a conductor track on the contacting layer, which is electrically connected to the contacting layer over the entire surface;

wherein the electrical conductivity of the conductive path is greater than an electrical conductivity of the contacting layer.

244. μ-LED arrangement comprising a substrate and at least one μ-LED raw chip fixed to one side of the substrate, which has a first electrical contact on a side facing away from the substrate, which is electrically connected by means of a mirror coating to an electrical control contact on the surface of the substrate, and wherein the mirror coating at least partially covers the substrate surface facing the at least one chip.

245. μ-LED arrangement according to item 244, further comprising:

a transparent cover electrode, which extends over the electrical contact and connects it to the mirror coating, the mirror coating being arranged at least partially below the cover electrode and spaced therefrom.

246. μ-LED arrangement according to any of items 244 and 245, in which the control contact is not located below the cover electrode, and the mirror coating at least one area is not located below the cover electrode.

247. μ-LED arrangement according to any of the preceding items, in which the mirror has a metal mirror, in particular comprising at least one of the following metals: Al, Ag, AgPdCu, Nd, Nb, La, Au, Cu, Pd, Pt, Mg, Mo, Cr, Ni, Os, Sn, Zn and combinations of the above.

248. μ-LED arrangement according to any of the preceding items, wherein the cover electrode has an electrically conductive oxide layer, in particular a material comprising IGZO, metal oxides, zinc oxide, tin oxide, cadmium oxide, indium-doped tin oxide (ITO), aluminium-doped (AZO), $Zn_2SnO_4$, $CdSnO_3$, $ZnSnO_3$, $In_4Sn_3O_{12}$ or mixtures of different transparent conductive oxides.

249. μ-LED arrangement according to any of the preceding items, wherein the substrate comprises a border at least partially surrounding the at least one μ-LED raw chip, on the upper side of which border the mirror coating is arranged, which there is electrically connected to the cover electrode surface.

250. μ-LED arrangement according to any of the preceding items, wherein the substrate has a cavity in which the at least one μ-LED raw chip is disposed, the cavity having a depth substantially equal to a height of the at least one μ-LED raw chip.

251. μ-LED arrangement according to any of the preceding items, in which an insulating planar isolation layer is provided around the μ-LED raw chip, the height of which is substantially less than or equal to a height of the μ-LED raw chip.

252. μ-LED arrangement according to any of the preceding items, in which the insulating planar isolation layer, at least partially between the cover electrode layer and the mirroring layer, extends in particular above the substrate between μ-LED chip and surrounding border.

253. μ-LED arrangement according to one of the items 239 to 252, in which mirroring extends at least partially on a side surface of the border facing the μ-LED raw chip, and the side surface in particular extends at a bevelled angle to the surface of the substrate.

254. μ-LED arrangement according to any of the preceding items, wherein direct electrical contact of the cover electrode with the mirror coating is provided by means of a via or via of the mirror coating material through the insulating layer.

255. μ-LED arrangement according to any of the preceding items, wherein the insulating layer is chamfered at a distance from the μ-LED raw chip in at least one region and the cover electrode extends in the direction of the mirroring thereof.

256. μ-LED arrangement according to item 255, in which the edges of the bevelled area have a flat pitch angle.

257. μ-LED arrangement according to any of the preceding items, in which the μ-LED raw chip has a second electrical contact directly connected to a contact on a surface of the substrate.

258. Pixel with a μ-LED arrangement according to any of the preceding items, in which a red, a green and a blue light-providing μ-LED raw chip is fixed on the substrate, the first electrical contacts of which are connected to the conductive reflective layer via a transparent conductive cover electrode.

259. Pixel according to item 258, in which the μ-LED raw chips are surrounded by a common border or arranged in a common cavity.

260. Pixel according to any of the preceding items, in which areas on the substrate between the μ-LED raw chips are at least partially covered with a reflective layer, in particular the mirror layer.

261. Pixel according to any of the preceding items, in which the μ-LED raw chips are embedded in a transparent and non-conductive material.

262. Pixel according to any of the preceding items, in which the substrate has leads configured to individually control each of the μ-LED die.

263. Pixel according to any of the preceding items, in which the substrate has TFT structures and electrical leads for an individual power supply to each μ-LED raw chip.

264. Pixel according to any of the preceding items, further comprising a light-shaping patterned layer on or in the transparent cover electrode, which has a lenticular element, a photonic crystal or a quasi-crystal structure and is adapted to suppress or reduce light emitted parallel to a surface of the substrate.

265. Pixel according to any of the preceding items, in which the transparent cover electrode is structured, in particular to collimate and radiate light in a direction away from the substrate surface, or to couple out light.

266. Pixel according to any of the preceding items, in which a converter material for light conversion is arranged at least above and/or around one of the μ-LED raw chips, wherein the converter material can be electrically insulated from the transparent cover electrode in particular by an insulating layer.

267. μ-display module with a large number of pixels according to any of the preceding items, arranged in rows and columns and individually controllable.

268. μ-display module according to item 267, in which pixels arranged in a row have a common cover layer and a common electrical control contact.

269. μ-display module according to any of the preceding items, in which the μ-pixels are separated from each other by a raised area on the substrate.

270. μ-display module according to any of the preceding items, wherein the substrate has a plurality of cavities separated from one another, one of the plurality of μ-pixels being located in each of the cavities.

271. μ-display module according to the preceding item, in which a converter material for light conversion, in particular with quantum dots, is incorporated in at least some cavities.

272a. μ-display module according to any of the preceding items, in which sidewalls of the elevation or the sidewalls between the cavities comprise a reflective layer, especially the mirror coating.

272b. μ-display module according to any of the preceding items, in which the substrate comprise conductive structures, in particular according to any of the preceding or subsequent items, which are configured to address and drive the μ-pixels individually.

273a. method for producing a μ-pixel comprising the steps of:

- providing a substrate with a number of contacts on the surface;
- attaching at least one μ-LED raw chip to one of the contacts, the μ-LED raw chip having a further contact on its side facing away from the substrate surface;
- providing a reflective layer on the substrate surface, which is electrically connected to an electrical control contact on the surface of the substrate and at least partially covers the surface;

forming of a transparent cover electrode on the further contact, which electrically contacts the reflective layer.

273b. Method according to any of the preceding items, in which the substrate has an elevation which at least partially surrounds the at least one μ-LED raw chip.

273c. Method according to any of the preceding items, wherein the mirror coating is applied at least partially to sidewalls of the elevation or cavity, in particular those facing the μ-LED raw chips.

273d. Method according to any of the preceding items, further comprising:

- depositing a transparent insulating layer on the substrate surface and surrounding the at least one μ-LED raw chip;

wherein the cover electrode is deposited on the transparent insulating layer.

273e. Method according to any of the preceding items, further comprising at least one of the following steps:

- forming an overlapping contact of the cover electrode surface and a mirroring surface in the area of the elevation or at the end of the cavity remote from the at least one μ-LED raw chip; or
- forming a through hole through a transparent insulating layer, and filling the through hole so that the cover electrode contacts the reflective layer thereover; or
- applying of a conductive connection on bevelled sides of the transparent insulating layer, which contacts the transparent cover electrode with the reflective layer.

273f. Method according to any of the preceding items, further comprising:

- mirroring of a part of the substrate surface between the μ-LED raw chips, in particular applying of the mirroring layer substrate surface between the μ-LED raw chips 273g. Method according to any of the preceding items, further comprising:

forming a patterned layer on the transparent cover electrode having a photonic crystal or quasi-crystal structure and adapted to suppress or reduce light emitted parallel to a surface of the substrate.

273h. Method according to any of the preceding items, further comprising:

structuring of the transparent cover electrode, in particular to collimate light and emit it directed away from the substrate surface, or to couple out light.

273i. Method according to any of the preceding items, further comprising:

applying of a converter material for light conversion over at least one of the μ-LED raw chips, the converter material being electrically insulated from the transparent cover electrode in particular by an insulating layer.

274. μ-LED device comprising:

a carrier substrate;

a column connected at least indirectly to the carrier substrate and pointing in a longitudinal direction from the latter, in particular a nanopillar with a semiconductor sequence, which comprises at least one active layer, wherein the active layer is formed for the emission of electromagnetic radiation and is arranged such that at least part of the radiation emission is transverse to the longitudinal direction;

characterised in that a reflector device is arranged on the carrier substrate laterally to the column, which deflects the radiation emission transversely to the longitudinal direction at least partially into a main radiation direction running parallel to the longitudinal direction.

275. μ-LED device according to item 274, characterized in that the reflector device comprises a first reflective optical element and a second reflective optical element arranged on different sides of the column.

276. μ-LED device according to any of the preceding items, characterized in that the reflector device is arranged between two columns.

277. μ-LED device according to any of the preceding items, characterized in that the reflector device comprises a shaped layer monolithically formed with a layer of the semiconductor sequence of the column.

278. μ-LED device according to any of the preceding items, characterized in that the reflector device comprises a metallic reflective layer and/or a Bragg mirror.

279. μ-LED device according to any of the preceding items, characterized in that the reflector device comprises a Fresnel lens array.

280. μ-LED device according to any of the preceding items, characterized in that a wavelength conversion element is arranged in the beam path between the column and the reflector device.

281. μ-LED device according to item 280, characterized in that a first wavelength conversion element associated with a first column is applied for emitting electromagnetic radiation, which is spectrally different from the emission of a second wavelength conversion element associated with a second column.

282. μ-LED device according to item 280 or 281, in which the wavelength conversion element comprises a converter material, in particular an inorganic dye or quantum dots.

283. μ-LED device according to any of the preceding items, characterized in that the reflector device comprises an optical separation element arranged between adjacent columns.

284. μ-LED device according to any of the preceding items, in which the reflector arrangement in plan view is formed as a four-sided pyramid and the side surface of each of which faces a column.

285. μ-LED device according to any of the preceding items, characterized in that the μ-LED device comprises a plurality of columns and a plurality of reflector devices disposed on the carrier substrate adjacent the columns, the columns and the reflector devices forming a matrix array.

286. μ-LED device according to any of the preceding items, further comprising a light-shaping structure, in particular a microlens or a photonic structure, extending across the column towards the reflector structure, in particular towards the reflector structure on each side 287. μ-LED device according to any of the preceding items, in which the light-shaping structure extends at least partially into the column and/or reflector structure.

288. Method for producing a μ-LED device comprising the steps:

applying of at least one column, in particular a nanopillar with an at least indirect connection to a carrier substrate, wherein the nanopillar comprises a semiconductor sequence with at least one active layer formed for the emission of electromagnetic radiation; and wherein the active layer is applied so that at least part of the radiation emission is transverse to the longitudinal direction, characterised in that a reflector device is arranged on the carrier substrate laterally to the nanopillar, which redirects the radiation emission transversely to the longitudinal direction at least partially into a main radiation direction running parallel to the longitudinal direction.

289. Method according to item 288, characterized in that at least one form layer of the reflector device and/or a layer of the semiconductor sequence of the column are structured photolithographically.

290. Method according to item 289, characterized in that at least one shaped layer of the reflector device is structured by an anisotropic etching process and an etch stop layer is used between the shaped layer and the column.

291. Method according to any of the preceding items, characterized in that a shaped layer of the reflector device and/or a layer of the semiconductor sequence of the column is grown epitaxially.

292. Method according to any of the preceding items, characterized in that at least one reflector surface of the reflector device is formed by a nano-stamping process.

293. Method according to any of the preceding items, further comprising introducing a converter material into a space between the reflector structure and the column, the converter material comprising in particular an inorganic dye and/or quantum dots.

294. Method according to any of the preceding items, further comprising depositing and subsequent patterning a layer over the column and reflector structure to produce a light-shaping structure.

295. Method according to the preceding item in which microlenses are formed over the column and reflector structure.

296. μ-displays having a plurality of μ-LED devices according to any of the preceding items, wherein columns of the plurality of μ-LED arrays are arranged in rows and columns.

297. An optoelectronic device, in particular a display device or headlamp, comprising at least one light source with a semiconductor layer sequence, which comprises an active zone for generating light wherein a light exit surface for the generated light is formed on an upper side of the light source, wherein the light source comprises, in addition to the upper side, at least one further boundary surface which delimits the light source to the side and/or downwards, characterised in that a dielectric reflector is arranged at the interface, which is configured to reflect the generated light.

298. Optoelectronic device according to item 297, characterised in that the interface has a lateral surface circumferentially surrounding the light source and a lower surface, the lower surface being opposite the upper surface.

299. Optoelectronic device according to item 298, characterised in that the dielectric reflector is arranged exclusively on the lateral surface or exclusively on the underside, or in that the dielectric reflector is arranged both on the side surface and on the underside.

300. Optoelectronic device according to any of the preceding items, characterized in that with the exception of the upper side, the dielectric reflector is arranged over the entire boundary surface bounding the light source.

301. Optoelectronic device according to any of the preceding items, characterized in that the dielectric reflector is formed on two opposite side faces of the light source.

302. Optoelectronic device according to any of the preceding items, characterized in that the dielectric reflector comprises a sequence, in particular a periodic or non-periodic sequence, of two alternating layers of material, which have different refractive indices.

303. Optoelectronic device according to any of the preceding items, in which the dielectric reflector is configured with at least one contacting conductive layer, which electrically connects a contact of the light source in such a way that a current direction within the semiconductor layer sequence, is opposite to a current direction through the conductive layer.

304. Optoelectronic device according to item 301, in which the conductive layer is substantially parallel along a lateral surface of the semiconductor layer sequence 305. Optoelectronic device according to any of the preceding items 302 to 304, in which the contacting conductive layer of the dielectric reflector is formed on two opposite side surfaces and a dielectric reflector without such a contacting conductive layer is formed on the other two side surfaces.

306. Optoelectronic device according to any of the preceding items, characterized in that the thickness of the layers of material is adapted to a wavelength of the emitted light in such a way that the dielectric reflector reflects light of that wavelength.

307. Optoelectronic device according to any of the preceding items, characterized in that the dielectric reflector is configured as a Bragg mirror.

308. Optoelectronic device according to any of the preceding items, further comprising:

a converter material on the light-emitting surface, wherein the converter material comprises an inorganic dye or quantum dots.

309. Optoelectronic device according to any of the preceding items, further comprising a light-shaping structure on the light-emitting surface, in particular a photonic structure or a microlens.

310. Optoelectronic device according to the preceding item, in which the light-shaping structure comprises at least one of the following characteristics:

the light-shaping structure comprises periodic regions of different refractive index;

the light-shaping structure comprises first and second regions of different refractive index; wherein converter material forms the first regions; and the light-forming structure is at least partially formed in the semiconductor layer sequence.

311. μ-display array or monolithic array or headlight array, comprising a plurality of optoelectronic devices according to any of the preceding items, the light sources of the optoelectronic devices being arrayed.

312. μ-display arrangement according to any of the preceding items, characterized in that the light sources of the optoelectronic devices are embedded in a carrier, in particular in such a way that only the light exit surfaces of the light sources constitute free, external surfaces, while the remaining interfaces of the light sources are surrounded by material of the carrier.

313. Method for producing an optoelectronic device, in particular a display device or headlamp, in which:

an optoelectronic light source based on semiconductor materials is provided, the light source having an active zone for generating light and a light exit surface for the generated light at an upper side, and a dielectric reflector is arranged at an interface of the light source, preferably not comprising the upper side, which is designed to reflect the light generated, the interface delimiting the light source laterally and/or downward.

314. Method for producing an optoelectronic device, in particular a display arrangement or a headlight arrangement, in which method the light sources of a plurality of optoelectronic devices are arranged in an array according to any of the preceding items and are embedded in a carrier in such a way that only the top sides with light exit surfaces of the light sources represent free, external surfaces and otherwise material of the carrier surrounds the interfaces of the light sources.

315. Method for producing a μ-display, a monolithic array or a headlamp assembly, in particular comprising a plurality of optoelectronic devices according to any of the preceding items, in which method optoelectronic light sources based on semiconductor materials are formed in an array on a carrier in such a way that each light source comprises an active zone for generating light and a free, external top surface on the top side as a light exit surface for the light, wherein for each light source a dielectric reflector is arranged on at least one boundary surface, which delimits the light source laterally and/or downwardly with respect to a material of the carrier, which reflector is configured to reflect the light generated in the light source.

316. Method according to any of the preceding items, characterised in that the arrangement of the dielectric reflector comprises applying material for the dielectric reflector by means of atomic layer deposition.

317. Method according to any of the preceding items, characterised in that arranging the dielectric reflector comprises arranging the material for at least one layer of the dielectric reflector by means of a first method and arranging the material for the other layers by means of a second method, preferably the first method is a vapour phase deposition method, and preferably the second method is atomic layer deposition.

318. Method for producing a μ-display, in particular with a plurality of optoelectronic devices according to any of the preceding items, in which method optoelectronic light sources based on semiconductor materials can be arranged in an array on a carrier in such a way that each light source comprises an active zone for generating light and, on the upper side, a free, external upper side as light exit surface for the light, wherein the light sources are arranged in such a way that there is at least a slight gap between adjacent light sources on the upper side with an intermediate space behind it, wherein for each light source a dielectric reflector is arranged at at least one boundary surface, which delimits the light source laterally and/or downwardly with respect to a material of the support, which reflector is configured to reflect the light generated in the light source, and wherein the dielectric reflectors of the light sources are formed by introducing material for the dielectric reflectors from the top side into the respective gap between adjacent light sources, in particular by means of atomic layer deposition, and the dielectric reflectors are formed in the respective space located behind a gap.

319. Method according to item 318, characterised in that at least the light emission surfaces of the light sources are covered, in particular with a photomask, while the dielectric reflectors are formed in the interspaces.

320. μ-LED device or optoelectronic device comprising:

at least one semiconductor element, in particular a μ-LED with an active zone designed to generate light a dielectric filter disposed above a first major surface of said at least one semiconductor element and adapted to transmit only light in predetermined directions, and a reflective material disposed on at least one side surface of said at least one semiconductor element and on at least one side surface of said dielectric filter.

321. μ-LED device according to item 320, wherein at least one side surface of the at least one semiconductor element is inclined at the height of the active region.

322. μ-LED device according to any of the preceding items, wherein the at least one semiconductor element has a first terminal and a second terminal, and the reflective material is electrically conductive and is coupled to the first terminal of the at least one semiconductor element.

323. μ-LED device according to any of the preceding items, characterized in that the reflective material is conductive only on two opposite side faces of the light source in such a way that it contacts the first terminal for power supply.

324. μ-LED device according to any of the preceding items, characterized in that the reflecting material on the other two sides is non-conductive, such that it is isolated from the connection to the power supply.

325. μ-LED device according to any of the preceding items, in which the dielectric filter is formed at least partially in a layer of the semiconductor element adjacent to the direction of emission.

326. μ-LED device according to any of the preceding items, wherein the dielectric filter has first and second regions of different refractive index; wherein converter material forms said first regions.

327. μ-LED device according to any of the preceding items, wherein the at least one semiconductor element comprises a second major surface opposite the first major surface, and a reflective layer is disposed below the second major surface of the at least one semiconductor element.

328. μ-LED device according to any of the preceding items, wherein the reflective layer is at least partially electrically conductive and is coupled to the second terminal of the at least one semiconductor element.

329. μ-LED device according to item 323, wherein the reflective layer is electrically insulating and one or more electrically conductive layers are arranged above and/or below the reflective layer.

330. μ-LED device according to any of the preceding items, wherein an electrically insulating first material is disposed between the reflecting material and the reflecting layer, the electrically insulating first material comprising in particular a lower refractive index than the at least one semiconductor element.

331. μ-LED device according to any of the preceding items, wherein a layer having a roughened surface is disposed between the at least one semiconductor element and the dielectric filter.

332. μ-LED device according to any of the preceding items, further comprising a converter material on the light-emitting surface, the converter material comprising an inorganic dye or quantum dots; or a converter material between the dielectric filter and the μ-LED, wherein the converter material comprises an inorganic dye or quantum dots.

333. μ-LED device according to any of the preceding items, wherein the first major surface of said at least one semiconductor element has a roughened surface.

334. μ-LED arrangement according to any of the preceding items, wherein the at least one semiconductor element has a lateral dimension of not more than 50 μm and/or a height of not more than 2 μm.

335. μ-LED device according to any of the preceding items, wherein said at least one semiconductor element comprises a plurality of semiconductor elements arranged in an array, adjacent semiconductor elements being separated from each other by the reflective material.

336. μ-LED device according to item 330, where the reflective material is electrically conductive and the first terminals of the semiconductor elements are connected to a common external terminal via the reflective material.

337. μ-LED device according to any of the preceding items, wherein the at least one semiconductor element comprises a plurality of semiconductor elements arranged side by side with an electrically insulating second material disposed between adjacent semiconductor elements.

338. μ-LED device according to any of the preceding items, wherein the reflective material is electrically conductive and conductive tracks extend above and/or below and/or within the electrically insulating second material connecting the first terminals of the semiconductor elements to a common external terminal.

339. μ-LED device according to any of the preceding items, whereby the second connections of the semiconductor elements can be individually controlled.

340. μ-LED device according to any of the preceding items, further comprising a microlens positioned above the dielectric filter.

341. Method of manufacturing a μ-LED device or optoelectronic component, comprising providing at least one semiconductor element, in particular a μ-LED according to one of the preceding or following items with an active zone configured to generate light is provided, disposing a dielectric filter above a first major surface of the at least one semiconductor element, the dielectric filter being adapted to transmit only light in predetermined directions, and disposing a reflective material on at least one side surface of said at least one semiconductor element and on at least one side surface of said dielectric filter.

The invention claimed is:

1. A semiconductor structure, comprising:

an n-doped first layer;

a p-doped second layer doped with a first dopant;

an active layer which is disposed between the n-doped first layer and the p-doped second layer and which comprises at least one quantum well;

wherein the active layer of the semiconductor structure is divided into a plurality of first optically active regions, at least one second region and at least one third region;

wherein said first plurality of optically active regions are spaced apart in a hexagonal pattern;

wherein the at least one quantum well in the active layer comprises a larger band gap in the at least one second region than in the plurality of first optically active regions and the at least one third region;

wherein the band gap is modified in particular by quantum well intermixing;

wherein the at least one second region encloses the plurality of first optically active regions; and wherein said at least one third region is located in spaces between said plurality of first optically active regions.

2. The semiconductor structure according to claim 1, wherein the plurality of first optically active regions are at least substantially circular in shape.

3. The semiconductor structure according to claim 1, wherein the at least one second region comprises a plurality of second regions and each region of the plurality of second regions concentrically encloses one of said plurality of first optically active regions.

4. The semiconductor structure according to claim 3, wherein the plurality of second regions are at least substantially circular in shape.

5. The semiconductor structure according to claim 1, wherein the at least one third region comprises a plurality of third regions and the plurality of third regions are arranged such that each region of the plurality of third regions is located in a center of exactly three first optically active regions.

6. The semiconductor structure according to claim 5, wherein each region of the plurality of third regions is at least substantially circular in shape.

7. The semiconductor structure according to claim 5, wherein each region of the plurality of third regions at least substantially represents the shape of a deltoid curve formed by exactly three of the plurality of second regions, each of which is at least substantially circular.

8. The semiconductor structure according to claim 1, wherein each optically active region of the plurality of first optically active regions forms part of a respective opto-electronic component.

9. The semiconductor structure according to claim 1, further comprising a second dopant substantially uniformly arranged in at least one second region.

10. The semiconductor structure according to claim 1, further comprising a second dopant in at least one second region in the p-doped second layer and/or in the active layer, and at least partially formed in a region of the n-doped layer adjacent to the active layer.

11. The semiconductor structure according to claim 1, wherein said at least one second region comprises a substantially uniform band gap modified by said quantum well intermixing.

12. The semiconductor structure according to claim 1, wherein the plurality of first optically active regions and the at least one third region comprise a substantially identical band gap.

13. The semiconductor structure according to claim 1, wherein the plurality of first optically active regions are substantially free of quantum well intermixing.

14. The semiconductor structure according to claim 1, wherein said at least one third region comprises substantially no quantum well intermixing.

15. The semiconductor structure according to claim 1, wherein quantum well intermixing decreases in a defined transition region from the at least one second region to the plurality of first optically active regions.

16. The semiconductor structure according to claim 1, further comprising a second dopant in one or more regions of the p-doped second layer, wherein the second dopant is different from the first dopant.

17. The semiconductor structure according to claim 16, wherein the second dopant is formed from a group comprising at least one of Mg, Zn, and/or Cd.

18. The semiconductor structure according to claim 1, further comprising an out-coupling structure, in particular a photonic structure on a side lying in the main radiation direction.

19. A μ-LED arrangement comprising the semiconductor structure according to claim 1.

* * * * *